US012615760B2

(12) United States Patent
Zhu et al.

(10) Patent No.: US 12,615,760 B2
(45) Date of Patent: Apr. 28, 2026

(54) VERTICAL TRANSISTORS AND METHODS FOR FORMING THE SAME

(71) Applicant: YANGTZE MEMORY TECHNOLOGIES CO., LTD., Wuhan (CN)

(72) Inventors: Hongbin Zhu, Wuhan (CN); Weihua Cheng, Wuhan (CN); Wei Liu, Wuhan (CN); Wenyu Hua, Wuhan (CN); Bingjie Yan, Wuhan (CN); Zichen Liu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 585 days.

(21) Appl. No.: 18/092,089

(22) Filed: Dec. 30, 2022

(65) Prior Publication Data

US 2024/0172415 A1    May 23, 2024

Related U.S. Application Data

(63) Continuation of application No. PCT/CN2022/132577, filed on Nov. 17, 2022.

(51) Int. Cl.
*H10B 12/00* (2023.01)
*H10B 53/30* (2023.01)
(Continued)

(52) U.S. Cl.
CPC ........... *H10B 12/315* (2023.02); *H10B 12/05* (2023.02); *H10B 53/30* (2023.02); *H10B 63/10* (2023.02); *H10B 63/34* (2023.02)

(58) Field of Classification Search
CPC ...... H10B 12/315; H10B 12/05; H10B 53/30; H10B 63/10; H10B 63/34; H10B 63/80; H10N 70/011
See application file for complete search history.

(56) References Cited

U.S. PATENT DOCUMENTS 8,409,948 B2    4/2013   Fischer et al.
2011/0169074 A1    7/2011   Lee
(Continued)

FOREIGN PATENT DOCUMENTS

CN    114373720 A    4/2022
TW    202030885 A    8/2020
(Continued)

OTHER PUBLICATIONS

International Search Report issued in corresponding International Application No. PCT/CN2022/132577, mailed Jul. 3, 2023, 5 pages.
(Continued)

*Primary Examiner* — Samuel Park
(74) *Attorney, Agent, or Firm* — BAYES PLLC

(57) ABSTRACT
In certain aspects, a semiconductor device includes a vertical transistor, a metal bit line, and a pad layer. The vertical transistor includes a semiconductor body extending in a first direction, and a gate structure coupled to at least one side of the semiconductor body. The gate structure includes a gate dielectric and a gate electrode. The metal bit line extends in a second direction perpendicular to the first direction and coupled to a terminal of the vertical transistor via an ohmic contact. The pad layer is positioned between the gate electrode and the metal bit line in the first direction. The gate dielectric and the pad layer have different dielectric materials.

20 Claims, 65 Drawing Sheets

500

(51) Int. Cl.
    *H10B 63/00*      (2023.01)
    *H10B 63/10*      (2023.01)

(56)            References Cited

U.S. PATENT DOCUMENTS

| | | |
|---|---|---|
| 2012/0018801 A1 | 1/2012 | Kobayashi et al. |
| 2013/0234242 A1* | 9/2013 | Hwang .............. H10D 84/0165 |
| | | 438/270 |
| 2016/0049406 A1* | 2/2016 | Sandhu .................. H10D 1/692 |
| | | 257/43 |
| 2019/0148286 A1 | 5/2019 | Or-Back et al. |
| 2020/0111800 A1 | 4/2020 | Ramaswamy |
| 2021/0074334 A1 | 3/2021 | Zhu |
| 2022/0165737 A1 | 5/2022 | Pillarisetty et al. |
| 2022/0173135 A1 | 6/2022 | Mariani et al. |

FOREIGN PATENT DOCUMENTS

| | | |
|---|---|---|
| TW | 202205540 A | 2/2022 |
| WO | 2018/118096 A1 | 6/2018 |

OTHER PUBLICATIONS

Communication pursuant to Article 94(3) EPC issued in corresponding European Application No. 22835203.5, mailed on Feb. 10, 2026, 6 pages.

* cited by examiner

100

500
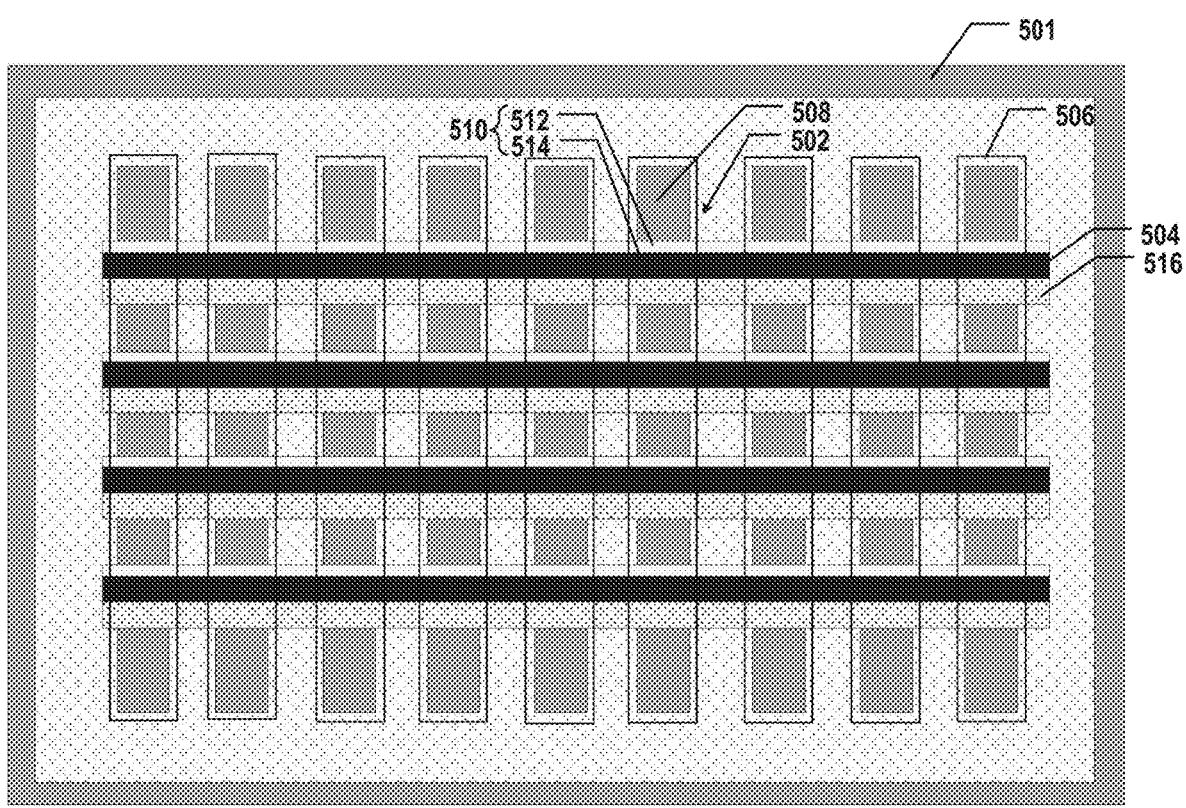
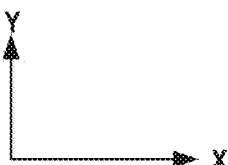
FIG. 5A

500
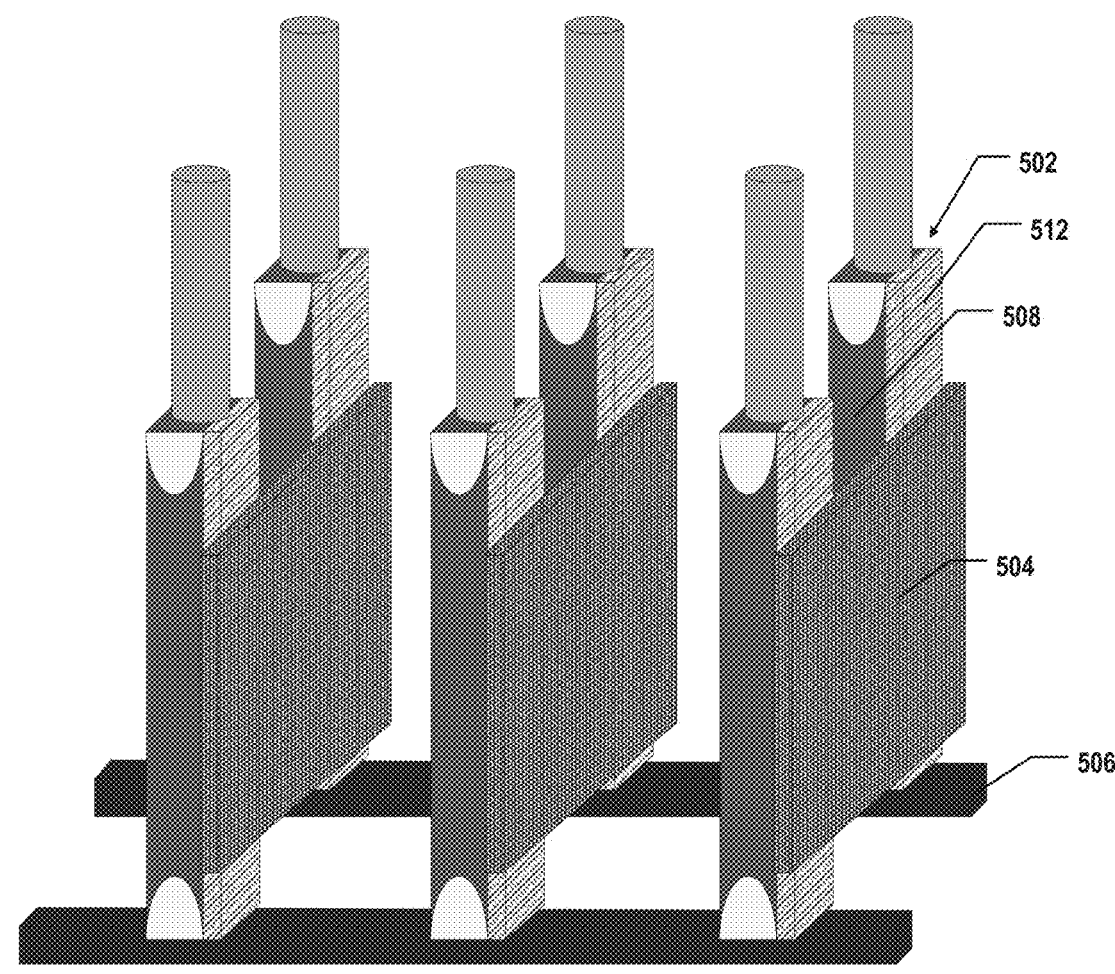
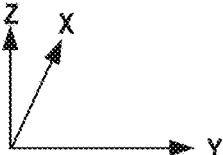
FIG. 5B

600
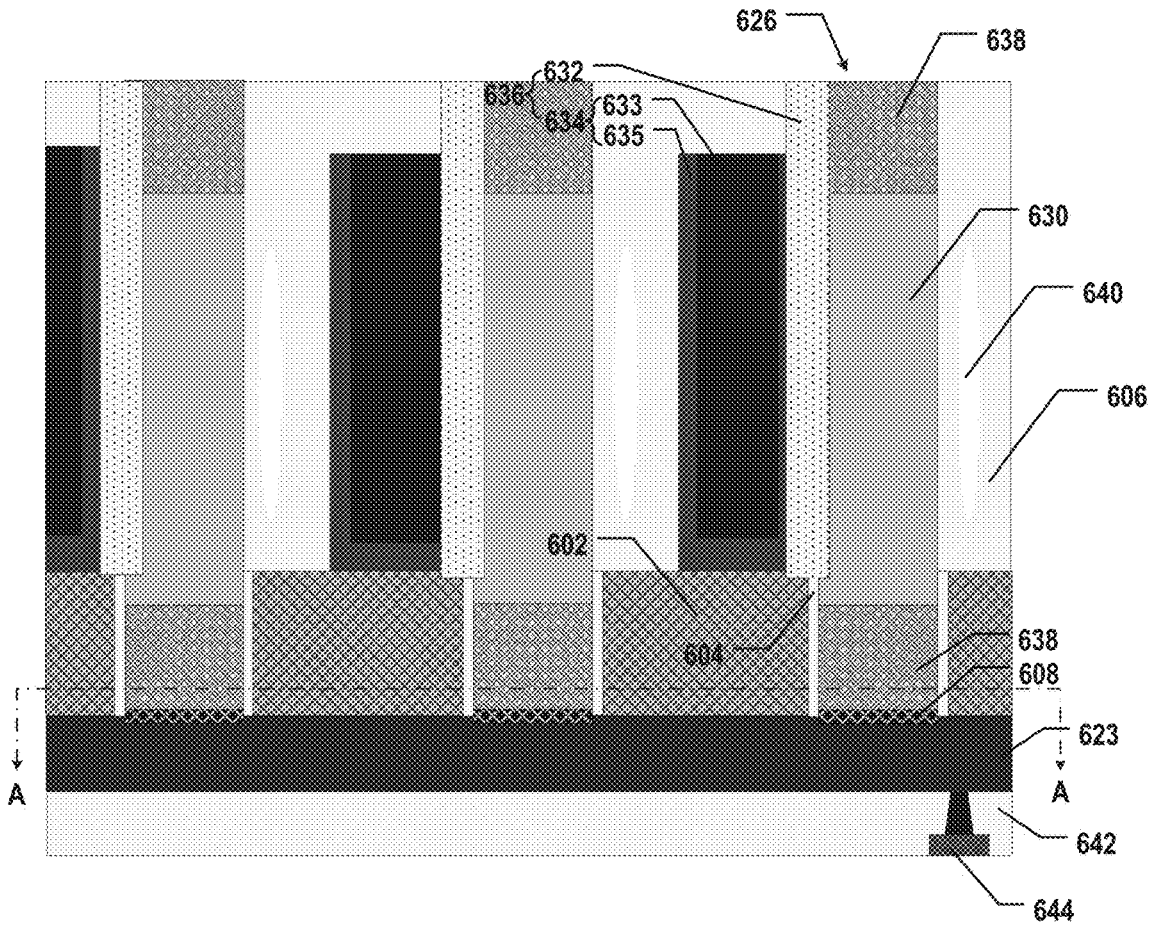
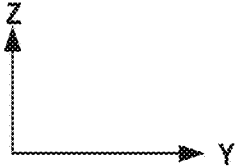
FIG. 6A

601
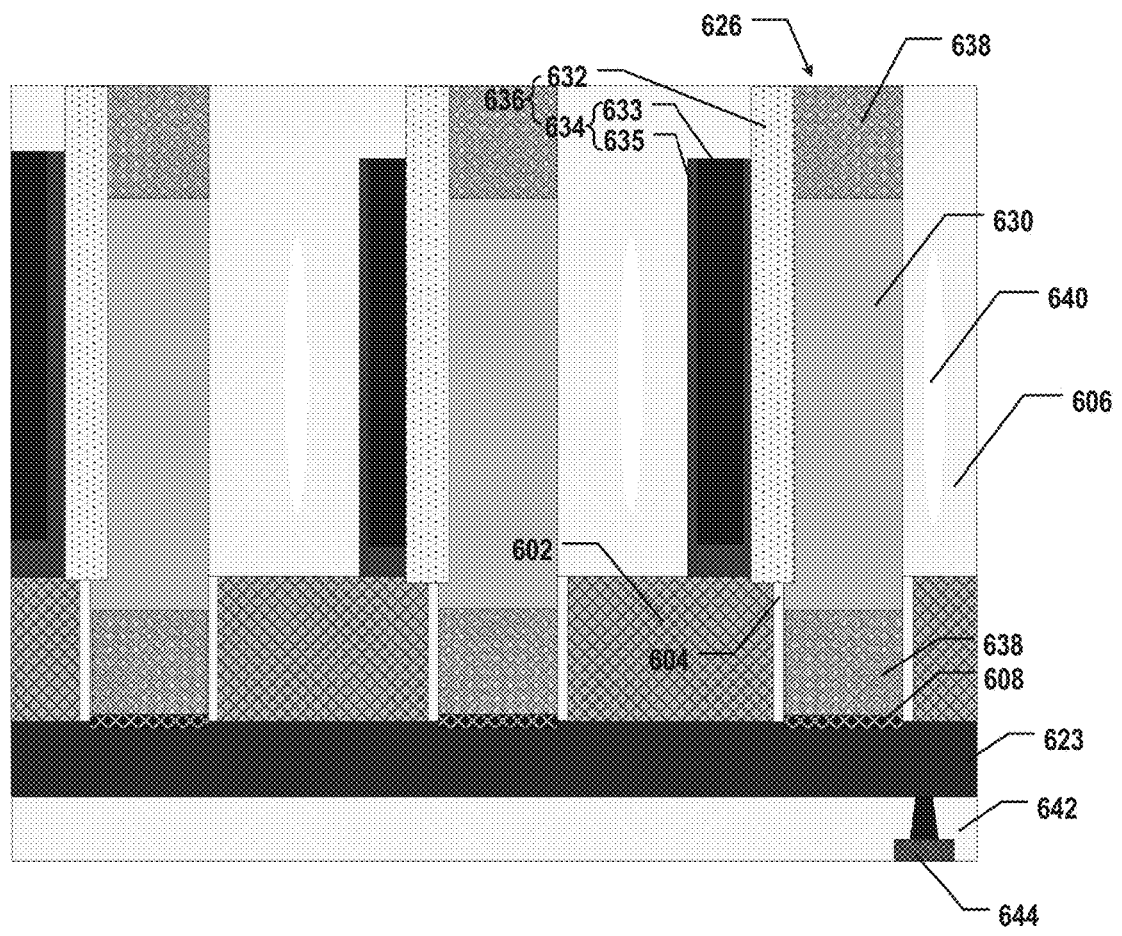
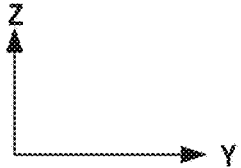
FIG. 6B

603
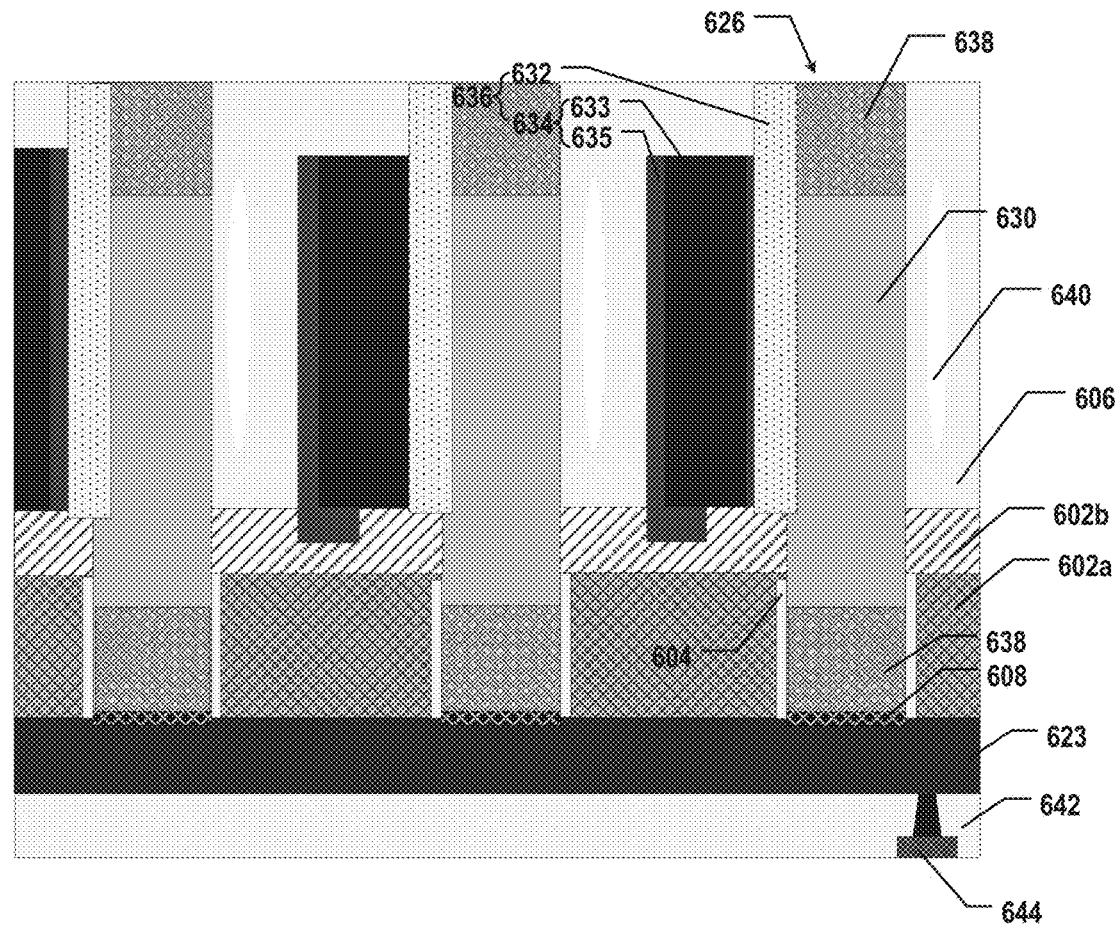
FIG. 6C

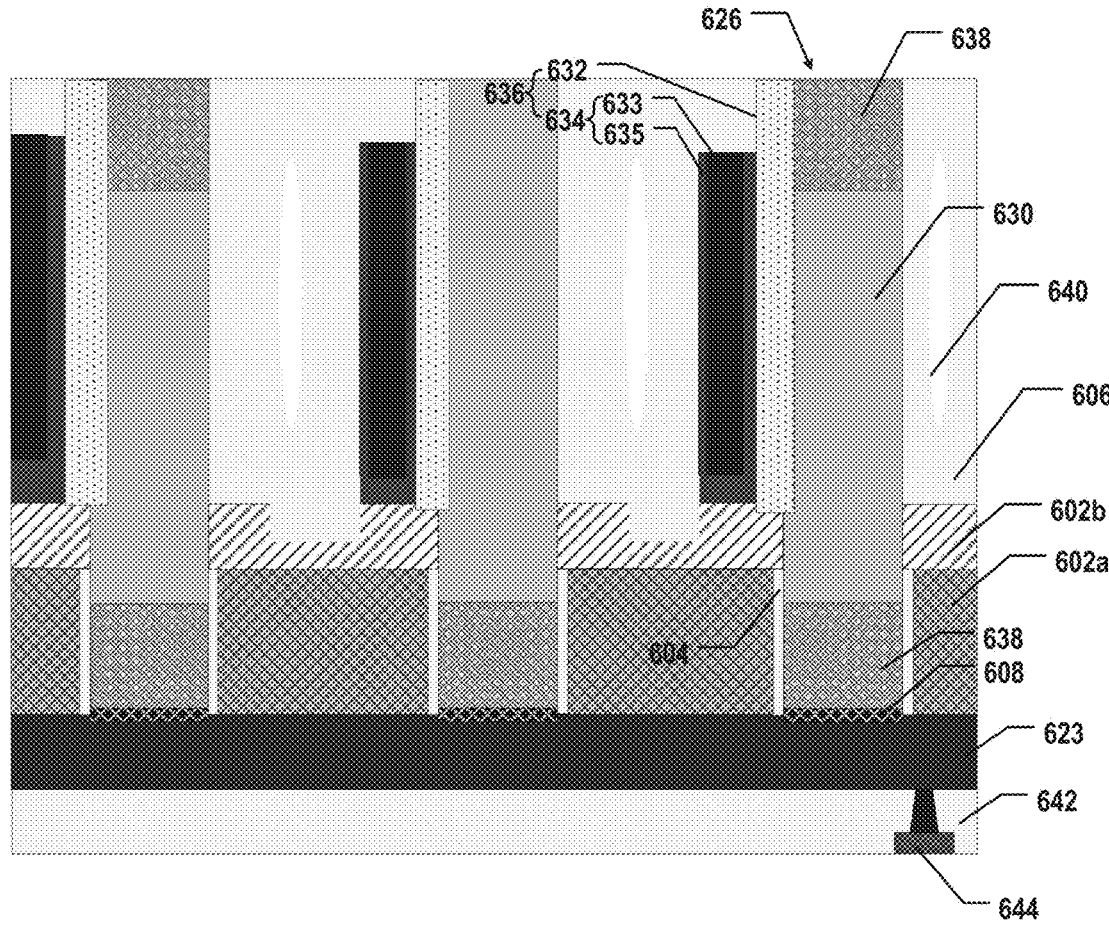
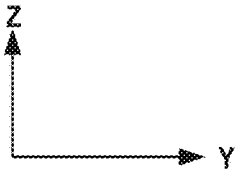
FIG. 6D

<u>600</u>
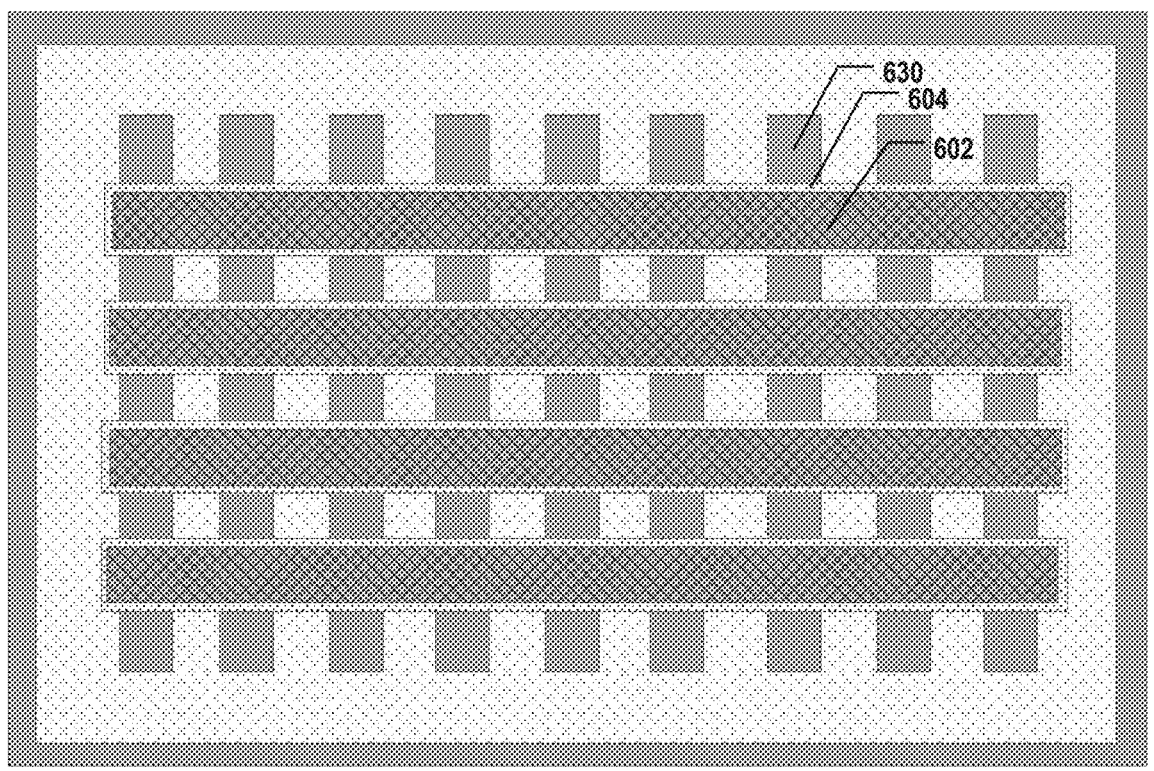
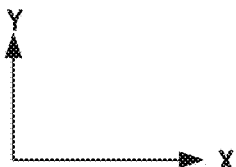
FIG. 7

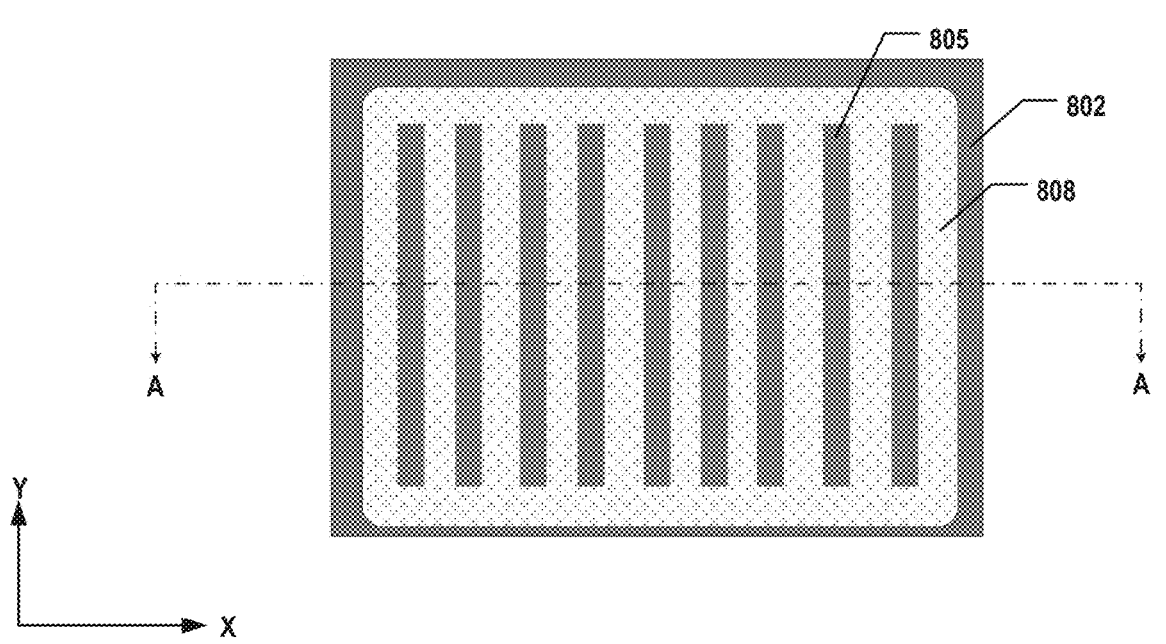
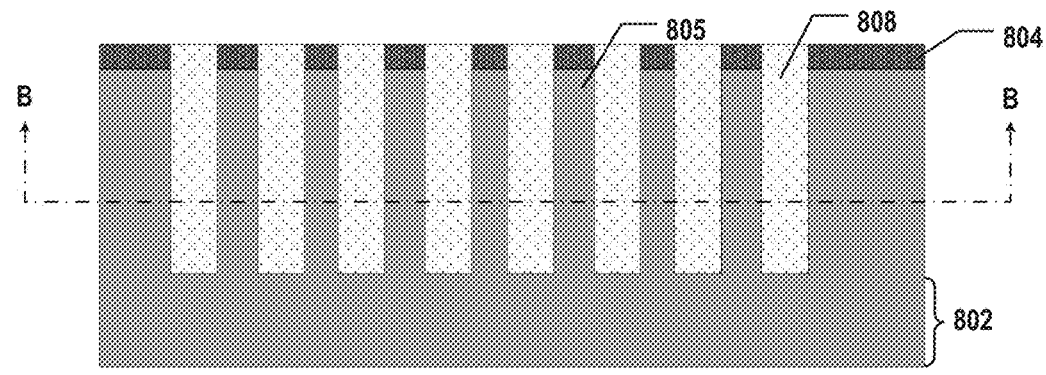
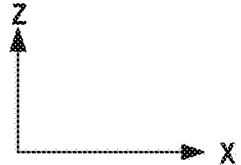
FIG. 8A

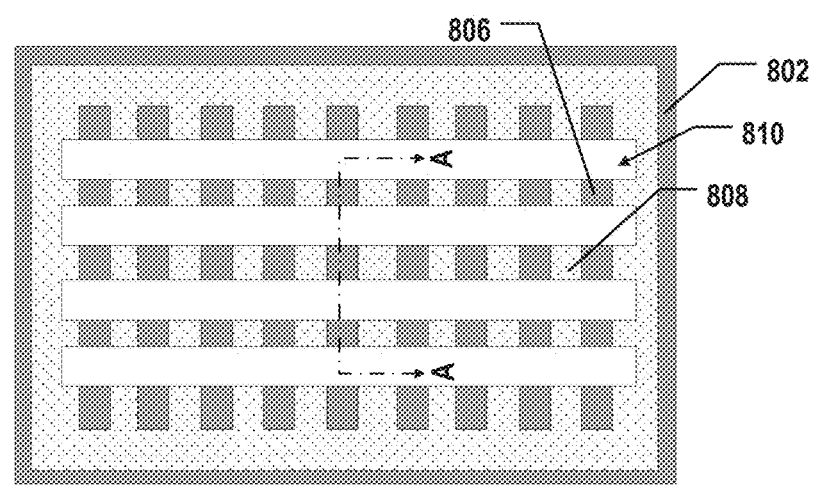
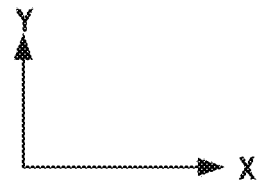
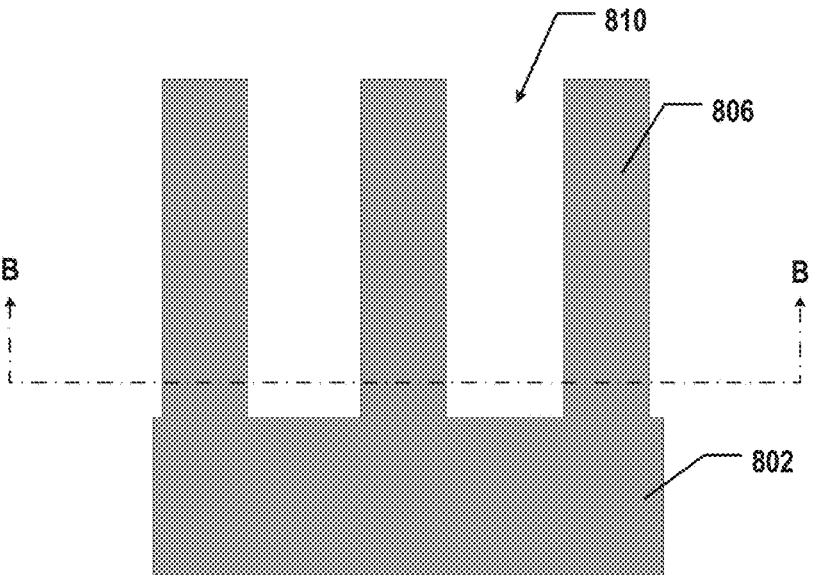
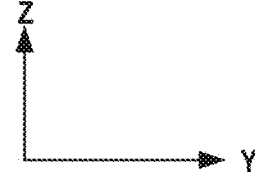
FIG. 8B

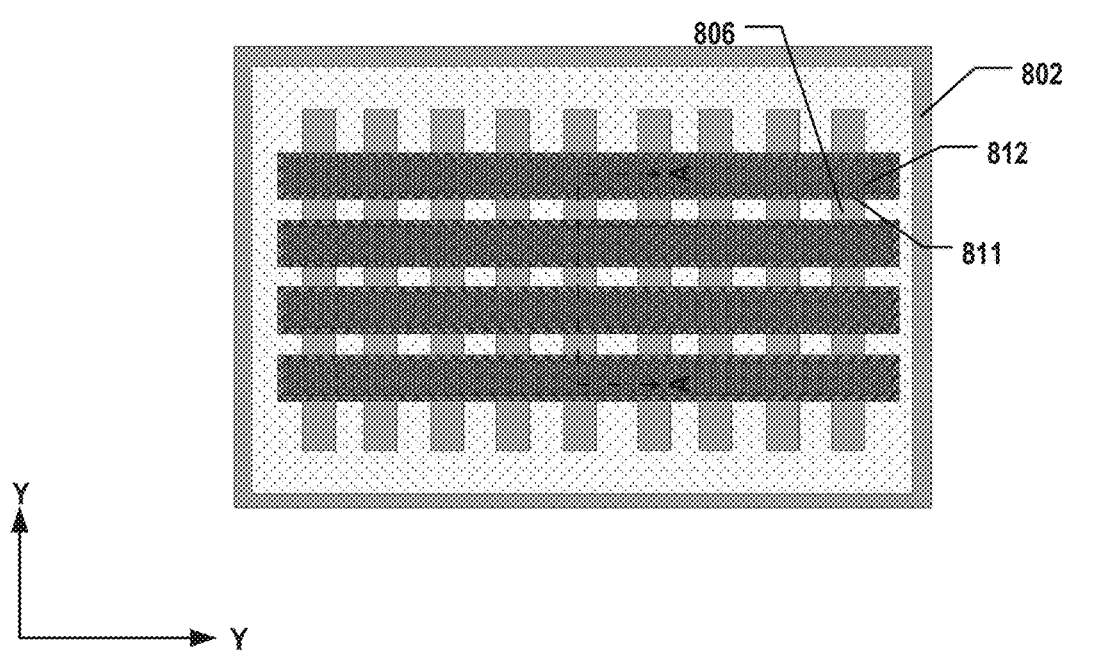
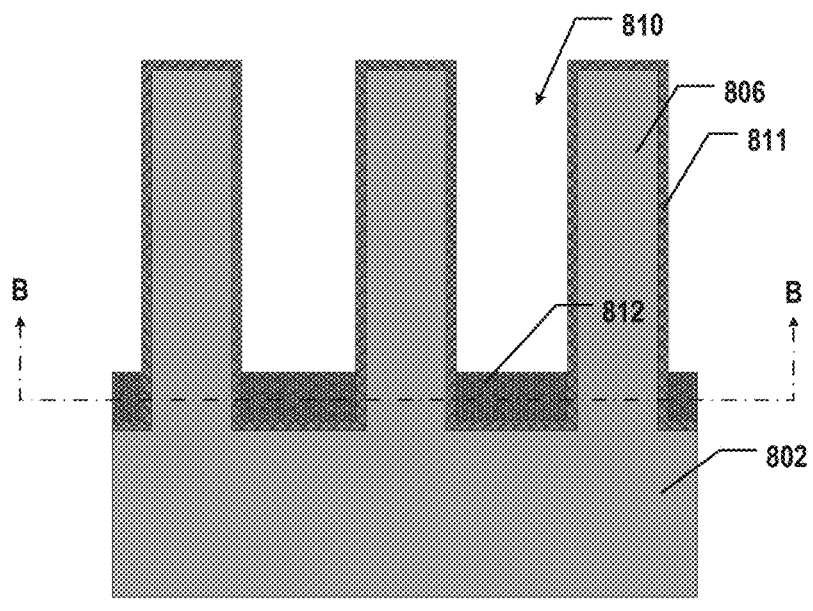
FIG. 8C

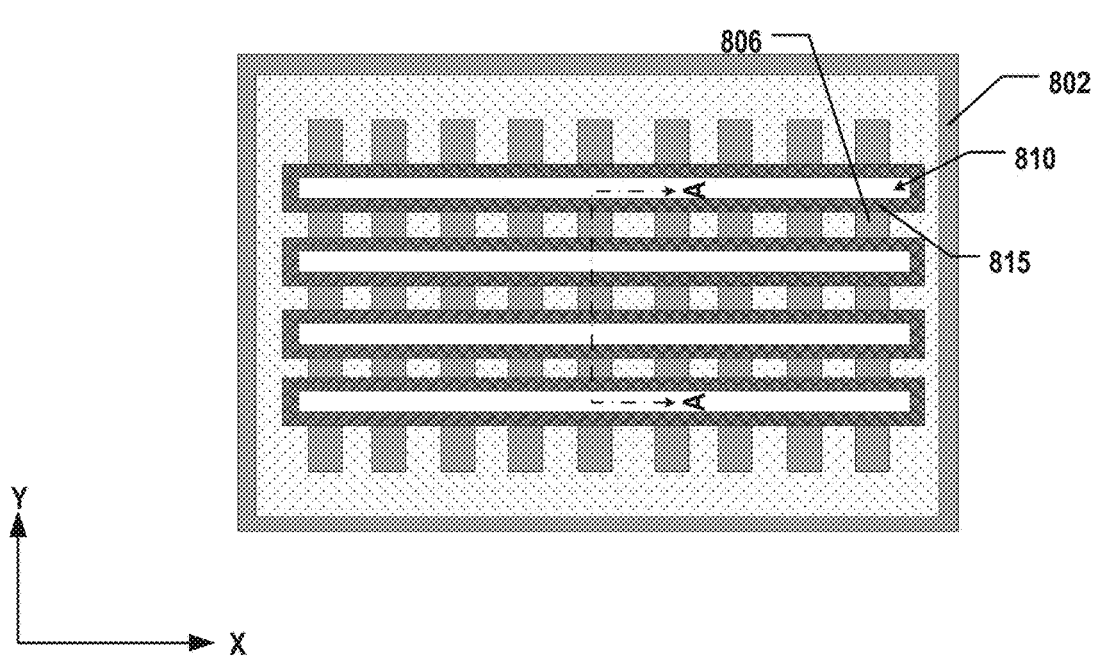
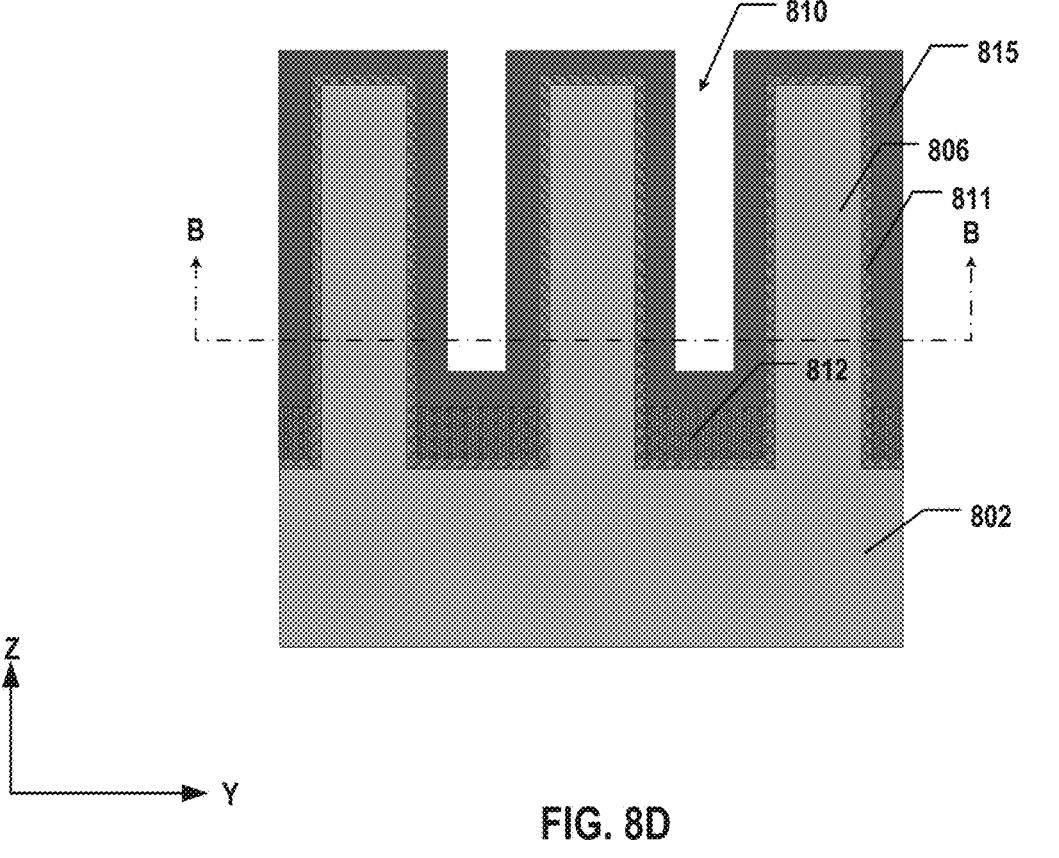
FIG. 8D

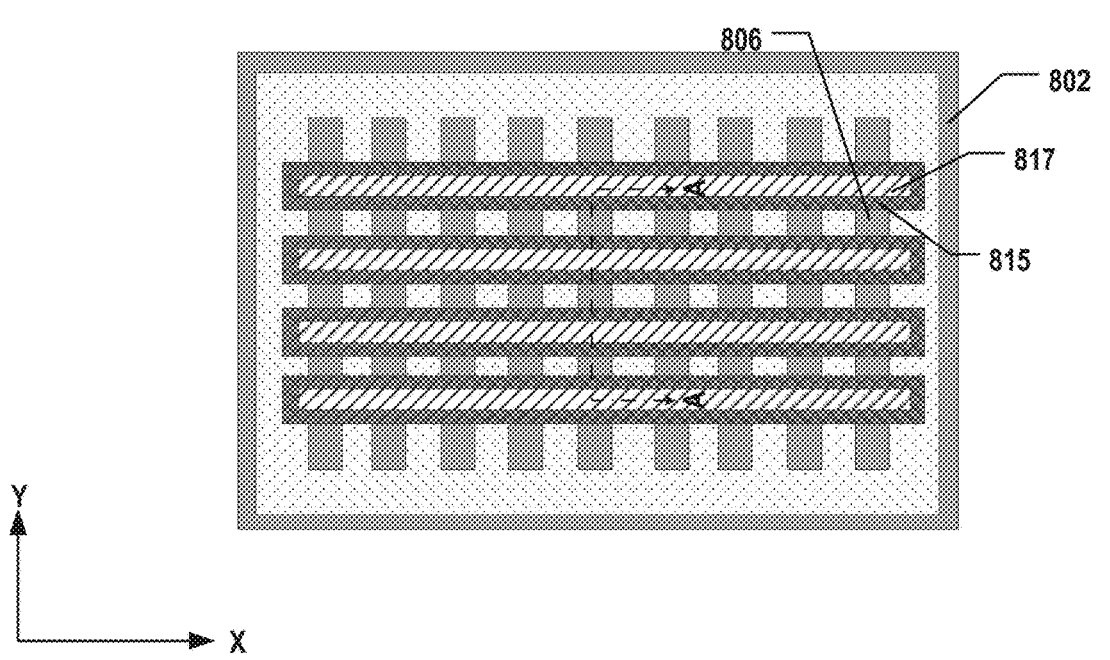
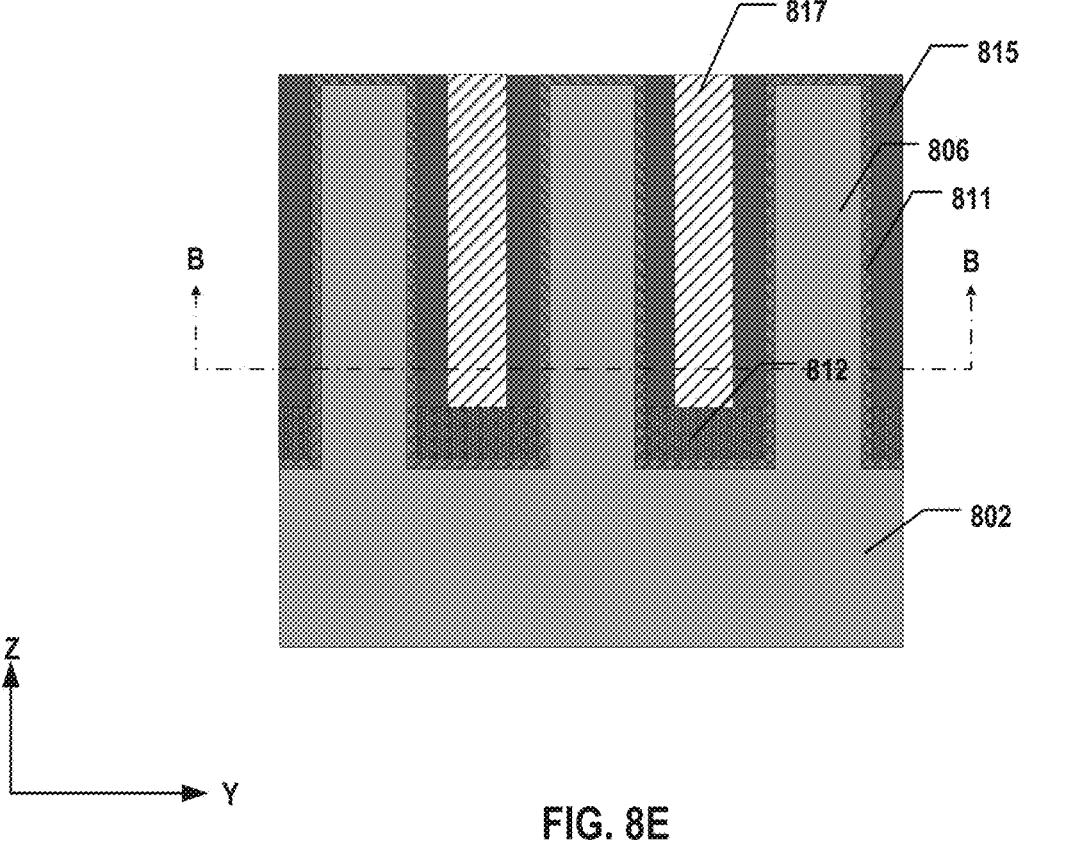
FIG. 8E

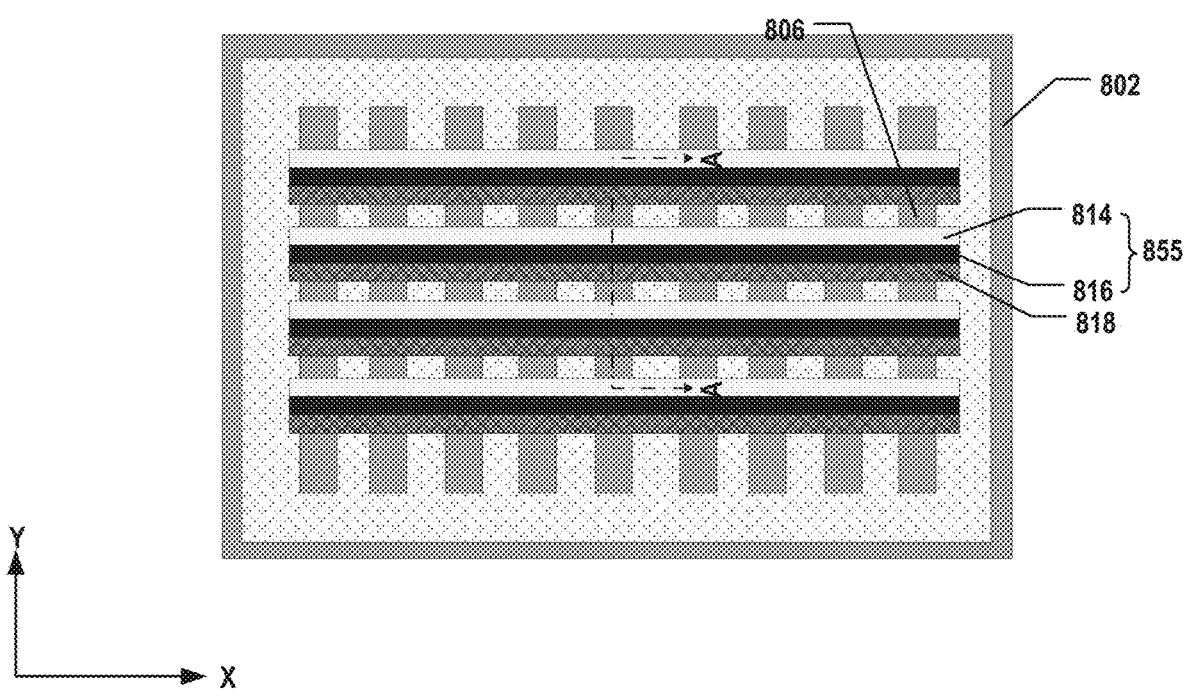
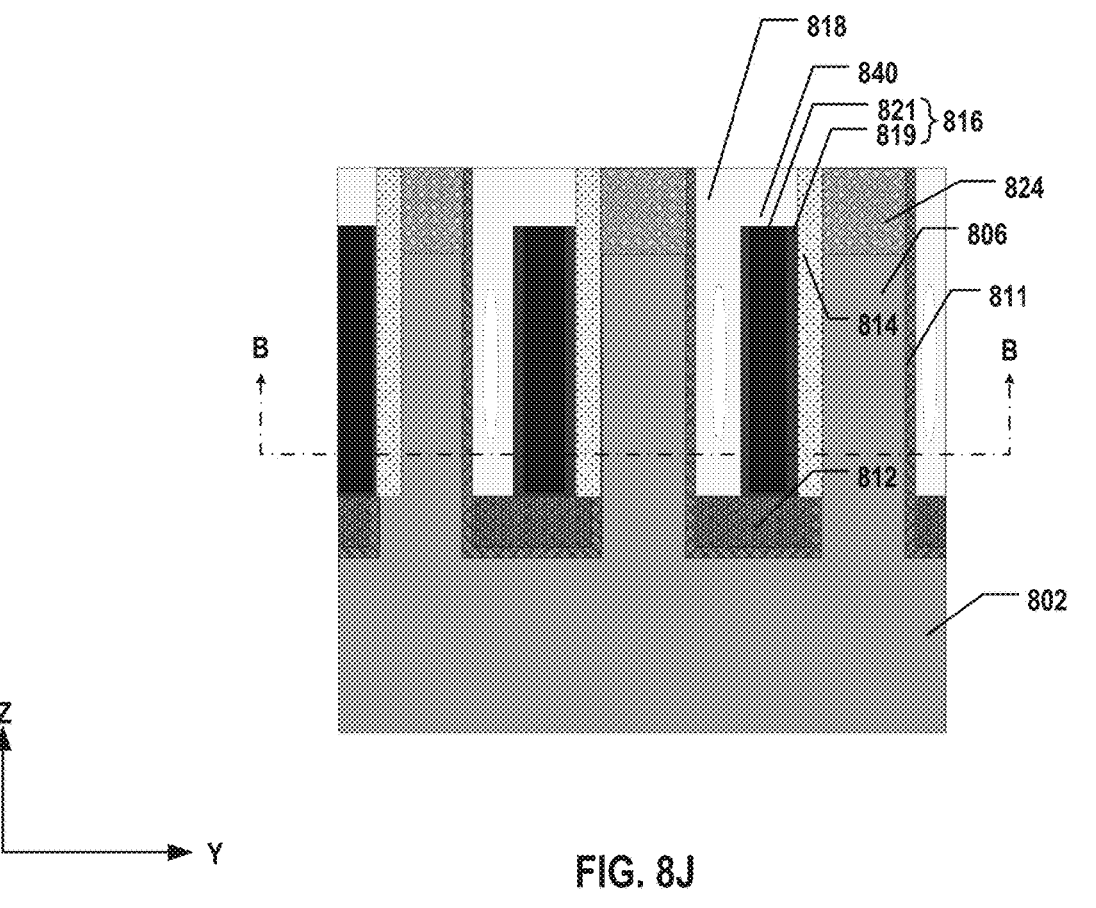
FIG. 8J

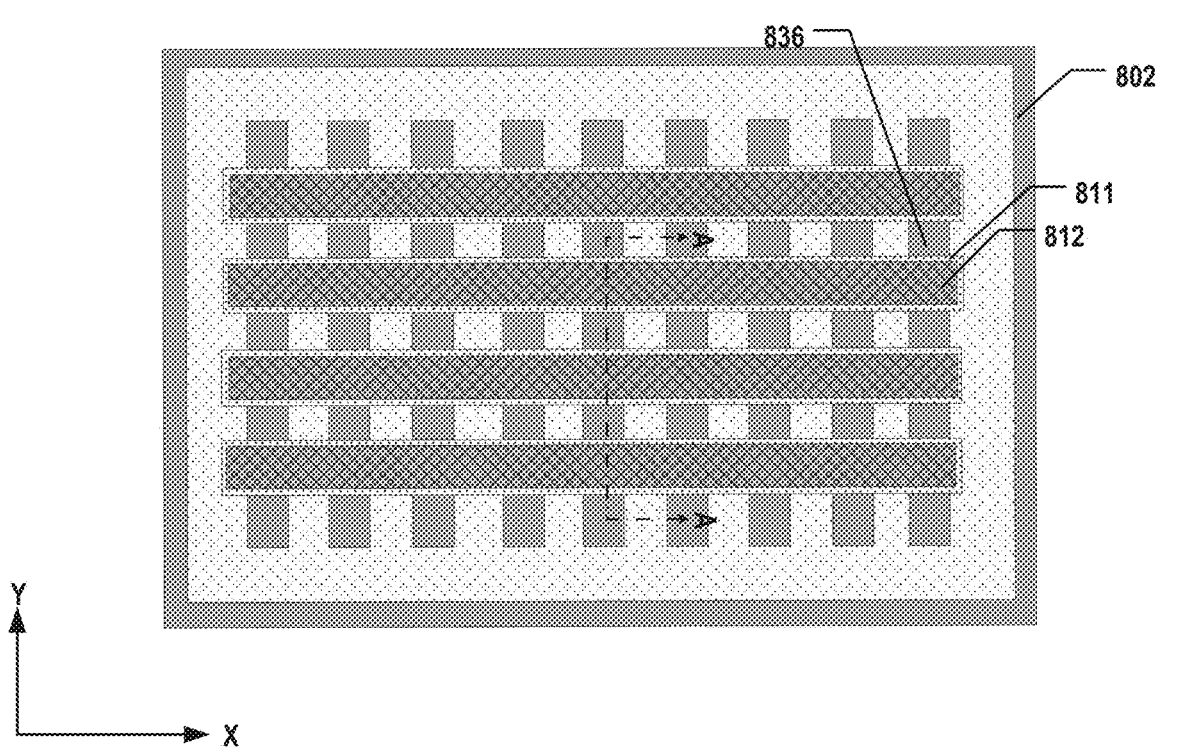
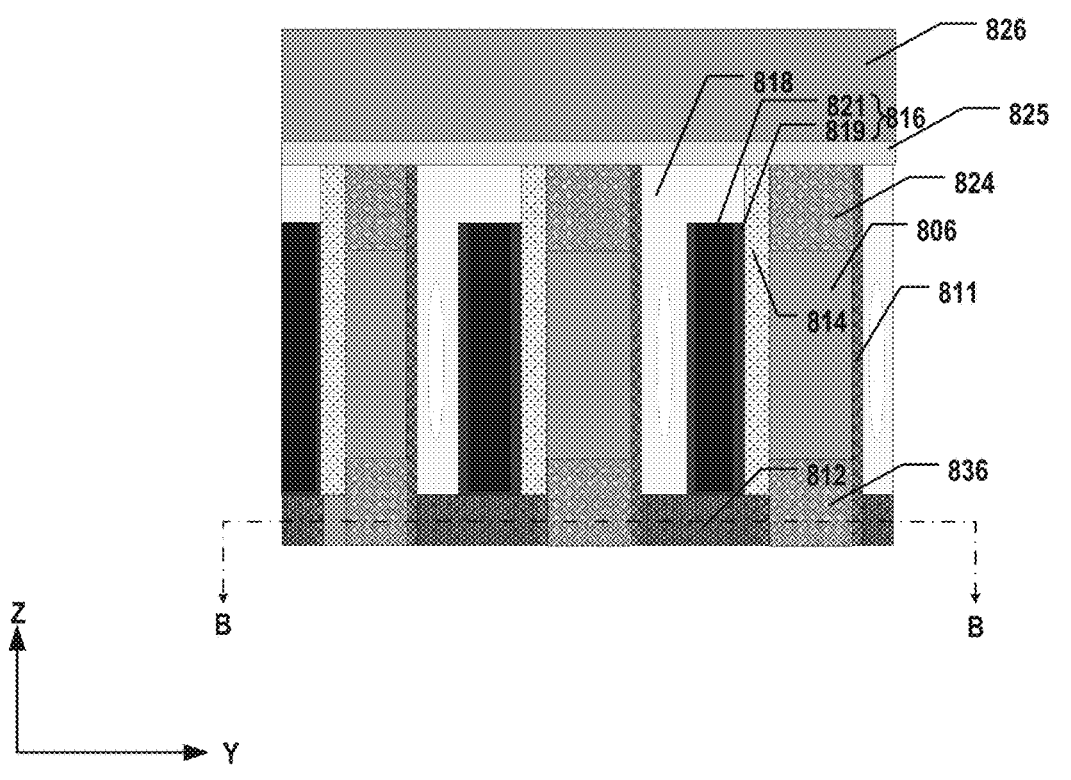
FIG. 8M

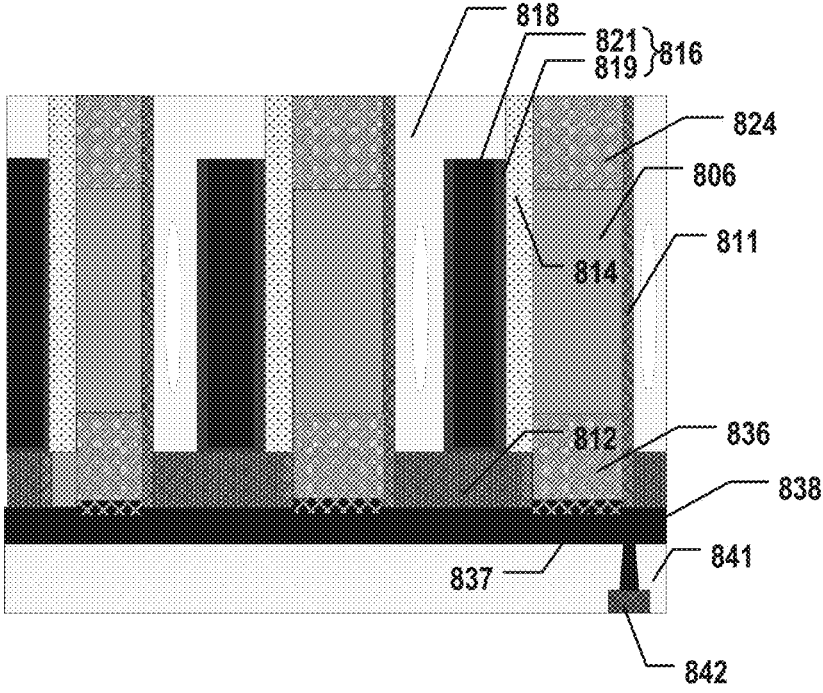
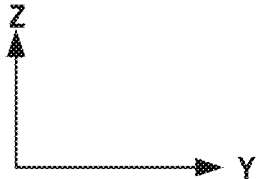
FIG. 8N

1100

<u>1101</u>

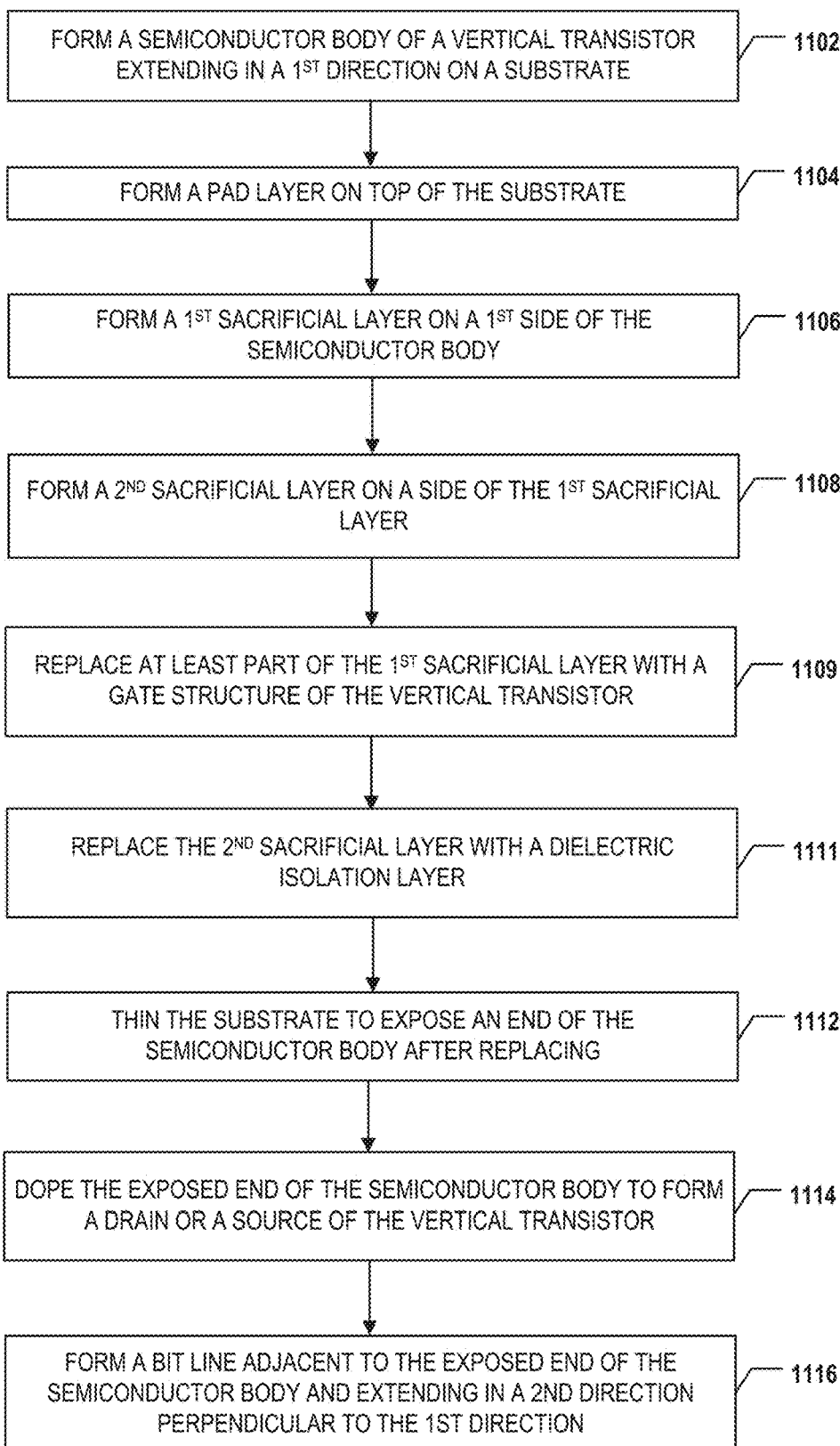

FORM A SEMICONDUCTOR BODY OF A VERTICAL TRANSISTOR EXTENDING IN A 1ST DIRECTION ON A SUBSTRATE — 1102

FORM A PAD LAYER ON TOP OF THE SUBSTRATE — 1104

FORM A 1ST SACRIFICIAL LAYER ON A 1ST SIDE OF THE SEMICONDUCTOR BODY — 1106

FORM A 2ND SACRIFICIAL LAYER ON A SIDE OF THE 1ST SACRIFICIAL LAYER — 1108

REPLACE AT LEAST PART OF THE 1ST SACRIFICIAL LAYER WITH A GATE STRUCTURE OF THE VERTICAL TRANSISTOR — 1109

REPLACE THE 2ND SACRIFICIAL LAYER WITH A DIELECTRIC ISOLATION LAYER — 1111

THIN THE SUBSTRATE TO EXPOSE AN END OF THE SEMICONDUCTOR BODY AFTER REPLACING — 1112

DOPE THE EXPOSED END OF THE SEMICONDUCTOR BODY TO FORM A DRAIN OR A SOURCE OF THE VERTICAL TRANSISTOR — 1114

FORM A BIT LINE ADJACENT TO THE EXPOSED END OF THE SEMICONDUCTOR BODY AND EXTENDING IN A 2ND DIRECTION PERPENDICULAR TO THE 1ST DIRECTION — 1116

FIG. 11B

1200
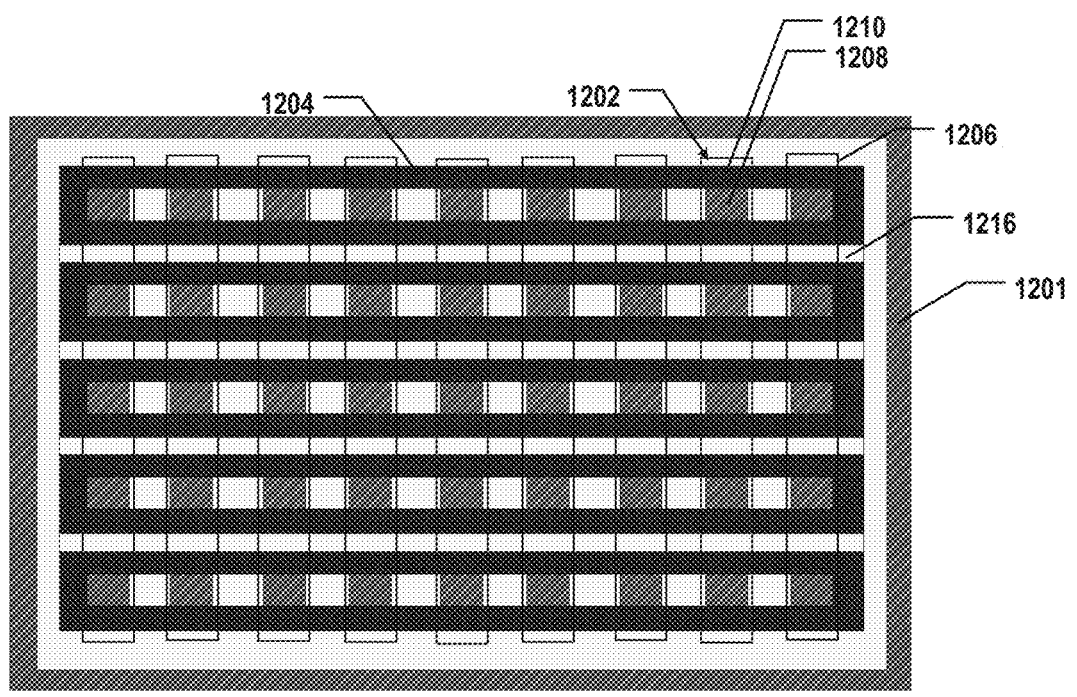
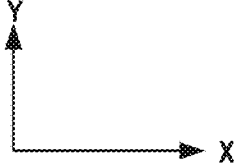
FIG. 12A

1200
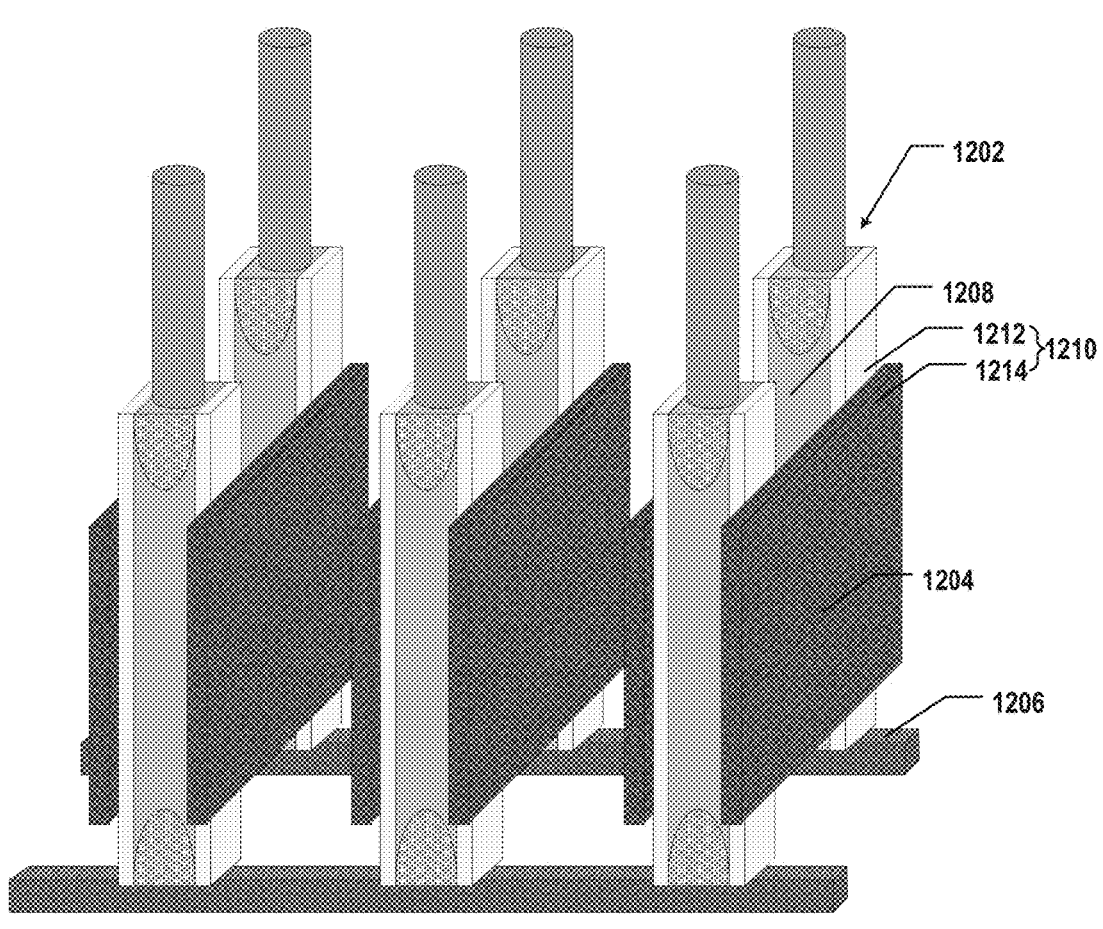
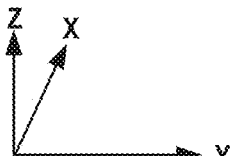
FIG. 12B

1300

1301

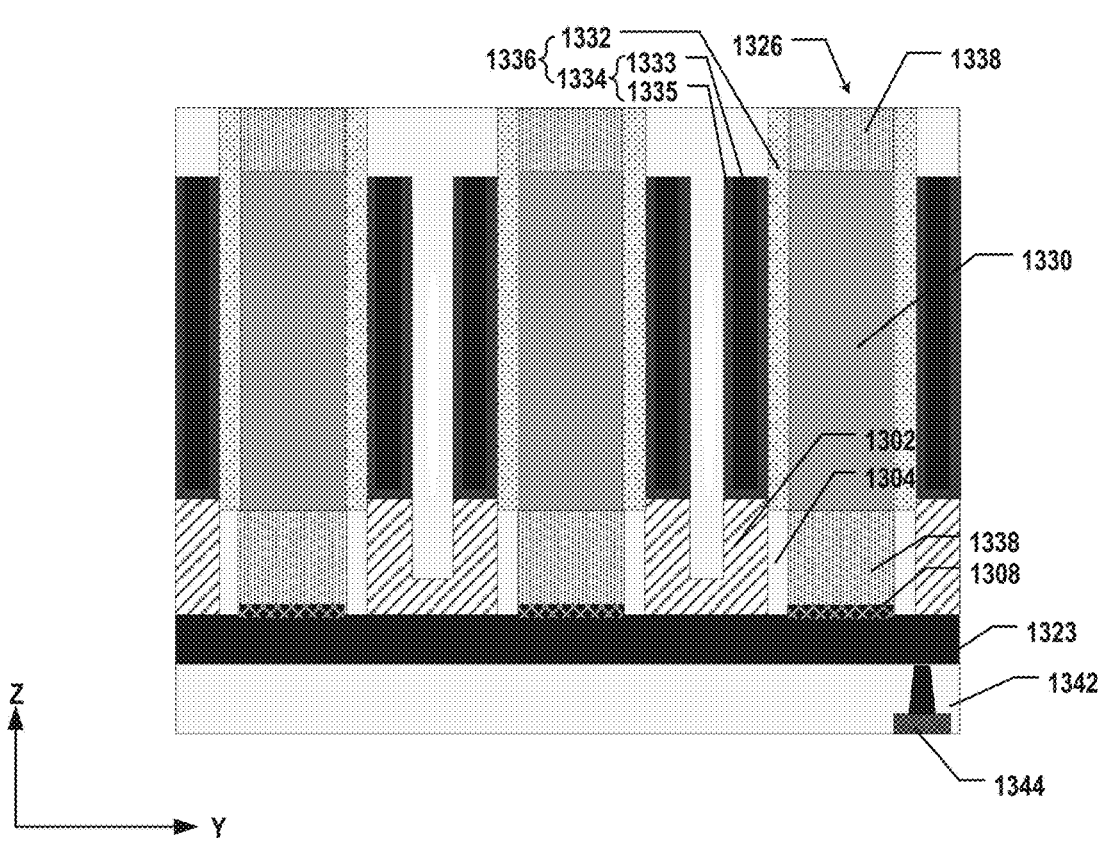
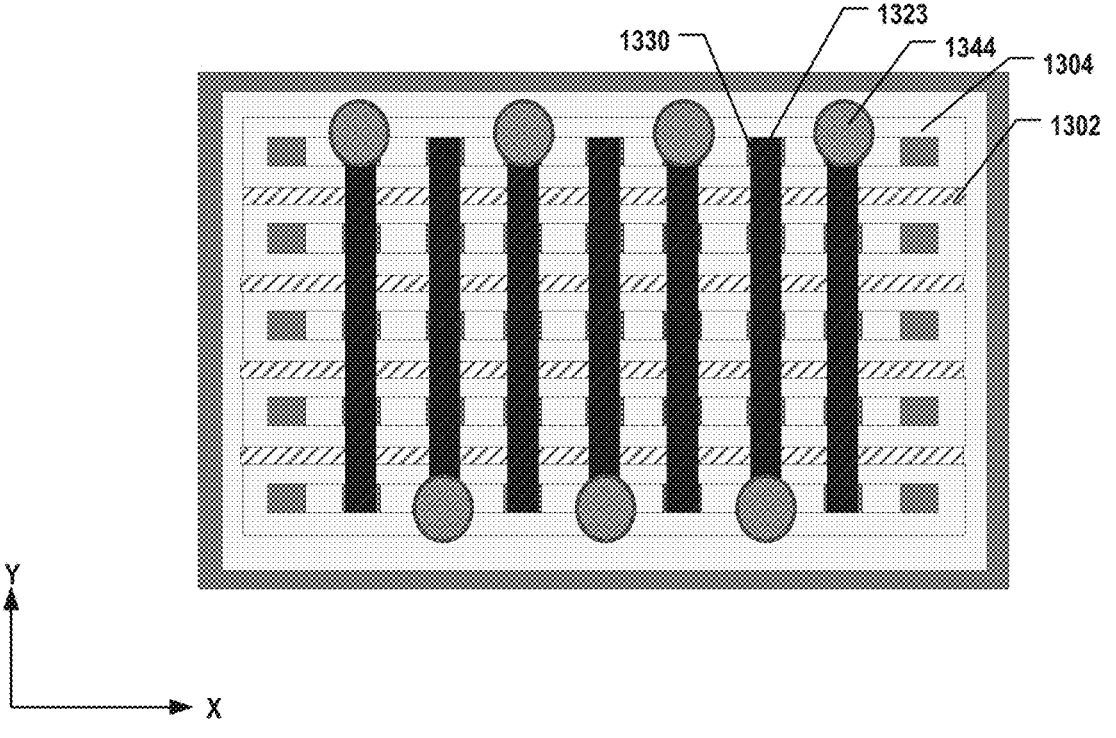
FIG. 14A

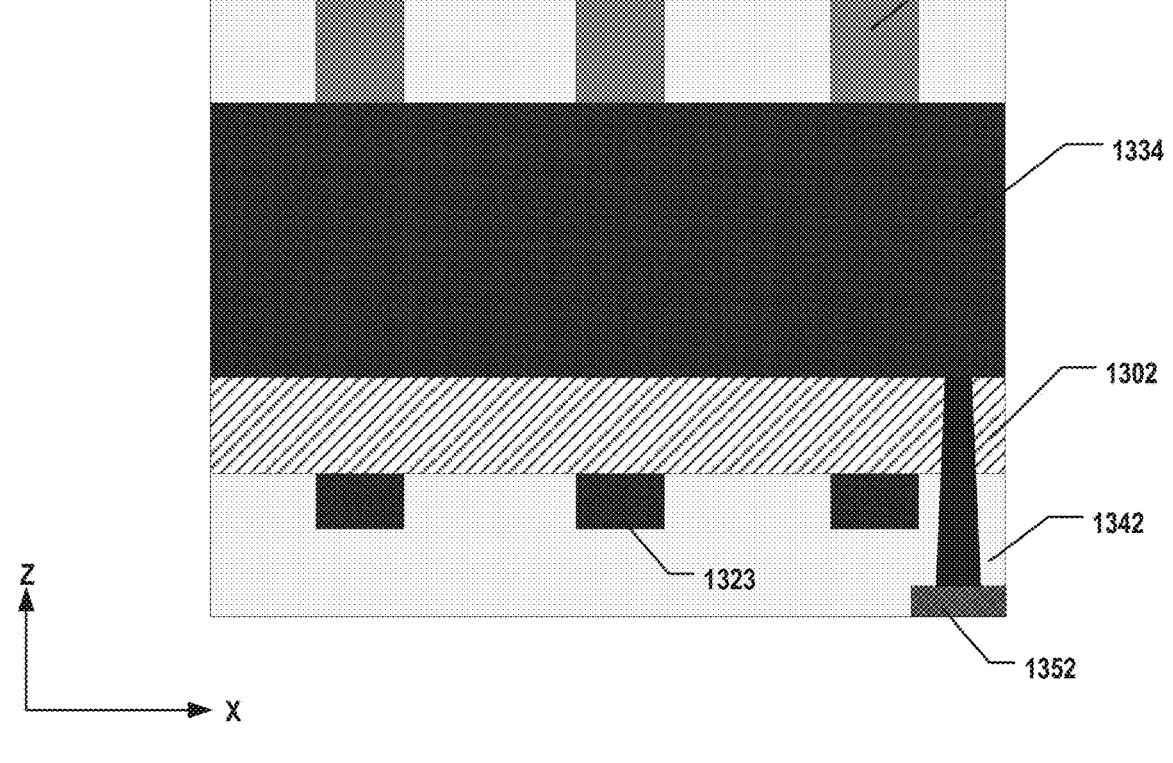
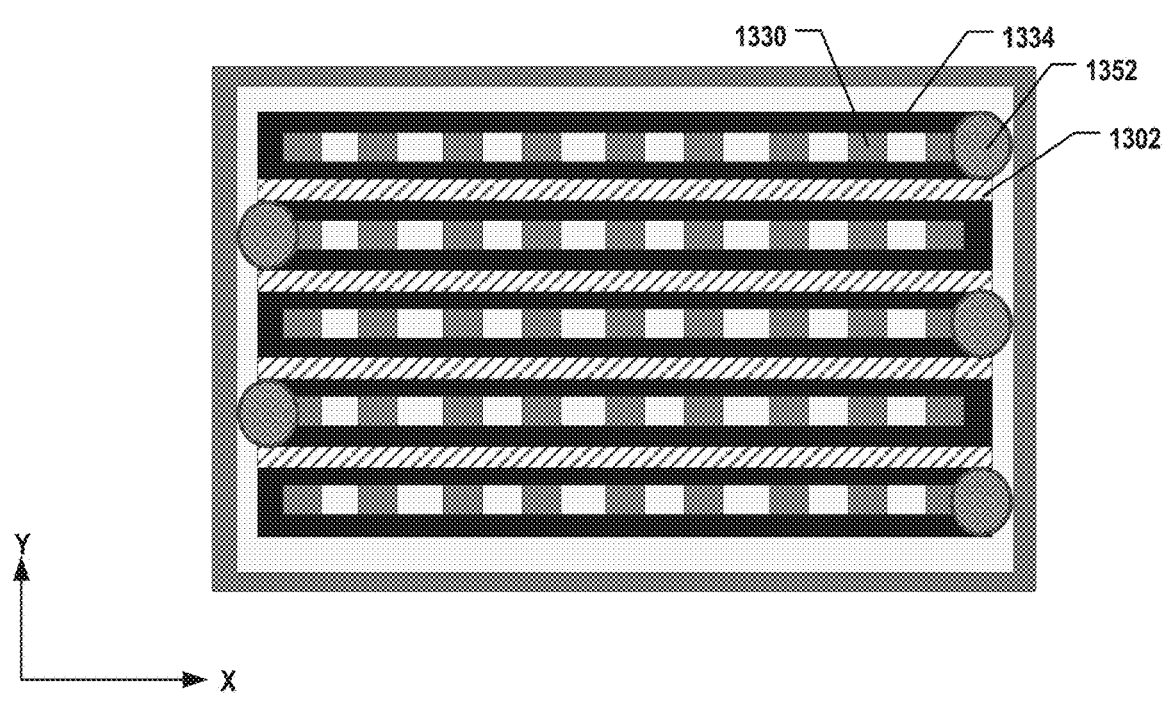
FIG. 14B

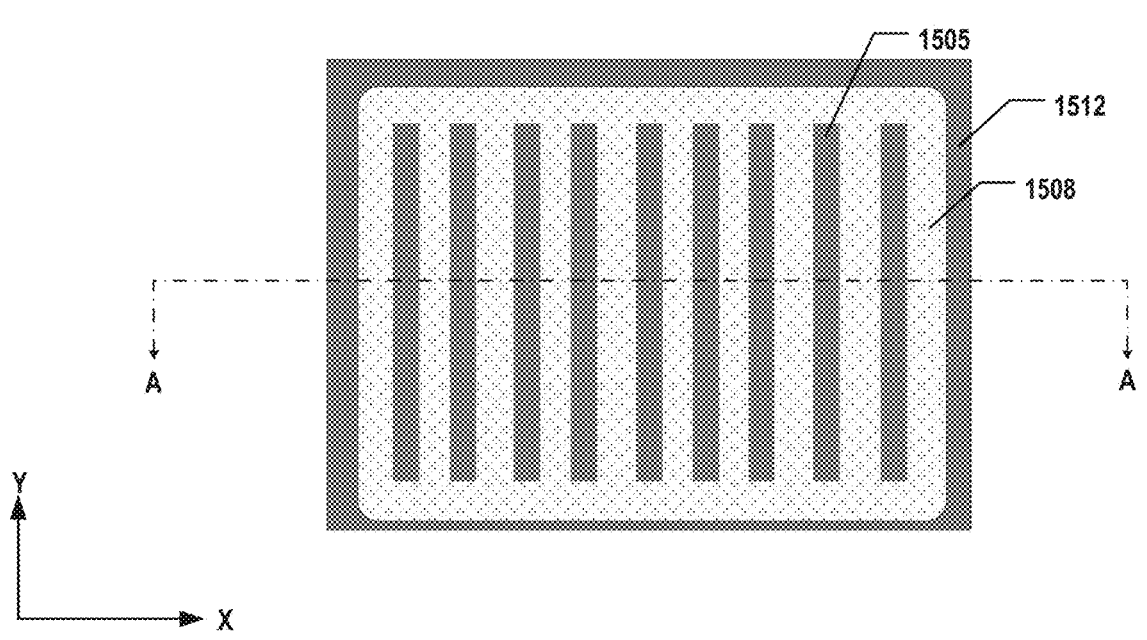
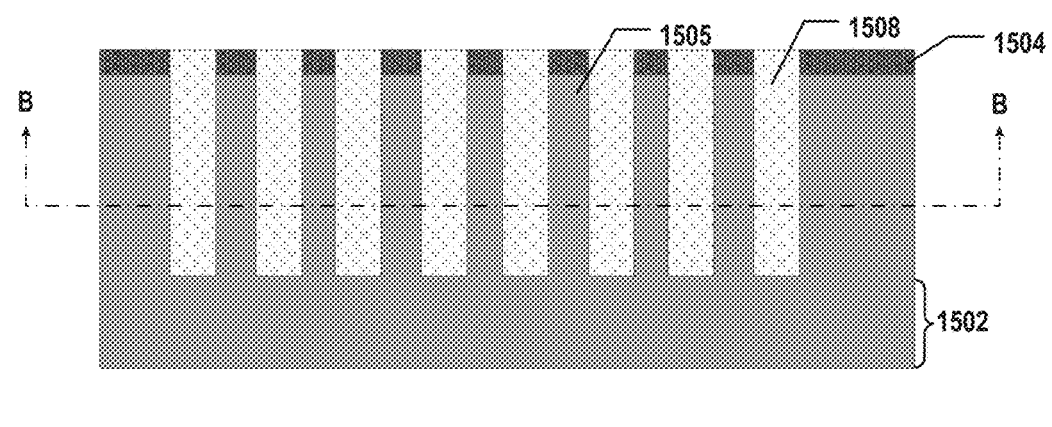
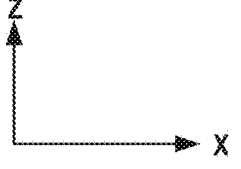
FIG. 15A

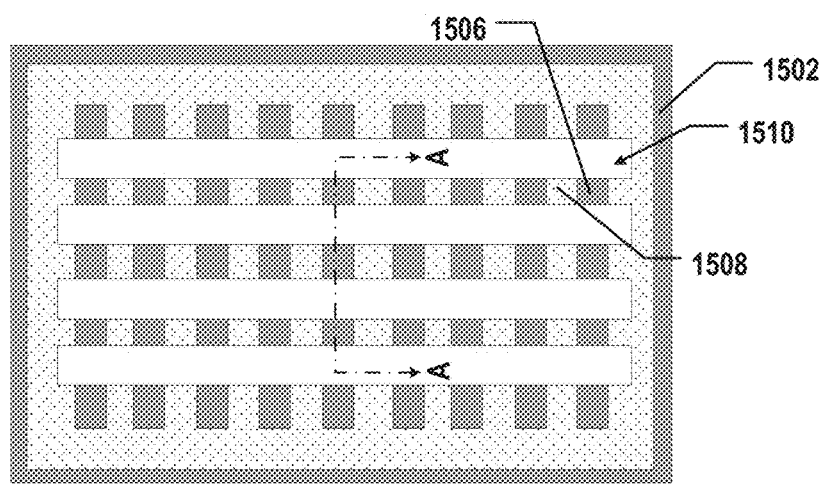
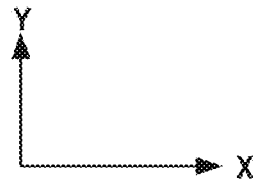
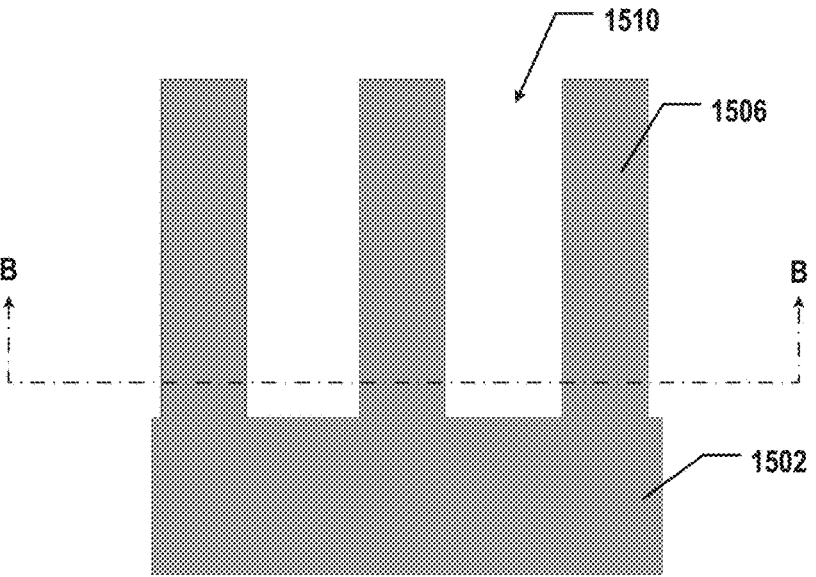
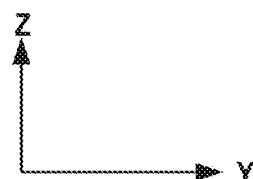
FIG. 15B

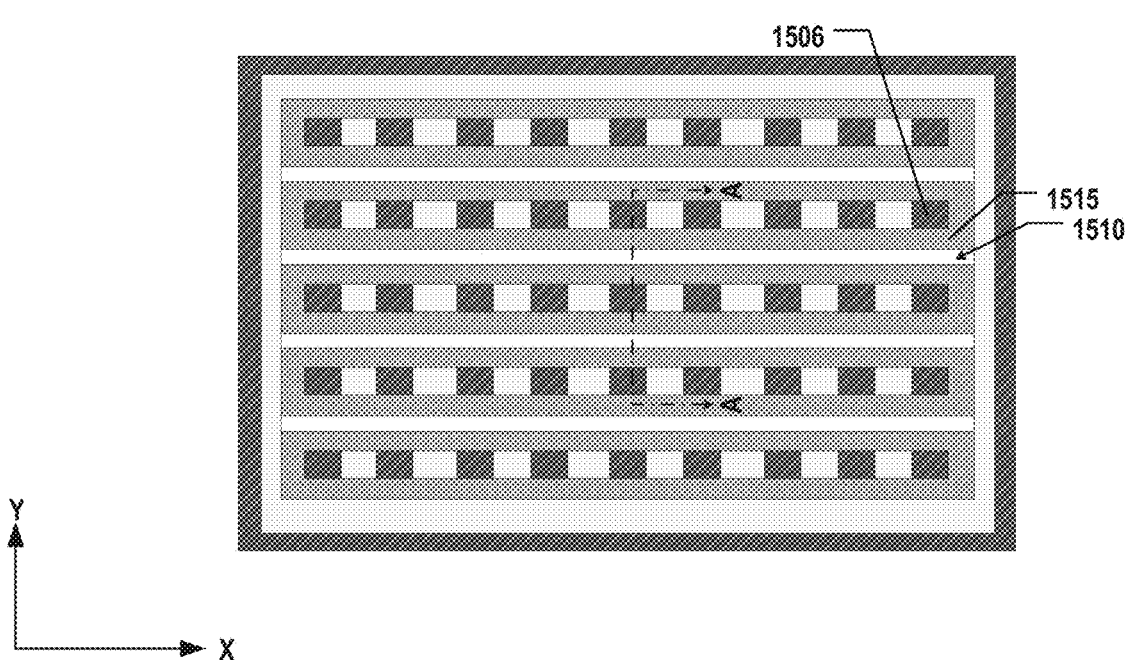
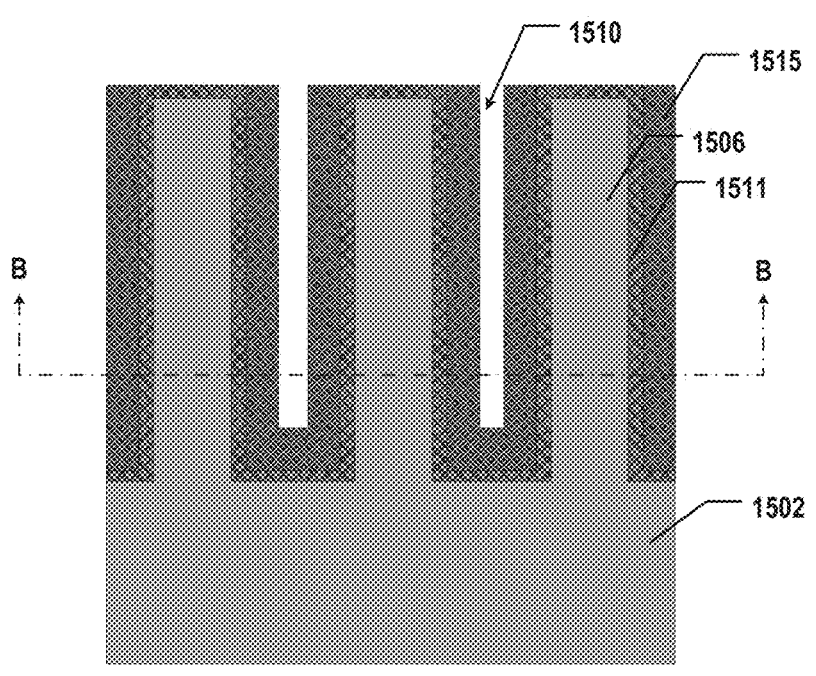
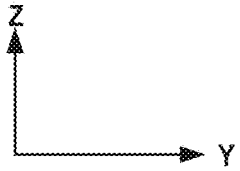
FIG. 15C

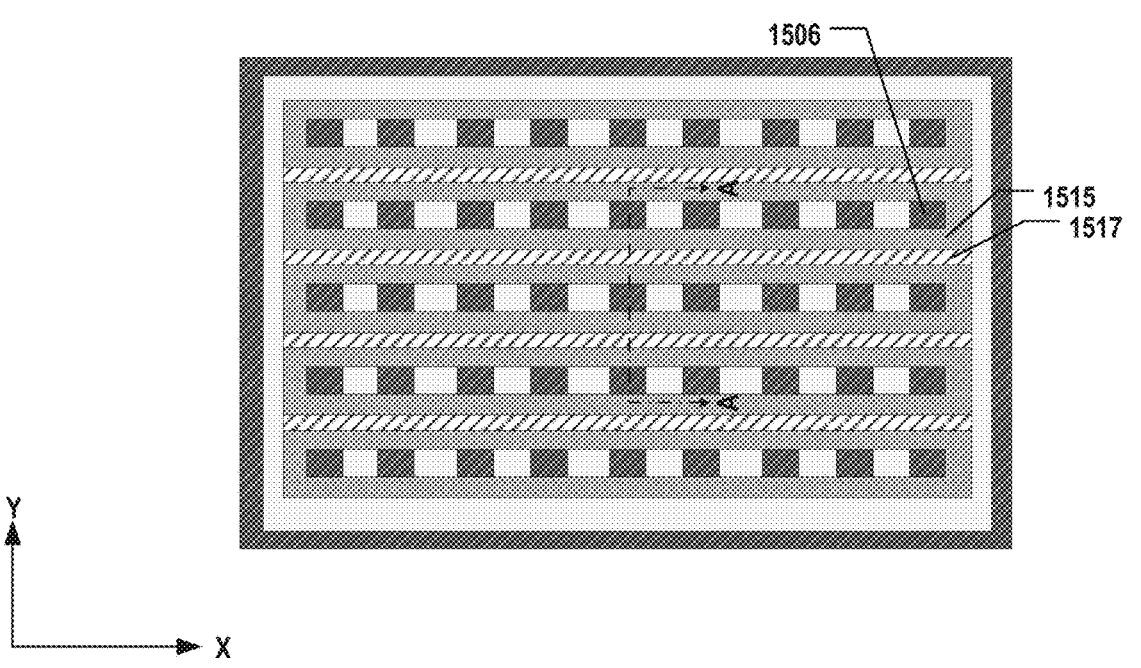
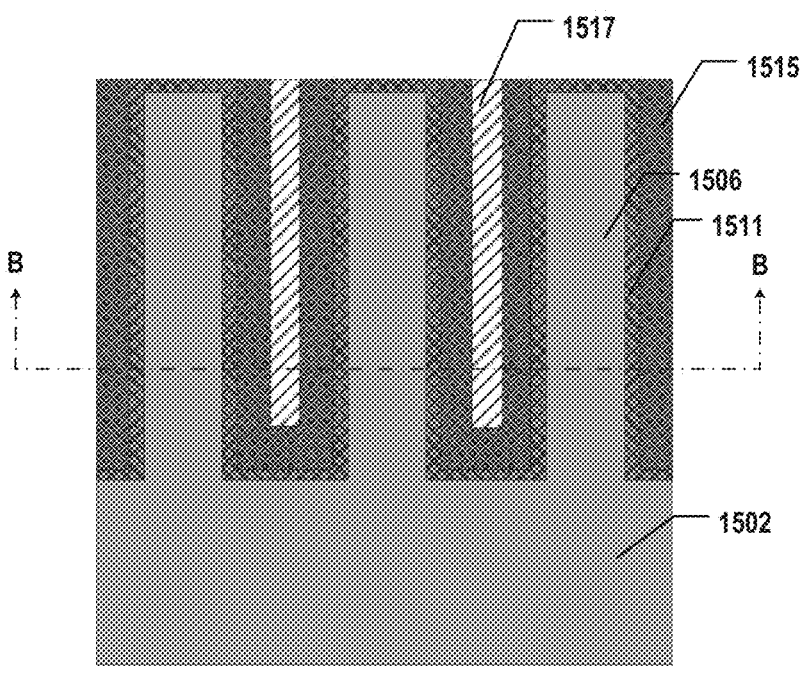
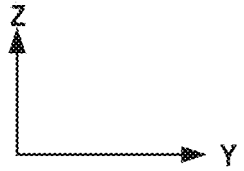
FIG. 15D

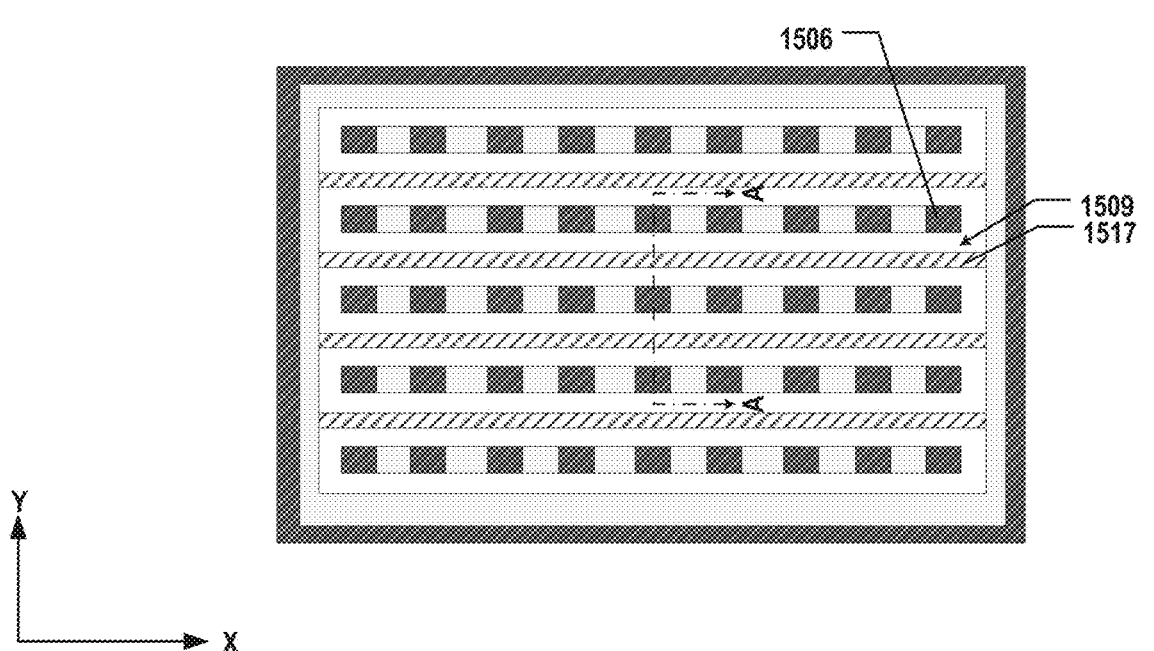
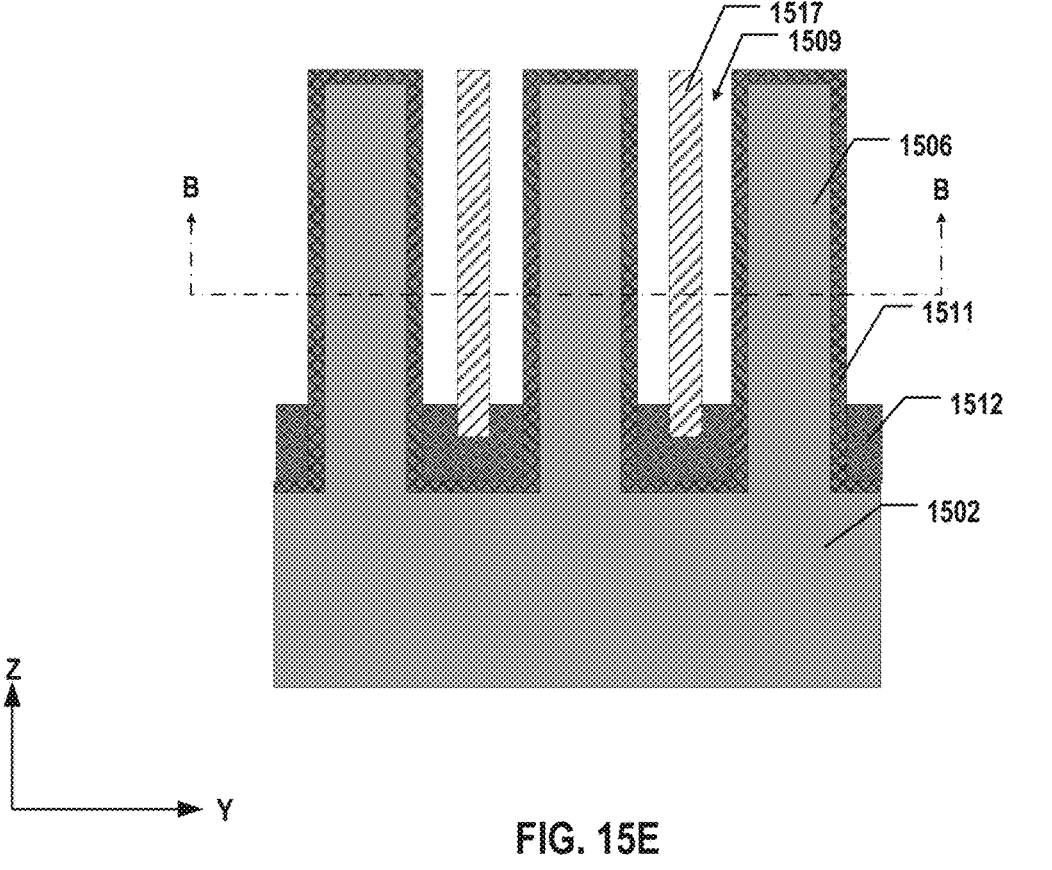
FIG. 15E

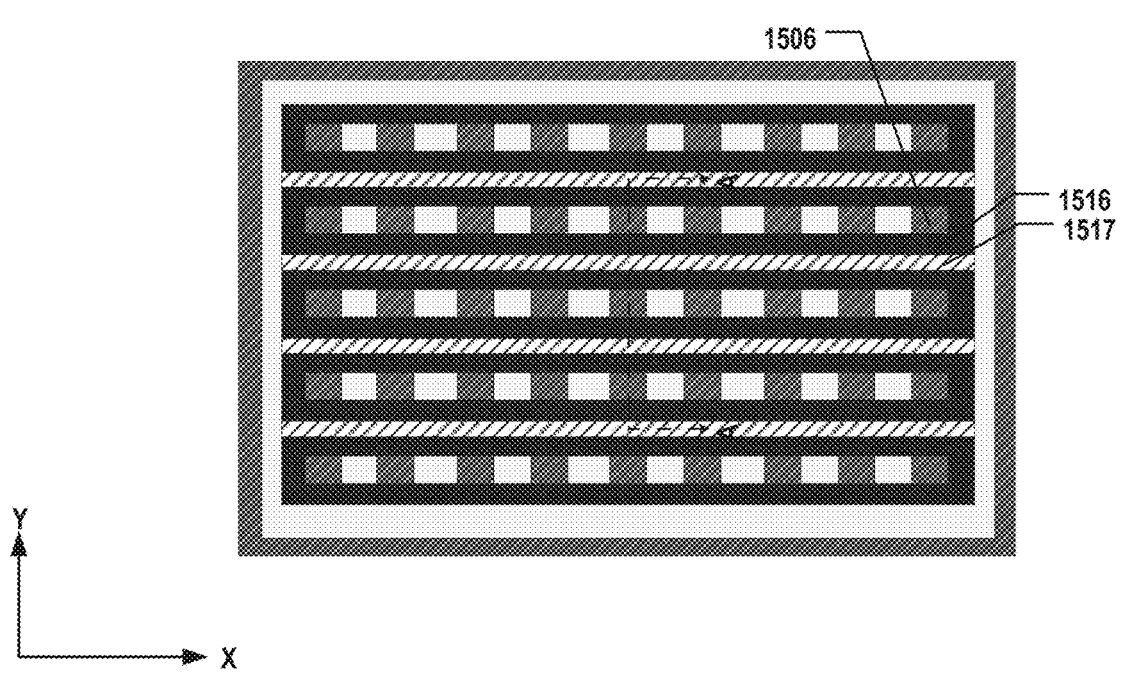
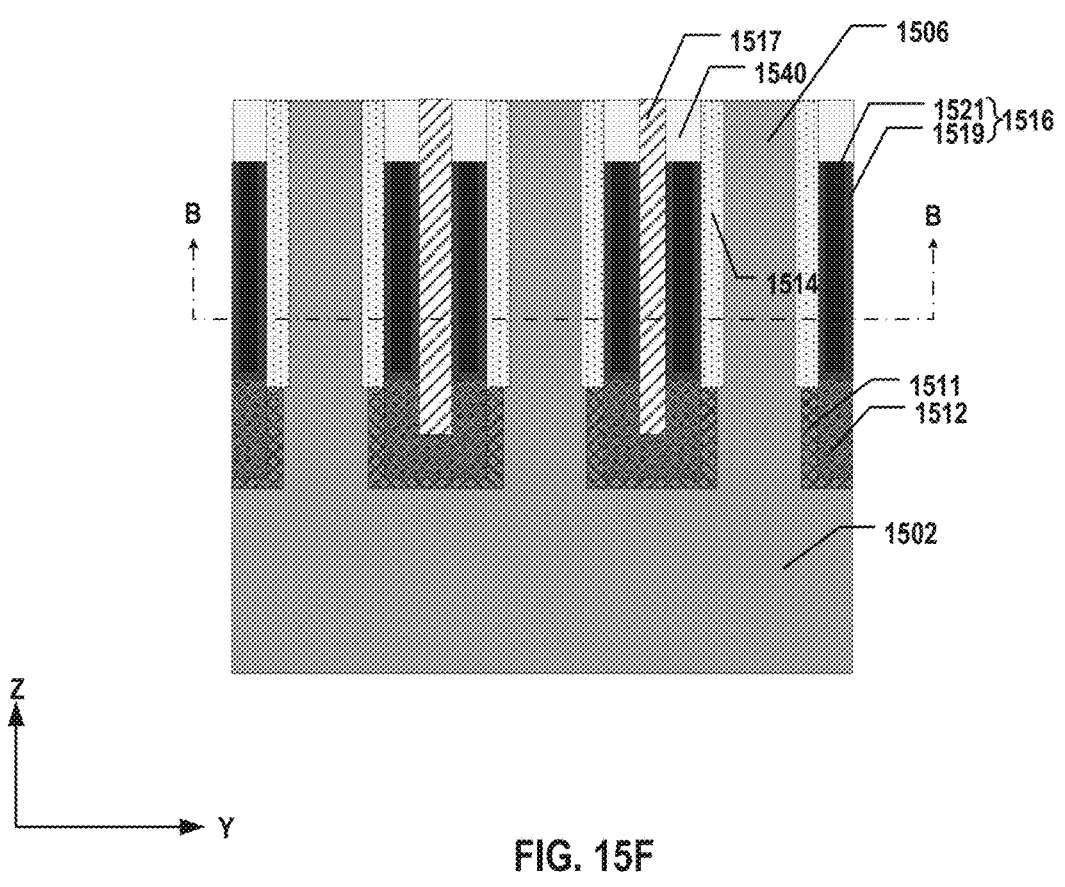
FIG. 15F

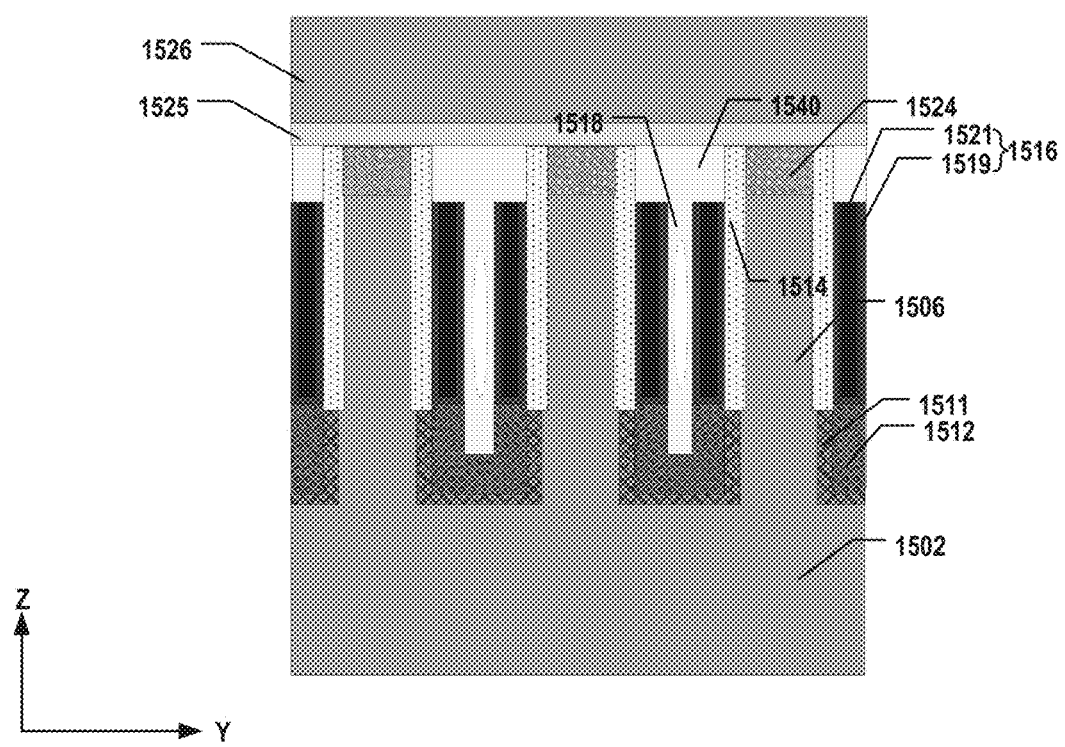
FIG. 15I
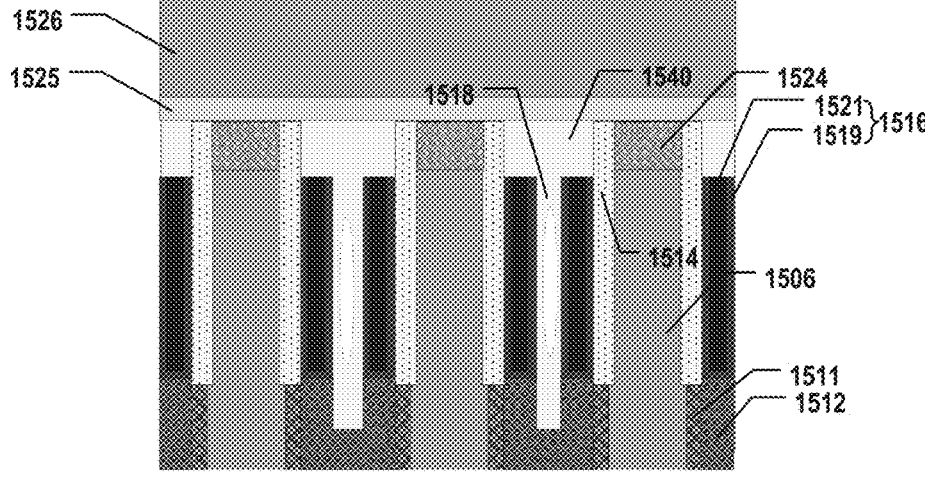
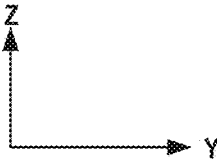
FIG. 15J

1600

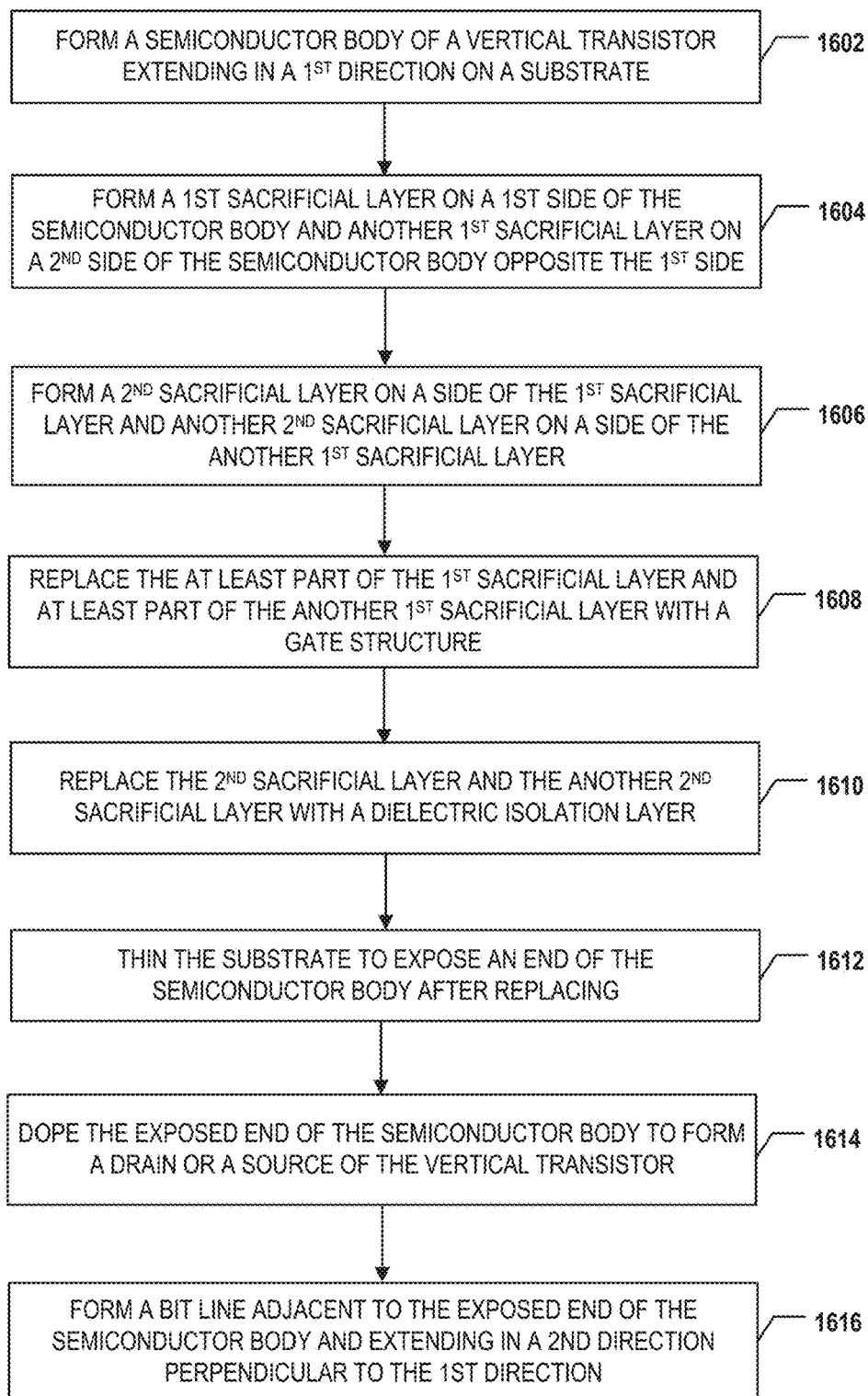

FORM A SEMICONDUCTOR BODY OF A VERTICAL TRANSISTOR EXTENDING IN A 1ST DIRECTION ON A SUBSTRATE — 1602

FORM A 1ST SACRIFICIAL LAYER ON A 1ST SIDE OF THE SEMICONDUCTOR BODY AND ANOTHER 1ST SACRIFICIAL LAYER ON A 2ND SIDE OF THE SEMICONDUCTOR BODY OPPOSITE THE 1ST SIDE — 1604

FORM A 2ND SACRIFICIAL LAYER ON A SIDE OF THE 1ST SACRIFICIAL LAYER AND ANOTHER 2ND SACRIFICIAL LAYER ON A SIDE OF THE ANOTHER 1ST SACRIFICIAL LAYER — 1606

REPLACE THE AT LEAST PART OF THE 1ST SACRIFICIAL LAYER AND AT LEAST PART OF THE ANOTHER 1ST SACRIFICIAL LAYER WITH A GATE STRUCTURE — 1608

REPLACE THE 2ND SACRIFICIAL LAYER AND THE ANOTHER 2ND SACRIFICIAL LAYER WITH A DIELECTRIC ISOLATION LAYER — 1610

THIN THE SUBSTRATE TO EXPOSE AN END OF THE SEMICONDUCTOR BODY AFTER REPLACING — 1612

DOPE THE EXPOSED END OF THE SEMICONDUCTOR BODY TO FORM A DRAIN OR A SOURCE OF THE VERTICAL TRANSISTOR — 1614

FORM A BIT LINE ADJACENT TO THE EXPOSED END OF THE SEMICONDUCTOR BODY AND EXTENDING IN A 2ND DIRECTION PERPENDICULAR TO THE 1ST DIRECTION — 1616

FIG. 16

1700
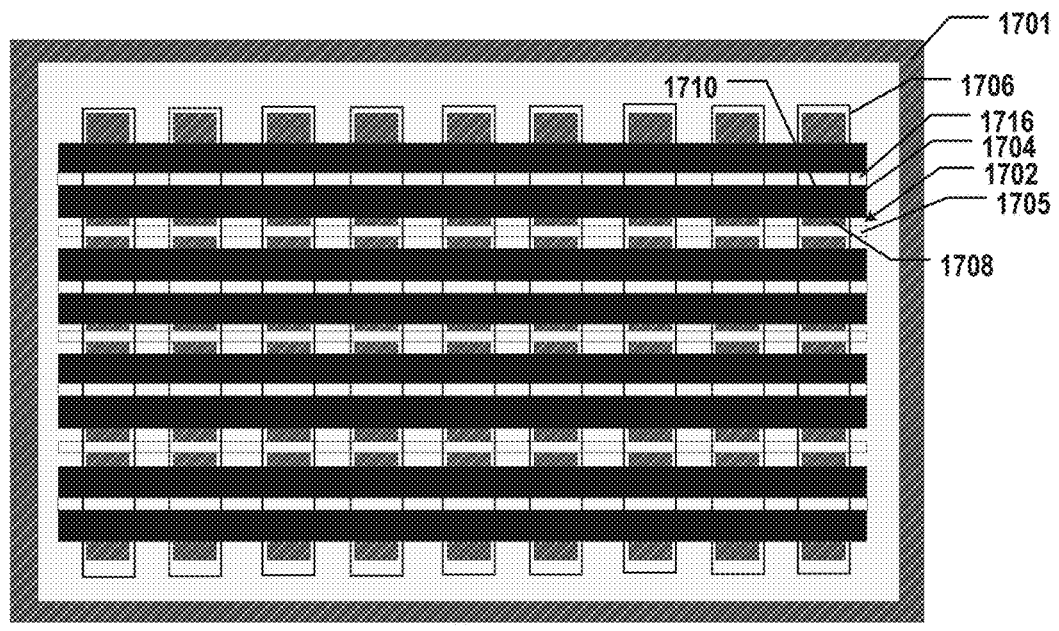
1701
1706
1710
1716
1704
1702
1705
1708
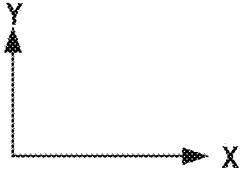
FIG. 17A

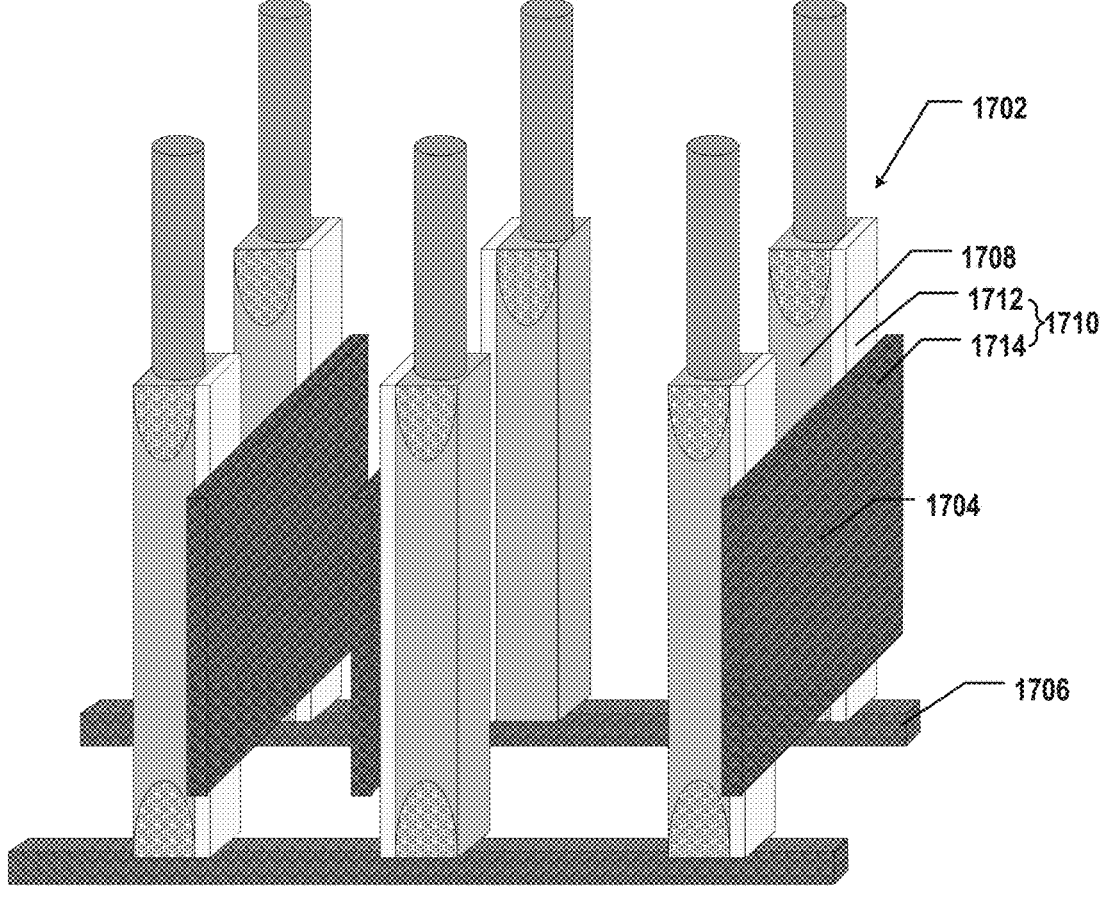
1702
1708
1712
1714 }1710
1704
1706
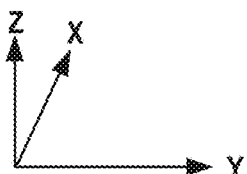
FIG. 17B

1800

1801

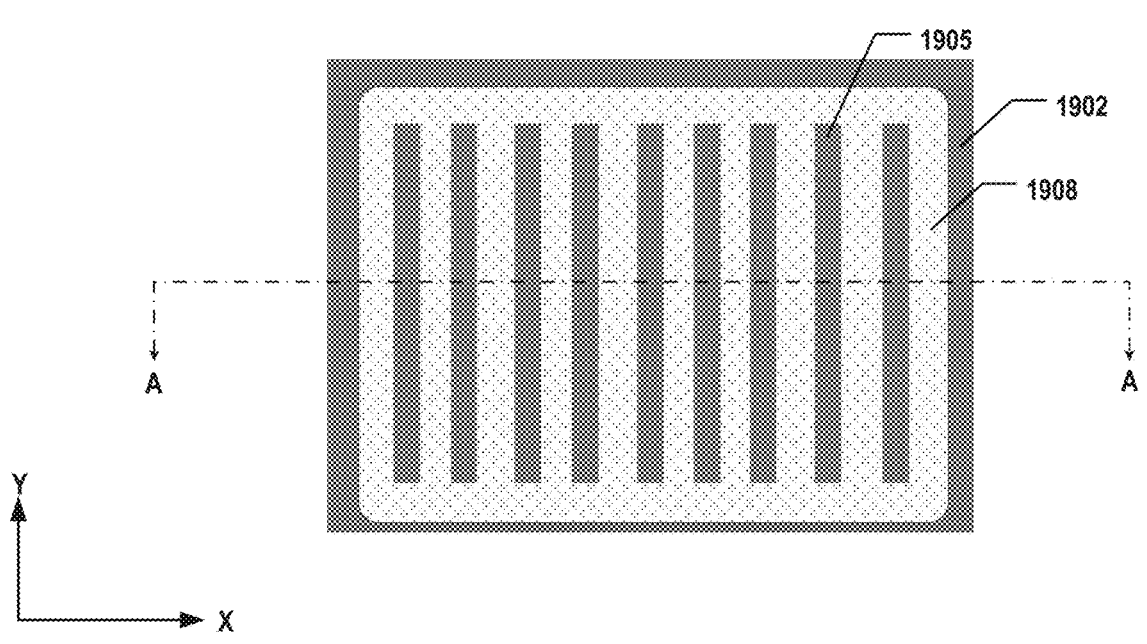
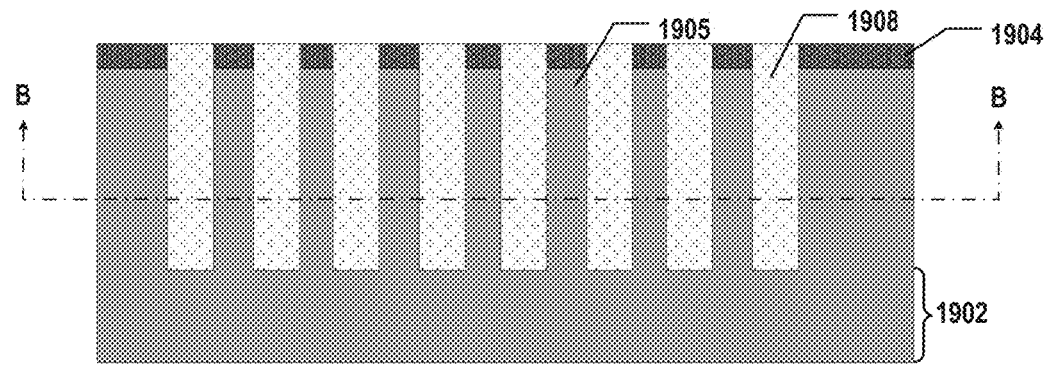
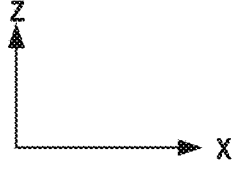
FIG. 19A

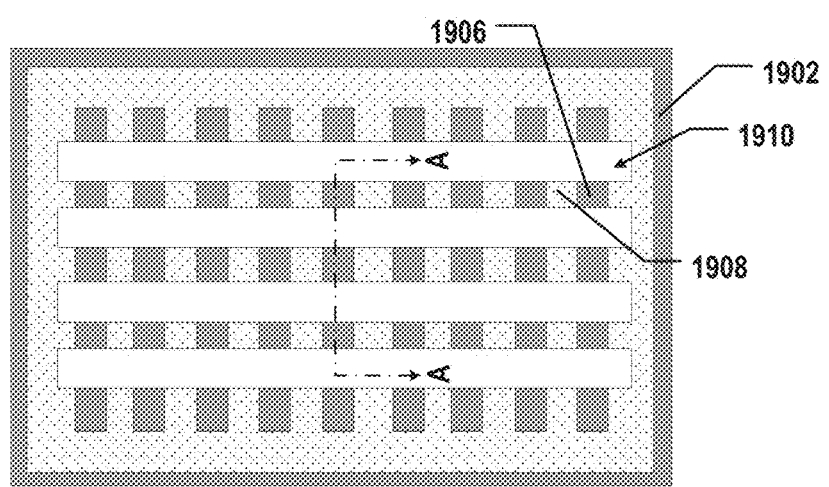
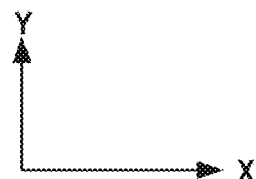
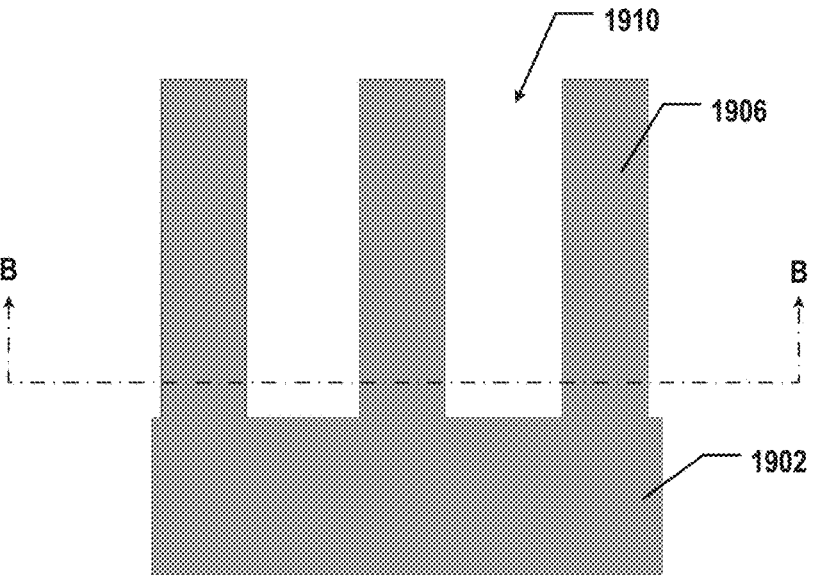
FIG. 19B

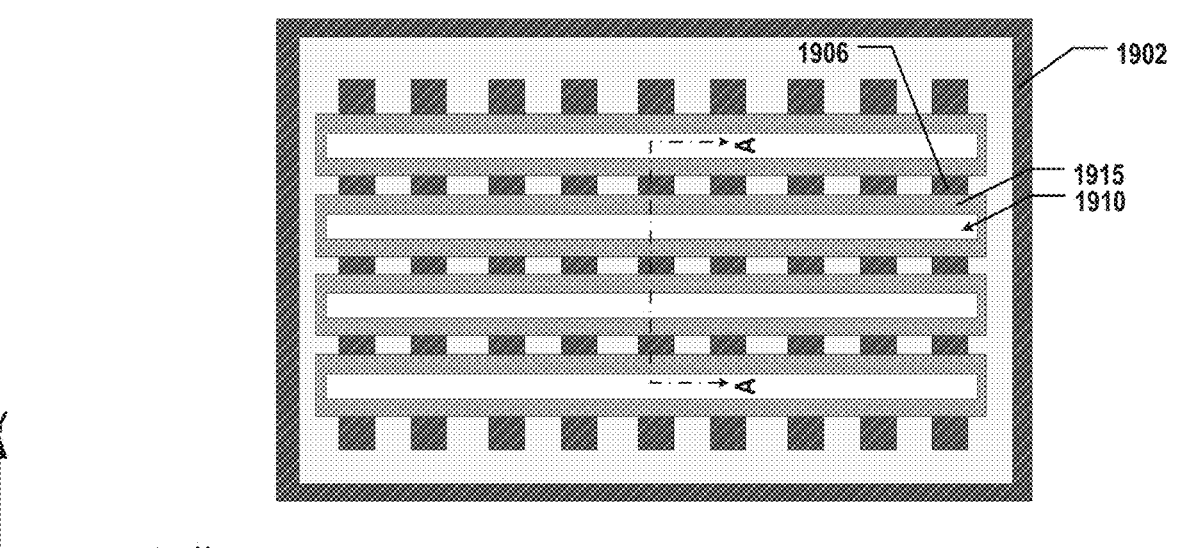
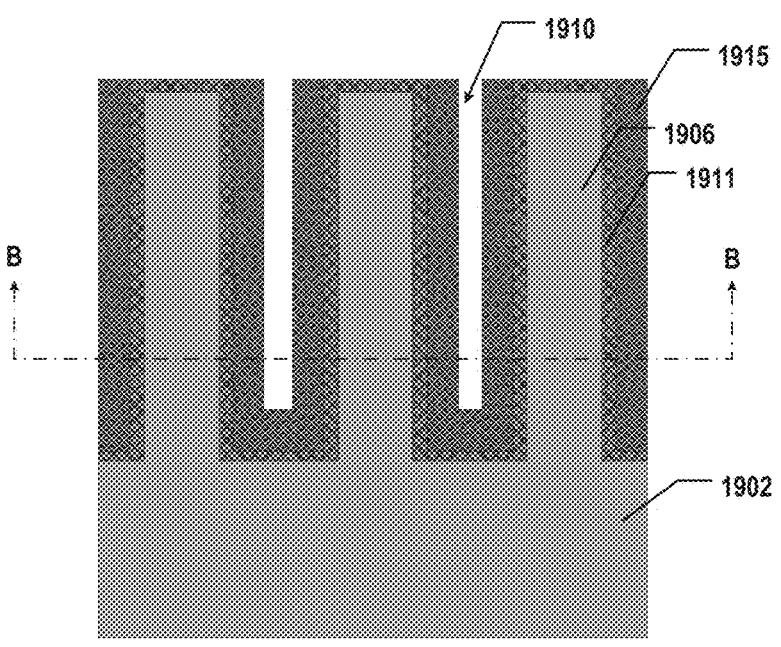
FIG. 19C

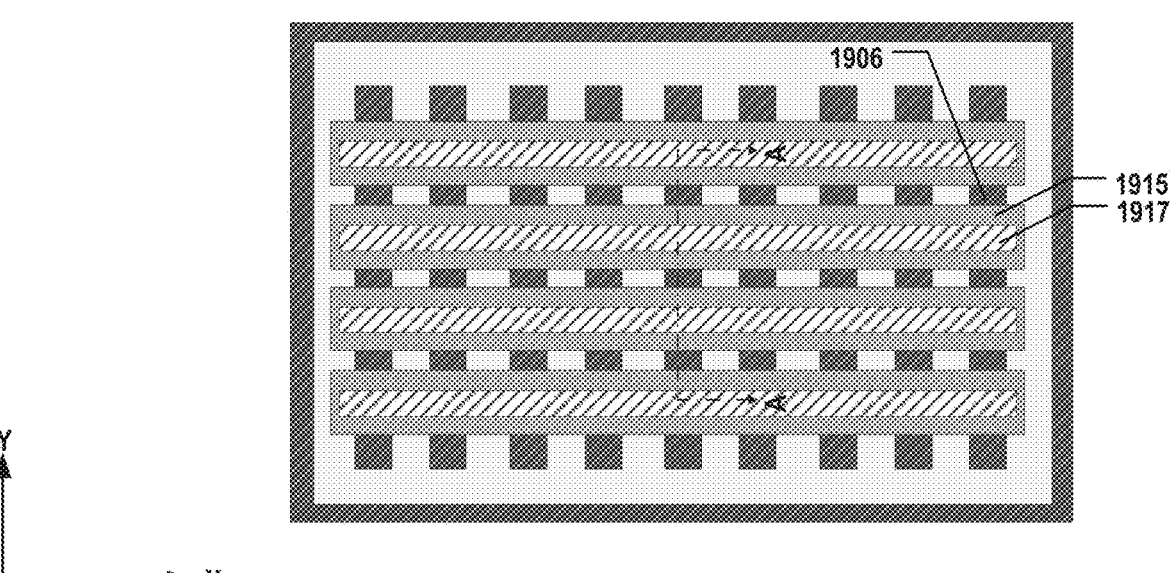
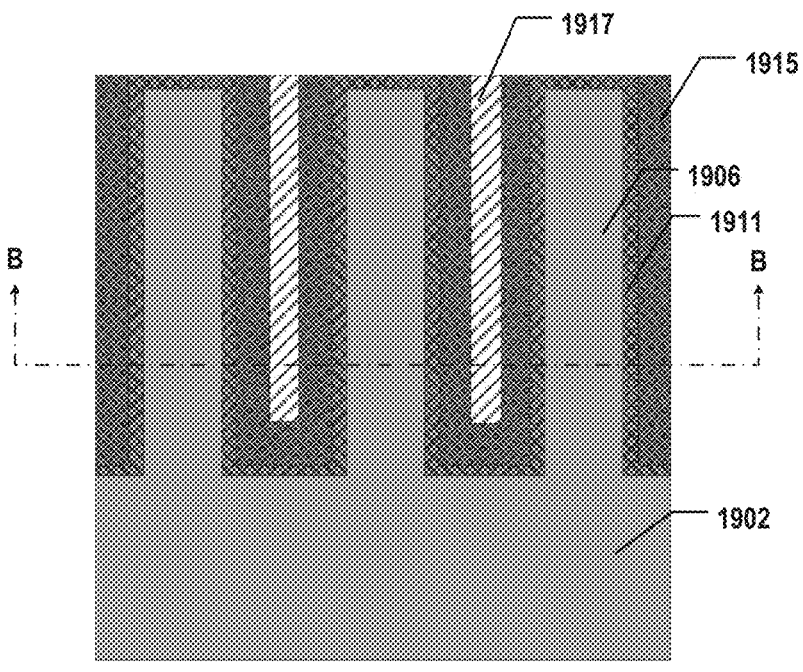
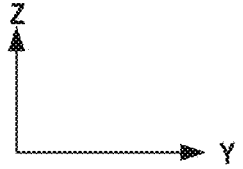
FIG. 19D

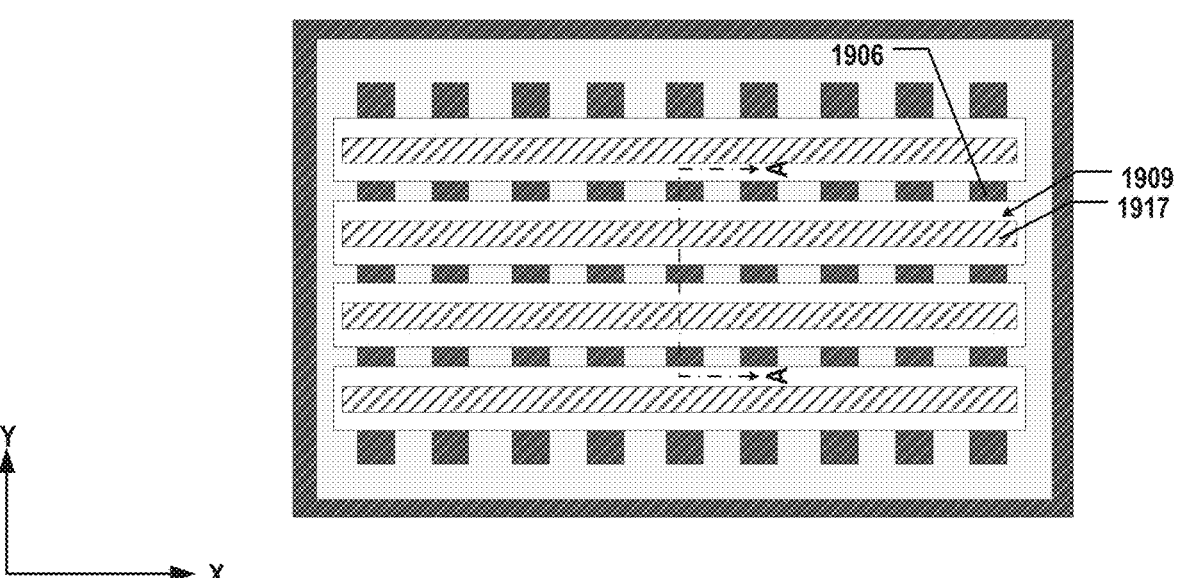
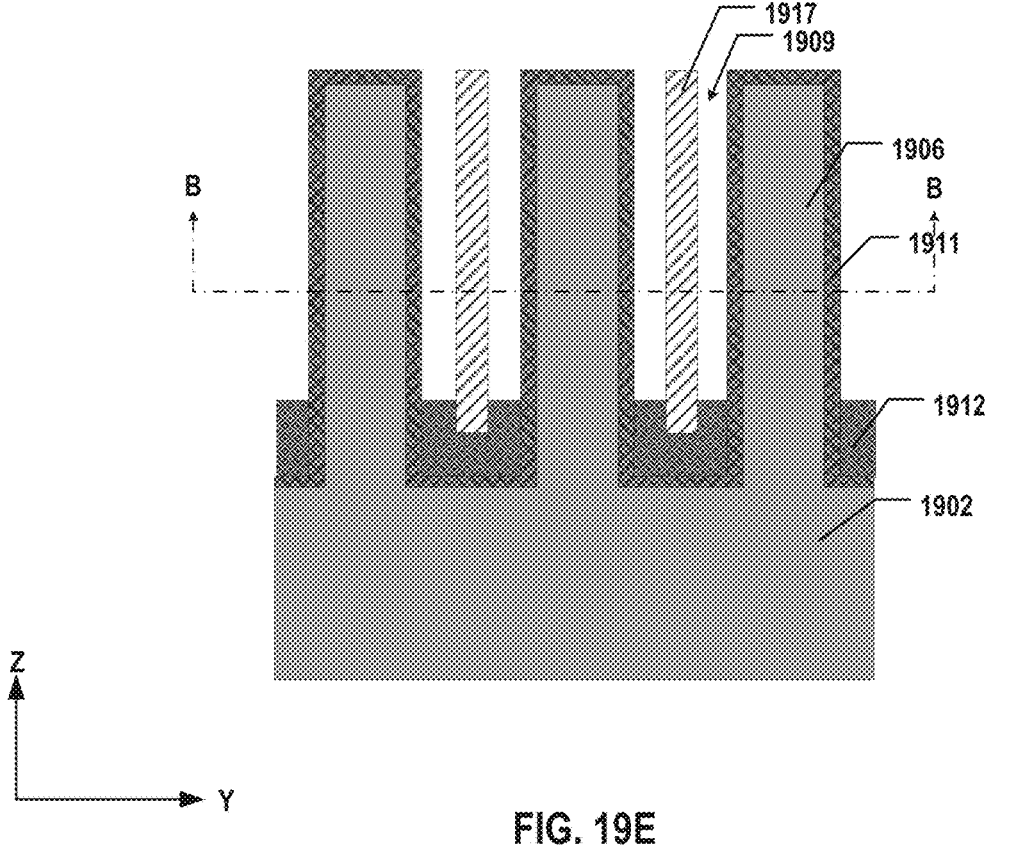
FIG. 19E

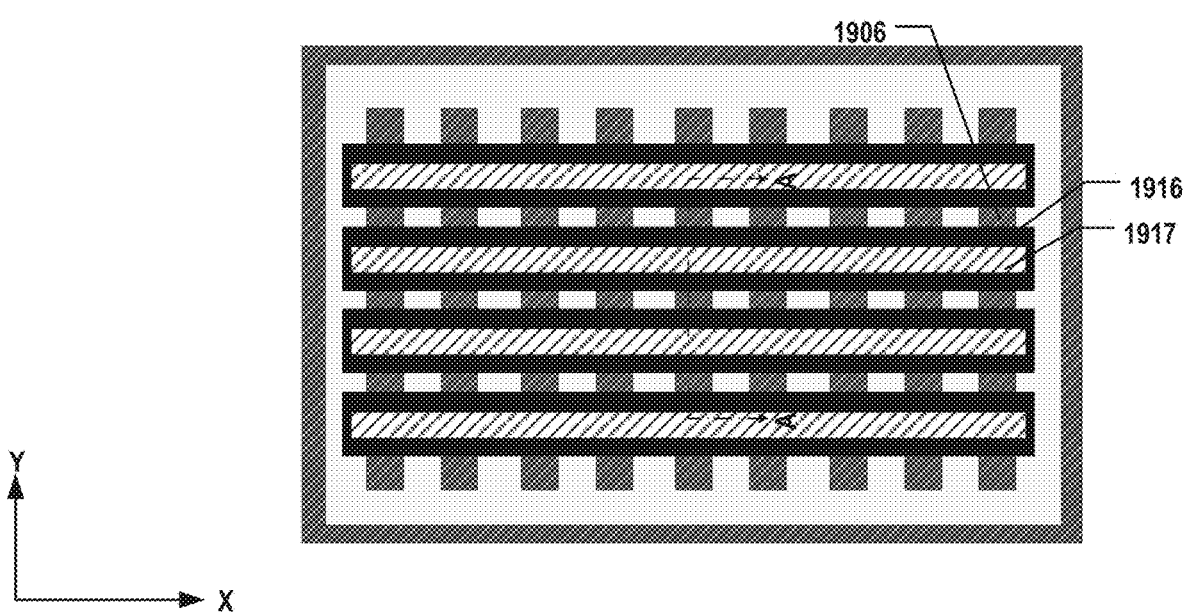
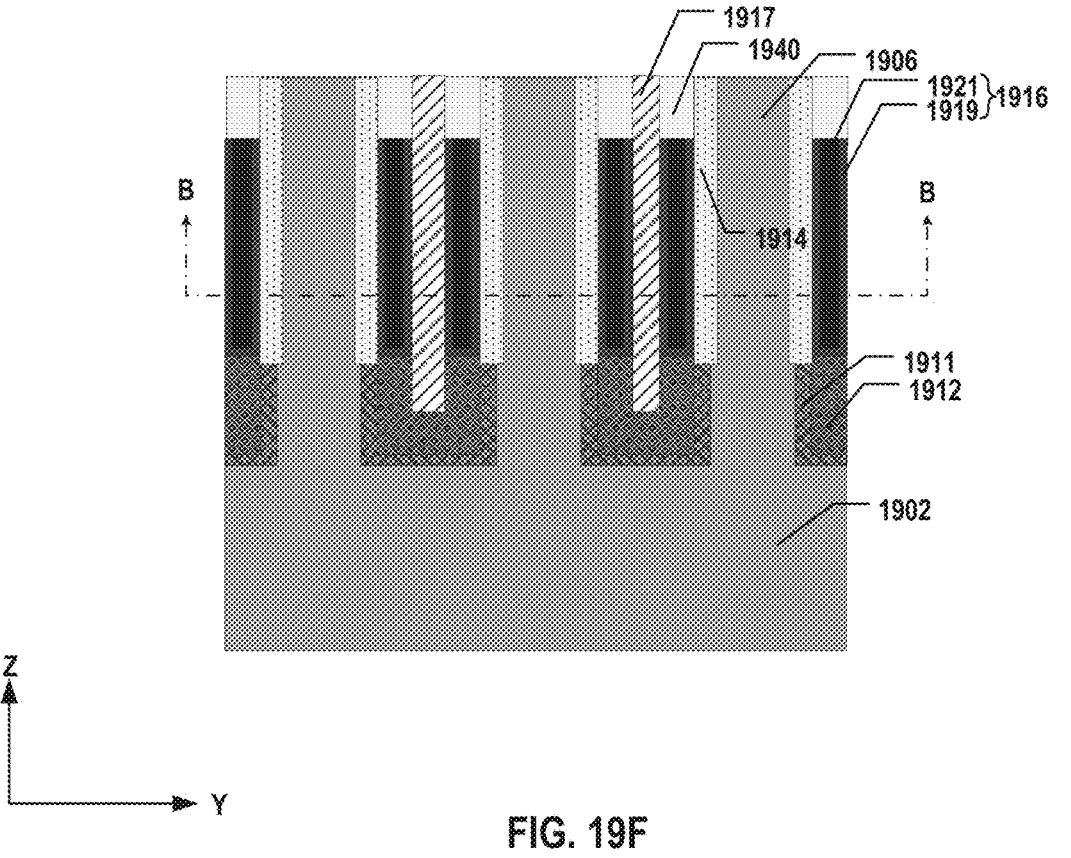
FIG. 19F

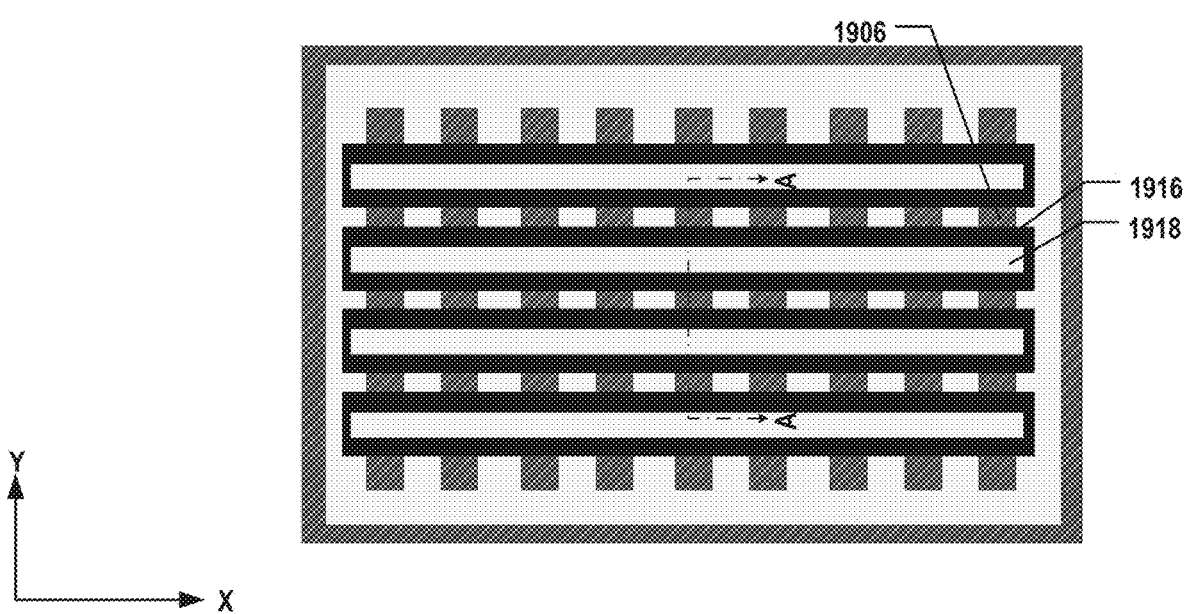
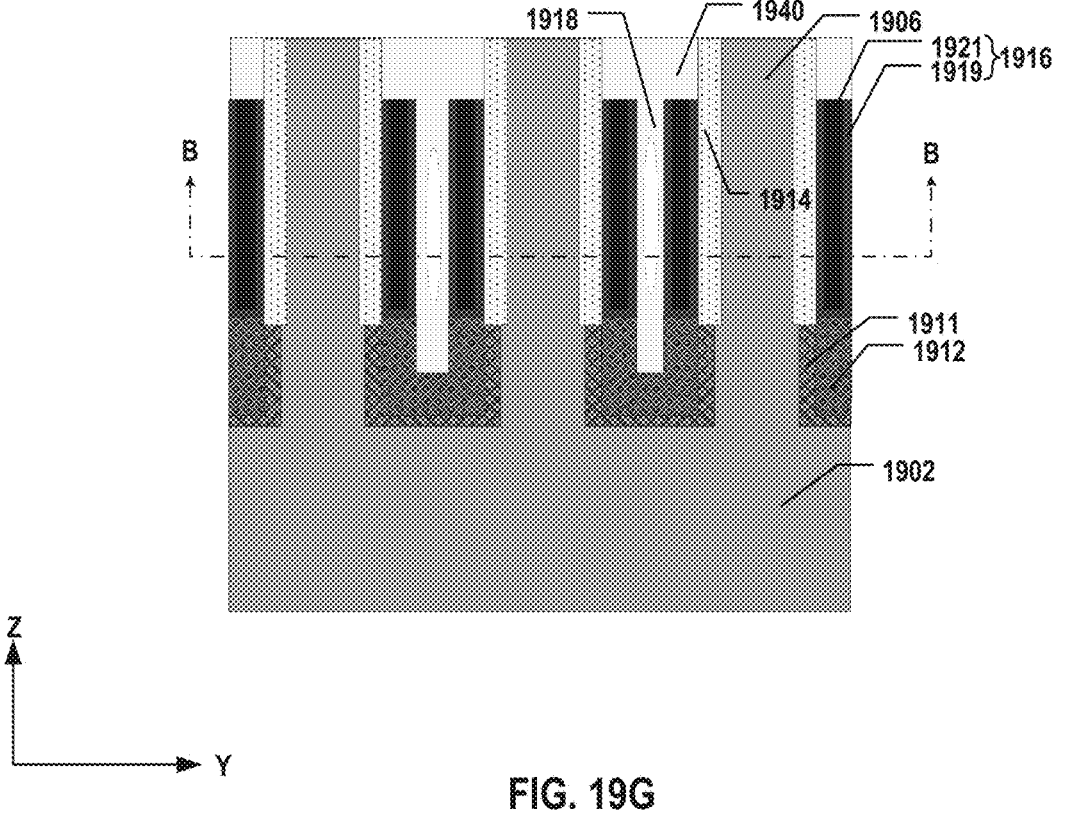
FIG. 19G

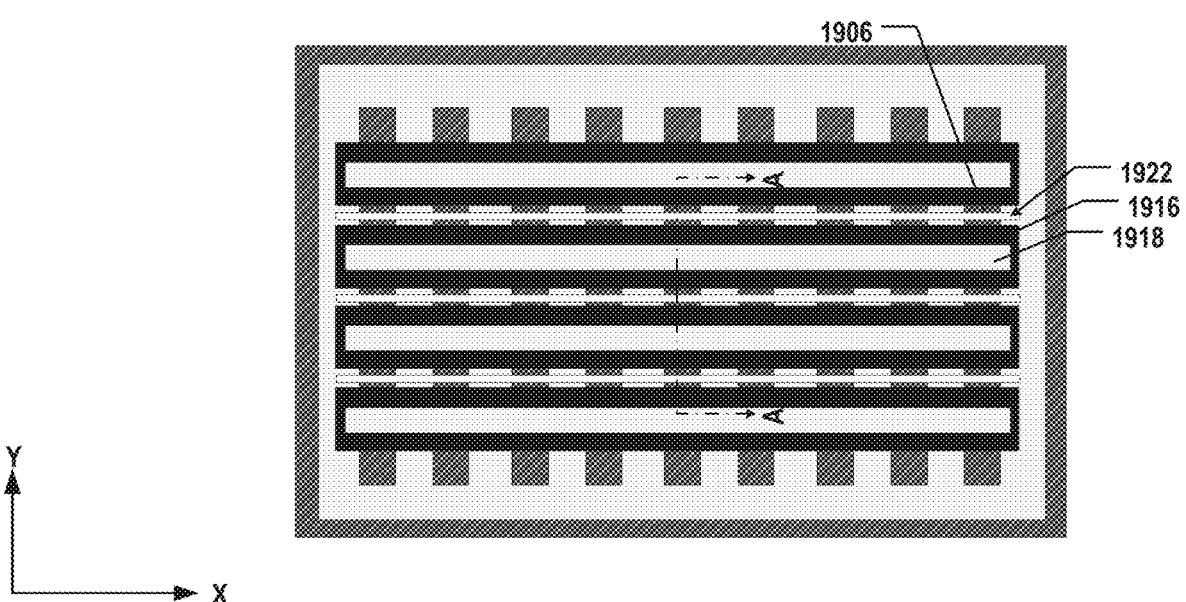
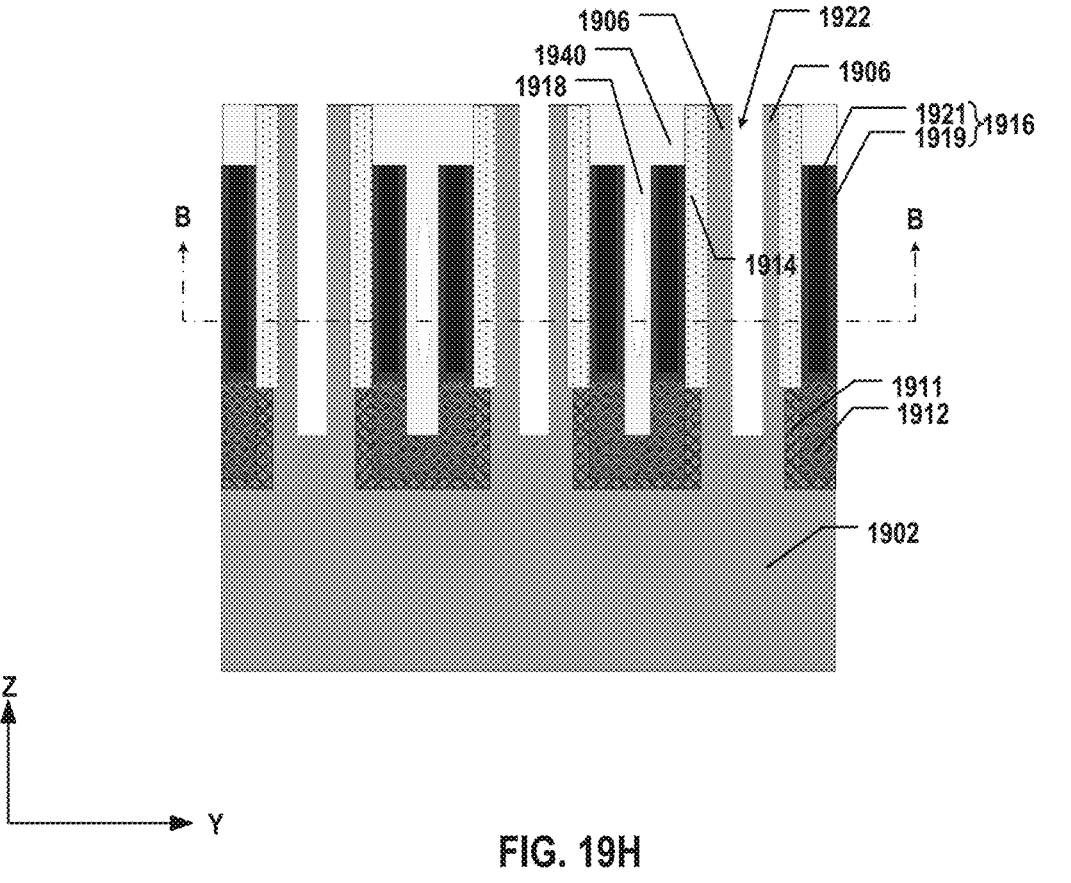
FIG. 19H

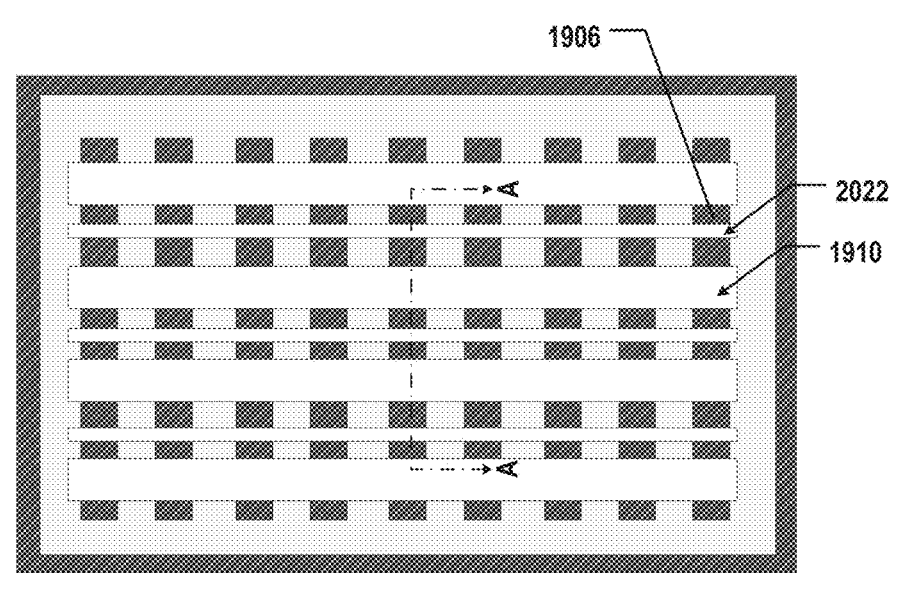
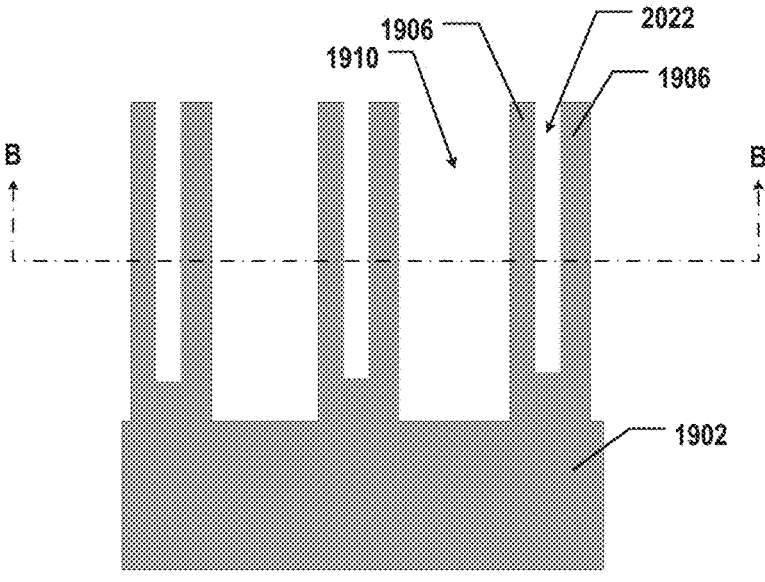
FIG. 20A

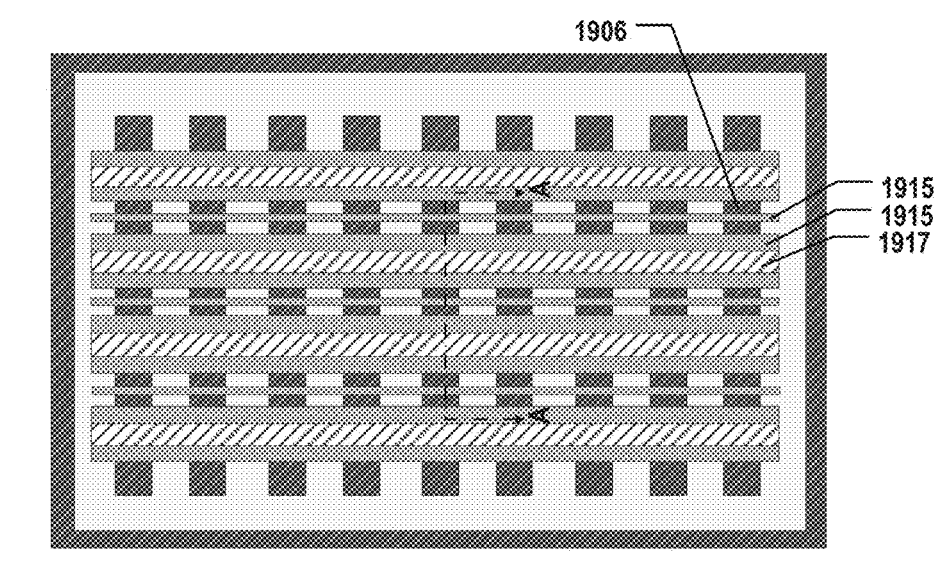
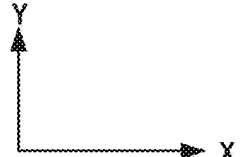
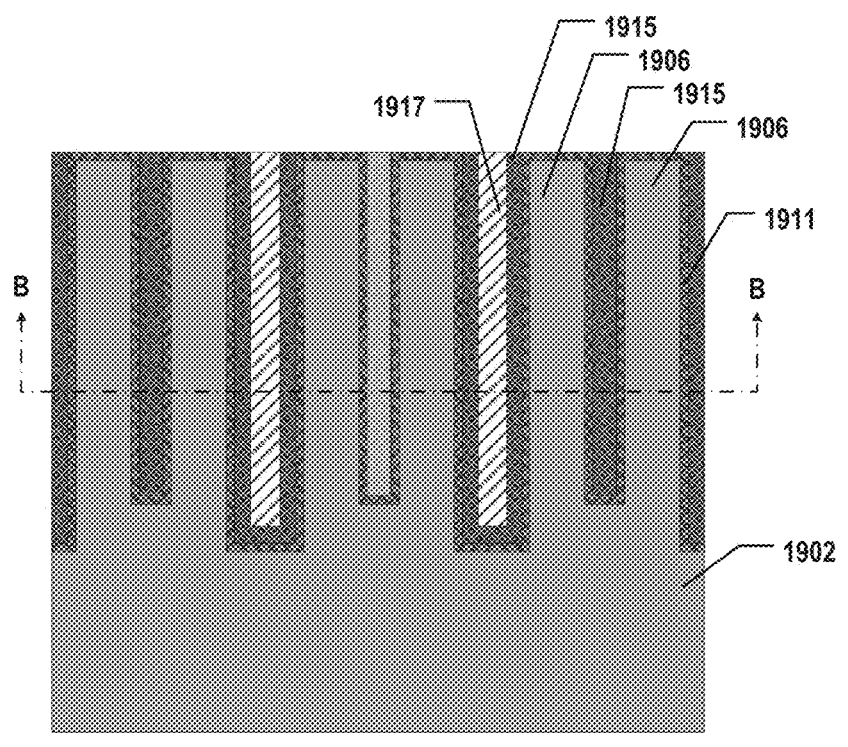
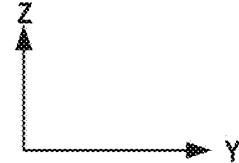
FIG. 20B

2100

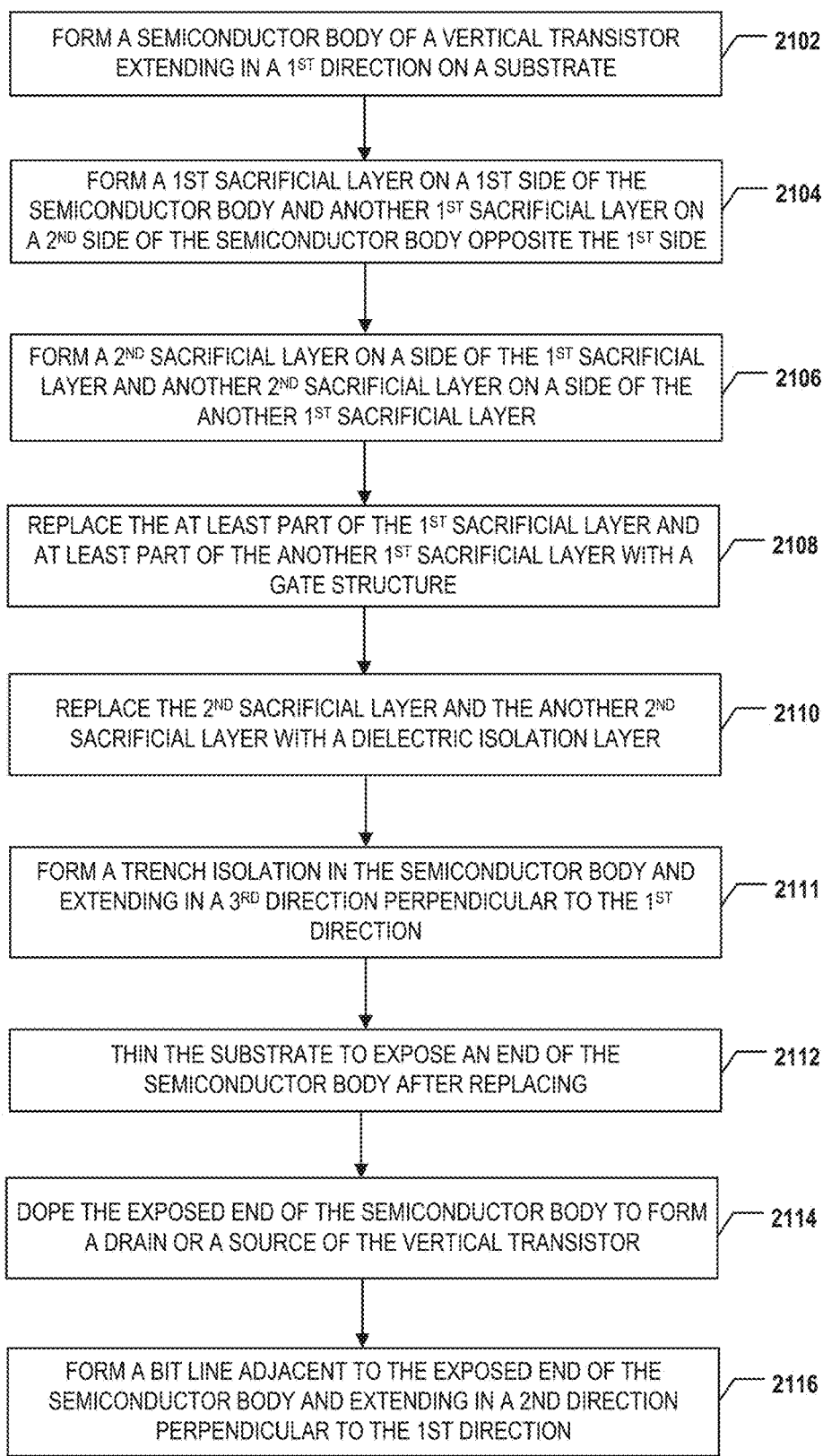

FORM A SEMICONDUCTOR BODY OF A VERTICAL TRANSISTOR EXTENDING IN A 1ST DIRECTION ON A SUBSTRATE — 2102

FORM A 1ST SACRIFICIAL LAYER ON A 1ST SIDE OF THE SEMICONDUCTOR BODY AND ANOTHER 1ST SACRIFICIAL LAYER ON A 2ND SIDE OF THE SEMICONDUCTOR BODY OPPOSITE THE 1ST SIDE — 2104

FORM A 2ND SACRIFICIAL LAYER ON A SIDE OF THE 1ST SACRIFICIAL LAYER AND ANOTHER 2ND SACRIFICIAL LAYER ON A SIDE OF THE ANOTHER 1ST SACRIFICIAL LAYER — 2106

REPLACE THE AT LEAST PART OF THE 1ST SACRIFICIAL LAYER AND AT LEAST PART OF THE ANOTHER 1ST SACRIFICIAL LAYER WITH A GATE STRUCTURE — 2108

REPLACE THE 2ND SACRIFICIAL LAYER AND THE ANOTHER 2ND SACRIFICIAL LAYER WITH A DIELECTRIC ISOLATION LAYER — 2110

FORM A TRENCH ISOLATION IN THE SEMICONDUCTOR BODY AND EXTENDING IN A 3RD DIRECTION PERPENDICULAR TO THE 1ST DIRECTION — 2111

THIN THE SUBSTRATE TO EXPOSE AN END OF THE SEMICONDUCTOR BODY AFTER REPLACING — 2112

DOPE THE EXPOSED END OF THE SEMICONDUCTOR BODY TO FORM A DRAIN OR A SOURCE OF THE VERTICAL TRANSISTOR — 2114

FORM A BIT LINE ADJACENT TO THE EXPOSED END OF THE SEMICONDUCTOR BODY AND EXTENDING IN A 2ND DIRECTION PERPENDICULAR TO THE 1ST DIRECTION — 2116

FIG. 21

VERTICAL TRANSISTORS AND METHODS FOR FORMING THE SAME

CROSS-REFERENCE TO RELATED APPLICATIONS

This application is a continuation of Internal Application No. PCT/CN2022/132577, filed Nov. 17, 2022, entitled "VERTICAL TRANSISTORS AND METHODS FOR FORMING THE SAME," which is incorporated herein by reference in its entirety.

BACKGROUND

The present disclosure relates to semiconductor devices and fabrication methods thereof.

A transistor is a miniature semiconductor that regulates or controls current or voltage flow in addition to amplifying and generating these electrical signals and acting as a switch/gate for them. The transistor is one of the basic building blocks of modern electronics. Historically, transistors have been built to lie flat upon the surface of a semiconductor, with the electric current flowing laterally, or side-to-side, through them, thereby being known as "planar transistors."

SUMMARY

In one aspect, a semiconductor device includes a vertical transistor, a metal bit line, and a pad layer. The vertical transistor includes a semiconductor body extending in a first direction, and a gate structure coupled to at least one side of the semiconductor body. The gate structure includes a gate dielectric and a gate electrode. The metal bit line extends in a second direction perpendicular to the first direction and coupled to a terminal of the vertical transistor via an ohmic contact. The pad layer is positioned between the gate electrode and the metal bit line in the first direction. The gate dielectric and the pad layer have different dielectric materials.

In some implementations, the pad layer has at least one of silicon nitride or high dielectric constant (high-k) dielectric.

In some implementations, the pad layer includes a first pad layer in contact with the metal bit line, and a second pad layer in contact with the gate electrode. In some implementations, the first and second pad layers have different dielectric materials.

In some implementations, the semiconductor device further includes a liner layer positioned between the pad layer and the semiconductor body in the second direction. In some implementations, the gate dielectric and the liner layer have a same material.

In some implementations, the gate dielectric is positioned between the gate electrode and the semiconductor body in the second direction.

In some implementations, the gate electrode includes a gate conductor and a barrier layer surrounding the gate conductor.

In some implementations, the ohmic contact includes a metal silicide contact.

In some implementations, the semiconductor device further includes a dielectric layer opposing the vertical transistor with the metal bit line positioned between the dielectric layer and the vertical transistor in the first direction.

In another aspect, a semiconductor device includes an array of vertical transistors, a bit line, and a pad layer. Each of the vertical transistors includes a semiconductor body extending in a first direction, and a gate structure coupled to at least one side of the semiconductor body. The gate structure includes a gate dielectric and a gate electrode. The bit line extends in a second direction perpendicular to the first direction and coupled to a column of the vertical transistors in the second direction. The pad layer extends in a third direction perpendicular to the first direction and the second direction and positioned between the bit line and the gate electrodes of a row of the vertical transistors in the third direction. The pad layer has a dielectric material.

In some implementations, the pad layer has at least one of silicon nitride or high-k dielectric.

In some implementations, the pad layer includes a first pad layer in contact with the bit line, and a second pad layer in contact with the gate electrodes. In some implementations, the first and second pad layers have different dielectric materials.

In some implementations, in each vertical transistor, the gate dielectric is positioned between the gate electrode and the semiconductor body in the second direction.

In some implementations, the gate structure is coupled to one side of the semiconductor body.

In some implementations, the gate electrodes of the row of the vertical transistors are continuous in the third direction.

In some implementations, the semiconductor device further includes a trench isolation extending in the third direction and positioned between two adjacent rows of the vertical transistors in the second direction.

In some implementations, the two adjacent rows of the vertical transistors are mirror-symmetric with respect to the trench isolation.

In some implementations, the gate structure is coupled to two opposite sides of the semiconductor body in the second direction.

In some implementations, the semiconductor device further includes a rectangular annulus word line surrounding the row of the vertical transistors to connect the gate electrodes of the row of the vertical transistors.

In still another aspect, a method for forming a semiconductor device is disclosed. A semiconductor body of a vertical transistor extending in a first direction on a substrate is formed. A first sacrificial layer is formed on a first side of the semiconductor body. A second sacrificial layer is formed on a side of the first sacrificial layer. At least part of the first sacrificial layer is replaced with a gate structure of the vertical transistor. The second sacrificial layer is replaced with a dielectric isolation layer after replacing the at least part of the first sacrificial layer with the gate structure of the vertical transistor.

In some implementations, to replace the at least part of the first sacrificial layer with the gate structure, the at least part of the first sacrificial layer is removed to expose the first side of the semiconductor body, a gate dielectric of the gate structure is formed on the exposed first side of the semiconductor body, and a gate electrode of the gate structure is formed on a side of the gate dielectric.

In some implementations, to replace the second sacrificial layer with the dielectric isolation layer, the second sacrificial layer is removed to expose one side of the gate structure, and the dielectric isolation layer is formed on the exposed side of the gate structure.

In some implementations, the substrate is thinned to expose an end of the semiconductor body after replacing the second sacrificial layer with the dielectric isolation layer, and a bit line adjacent to the exposed end of the semiconductor body and extending in a second direction perpendicular to the first direction is formed.

In some implementations, to thin the substrate, the substrate is polished until being stopped by a remainder of the first sacrificial layer after replacing.

In some implementations, prior to forming the first sacrificial layer, a pad layer is formed on top of the substrate, such that the first sacrificial layer is formed on top of the pad layer.

In some implementations, to thin the substrate, the substrate is polished until being stopped by the pad layer after replacing.

In some implementations, the exposed end of the semiconductor body is doped to form a drain or a source of the vertical transistor prior to forming the bit line, wherein the bit line is coupled to the drain or the source.

In some implementations, to thin the substrate, a carrier substrate is attached above the vertical transistor and opposite the substrate.

In some implementations, another first sacrificial layer is formed on a second side of the semiconductor body opposite the first side, and another second sacrificial layer is formed on a side of the another first sacrificial layer. In some implementations, to replace the second sacrificial layer with the dielectric isolation layer, the second sacrificial layer and the another first and second sacrificial layers are replaced with the dielectric isolation layer.

In some implementations, another first sacrificial layer is formed on a second side of the semiconductor body opposite the first side, and another second sacrificial layer is formed on a side of the another first sacrificial layer. In some implementations, to replace the at least part of the first sacrificial layer with the gate structure, the at least part of the first sacrificial layer and at least part of the another first sacrificial layer are replaced with the gate structure. In some implementations, to replace the second sacrificial layer with the dielectric isolation layer, the second sacrificial layer and the another second sacrificial layer are replaced with the dielectric isolation layer.

In some implementations, a trench isolation in the semiconductor body and extending in a third direction perpendicular to the first direction is formed.

In yet another aspect, a method for forming a semiconductor device is disclosed. A semiconductor body of a vertical transistor extending in a first direction on a substrate is formed. A first sacrificial layer is formed on a first side of the semiconductor body. A second sacrificial layer is formed on a side of the first sacrificial layer. The second sacrificial layer and at least part of the first sacrificial layer are replaced with a gate structure of the vertical transistor.

In some implementations, to replace, the at least part of the first sacrificial layer is removed to expose the first side of the semiconductor body, the second sacrificial layer is removed, a gate dielectric of the gate structure is formed on the exposed first side of the semiconductor body after removing the second sacrificial layer, and a gate electrode of the gate structure is formed on a side of the gate dielectric.

In some implementations, another first sacrificial layer is formed on a second side of the semiconductor body opposite the first side, and the another first sacrificial layer is replaced with a dielectric isolation layer prior to replacing the second sacrificial layer and the at least part of the first sacrificial layer with the gate structure.

In some implementations, to replace the another first sacrificial layer with the dielectric isolation layer, the another one of the first sacrificial layers is removed to expose the second side of the semiconductor body, and the dielectric isolation layer is formed on the exposed second side of the semiconductor body.

In some implementations, the substrate is thinned to expose an end of the semiconductor body after replacing, and a bit line adjacent to the exposed end of the semiconductor body and extending in a second direction perpendicular to the first direction is formed.

In some implementations, prior to forming the first sacrificial layer, a pad layer is formed on top of the substrate, wherein the first sacrificial layer is formed on top of the pad layer.

In some implementations, to thin the substrate, the substrate is polished until being stopped by the pad layer after replacing.

In some implementations, the exposed end of the semiconductor body is doped to form a drain or a source of the vertical transistor prior to forming the bit line, wherein the bit line is coupled to the drain or the source.

In some implementations, to thin the substrate, a carrier substrate is attached above the vertical transistor and opposite the substrate.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIG. 5A illustrates a plan view of an array of vertical transistors in a semiconductor device, according to some aspects of the present disclosure.

FIG. 5B illustrates a perspective view of an array of vertical transistors, according to some aspects of the present disclosure.

FIG. 6A illustrates a side view of a cross-section of a semiconductor device including vertical transistors, according to some aspects of the present disclosure.

FIG. 6B illustrates a side view of a cross-section of another semiconductor device including vertical transistors, according to some aspects of the present disclosure.

FIG. 6C illustrates a side view of a cross-section of still another semiconductor device including vertical transistors, according to some aspects of the present disclosure.

FIG. 6D illustrates a side view of a cross-section of yet another semiconductor device including vertical transistors, according to some aspects of the present disclosure.

FIG. 7 illustrates a plan view of a cross-section of a semiconductor device including vertical transistors, according to some aspects of the present disclosure.

FIG. 11B illustrates a flowchart of a method for forming another semiconductor device including vertical transistors, according to some aspects of the present disclosure.

FIG. 12A illustrates a plan view of another array of vertical transistors in a semiconductor device, according to some aspects of the present disclosure.

FIG. 12B illustrates a perspective view of another array of vertical transistors, according to some aspects of the present disclosure.

FIG. 14A illustrates a side view and a plan view of bit lines and bit line contacts coupled to vertical transistors in a semiconductor device, according to some aspects of the present disclosure.

FIG. 14B illustrates a side view and a plan view of word lines and word line contacts coupled to vertical transistors in a semiconductor device, according to some aspects of the present disclosure.

FIGS. 15A-15L illustrate a fabrication process for forming yet another semiconductor device including vertical transistors, according to some aspects of the present disclosure.

FIG. 16 illustrates a flowchart of a method for forming still another semiconductor device including vertical transistors, according to some aspects of the present disclosure.

FIG. 17A illustrates a plan view of still another array of vertical transistors in a semiconductor device, according to some aspects of the present disclosure.

FIG. 17B illustrates a perspective view of yet another array of vertical transistors, according to some aspects of the present disclosure.

FIGS. 20A-20F illustrate a fabrication process for forming yet another semiconductor device including vertical transistors, according to some aspects of the present disclosure.

FIG. 21 illustrates a flowchart of a method for forming yet another semiconductor device including vertical transistors, according to some aspects of the present disclosure.

Figure 1:
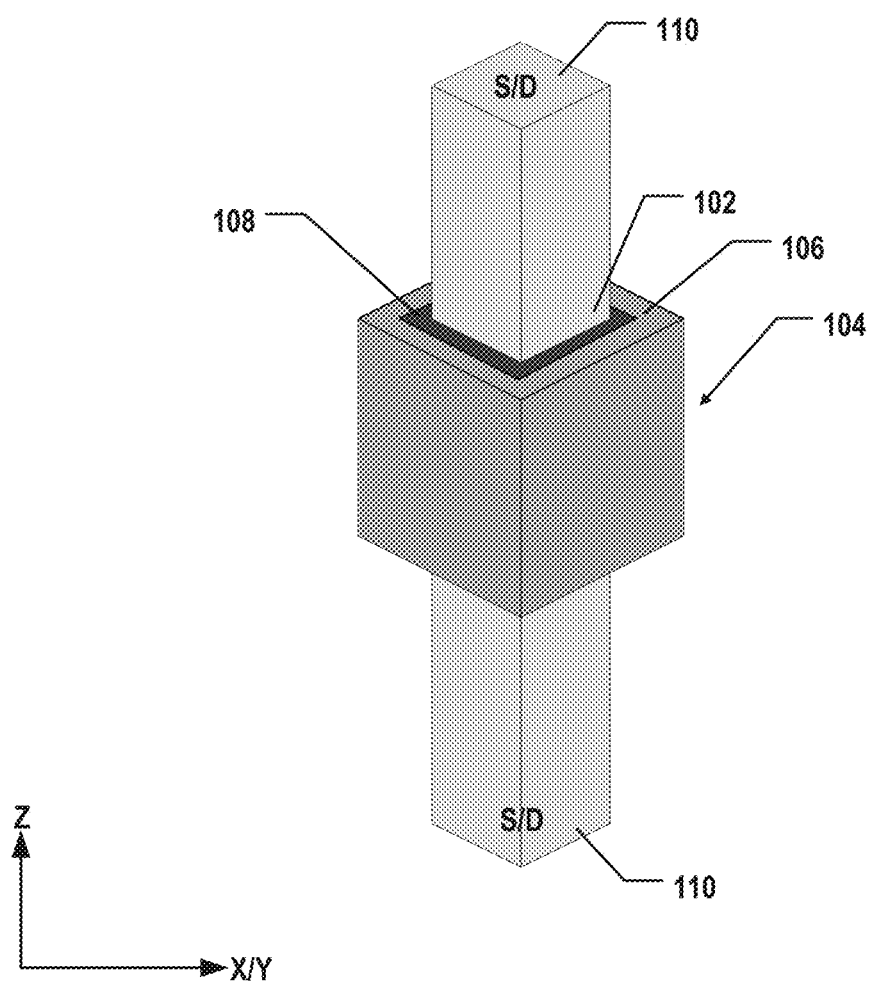
FIG. 1 illustrates a perspective view of a vertical transistor, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical interconnect access (via) contacts are formed) and one or more dielectric layers.

Transistors are used as the switch or selecting devices in the memory cells of some memory devices, such as DRAM, PCM, and ferroelectric DRAM (FRAM). However, the planar transistors commonly used in existing memory cells usually have a horizontal structure with buried word lines in the substrate and bit lines above the substrate. Since the source and drain of a planar transistor are disposed laterally at different locations, which increases the area occupied by the transistor. The design of planar transistors also compli- cates the arrangement of interconnected structures, such as word lines and bit lines, coupled to the memory cells, for example, limiting the pitches of the word lines and/or bit lines, thereby increasing the fabrication complexity and reducing the production yield.

In fabricating vertical transistors, the process of forming the gate ("gate process") is complicated, and the variation thereof is hard to control, compared with planar transistors. Since multiple deposition and etching processes are involved in the gate process, the uniformity among different vertical transistors becomes very difficult to control. For example, the heights of the word lines/gate electrodes may have a large variation due to the different sidewall profiles of semiconductor bodies after etching, as well as the seams and voids formed in the dielectric isolation layers after recessing the word lines/gate electrodes. Also, as the feature size of the vertical transistors keeps decreasing, the etching process to separate the continuous word lines/gate electrodes at the bottom (a.k.a., "bottom punch") becomes more chal- lenging. Furthermore, the current gate process limits the formation of the barrier layer in the gate electrode, such that the barrier layer cannot surround the gate conductor in the gate electrode to prevent fluorine (F) in the gate conductor from releasing and attacking the silicon oxide in the dielec- tric isolation layers, thereby forming voids and seams.

To address one or more of the aforementioned issues, the present disclosure introduces a self-aligned gate process for forming the gates of vertical transistors. The self-aligned gate process can utilize multiple sacrificial layers to more precisely define the positions and heights of gate electrodes. Since the sacrificial layers can be eventually replaced with the gate electrodes in the vertical transistors, any negative effect due to the seams and voids occurred in depositing the sacrificial layers can be avoided as well. The self-aligned gate process can also allow the barrier layer to surround the gate conductor in the gate electrode to prevent the fluorine from attacking the neighboring dielectric isolation layers. Moreover, since the continuous word line/gate electrode may not need to be separated by the "bottom punch" in the self-aligned gate process, the process margin can be increased, and the word line contact landing window can be increased as well.

According to some aspects of the present disclosure, the vertical transistors disclosed herein include single-gate tran- sistors (a.k.a. single-side gate transistors), which can have a thicker isolation layer (and/or with air gap) on the opposite side of the gate to reduce the coupling between adjacent vertical transistors. Thus, using single-gate transistors can increase the transistor density. In some examples, the single- gate transistors may be in a mirror-symmetric arrangement with respect to adjacent transistors in the bit line direction as a result of splitting multi-gate transistors (e.g., double-gate transistors) using trench isolations extending along the word line direction. Thus, the transistor density in the bit line direction can be significantly increased (e.g., doubled) with- out unduly complicating the fabrication process compared with using processes, such as self-aligned double patterning (SADP). Also, the mirror-symmetric single-gate transistors have a larger process window for word line, bit line, and transistor pitch reduction, compared to either planar transis- tors or multi-gate vertical transistors, for example, with dual-side or all-around gates.

To form the single-gate transistors, in some implementa- tions, both of the two sacrificial layers are replaced with a gate electrode. The resulting gate electrode thus can have a relatively large dimension in the bit line direction (also referred to herein as "thick gate electrode"), which can reduce the resistance and increase the process margin. In some implementations, only one of the two sacrificial layers is replaced with a gate electrode. The resulting gate elec- trode thus can have a relatively small dimension in the bit line direction (also referred to herein as "thin gate elec- trode"), which can leave more space to form a "thicker" dielectric isolation layer between the adjacent vertical tran- sistors, thereby reducing the coupling effect.

According to some aspects of the present disclosure, the vertical transistors disclosed herein include multi-gate tran- sistors (e.g., double-gate transistors), which can have a larger gate control area to achieve better channel control with a smaller subthreshold swing. Since the channel is fully depleted, the leakage current of multi-gate transistors can be significantly reduced as well. Thus, using multi-gate tran- sistors instead of planar transistors can achieve a much better speed (saturated drain current)/leakage current per- formance.

FIG. 1 illustrates a perspective view of a vertical transistor 100, according to some aspects of the present disclosure. In some implementations, different from planar transistors in which the active regions are formed in the substrate, vertical transistor 100 includes a semiconductor body 102 extending vertically (in the z-direction) above the substrate (not shown). That is, semiconductor body 102 can extend above the top surface of the substrate to allow channels to be formed not only at the top surface of semiconductor body 102, but also at one or more side surfaces thereof. It is noted that x, y, and z axes are included in FIG. 1 to further illustrate the spatial relationship of the components in a semiconduc- tor device having vertical transistor 100. The substrate of the semiconductor device includes two lateral surfaces extend- ing laterally in the x-y plane: a top surface on the front side of the wafer on which the semiconductor device can be formed, and a bottom surface on the backside opposite to the front side of the wafer. The z-axis is perpendicular to both the x and y axes. As used herein, whether one component (e.g., a layer or a device) is "on," "above," or "below" another component (e.g., a layer or a device) of the semi- conductor device is determined relative to the substrate of the semiconductor device in the z-direction (the vertical direction perpendicular to the x-y plane, e.g., the thickness direction of the substrate) when the substrate is positioned in the lowest plane of the semiconductor device in the z-di- rection. The same notion for describing the spatial relation- ships is applied throughout the present disclosure.

As shown in FIG. 1, for example, semiconductor body 102 can have a cuboid shape to expose four sides thereof. It is understood that semiconductor body 102 may have any suitable three-dimensional (3D) shape, such as polyhedron shapes or a cylinder shape. That is, the cross-section of semiconductor body 102 in the plan view (e.g., in the x-y plane) can have a square shape, a rectangular shape (or a trapezoidal shape), a circular (or an oval shape), or any other suitable shapes. It is understood that consistent with the scope of the present disclosure, for semiconductor bodies that have a circular or oval shape of their cross-sections in the plan view, the semiconductor bodies may still be considered as having multiple sides, such that the gate structures are in contact with more than one side of the semiconductor bodies. As described below with respect to the fabrication process, semiconductor body 102 can be formed from the substrate (e.g., by etching) and thus, has the same semiconductor material (e.g., silicon crystalline silicon) as the substrate (e.g., a silicon substrate).

As shown in FIG. 1, vertical transistor 100 can also include a gate structure 104 in contact with one or more sides of semiconductor body 102, e.g., in one or more planes of the side surface(s) of the active region. In other words, the active region of vertical transistor 100, e.g., semiconductor body 102, can be at least partially surrounded by gate structure 104. Gate structure 104 can include a gate dielectric 108 over one or more sides of semiconductor body 102, e.g., in contact with four side surfaces of semiconductor body 102 as shown in FIG. 1. Gate structure 104 can also include a gate electrode 106 over and in contact with gate dielectric 108. Gate dielectric 108 can include any suitable dielectric materials, such as silicon oxide, silicon nitride, silicon oxynitride, or high-k dielectrics. As used herein, high-k dielectric materials may include any dielectrics having a dielectric constant, or k-value, higher than that of silicon nitride (k>7). For example, gate dielectric 108 may include silicon oxide, which is a form of gate oxide. Gate electrode 106 can include any suitable conductive materials, such as polysilicon, metals (e.g., tungsten (W), copper (Cu), aluminum (Al), etc.), metal compounds (e.g., titanium nitride (TiN), tantalum nitride (TaN), etc.), or silicides. For example, gate electrode 106 may include doped polysilicon, which is a form of a gate poly. In some implementations, gate electrode 106 includes multiple conductive layers, such as a W layer over a TiN layer. It is understood that in a semiconductor device having vertical transistors 100, gate electrode 106 and a word line (not shown in FIG. 1) may be a continuous conductive structure in some examples. In other words, gate electrode 106 may be viewed as part of a word line (not shown in FIG. 1) that forms gate structure 104, or the word line may be viewed as the extension of gate electrode 106 to be coupled to peripheral circuits.

As shown in FIG. 1, vertical transistor 100 can further include a pair of a source and a drain 110 (S/D, dope regions, a.k.a., source electrode and drain electrode) formed at the two terminals (ends) of semiconductor body 102 in the vertical direction (the z-direction), respectively. Source and drain 110 can be doped with any suitable P-type dopants, such as boron (B) or Gallium (Ga), or any suitable N-type dopants, such as phosphorus (P) or arsenic (As). Source and drain 110 can be separated by gate structure 104 in the vertical direction (the z-direction). In other words, gate structure 104 is formed vertically between source and drain 110. As a result, one or more channels (not shown) of vertical transistor 100 can be formed in semiconductor body 102 vertically between source and drain 110 when a gate voltage applied to gate electrode 106 of gate structure 104 is above the threshold voltage of vertical transistor 100. That is, each channel of vertical transistors 100 is also formed in the vertical direction along which semiconductor body 102 extends, according to some implementations.

In some implementations, as shown in FIG. 1, vertical transistor 100 is a multi-gate transistor. That is, gate structure 104 can be in contact with more than one side of semiconductor body 102 (e.g., four sides in FIG. 1) to form more than one gate, such that more than one channel can be formed between source and drain 110 in operation. That is, different from the planar transistor that includes only a single planar gate (and results in a single planar channel), vertical transistor 100 shown in FIG. 1 can include multiple vertical gates on multiple sides of semiconductor body 102 due to the 3D structure of semiconductor body 102 and gate structure 104 that surrounds the multiple sides of semiconductor body 102. As a result, compared with planar transistors, vertical transistor 100 shown in FIG. 1 can have a larger gate control area to achieve better channel control with a smaller subthreshold swing. Since the channel is fully depleted, the leakage current ($I_{off}$) of vertical transistor 100 can be significantly reduced a well.

It is understood that although vertical transistor 100 is shown as a multi-gate transistor in FIG. 1, the vertical transistors disclosed herein may also include single-gate transistors as described below in detail. That is, gate structure 104 may be in contact with a single side of semiconductor body 102, for example, for the purpose of increasing the transistor density. It is also understood that although gate dielectric 108 is shown as being separate (a separate structure) from other gate dielectrics of adjacent vertical transistors (not shown), gate dielectric 108 may be part of a continuous dielectric layer having multiple gate dielectrics of vertical transistors.

In planar transistors and some lateral multiple-gate transistors (e.g., FinFET), the active regions, such as semiconductor bodies (e.g., Fins), extend laterally (in the x-y plane), and the source and the drain are disposed at different locations in the same lateral plane (the x-y plane). In contrast, in vertical transistor 100, semiconductor body 102 extends vertically (in the z-direction), and source and drain 110 are disposed in the different lateral planes, according to some implementations. In some implementations, source and drain 110 are formed at two terminals of semiconductor body 102 in the vertical direction (the z-direction), respectively, thereby being overlapped in the plan view. As a result, the area (in the x-y plane) occupied by vertical transistor 100 can be reduced compared with planar transistors and lateral multiple-gate transistors. Also, the metal wiring coupled to vertical transistors 100 can be simplified as well since the interconnects can be routed in different planes.

Figure 2:
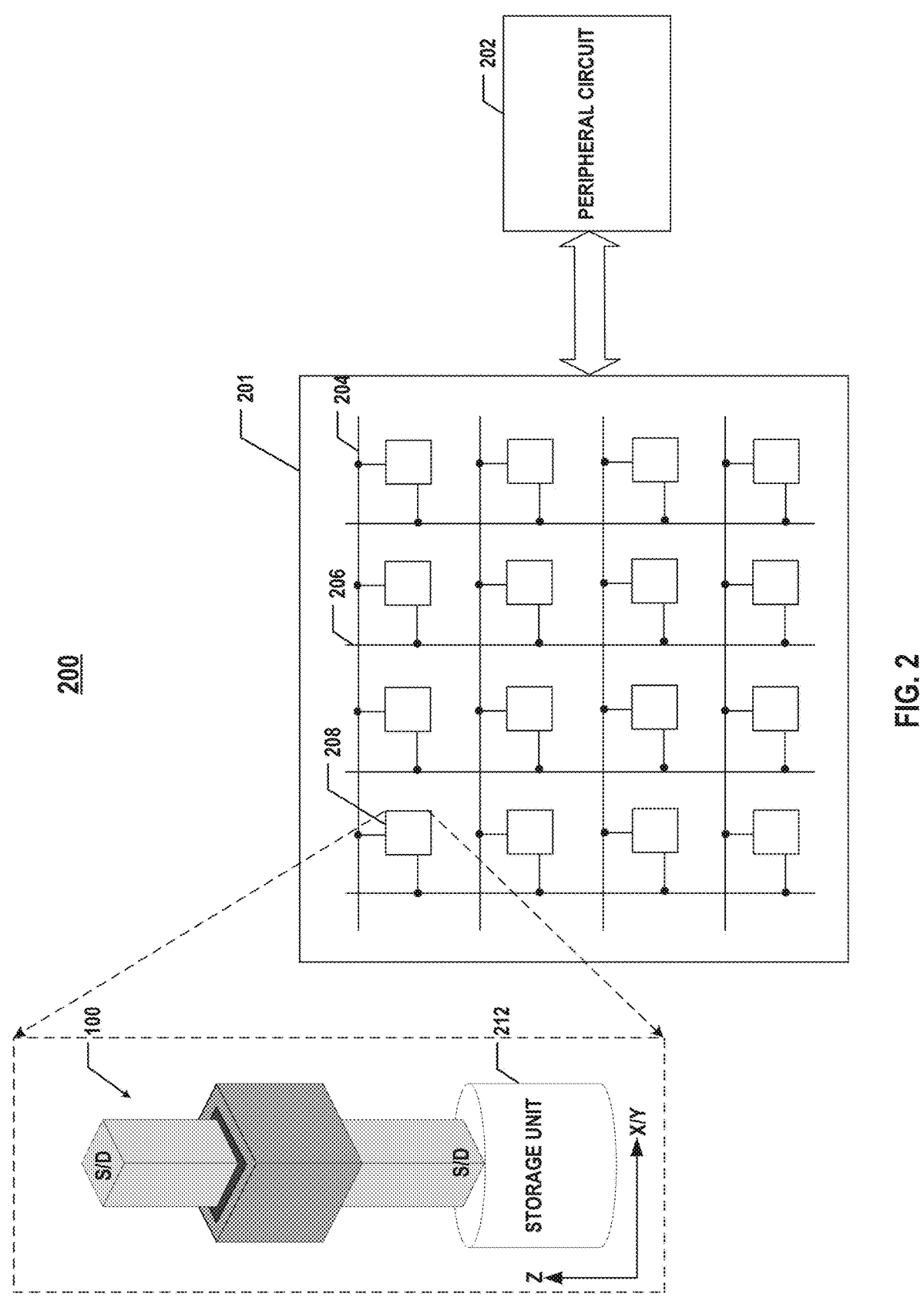
FIG. 2 illustrates a schematic diagram of a memory device including peripheral circuits and an array of memory cells each having a vertical transistor, according to some aspects of the present disclosure.

FIG. 2 illustrates a schematic diagram of a memory device 200 including peripheral circuits and an array of memory cells each having vertical transistor 100, according to some aspects of the present disclosure. Memory device 200 can include a memory cell array 201 and peripheral circuits 202 coupled to memory cell array 201. Memory cell array 201 can be any suitable memory cell array in which each memory cell 208 includes vertical transistor 100 and a storage unit 212 coupled to vertical transistor 100. In some implementations, memory cell array 201 is a DRAM cell array, and storage unit 212 is a capacitor for storing charge as the binary information stored by the respective DRAM cell. In some implementations, memory cell array 201 is a PCM cell array, and storage unit 212 is a PCM element (e.g., including chalcogenide alloys) for storing binary information of the respective PCM cell based on the different resistivities of the PCM element in the amorphous phase and the crystalline phase. In some implementations, memory cell array 201 is a ferroelectric RAM (FRAM) cell array, and storage unit 212 is a ferroelectric capacitor for storing binary information of the respective FRAM cell based on the switch between two polarization states of ferroelectric materials under an external electric field.

As shown in FIG. 2, memory cells 208 can be arranged in a two-dimensional (2D) array having rows and columns. Memory device 200 can include word lines 204 coupling peripheral circuits 202 and memory cell array 201 for controlling the switch of vertical transistors 100 in memory cells 208 located in a row, as well as bit lines 206 coupling peripheral circuits 202 and memory cell array 201 for sending data to and/or receiving data from memory cells 208 located in a column. That is, each word line 204 is coupled to a respective row of memory cells 208, and each bit line is coupled to a respective column of memory cells 208.

Consistent with the scope of the present disclosure, vertical transistors 100, such as vertical metal-oxide-semiconductor field-effect transistors (MOSFETs), can replace the planar transistors as the pass transistors of memory cells 208 to reduce the area occupied by the pass transistors, the coupling capacitance, as well as the interconnect routing complexity. For example, bit lines 206 and storage units 212 may be formed on opposite sides of vertical transistor 100. In one example, bit line 206 may be coupled to source or drain 110 at the upper end of semiconductor body 102, while storage unit 212 may be coupled to the other source or drain 110 at the lower end of semiconductor body 102.

Figure 3:
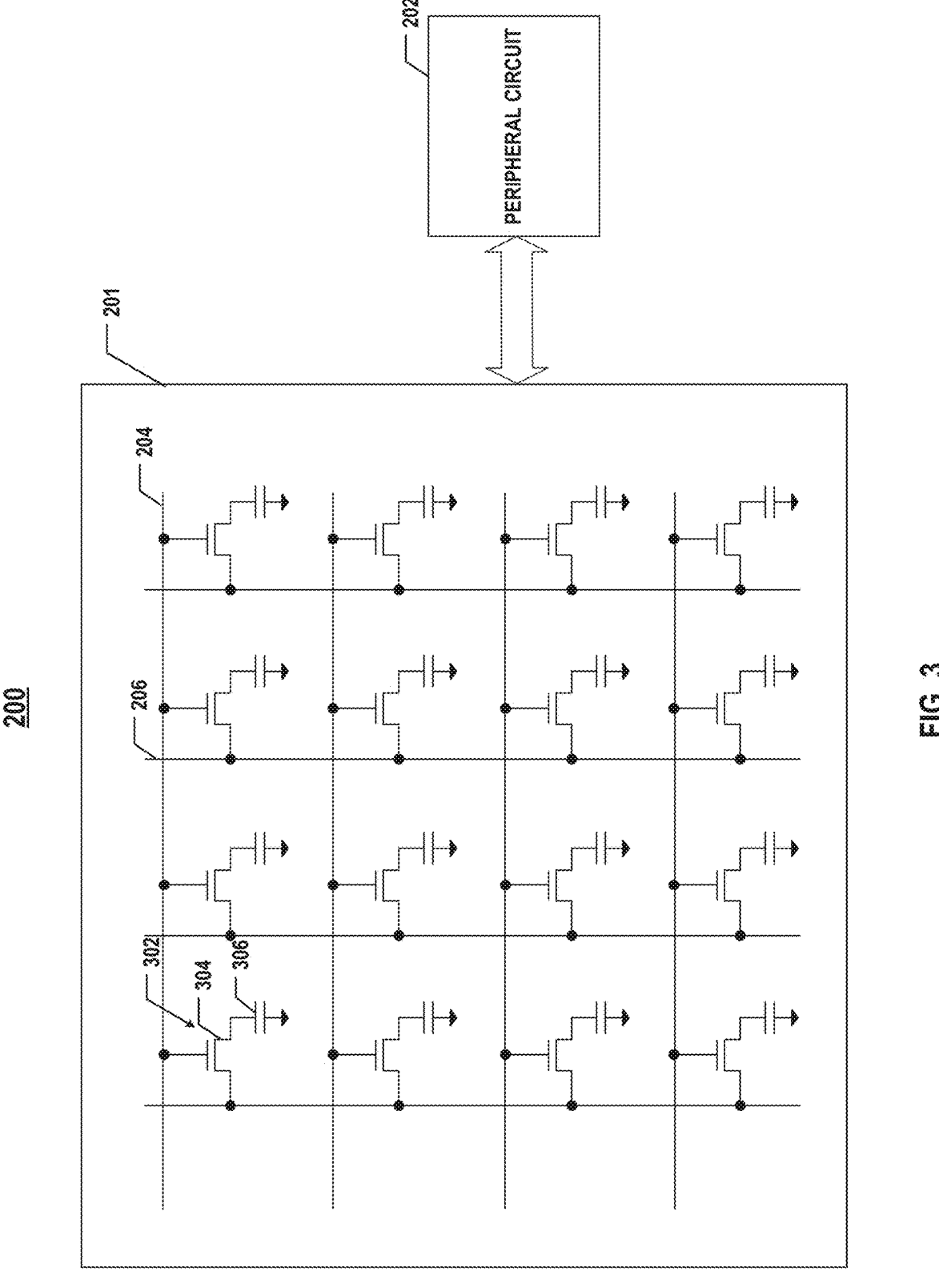
FIG. 3 illustrates a schematic circuit diagram of a memory device including peripheral circuits and an array of dynamic random-access memory (DRAM) cells, according to some aspects of the present disclosure.
Figure 4:
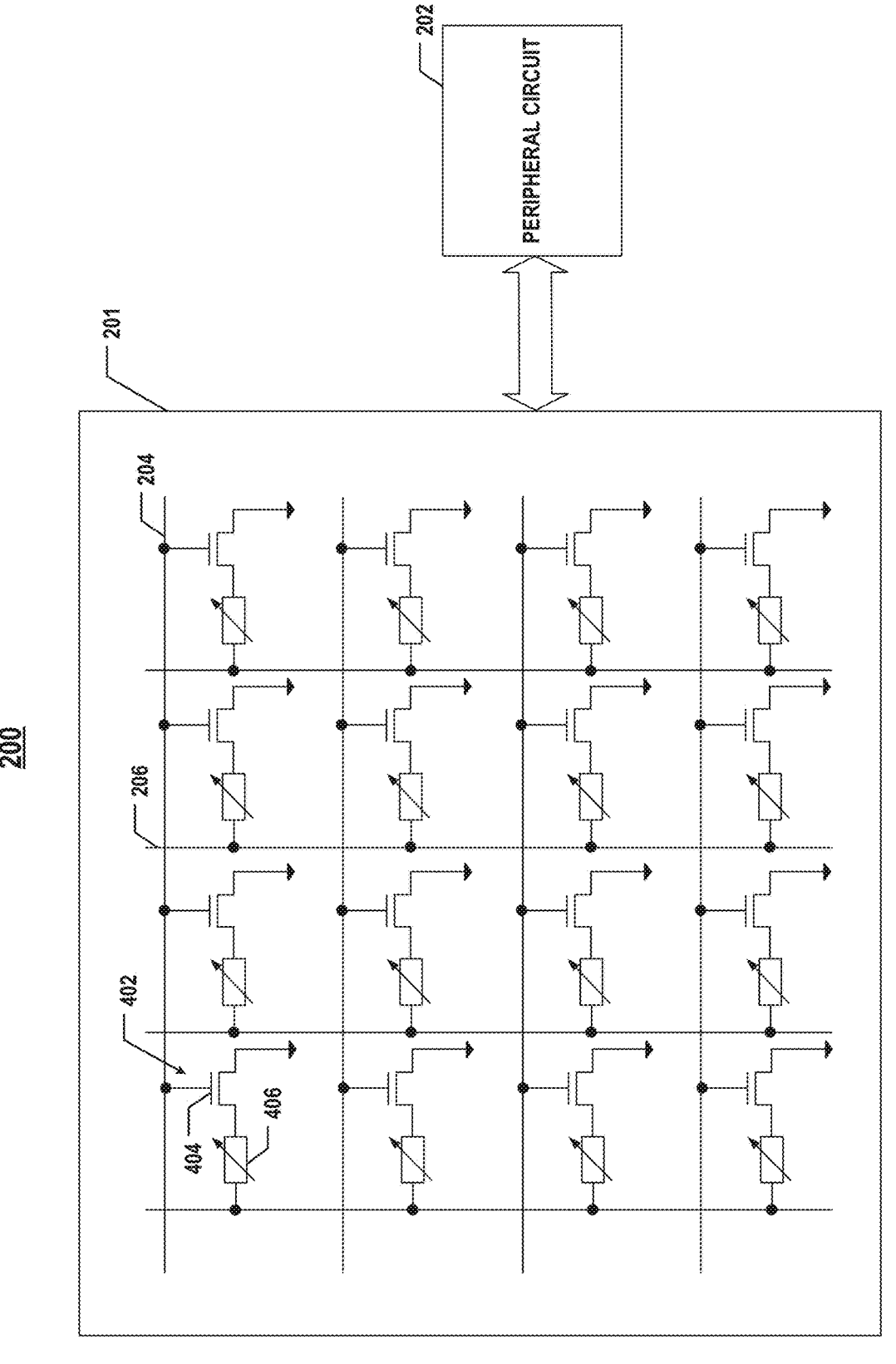
FIG. 4 illustrates a schematic circuit diagram of a memory device including peripheral circuits and an array of phase-change memory (PCM) cells, according to some aspects of the present disclosure.

As shown in FIG. 2, storage unit 212 can be coupled to source or drain 110 of vertical transistor 100. Storage unit 212 can include any devices that are capable of storing binary data (e.g., 0 and 1), including but not limited to, capacitors for DRAM cells and FRAM cells, and PCM elements for PCM cells. In some implementations, vertical transistor 100 controls the selection and/or the state switch of the respective storage unit 212 coupled to vertical transistor 100. In some implementations as shown in FIG. 3, each memory cell 208 is a DRAM cell 302 including a transistor 304 (e.g., implementing using vertical transistors 100 in FIGS. 1 and 2) and a capacitor 306 (e.g., an example of storage unit 212 in FIG. 2). The gate of transistor 304 (e.g., corresponding to gate electrode 106) may be coupled to word line 204, one of the source and the drain of transistor 304 may be coupled to bit line 206, the other one of the source and the drain of transistor 304 may be coupled to one electrode of capacitor 306, and the other electrode of capacitor 306 may be coupled to the ground. In some implementations as shown in FIG. 4, each memory cell 208 is a PCM cell 402 including a transistor 404 (e.g., implementing using vertical transistors 100 in FIGS. 1 and 2) and a PCM element 406 (e.g., an example of storage unit 212 in FIG. 2). The gate of transistor 404 (e.g., corresponding to gate electrode 106) may be coupled to word line 204, one of the source and the drain of transistor 404 may be coupled to the ground, the other one of the source and the drain of transistor 404 may be coupled to one electrode of PCM element 406, and the other electrode of PCM element 406 may be coupled to bit line 206.

Peripheral circuits 202 (a.k.a. control and sensing circuits) can be coupled to memory cell array 201 through bit lines 206, word lines 204, and any other suitable metal wirings. Peripheral circuits 202 can include any suitable digital, analog, and/or mixed-signal circuits used for facilitating the operations of memory cell array 201 by applying and sensing voltage signals and/or current signals through word lines 204 and bit lines 206 to and from each memory cell 208. For example, peripheral circuit 202 can include one or more of a page buffer, a decoder (e.g., a row decoder and a column decoder), a sense amplifier, a driver (e.g., a word line driver), an input/output (I/O) circuit, a charge pump, a voltage source or generator, a current or voltage reference, any portions (e.g., a sub-circuit) of the functional circuits mentioned above, or any active or passive components of the circuit (e.g., transistors, diodes, resistors, or capacitors). Peripheral circuits 202 use complementary metal-oxide-semiconductor (CMOS) technology, e.g., which can be implemented with logic processes (e.g., technology nodes of 90 nm, 65 nm, 60 nm, 45 nm, 32 nm, 28 nm, 22 nm, 20 nm, 16 nm, 14 nm, 10 nm, 7 nm, 5 nm, 3 nm, 2 nm, etc.), according to some implementations.

According to some aspects of the present disclosure, the vertical transistors are single-gate transistors. For example, FIGS. 5A and 5B illustrate a plan view and a perspective view, respectively, of an array of vertical transistors 502 in a semiconductor device 500, according to some aspects of the present disclosure. As shown in FIGS. 5A and 5B, semiconductor device 500 can include a plurality of word lines 504 each extending in a first lateral direction (the x-direction, referred to herein as the word line direction). Semiconductor device 500 can also include a plurality of bit lines 506 each extending in a second lateral direction perpendicular to the first lateral direction (the y-direction, referred to herein as the bit line direction). It is understood that FIG. 5A does not illustrate a cross-section of semiconductor device 500 in the same lateral plane, and word lines 504 and bit lines 506 may be formed in different lateral planes for ease of routing as described below in detail.

Vertical transistors 502 can be formed at the intersections of word lines 504 and bit lines 506. In some implementations, each vertical transistor 502 includes a semiconductor body 508 and a gate structure 510. As shown in FIG. 5B, semiconductor body 508 can extend on a substrate 501 (shown in FIG. 5A) in the vertical direction (the z-direction) perpendicular to the first and second lateral directions. Vertical transistor 502 can be a single-gate transistor in which gate structure 510 is coupled to a single side (e.g., one of four sides in FIGS. 5A and 5B) of semiconductor body 508 (the active region in which channels are formed). As shown in FIGS. 5A and 5B, vertical transistor 502 is a single-gate transistor in which gate structure 510 abuts one side of semiconductor body 508 (having a rectangle or square-shaped cross-section) in the bit line direction (the y-direction) in the plan view. Gate structure 510 does not surround and contact other three sides of semiconductor body 508, according to some implementations. Gate structure 510 can include a gate dielectric 512 abuts one side of semiconductor body 508 in the plan view, and a gate electrode 514 in contact with gate dielectric 512. In some implementations, gate dielectric 512 is positioned laterally between gate electrode 514 and semiconductor body 508 in the bit line direction (the y-direction).

As described above, gate electrode 514 may be part of word line 504, and word line 504 may be an extension of gate electrode 514. That is, gate electrodes 514 of adjacent vertical transistors 502 in the word line direction (the x-direction), e.g., in the same row, are continuous, e.g., parts of a continuous conductive layer having gate electrodes 514 and word line 504. Similarly, gate dielectrics 512 of adjacent vertical transistors 502 in the word line direction, e.g., in the same row, are continuous, e.g., parts of a continuous dielectric layer having gate dielectrics 512 and extending in the word line direction to abut vertical transistors 502 in the same row on the same side. Gate structures 510 can be thus viewed as parts of a continuous structure extending in the word line direction at which the continuous structure abuts vertical transistors 502 in the same row on the same side. Gate electrodes 514 and gate dielectrics 512 of a row of vertical transistors 502 are continuous in the word line direction, according to some implementations.

As shown in FIG. 5A, semiconductor device 500 can further include a plurality of parallel dielectric isolation layers 516 each extending in the word line direction (the x-direction). Each dielectric isolation layer 516 is positioned laterally between two adjacent rows of vertical transistors 502 in the bit line direction (the y-direction) to reduce the coupling effect between the adjacent rows of vertical transistors 502. As described below in detail, the thickness (the dimension in the bit line direction) of dielectric isolation layer 516 and/or whether air gaps being formed in dielectric isolation layer 516 can affect the effectiveness of coupling reduction.

FIG. 6A illustrates a side view of a cross-section of a semiconductor device 600 including vertical transistors 626, according to some aspects of the present disclosure. Semiconductor device 600 may be one example of semiconductor device 500 including single-gate vertical transistors 502 in which gate structure 510 is coupled to one side of semiconductor body 508. It is understood that FIG. 6A is for illustrative purposes only and may not necessarily reflect the actual device structure (e.g., interconnections) in practice. It is also understood that any other suitable components not shown in FIG. 6A may be included in semiconductor device 600 to be coupled to vertical transistors 626, such as any suitable storage units and peripheral circuits. It is further understood that the cross-section of semiconductor device 600 in FIG. 6A may be made along the bit line direction (the y-direction), and bit line 623 extending laterally in the y-direction may be coupled to a column of vertical transistors 626.

Vertical transistor 626 can be a MOSFET. In some implementations, vertical transistor 626 includes a semiconductor body 630 (the active region in which one or more channels can form) extending vertically (in the z-direction), and a gate structure 636 coupled to one side of semiconductor body 630. As described above, as in a single-gate vertical transistor, semiconductor body 630 can have a cuboid shape or a cylinder shape, and gate structure 636 can be in contact with only one of the two sides of semiconductor body 630 in the bit line direction in the plan view, for example, as shown in FIG. 5A. Gate structure 636 includes a gate electrode 634 and a gate dielectric 632 positioned laterally between gate electrode 634 and semiconductor body 630 in the bit line direction, according to some implementations. For example, for semiconductor body 630 having a cylinder shape, semiconductor body 630, gate dielectric 632, and gate electrode 634 may be disposed radially from the center of vertical transistor 626 in this order. In some implementations, gate dielectric 632 abuts one side of semiconductor body 630, and gate electrode 634 abuts gate dielectric 632.

As shown in FIG. 6A, in some implementations, semiconductor body 630 has two ends (the upper end and lower end) in the vertical direction (the z-direction), and both ends extend beyond gate electrode 634, respectively, in the vertical direction (the z-direction). That is, semiconductor body 630 can have a larger vertical dimension (e.g., the depth) than that of gate electrode 634 (e.g., in the z-direction), and neither the upper end nor the lower end of semiconductor body 630 is flush with the respective end of gate electrode 634. Thus, short circuits between bit lines 623 and word lines/gate electrodes 634 or between word lines/gate electrodes 634 and other components coupled to the upper terminal of vertical transistor 626 (not shown, e.g., a capacitor) can be avoided. In some implementations, the upper end of semiconductor body 630 is flush with the upper end of gate dielectric 632, as shown in FIG. 6A. Thus, within gate structure 636, the upper end of gate dielectric 632 can extend beyond the upper end of gate electrode 634 in the vertical direction as well.

Vertical transistor 626 can further include a source and a drain (both referred to as 638 as their locations may be interchangeable) disposed at the two ends (the upper end and lower end) of semiconductor body 630, respectively, in the vertical direction (the z-direction). In some implementations, one of source and drain 638 (e.g., at the upper end in FIG. 6A) is coupled to a capacitor (not shown), and the other one of source and drain 638 (e.g., at the lower end in FIG. 6A) is coupled to bit line 623 (e.g., via an ohmic contact 608). That is, vertical transistor 626 can have a first terminal in the positive z-direction and a second terminal opposite the first terminal in the negative z-direction, as shown in FIG. 6A. In some implementations, a metal bit line (e.g., bit line 623 made of a metal material) is coupled to the second terminal of vertical transistor 626 via ohmic contact 608. Ohmic contact 608 can be made of a metal silicide material, i.e., a metal silicide contact. The usage of a metal bit line (as opposed to doped silicon) and a metal silicide contact (as opposed to a Schottky contact) can significantly reduce the contact resistance between vertical transistor 626 and bit line 623. For example, bit line 623 may include W, Co, Cu, Al, or any other suitable metals having higher conductivities than doped silicon. For example, ohmic contact 608 may include metal silicides, such as WSi, CoSi, CuSi, AlSi, or any other suitable metal silicides having higher conductivities than doped silicon.

In some implementations, semiconductor body 630 includes semiconductor materials, such as single crystalline silicon, polysilicon, amorphous silicon, Ge, any other semiconductor materials, or any combinations thereof. In one example, semiconductor body 630 may include single crystalline silicon. Source and drain 638 can be doped with N-type dopants (e.g., P or As) or P-type dopants (e.g., B or Ga) at a desired doping level. In some implementations, gate dielectric 632 includes dielectric materials, such as silicon oxide, silicon nitride, or high-k dielectrics including, but not limited to, aluminum oxide ($Al_2O_3$), hafnium oxide ($HfO_2$), tantalum oxide ($Ta_2O_5$), zirconium oxide ($ZrO_2$), titanium oxide ($TiO_2$), or any combination thereof. In some implementations, gate electrode 634 includes conductive materials including, but not limited to W, Co, Cu, Al, TiN, TaN, polysilicon, silicides, or any combination thereof. In one example, gate structure 636 may be a "gate oxide/gate poly" gate in which gate dielectric 632 includes silicon oxide and gate electrode 634 includes doped polysilicon. In another example, gate structure 636 may be a high-k metal gate (HKMG) in which gate dielectric 632 includes a high-k dielectric and gate electrode 634 includes a metal.

As shown in FIG. 6A, in some implementations, gate electrode 634 includes a gate conductor 633 and a barrier layer 635 surrounding gate conductor 633. In one example, gate conductor 633 may include W, and barrier layer 635 may include TiN. In forming gate conductor 633 having W, F may be used in the precursor of the deposition materials and trapped into gate conductor 633 having W. Barrier layer 635 that surrounds the gate conductor 633 thus can prevent the trapped F from releasing and attacking the adjacent silicon oxide to form voids and seams. Barrier layer 635 can also serve as the glue layer/adhesive layer to increase the adhesion between gate conductor 633 and gate dielectric 632. As described below in detail with respect to the fabrication process, the self-aligned gate process can enable the formation of barrier layer 635 that surrounds gate conductor 633.

As described above, since gate electrode 634 may be part of a word line or extend in the word line direction (e.g., the x-direction in FIG. 5A) as a word line, although not directly shown in FIG. 6A, semiconductor device 600 can also include a plurality of word lines (e.g., an example of word lines 504 in FIG. 5A, referred to as 634 in FIG. 6A as well) each extending in the word line direction (the x-direction). Each word line 634 can be coupled to a row of vertical transistors 626. That is, bit line 623 and word line 634 can extend in two perpendicular lateral directions, and semiconductor body 630 of vertical transistor 626 can extend in the vertical direction perpendicular to the two lateral directions in which bit line 623 and word line 634 extend. Word lines 634 are in contact with word line contacts (not shown), according to some implementations. In some implementations, word lines 634 include conductive materials including, but not limited to W, Co, Cu, Al, TiN, TaN, polysilicon, silicides, or any combination thereof. In some implementations, word line 634 includes multiple conductive layers, such as a gate conductor 633 having W surrounded by a barrier layer 635 having TiN.

As shown in FIG. 6A, semiconductor device 600 can further include a plurality of dielectric isolation layers 606 each disposed laterally between adjacent vertical transistors 626 in the bit line direction. In some implementations, air gaps 640 are formed in dielectric isolation layers 606 to further increase the effectiveness of coupling reduction between adjacent vertical transistors 626. Each air gap 640 can be a trench extending in the word line direction (e.g., the x-direction) in parallel with word lines 634 to separate adjacent rows of vertical transistors 626. As described below with respect to the fabrication process, air gaps 640 may be formed due to the relatively small pitches of word lines 634 (and rows of vertical transistors 626) in the bit line direction (e.g., the y-direction). On the other hand, the relatively large dielectric constant of air in air gaps 640 (e.g., about 4 times of the dielectric constant of silicon oxide) can improve the insulation effect between word lines 634 (and rows of vertical transistors 626) compared with some dielectrics (e.g., silicon oxide).

Consistent with the scope of the present disclosure, as shown in FIG. 6A, semiconductor device 600 can further include a pad layer 602 positioned between gate electrode 634 and bit line 623 in the vertical direction. As described above, pad layer 602 can provide insulation between gate electrode 634 and bit line 623 and avoid direct contact between gate electrode 634 and bit line 623. In some implementations, the thickness (the dimension in the z-direction) of pad layer 602 is the same as the step between the lower end of semiconductor body 630 and the lower end of gate electrode 634. As described below with respect to the fabrication process, pad layer 602 can also serve as the stop layer when removing the substrate on which semiconductor body 630 is formed to expose the lower end of semiconductor body 630. It is understood that, like bit line 623, pad layer 602 may extend laterally in the bit line direction (the y-direction) such that pad layer 602 may be positioned between dielectric isolation layer 606 and bit line 623 in the vertical direction as well.

As shown in FIG. 6A, pad layer 602 can have a single dielectric layer in contact with gate electrode 634 and bit line 623 on opposite sides. In some implementations, pad layer 602 and gate dielectric 632 have different dielectric materials. For example, when gate dielectric 632 has silicon oxide, pad layer 602 may have any dielectric materials other than silicon oxide. In some implementations, pad layer 602 has at least one of silicon nitride or high-k dielectrics, such as $Al_2O_3$, $HfO_2$, $Ta_2O_5$, $ZrO_2$, $TiO_2$, etc.

As shown in FIG. 6A, in some implementations, semiconductor device 600 further includes a liner layer 604 positioned between pad layer 602 and semiconductor body 630 in the bit line direction (they-direction). Gate dielectric 632 and liner layer 604 can have the same material, such as silicon oxide. Thus, it is understood that the interface and boundary between gate dielectric 632 and liner layer 604 may become indistinguishable in some cases when gate dielectric 632 and liner layer 604 have the same material. Different from gate dielectric 632, which is formed on only one side of semiconductor body 630 in the bit line direction, liner layer 604 can be formed on both sides of semiconductor body 630 in the bit line direction.

FIG. 7 illustrates a plan view of a cross-section in the x-y plane (e.g., in the AA plane through pad layer 602 and liner layer 604 in FIG. 6A), according to some aspects of the present disclosure. As shown in FIGS. 6A and 7, semiconductor device 600 can include pad layer 602 extending in the word line direction (the x-direction) and positioned between bit line 623 and gate electrodes 634 of a row of vertical transistors 626 in the vertical direction. As shown in FIG. 7, semiconductor device 600 can further include rectangular annulus liner layer 604 surrounding pad layer 602 and in contact with semiconductor bodies 630 of a row of vertical transistors 626.

In some implementations, as shown in FIG. 6A, semiconductor device 600 further includes a dielectric layer 642 opposing vertical transistor 626 with bit line 623 positioned between dielectric layer 642 and vertical transistor 626 in the vertical direction. That is, vertical transistor 626 and dielectric layer 642 can be formed on opposite sides of bit line 623 in the vertical direction. Local interconnects, such as bit line contacts 644 can be formed in dielectric layer 642. Bit line contacts 644 can include conductive materials including, but not limited to, W, Co, Cu, Al, doped silicon, silicides, or any combination thereof. Dielectric layer 642 can include dielectric materials including, but not limited to, silicon oxide, silicon nitride, silicon oxynitride, low-k dielectrics, or any combination thereof.

As shown in FIG. 6A, for the same distance between two adjacent semiconductor bodies 630 in the bit line direction, the thickness (the dimension in the bit line direction) of gate electrode 634 of gate structure 636 is limited by the thickness (the dimension in the bit line direction) of dielectric isolation layer 606, according to some implementations. As described below in detail with respect to the self-aligned gate process for forming gate structure 636, the thickness of gate electrode 634 of gate structure 636 may be adjusted to form either a "thick gate," as shown in semiconductor device 600 in FIG. 6A, or a "thick gate" as shown in semiconductor device 601 in FIG. 6B, by replacing different numbers of sacrificial layers in forming gate electrodes 634. Comparing semiconductor device 600 in FIG. 6A and semiconductor device 601 in FIG. 6B, for the same distance between two adjacent semiconductor bodies 630 in the bit line direction, the relative thickness between gate electrode 634 and dielectric isolation layer 606 may vary in the "thick gate" (in FIG. 6A) and the "thin gate" (in FIG. 6B). For example, for "thick gate" in semiconductor device 600 in FIG. 6A, the thickness of gate electrode 634 may be greater than the thickness of dielectric isolation layer 606, whereas for "thin gate" in semiconductor device 601 in FIG. 6B, the thickness of dielectric isolation layer 606 may be greater than gate electrode 634.

It is understood that pad layer 602 may include more than one dielectric layer with different dielectric materials. For example, FIG. 6C illustrates a side view of a cross-section of still another semiconductor device 603 including vertical transistors 626, according to some aspects of the present disclosure, and FIG. 6D illustrates a side view of a cross-section of yet another semiconductor device 605 including vertical transistors 626, according to some aspects of the present disclosure. Similar to semiconductor devices 600 and 601, semiconductor devices 603 and 605 include examples of vertical transistors 626 with a "thick gate" (shown in FIG. 6C) and vertical transistors 626 with a "thin gate" (shown in FIG. 6D). Pad layer 602 in semiconductor devices 603 and 605 can include a first pad layer 602a in contact with bit line 623, and a second pad layer 602b in contact with gate electrode 634. First and second pad layers 602a and 602b have different dielectric materials, according to some implementations. For example, first pad layer 602a may have silicon nitride, and second pad layer 602b may have high-k dielectric, such as $Al_2O_3$, or vice versa. As described below with respect to the self-aligned gate process, first pad layer 602a may serve as the stop layer for removing the substrate on which semiconductor body 630 is formed to expose the lower end of semiconductor body 630, and second pad layer 602b may be the remainder of the first sacrificial layer for defining gate electrode 634.

Besides having additional second pad layer 602b, the shapes of gate electrode 634 in semiconductor devices 603 and 605 in FIGS. 6C and 6D are different from that in semiconductor devices 600 and 601 in FIGS. 6A and 6B. As shown in FIG. 6C, part of gate electrode 634 (at the bottom portion away from gate dielectric 632) protrudes into second pad layer 602b, according to some implementations. As described below with respect to the self-aligned gate process, the protrusion of gate electrode 634 is formed by replacing part of the second sacrificial layer that protrudes into the remainder of the first sacrificial layer (now second pad layer 602b) with gate electrode 634, according to some implementations. As shown in FIG. 6D, part of dielectric isolation layer 606 (at the bottom portion away from semiconductor body 630) protrudes into second pad layer 602b, according to some implementations. As described below with respect to the self-aligned gate process, the protrusion of dielectric isolation layer 606 is formed by replacing part of the second sacrificial layer that protrudes into the remainder of the first sacrificial layer (now second pad layer 602b) with dielectric isolation layer 606, according to some implementations. It is understood that in some examples, gate electrode 634 and dielectric isolation layer 606 may not have the protrusion, and the top surface of second pad layer 602b may be flat.

FIGS. 8A-8N illustrate a fabrication process for forming a semiconductor device including vertical transistors, according to some aspects of the present disclosure. FIGS. 9A-9D illustrate a fabrication process for forming another semiconductor device including vertical transistors, according to some aspects of the present disclosure. FIGS. 10A-10F illustrate a fabrication process for forming still another semiconductor device including vertical transistors, according to some aspects of the present disclosure. FIG. 11A illustrates a flowchart of a method 1100 for forming a semiconductor device including vertical transistors, according to some aspects of the present disclosure. FIG. 11B illustrates a flowchart of another method 1101 for forming another semiconductor device including vertical transistors, according to some aspects of the present disclosure. Examples of the semiconductor devices depicted in FIGS. 8A-8N include semiconductor device 600 depicted in FIG. 6A. Examples of the semiconductor device depicted in FIGS. 9A-9D include semiconductor device 601 depicted in FIG. 6B. Examples of the semiconductor device depicted in FIGS. 10A-10F include semiconductor device 603 depicted in FIG. 6C. FIGS. 8A-8N, 9A-9D, 10A-10F, 11A, and 11B will be described together. It is understood that the operations shown in methods 1100 and 1101 are not exhaustive and that other operations can be performed as well before, after, or between any of the illustrated operations. Further, some of the operations may be performed simultaneously, or in a different order than shown in FIGS. 11A and 11B.

Referring to FIGS. 11A and 11B, methods 1100 and 1101 start at operation 1102, in which a semiconductor body of a vertical transistor extending in a first direction on a substrate is formed. The substrate can be a silicon substrate.

As illustrated in FIG. 8A, a plurality of parallel semiconductor walls 805 are formed in the y-direction (the bit line direction). To form semiconductor walls 805, a plurality of parallel trenches are formed in a silicon substrate 802 in the y-direction. In some implementations, a lithography process is performed to pattern the trenches and semiconductor walls 805 using an etch mask 804 (e.g., a photoresist mask and/or a hard mask), for example, based on the design of bit lines, and one or more dry etching and/or wet etching processes, such as reactive ion etching (RIE), are performed to etch the trenches in silicon substrate 802. Thus, semiconductor wall 805 extending in the vertical direction on silicon substrate 802 can be formed. Since semiconductor walls 805 are formed by etching silicon substrate 802, semiconductor walls 805 can have the same material as silicon substrate 802, such as single crystalline silicon. FIG. 8A illustrates both the side view (in the bottom portion of FIG. 8A) of a cross-section along the x-direction (the word line direction, e.g., in the AA plane) and the plan view (in the top portion of FIG. 8A) of a cross-section in the x-y plane (e.g., in the BB plane through semiconductor walls 805).

As illustrated in FIG. 8A, trench isolations 808 are formed in the trenches. In some implementations, a dielectric, such as silicon oxide and/or silicon nitride, is deposited to fully fill the trenches using one or more thin film deposition processes including, but not limited to, chemical vapor deposition (CVD), physical vapor deposition (PVD), atomic layer deposition (ALD), or any combination thereof. In some implementations, a planarization process, such as chemical mechanical polishing (CMP), is performed to remove excess dielectric deposited beyond the top surface of etch mask 804. As a result, parallel semiconductor walls 805 can be separated by trench isolations 808. It is understood that in some examples, before depositing trench isolations 808, a liner layer (e.g., a native oxide layer, not shown) may be formed on the sidewalls of semiconductor walls 805 to cure the defects on the sidewalls of semiconductor walls 805 caused by the etching process.

As illustrated in FIG. 8B, a plurality of parallel trenches 810 are formed each extending in the x-direction (the word line direction) to form an array of semiconductor bodies 806 each extending in the vertical direction on silicon substrate 802. In some implementations, a lithography process is performed to pattern trenches 810 to be perpendicular to trench isolations 808 using an etch mask (e.g., a photoresist mask and/or a hard mask), for example, based on the design of word lines, and one or more dry etching and/or wet etching processes, such as RIE, are performed on silicon substrate 802 and trench isolation 808 to etch trenches 810 in silicon substrate 802. As a result, semiconductor walls 805 (shown in FIG. 8A) can be cut by trenches 810 to form an array of semiconductor bodies 806 each extending vertically on silicon substrate 802. Since semiconductor bodies 806 are formed by etching silicon substrate 802, semiconductor bodies 806 can have the same material as silicon substrate 802, such as single crystalline silicon. FIG. 8B illustrates both the side view (in the bottom portion of FIG. 8B) of a cross-section along the y-direction (the bit line direction, e.g., in the AA plane through semiconductor bodies 806) and the plan view (in the top portion of FIG. 8B) of a cross-section in the x-y plane (e.g., in the BB plane through semiconductor bodies 806).

Methods 1100 and 1101 proceed to operation 1104, as illustrated in FIGS. 11A and 11*n*, in which a pad layer is formed on top of the substrate. In some implementations, a liner layer is formed on the sidewalls of the semiconductor body prior to forming the pad layer.

As illustrated in FIG. 8C, a liner layer 811 is formed on the top surface and the sidewalls of semiconductor body 806. Liner layer 811 can be a native oxide layer of semiconductor body 806 having single crystalline silicon, for example, grown using thermal oxidation (e.g., in situ steam generation (ISSG) oxidation), which can cure the defects on the surfaces of semiconductor body 806 caused by the etching processes. A pad layer 812 can be formed on top of silicon substrate 802, at the bottom of trench 810, for example, by depositing a dielectric, such as silicon nitride and/or high-k dielectrics (e.g., $Al_2O_3$), to partially fill trench 810, using one or more thin film deposition processes including, but not limited to, CVD, PVD, ALD, or any combination thereof. In some implementations, pad layer 812 has silicon nitride. The deposition conditions, such as deposition rate and/or time, can be controlled to control the thickness of pad layer 812 and avoid fully filling trench 810. As a result, the bottom surface of trench 810 can be elevated to be above the bottom surface of semiconductor body 806. As described below in detail, since pad layer 812 is used as the stop layer in removing silicon substrate 802 and to form the step between semiconductor body 806 and the gate electrode later, the thickness (the dimension in the vertical direction) of pad layer 812 can be determined based on the step and/or the substrate removing process. In some implementations, the thickness of pad layer 812 is between 10 nm and 500 nm, such as between 50 nm and 150 nm (e.g., 50 nm, 60 nm, 70 nm, 80 nm, 90 nm, 100 nm, 110 nm, 120 nm, 130 nm, 140 nm, 150 nm, any range bounded by the lower end by any of these values, or in any range defined by any two of these values).

FIG. 8C illustrates both the side view (in the bottom portion of FIG. 8C) of a cross-section along the y-direction (the bit line direction, e.g., in the AA plane through semiconductor bodies 806) and the plan view (in the top portion of FIG. 8C) of a cross-section in the x-y plane (e.g., in the BB plane through semiconductor bodies 806 and pad layer 812). As shown in the side view, the two opposite sides of semiconductor body 806 in the y-direction are partially exposed by trenches 810 (not considering liner layer 811); as shown in the plan view, the other two opposite sides of semiconductor body 806 in the x-direction are in contact with trench isolations 808. In other words, semiconductor body 806 is surrounded by trenches 810 and trench isolations 808.

Methods 1100 and 1101 proceed to operation 1106, as illustrated in FIGS. 11A and 11B, in which a first sacrificial layer is formed on a first side of the semiconductor body. In some implementations, another first sacrificial layer is formed on a second side of the semiconductor body opposite the first side. The first sacrificial layers can be formed on top of the pad layer.

As illustrated in FIG. 8D, sacrificial layers 815 are formed on the sidewalls and the top surfaces of semiconductor body 806. For each semiconductor body 806, two sacrificial layers 815 can be formed on the two opposite sides of each semiconductor body 806 in the bit line direction (they-direction), as shown in the plan view. As shown in the side view, sacrificial layers 815 can be a continuous layer in the bit line direction as sacrificial layers 815 can be deposited over the top surfaces of semiconductor bodies 806 and the bottom surfaces of trenches 810 as well. In some implementations, sacrificial layers 815 are formed by depositing one or more materials that are different from the materials of pad layers 812 and liner layers 811 over pad layers 812 and liner layers 811 using one or more thin film deposition processes including, but not limited to, CVD, PVD, ALD, or any combination thereof, to partially fill trenches 810. For example, a high-k dielectric, such as $Al_2O_3$, may be deposited to form sacrificial layers 815 over pad layers 812 having silicon nitride and liner layers 811 having silicon oxide. FIG. 8D illustrates both the side view (in the bottom portion of FIG. 8D) of a cross-section along the y-direction (the bit line direction, e.g., in the AA plane through semiconductor bodies 806) and the plan view (in the top portion of FIG. 8D) of a cross-section in the x-y plane (e.g., in the BB plane through semiconductor bodies 806 and sacrificial layers 815).

In some implementations, the first sacrificial layers formed on the first and second sides of the semiconductor body are separated from one another. As illustrated in FIG. 8E, parts of sacrificial layers 815 that are formed over the top surfaces of semiconductor bodies 806 and the bottom surfaces of trenches 810 are removed, leaving sacrificial layers 815 formed only on the sidewalls of semiconductor bodies 806 in the bit line direction. That is, parts of sacrificial layers 815 at the bottom surfaces of trenches 810 can be removed to separate the continuous layer into discrete pieces in the bit line direction. Thus, two sacrificial layers 815 on the two opposite sides of each semiconductor body 806 in the bit line direction can be separated from one another. In some implementations, parts of sacrificial layers 815 that are formed over the bottom surfaces of trenches 810 are removed by a dry etching process, such as RIE, and parts sacrificial layers 815 that are formed over the top surfaces of semiconductor bodies 806 are removed by the same dry etching process and/or a planarization process, such as CMP.

Methods 1100 and 1101 proceed to operation 1108, as illustrated in FIGS. 11A and 11B, in which a second sacrificial layer is formed on a side of the first sacrificial layer. In some implementations, another second sacrificial layer is formed on a side of the another first sacrificial layer. The second sacrificial layers can be formed on top of the pad layer.

As illustrated in FIG. 8E, sacrificial layers 817 are formed on the sidewalls of sacrificial layers 815 to fill trenches 810 (shown in FIG. 8D). Each sacrificial layer 817 can be a continuous layer in the word line direction and surrounded by sacrificial layer 815, as shown in the plan view. In some implementations, sacrificial layers 817 are formed by depositing one or more materials that are different from the materials of pad layers 812 and sacrificial layers 815 over pad layers 812 and sacrificial layers 815 using one or more thin film deposition processes including, but not limited to, CVD, PVD, ALD, or any combination thereof, to fully fill trenches 810. For example, polysilicon may be deposited to form sacrificial layers 817 over pad layers 812 having silicon nitride and sacrificial layers 815 having a high-k dielectric (e.g., $Al_2O_3$). Similar to sacrificial layers 815, any excess materials of sacrificial layers 817 over the top surfaces of semiconductor bodies 806 and sacrificial layers 815 can be removed by a dry etching process, such as RIE, and/or a planarization process, such as CMP, to separate sacrificial layers 817 into discrete pieces in the bit line direction. Thus, for each semiconductor body 806, a pair of sacrificial layers 815 and 817 are sequentially formed on one side in the bit line direction, and another pair of sacrificial layers 815 and 817 are sequentially formed on the opposite side in the bit line direction, according to some implementations. FIG. 8E illustrates both the side view (in the bottom portion of FIG. 8E) of a cross-section along the y-direction (the bit line direction, e.g., in the AA plane through semiconductor bodies 806) and the plan view (in the top portion of FIG. 8E) of a cross-section in the x-y plane (e.g., in the BB plane through semiconductor bodies 806 and sacrificial layers 815 and 817).

After operation 1108, a pair of sacrificial layers 815 and 817, along with pad layer 812, are formed to define the gate structure to be formed for semiconductor body 806 in the so-called "self-aligned gate process" disclosed herein. Methods 1100 and 1101 diverge after operation 1108 according to two self-aligned gate processes that form "thick gate" and "thin gate," respectively.

According to some aspects of the present disclosure, to form "thick gate," after operation 1108, method 1100 proceeds to operation 1110, as illustrated in FIG. 11A, in which the second sacrificial layer and at least part of the first sacrificial layer are replaced with a gate structure of the vertical transistor. In some implementations, to replace the second sacrificial layer and at least part of the first sacrificial layer with the gate structure, the at least part of the first sacrificial layers is removed to expose the first side of the semiconductor body, the second sacrificial layer is removed, a gate dielectric of the gate structure is formed on the exposed first side of the semiconductor body after removing the second sacrificial layer, and a gate electrode of the gate structure is formed on a side of the gate dielectric.

Prior to replacing the second sacrificial layer and the at least part of the first sacrificial layer with the gate structure, the another first sacrificial layer can be first replaced with a dielectric isolation layer. In some implementations, to replace the another first sacrificial layer with the dielectric isolation layer, the another one of the first sacrificial layers is removed to expose the second side of the semiconductor body, and the dielectric isolation layer is formed on the exposed second side of the semiconductor body.

Figure 8F:
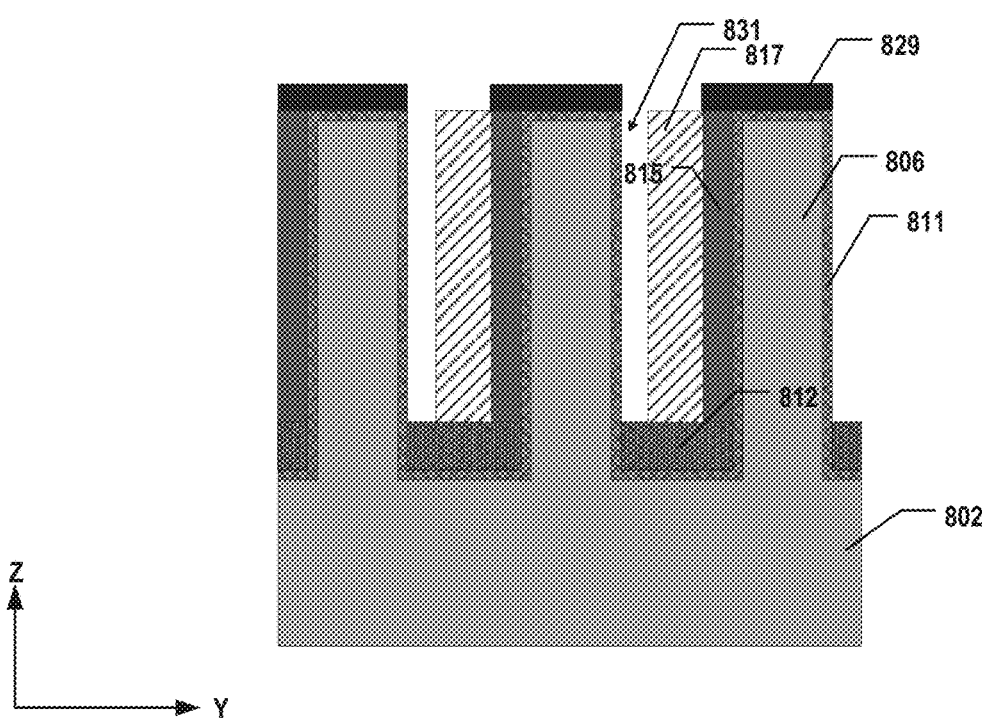
FIGS. 8A-8N illustrate a fabrication process for forming a semiconductor device including vertical transistors, according to some aspects of the present disclosure.

As illustrated in FIG. 8F, sacrificial layers 815 on one side of semiconductor bodies 806 in the bit line direction where the gate structures are not to be formed (shown in FIG. 8E) are removed to form trenches 831, exposing the opposite side of semiconductor bodies 806 where the gate structures are not to be formed. To remove sacrificial layer 815, a lithography process, such as self-aligned double patterning (SADP) or self-aligned quadruple patterning (SAQP), can be performed to pattern trenches 831 using an etch mask 829 (e.g., a photoresist mask and/or a hard mask), which exposes sacrificial layers 815 on one side of semiconductor bodies 806 in the bit line direction where the gate structures are not to be formed, but covers and protects sacrificial layers 815 on the other side of semiconductor bodies 806 in the bit line direction where the gate structures are to be formed, as shown in FIG. 8F. Then, one or more selective etching processes, such as wet etching, can be performed through etch mask 829 to etch away only sacrificial layers 815 on one side of semiconductor bodies 806 in the bit line direction where the gate structures are not to be formed, leaving sacrificial layers 815 on the opposite side of semiconductor bodies 806 intact. The etchant can have a relatively high selectivity (e.g., greater than 5 times) of sacrificial layers 815 with respect to sacrificial layers 817 and liner layers 811, thereby leaving sacrificial layers 817 and liner layers 811 intact as well, even without the protection of etch mask 829. For example, etchants having phosphoric acid ($H_3PO_4$) may be used to selectively remove sacrificial layers 815 having $Al_2O_3$, without removing sacrificial layers 817 having polysilicon and liner layers 811 having silicon oxide.

Figure 8G:
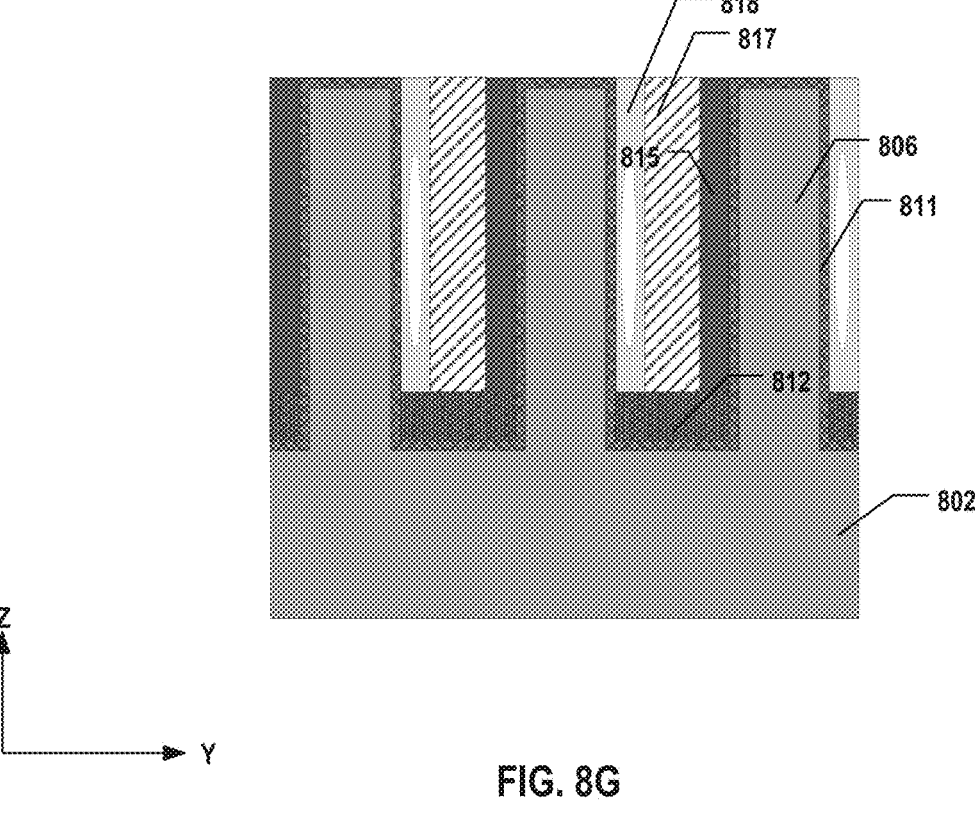

As illustrated in FIG. 8G, dielectric isolation layers 818 are formed on the exposed side of semiconductor bodies 806 where sacrificial layers 815 are selectively removed. To form dielectric isolation layers 818, dielectric material(s), such as silicon oxide, are deposited using one or more thin film deposition processes including, but not limited to, CVD, PVD, ALD, or any combination thereof, to fill trenches 831 (shown in FIG. 8F). Depending on the lateral dimensions of trenches 831, trenches 831 may not be fully filled with the deposited dielectric material(s) (e.g., silicon oxide) when forming dielectric isolation layers 818 and thus, become air gaps therein according to the self-aligned gate process for forming "thick gate," as shown in FIG. 8G. It is understood that in some examples, when the lateral dimensions of trenches 831 are sufficiently large, dielectric material(s) may fully fill trenches 831 during the formation of dielectric isolation layers 818, thereby eliminating the air gaps.

Figure 8H:
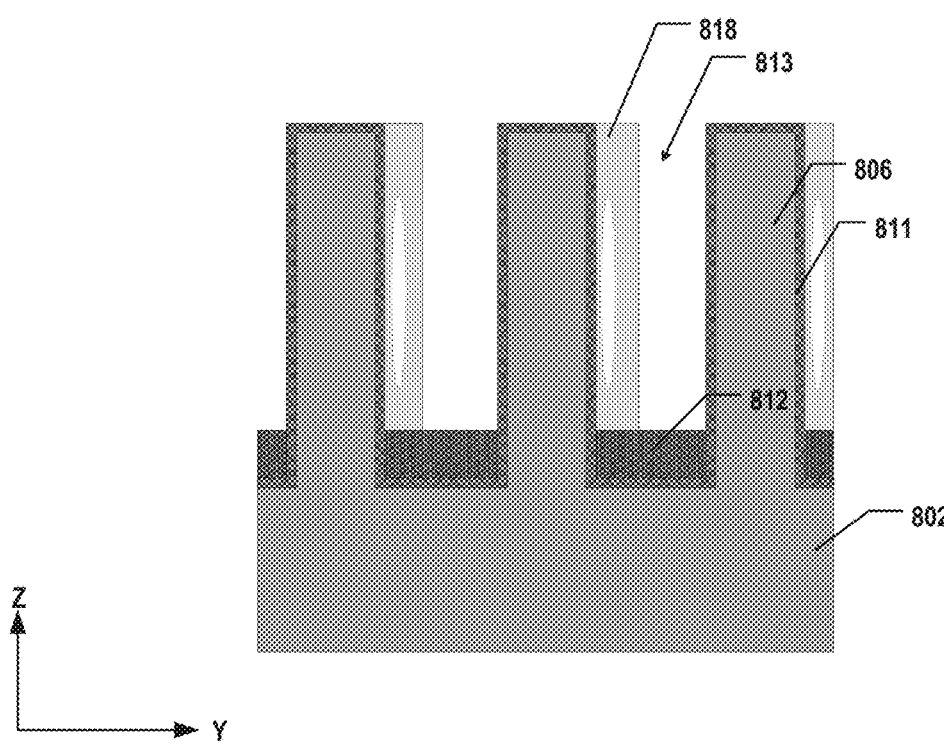

As illustrated in FIG. 8H, sacrificial layers 817 and remaining sacrificial layers 815 are selectively removed to form trenches 813, exposing the side of semiconductor bodies 806 where the gate structures are to be formed. Selective etching processes, such as wet etching, can be sequentially performed to etch away sacrificial layers 817 and the remaining sacrificial layers 815. The first etchant can have a relatively high selectivity (e.g., greater than 5 times) of sacrificial layers 817 with respect to dielectric isolation layers 818 and liner layers 811, and the second etchant can have a relatively high selectivity (e.g., greater than 5 times) of sacrificial layers 815 with respect to dielectric isolation layers 818 and liner layers 811, thereby leaving dielectric isolation layers 818 and liner layers 811 intact. For example, the first etchant having potassium hydroxide (KOH) may be used to selectively remove sacrificial layers 817 having polysilicon, and the second etchant having phosphoric acid ($H_3PO_4$) may be used to selectively remove sacrificial layers 815 having $Al_2O_3$, without removing dielectric isolation layers 818 and liner layers 811 both having silicon oxide. As shown in FIG. 8H, pad layers 812 can remain after removing sacrificial layers 815 and 817.

Figure 8I:
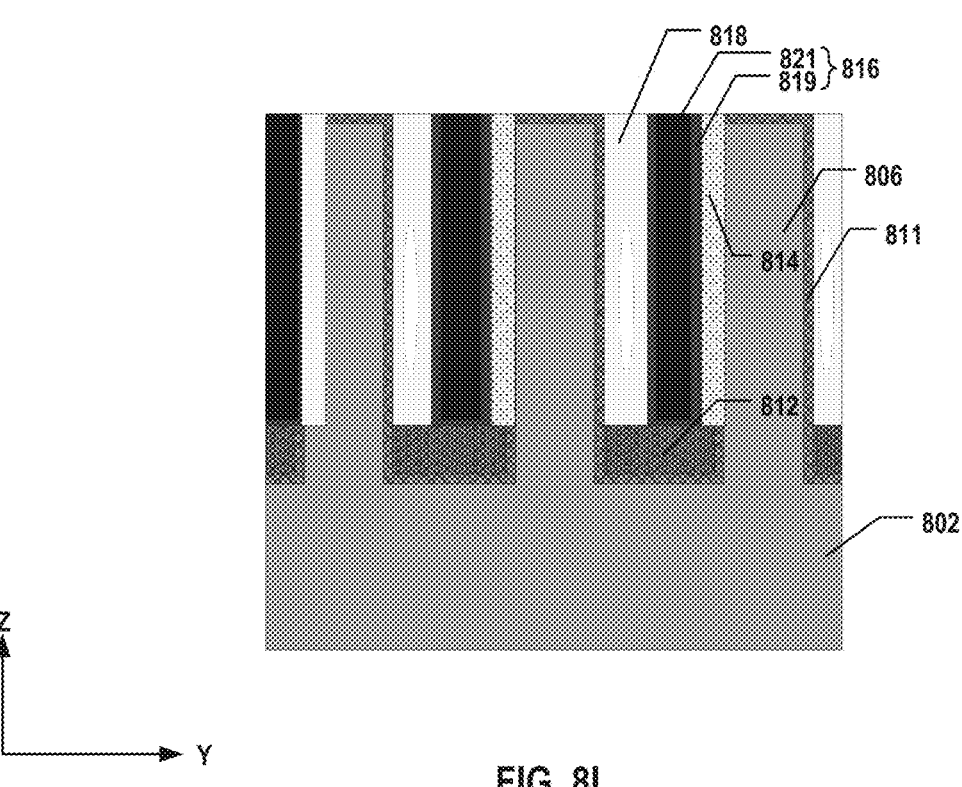

As illustrated in FIG. 8I, gate dielectrics 814 are formed on the exposed side of semiconductor bodies 806 in trenches 813 (shown in FIG. 8H). Gate dielectrics 814 are not formed on the opposite side of semiconductor bodies 806 in the bit line direction where dielectric isolation layers 818 are formed, according to some implementations. In some implementations, gate dielectrics 814 are formed by depositing a layer of dielectric, such as silicon oxide, over the exposed sidewall of semiconductor bodies 806 using one or more thin film deposition processes including, but not limited to, CVD, PVD, ALD, or any combination thereof, without fully filling trenches 813. It is understood that in some examples, gate dielectrics 814 may not be parts of a continuous dielectric layer. For example, a thermal oxidation process, such as ISSG oxidation, is performed to further grow native oxide (e.g., silicon oxide) on semiconductor bodies 806 (e.g., single crystalline silicon) from liner layer 811 to become gate dielectric 814. It is also understood that since gate dielectrics 814 and liner layers 811 may have the same materials, such as silicon oxide, the interface and boundary between gate dielectrics 814 and liner layers 811 may become indistinguishable. Thus, for ease of description, liner layers 811 that are in contact with gate dielectrics 814 may be illustrated as part of gate dielectrics 814 in the present disclosure, for example, as shown in FIG. 8I.

As illustrated in FIG. 8I, gate electrodes 816 are formed on the side of gate dielectrics 814 in trenches 813 (shown in FIG. 8H). Gate electrode 816 can be formed between gate dielectric 814 and dielectric isolation layer 818 in the bit line direction to fill trench 813. In some implementations, gate electrode 816 includes a gate conductor 821 and a barrier layer 819 surrounding gate conductor 821. In some implementations, gate electrodes 816 are formed by depositing one or more layers of conductive layers, such as metals or metal compounds, over the exposed sidewall of gate dielectrics 814 using one or more thin film deposition processes including, but not limited to, CVD, PVD, ALD, or any combination thereof, fully filling trenches 813. For example, a layer of TiN and a layer of W may be sequentially deposited into trench 813 to form barrier layer 819 having TiN and gate conductor 821 having W, respectively. That is, the self-aligned gate process disclosed herein can allow the later deposited gate conductor 821 to be surrounded by the first deposited barrier layer 819 when filling trench 813.

As illustrated in FIG. 8J, a top portion of gate electrode 816 is replaced with a dielectric plug 840, making the top end of gate electrode 816 below the top end of semiconductor body 806. To form dielectric plug 840, gate electrode 816 can be etched back (recessed) from the top by wet etching and/or drying etching, such that the upper end of gate electrode 816 becomes below the top surface of semiconductor body 806, and the resulting recess can be filled with dielectric plug 840 by depositing dielectrics, such as silicon oxide, using one or more thin film deposition processes including, but not limited to, CVD, PVD, ALD, or any combination thereof. It is understood that since dielectric isolation layer 818 and dielectric plug 840 may have the same materials, such as silicon oxide, the interface and boundary between dielectric isolation layer 818 and dielectric plug 840 may become indistinguishable. The remainder of gate electrode 816 (referring to hereafter as "gate electrode 816" for ease of description) and gate dielectric 814 in contact with gate electrode 816 become a gate structure 855 coupled to one side of semiconductor body 806 in the bit line direction, according to some implementations, as shown in FIG. 8J. FIG. 8J illustrates both the side view (in the bottom portion of FIG. 8J) of a cross-section along the y-direction (the bit line direction, e.g., in the AA plane through semiconductor bodies 806) and the plan view (in the top portion of FIG. 8J) of a cross-section in the x-y plane (e.g., in the BB plane through semiconductor bodies 806, gate electrodes 816, and gate dielectrics 814).

Comparing FIGS. 8E and 8J, sacrificial layer 817 and sacrificial layer 815 that is on one side of semiconductor body 806 are replaced with gate structure 855, and sacrificial layer 815 that is on the opposite side of semiconductor body 806 is replaced with dielectric isolation layer 818, according to some implementations. For example, sacrificial layers 817 and sacrificial layers 815 may be removed to form a continuous trench between adjacent rows of semiconductor bodies 806 in the bit line direction in the plan view, and the continuous trench may be filled with a continuous conductive layer (e.g., having gate electrodes 816) sandwiched between two continuous dielectric layers (e.g., having gate dielectrics 814 and dielectric isolation layers 818) in the bit line direction, as shown in the plan view of FIG. 8J. As shown in the side view of FIG. 8J, gate electrode 816, gate dielectric 814, and dielectric isolation layer 818 can be formed on top of pad layer 812. That is, pad layer 812 and sacrificial layers 815 and 817 are used to define the shape, position, and dimensions of gate structure 855 according to the self-aligned gate process. Specifically, the shape, position, and dimensions of gate electrode 816 can be further defined by dielectric plug 840 as well. As a result, the various issues associated with the gate process described above, such as the nonuniformity of the gate structure, the challenging bottom punch process, and the F attack, can be addressed by the self-aligned gate process disclosed herein.

As illustrated in FIG. 8J, the exposed top end (e.g., the end away from silicon substrate 802 in the vertical direction) of semiconductor body 806 is doped to form a drain or a source 824 (referrer to hereinafter as "source/drain 824") of the vertical transistor. For example, source/drain 824 may be the source terminal of the vertical transistor. In some implementations, an implantation process and/or thermal diffusion process are performed to dope P-type dopants or N-type dopants to exposed upper ends of semiconductor bodies 806 to form sources/drains 824. In some implementations, a silicide layer is formed on source/drain 824 by performing a silicidation process at the exposed upper ends of semiconductor bodies 806.

According to some aspects of the present disclosure, to form "thin gate," after operation 1108, method 1101 proceeds to operation 1109, as illustrated in FIG. 11B, in which at least part of the first sacrificial layer is replaced with a gate structure of the vertical transistor. The gate structure can be coupled to one side of the semiconductor body. In some implementations, to replace the at least part of the first sacrificial layer with the gate structure, the at least part of the first sacrificial layers is removed to expose the first side of the semiconductor body, a gate dielectric of the gate structure is formed on the exposed first side of the semiconductor body, and a gate electrode of the gate structure is formed on a side of the gate dielectric.

Figure 9A:
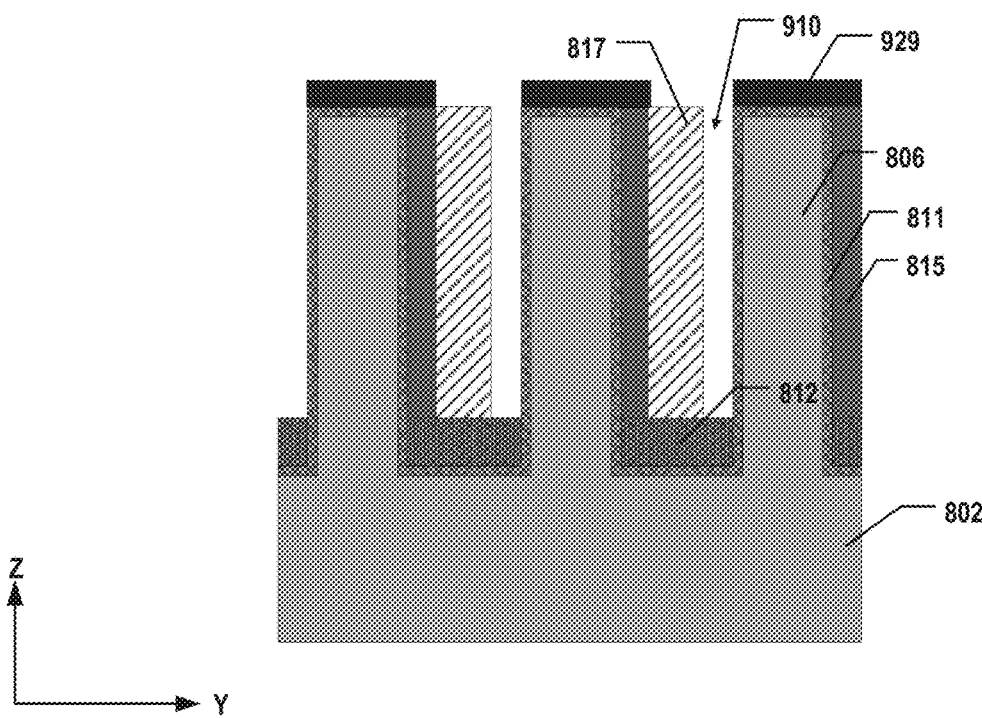
FIGS. 9A-9D illustrate a fabrication process for forming another semiconductor device including vertical transistors, according to some aspects of the present disclosure.

As illustrated in FIG. 9A, sacrificial layers 815 on one side of semiconductor bodies 806 in the bit line direction where the gate structures are to be formed (shown in FIG. 8E) are removed to form trenches 910, exposing the side of semiconductor bodies 806 where the gate structures are to be formed. To remove sacrificial layer 815, a lithography process, such as SADP or SAQP, can be performed to pattern trenches 910 using an etch mask 929 (e.g., a photoresist mask and/or a hard mask), which exposes sacrificial layers 815 on one side of semiconductor bodies 806 in the bit line direction where the gate structures are to be formed, but covers and protects sacrificial layers 815 on the other side of semiconductor bodies 806 in the bit line direction where the gate structures are not to be formed, as shown in FIG. 9A. Then, one or more selective etching processes, such as wet etching, can be performed through etch mask 929 to etch away only sacrificial layers 815 on one side of semiconductor bodies 806 in the bit line direction where the gate structures are to be formed, leaving sacrificial layers 815 on the opposite side of semiconductor bodies 806 intact. The etchant can have a relatively high selectivity (e.g., greater than 5 times) of sacrificial layers 815 with respect to sacrificial layers 817 and liner layers 811, thereby leaving sacrificial layers 817 and liner layers 811 intact as well, even without the protection of etch mask 929. For example, etchants having phosphoric acid ($H_3PO_4$) may be used to selectively remove sacrificial layers 815 having $Al_2O_3$, without removing sacrificial layers 817 having polysilicon and liner layers 811 having silicon oxide.

Figure 9B:
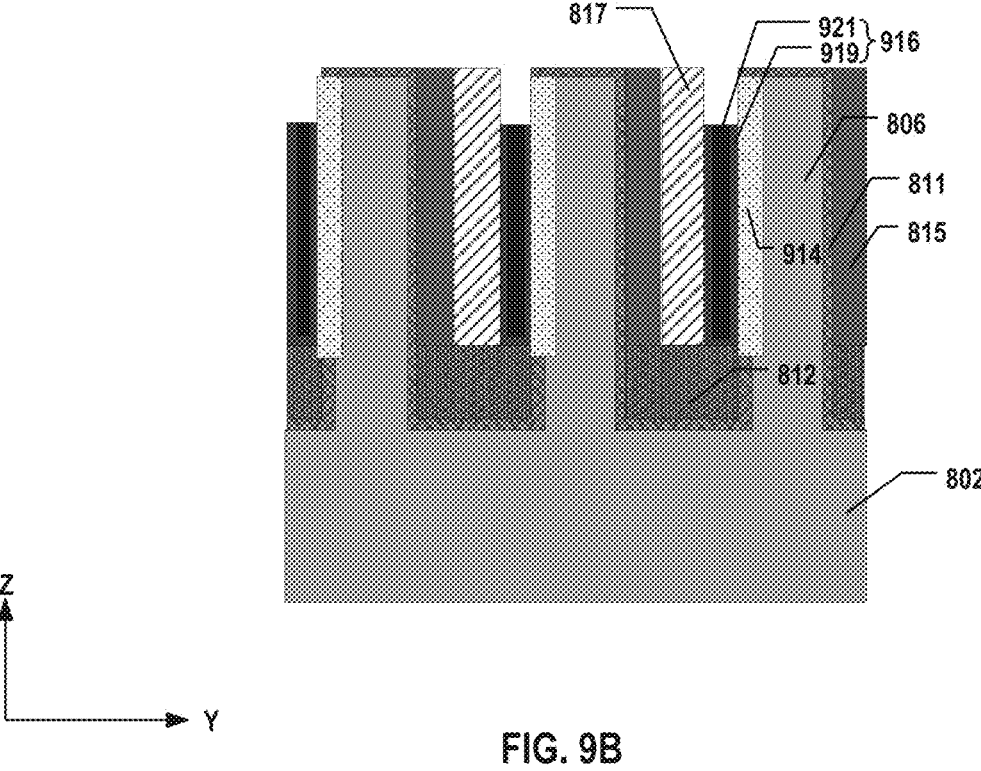

As illustrated in FIG. 9B, gate dielectrics 914 are formed on the exposed side of semiconductor bodies 806 in trenches 910 (shown in FIG. 9A). Gate dielectrics 914 are not formed on the opposite side of semiconductor bodies 806 in the bit line direction, according to some implementations. In some implementations, gate dielectrics 914 are formed by depositing a layer of dielectric, such as silicon oxide, over the exposed sidewall of semiconductor bodies 806 using one or more thin film deposition processes including, but not limited to, CVD, PVD, ALD, or any combination thereof, without fully filling trenches 910. It is understood that in some examples, gate dielectrics 914 may not be parts of a continuous dielectric layer. For example, a thermal oxidation process, such as ISSG oxidation, is performed to further grow native oxide (e.g., silicon oxide) on semiconductor bodies 806 (e.g., single crystalline silicon) from liner layer 811 to become gate dielectric 914. It is also understood that since gate dielectrics 914 and liner layers 811 may have the same materials, such as silicon oxide, the interface and boundary between gate dielectrics 914 and liner layers 811 may become indistinguishable. Thus, for ease of description, liner layers 811 that are in contact with gate dielectrics 914 may be illustrated as part of gate dielectrics 914 in the present disclosure, for example, as shown in FIG. 9B.

As illustrated in FIG. 9B, gate electrodes 916 are formed on the side of gate dielectrics 914 in trenches 910 (shown in FIG. 9A). Gate electrode 916 can be formed between gate dielectric 914 and sacrificial layer 817 in the bit line direction to fill trench 910. In some implementations, gate electrode 916 includes a gate conductor 921 and a barrier layer 919 surrounding gate conductor 921. In some implementations, gate electrodes 916 are formed by depositing one or more layers of conductive layers, such as metals or metal compounds, over the exposed sidewall of gate dielectrics 914 using one or more thin film deposition processes including, but not limited to, CVD, PVD, ALD, or any combination thereof, fully filling trenches 910. For example, a layer of TiN and a layer of W may be sequentially deposited into trench 910 to form barrier layer 919 having TiN and gate conductor 921 having W, respectively. That is, the self-aligned gate process disclosed herein can allow the later deposited gate conductor 921 to be surrounded by the first deposited barrier layer 919 when filling trench 910.

As illustrated in FIG. 9B, a top portion of gate electrode 916 is etched back, making the top end of gate electrode 916 below the top end of semiconductor body 806. Gate electrode 816 can be etched back (recessed) from the top by wet etching and/or drying etching, such that the upper end of gate electrode 916 becomes below the top surface of semiconductor body 806. The remainder of gate electrode 916 (referring to hereafter as "gate electrode 916" for ease of description) and gate dielectric 914 in contact with gate electrode 916 become a gate structure coupled to one side of semiconductor body 806 in the bit line direction, according to some implementations, as shown in FIG. 9B.

Method 1101 proceeds to operation 1111, as illustrated in FIG. 11B, in which the second sacrificial layer is replaced with a dielectric isolation layer after replacing the at least part of the first sacrificial layer with the gate structure of the vertical transistor. In some implementations, to replace the second sacrificial layer with the dielectric isolation layer, the second sacrificial layer is removed to expose one side of the gate structure, and the dielectric isolation layer is formed on the exposed side of the gate structure. In some implementations, to replace the second sacrificial layer with the dielectric isolation layer, the second sacrificial layer and the another first and second sacrificial layers are replaced with the dielectric isolation layer.

Figure 9C:
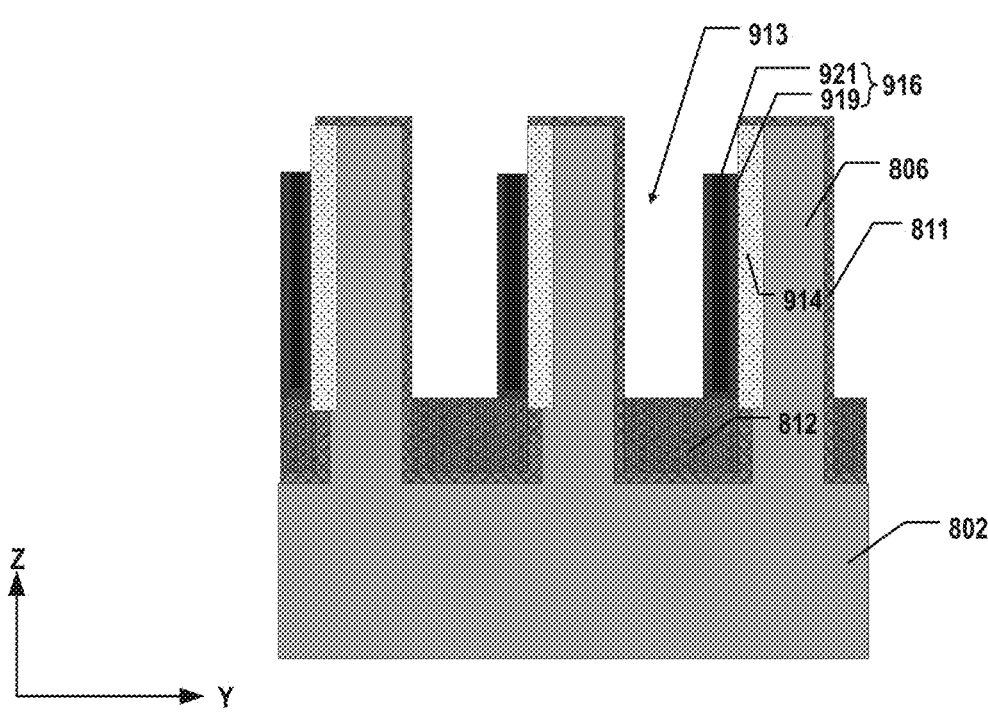

As illustrated in FIG. 9C, sacrificial layer 817 and sacrificial layer 815 that is on one side of semiconductor body 806 in the bit line direction where the gate structure is not to be formed (shown in FIG. 8E) are selectively removed to form trenches 913, exposing the opposite side of semiconductor body 806 where the gate structure is not to be formed and one side of gate electrode 916. Selective etching processes, such as wet etching, can be sequentially performed to etch away sacrificial layers 817 and the remaining sacrificial layers 815. The first etchant can have a relatively high selectivity (e.g., greater than 5 times) of sacrificial layers 817 with respect to gate electrodes 916, gate dielectrics 914, and liner layers 811, and the second etchant can have a relatively high selectivity (e.g., greater than 5 times) of sacrificial layers 815 with respect to gate electrodes 916, gate dielectrics 914, and liner layers 811, thereby leaving gate electrodes 916, gate dielectrics 914, and liner layers 811 intact. For example, the first etchant having potassium hydroxide (KOH) may be used to selectively remove sacrificial layers 817 having polysilicon, and the second etchant having phosphoric acid ($H_3PO_4$) may be used to selectively remove sacrificial layers 815 having $Al_2O_3$, without removing gate electrodes 916 having W and TiN and gate dielectrics 914 and liner layers 811 both having silicon oxide. As shown in FIG. 9C, pad layers 812 can be remained after removing sacrificial layers 815 and 817.

Figure 9D:
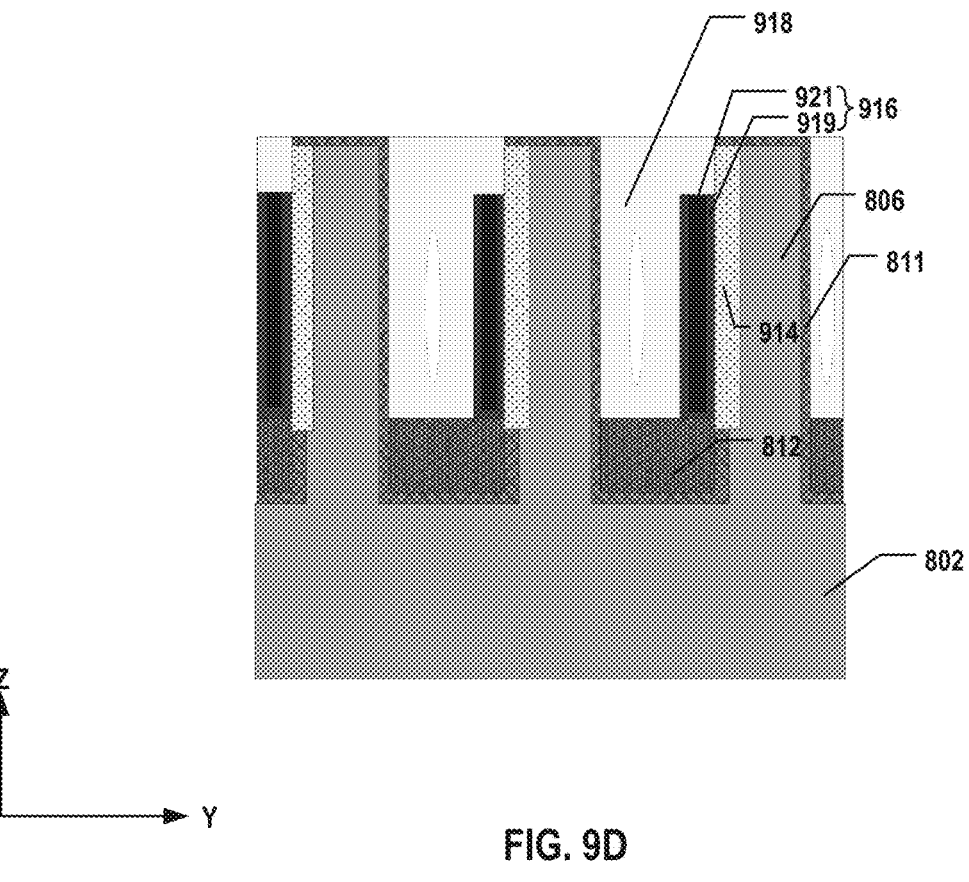

As illustrated in FIG. 9C, dielectric isolation layers 918 are formed on the exposed side of semiconductor bodies 806 where gate dielectrics 914 and gate electrodes 916 are not formed. To form dielectric isolation layers 918, dielectric material(s), such as silicon oxide, are deposited using one or more thin film deposition processes including, but not limited to, CVD, PVD, ALD, or any combination thereof, to fill trenches 913 as well as the recesses above gate electrodes 916 (shown in FIG. 9C). Depending on the lateral dimensions of trenches 913, trenches 913 may not be fully filled with the deposited dielectric material(s) (e.g., silicon oxide) when forming dielectric isolation layers 918 and thus, become air gaps therein according to the self-aligned gate process for forming "thin gate," as shown in FIG. 9D. It is understood that in some examples, when the lateral dimensions of trenches 913 are sufficiently large, dielectric material(s) may fully fill trenches 913 during the formation of dielectric isolation layers 918, thereby eliminating the air gaps.

Comparing FIGS. 8E and 9D, sacrificial layer 815 that is on one side of semiconductor body 806 is replaced with the gate structure having gate electrode 916 and gate dielectric 914, and sacrificial layer 817 and sacrificial layer 815 that is on the opposite side of semiconductor body 806 are replaced with dielectric isolation layer 918, according to some implementations. For example, sacrificial layers 817 and sacrificial layers 815 may be removed to form a continuous trench between adjacent rows of semiconductor bodies 806 in the bit line direction in the plan view, and the continuous trench may be filled with a continuous conductive layer (e.g., having gate electrodes 916) sandwiched between two continuous dielectric layers (e.g., having gate dielectrics 914 and dielectric isolation layers 918) in the bit line direction.

As shown in FIG. 9D, gate electrode 916, gate dielectric 914, and dielectric isolation layer 918 can be formed on top of pad layer 812. That is, pad layer 812 and sacrificial layers 815 and 817 are used to define the shape, position, and dimensions of the gate structure according to the self-aligned gate process. Specifically, the shape, position, and dimensions of gate electrode 916 can be further defined by the etched-back recess as well. As a result, the various issues associated with the gate process described above, such as the nonuniformity of the gate structures, the challenging bottom punch process, and the F attack, can be addressed by the self-aligned gate process disclosed herein.

Methods 1100 and 1101 proceed to operation 1112, as illustrated in FIGS. 11A and 11B, in which the substrate is thinned to expose an end of the semiconductor body. In some implementations, to thin the substrate, a carrier substrate is attached above the vertical transistor and opposite the substrate, and the substrate is polished until being stopped by the pad layer.

Figure 8K:
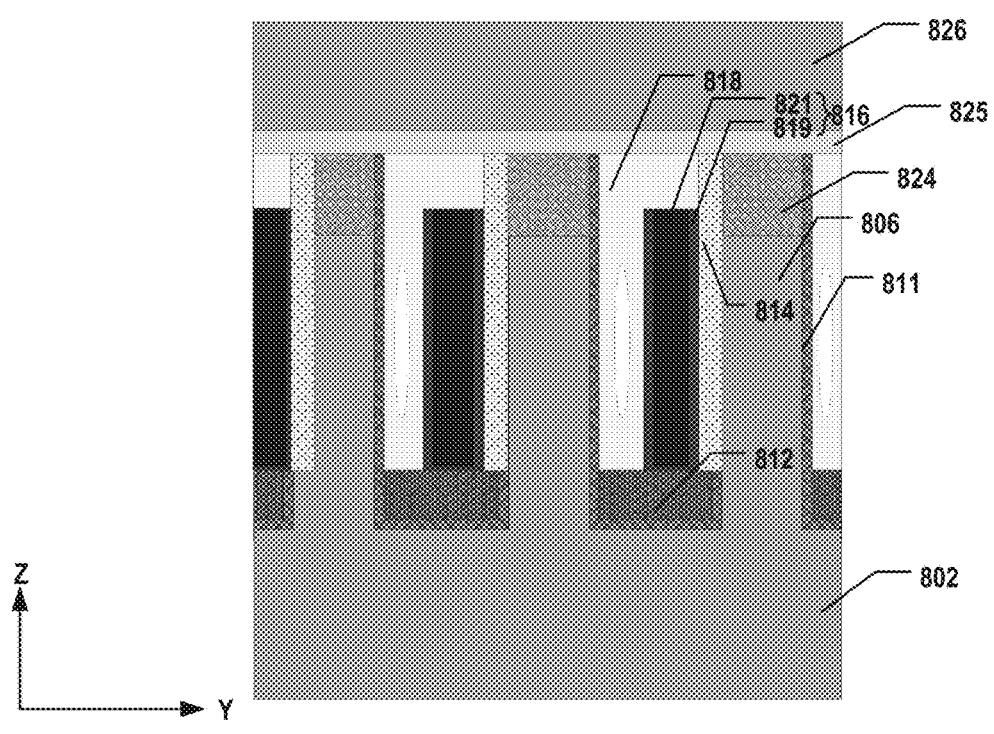

As illustrated in FIG. 8K, a carrier substrate 826 (a.k.a. a handle substrate) is attached above gate structures 855 and semiconductor bodies 806 and opposite silicon substrate 802 using any suitable bonding processes, such as anodic bonding, fusion bonding, transfer bonding, adhesive bonding, and eutectic bonding. In some implementations, a dielectric layer 825 is formed between carrier substrate 826 and silicon substrate 802 prior to attaching carrier substrate 826. The attached structure can then be flipped upside down, such that silicon substrate 802 becomes above carrier substrate 826.

Figure 8L:
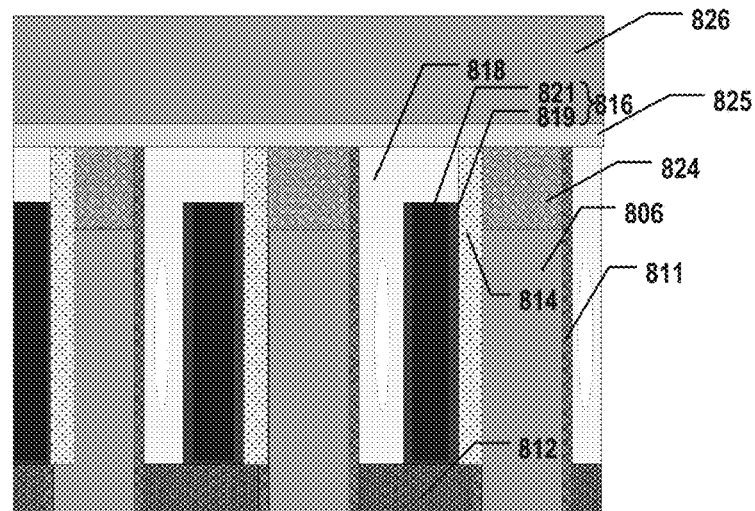

As illustrated in FIG. 8L, silicon substrate 802 (shown in FIG. 8K) is thinned to expose the undoped upper ends of semiconductor bodies 806 (used to be the lower ends before flipping over) that are away from carrier substrate 826. In some implementations, a polishing process (e.g., CMP) is performed to polish silicon substrate 802 from the backside until being stopped by pad layers 812. In other words, pad layers 812 can be used as the stop layers in thinning silicon substrate 802 from the backside. As a result, pad layers 812 and semiconductor bodies 806 are exposed from the backside, according to some implementations.

Methods 1100 and 1101 proceed to operation 1114, as illustrated in FIGS. 11A and 11B, in which the exposed end of the semiconductor body is doped to form a drain or a source of the vertical transistor. As illustrated in FIG. 8M, the exposed bottom end (e.g., the end away from carrier substrate 826 in the vertical direction) of semiconductor body 806 is doped to form another drain or source 836 (referrer to hereinafter as "source/drain 836") of the vertical transistor. For example, source/drain 836 may be the drain terminal of the vertical transistor. In some implementations, an implantation process and/or thermal diffusion process are performed to dope P-type dopants or N-type dopants to exposed lower ends of semiconductor bodies 806 to form sources/drains 836. FIG. 8M illustrates both the side view (in the bottom portion of FIG. 8M) of a cross-section along the y-direction (the bit line direction, e.g., in the AA plane through semiconductor bodies 806) and the plan view (in the top portion of FIG. 8M) of a cross-section in the x-y plane (e.g., in the BB plane through sources/drains 836, liner layers 811, and pad layers 812).

Methods 1100 and 1101 proceed to operation 1116, as illustrated in FIGS. 11A and 11B, in which a bit line adjacent to the exposed end of the semiconductor body and extending in a second direction perpendicular to the first direction is formed. The bit line can be coupled to the drain or the source.

As illustrated in FIG. 8N, a bit line 838 extending in the bit line direction (the y-direction) is formed adjacent to the exposed lower ends of semiconductor bodies 806, being coupled to drains/sources 836. Bit line 838 can be formed by patterning and etching a trench aligned with a column of sources/drains in the bit line direction using lithography and etching processes. The trenches can then be filled by depositing conductive materials, such as metals (e.g., W), using one or more thin film deposition processes including, but not limited to, CVD, PVD, ALD, or any combination thereof. In some implementations, forming bit line 838 includes depositing a metal layer (e.g., W) onto the exposed lower end of semiconductor body 806 to form a metal bit line.

As illustrated in FIG. 8N, ohmic contacts 837 are formed between bit line 838 and sources/drains 836 at the exposed lower ends of semiconductor bodies 806 to couple bit line 838 and sources/drains 836. Ohmic contacts 837 can include metal silicide material, i.e., metal silicide contacts. In some implementations, a metal silicide layer is formed between sources/drains 836 and bit line 838 by performing a silicidation process, for example, rapid thermal annealing (RTA), as ohmic contacts 837 having a metal silicide, such as WSi.

As illustrated in FIG. 8N, a dielectric layer 841 is formed opposing pad layers 812 with bit line 838 positioned between dielectric layer 841 and pad layers 812 in the vertical direction. Bit line contacts 842 in contact with bit line 838 can be formed through dielectric layer 841. In some implementations, dielectric layer 841 having silicon oxide is deposited on bit line 838 using one or more thin film deposition processes including, but not limited to, CVD, PVD, ALD, or any combination thereof. Bit line contacts 842 can then be formed through dielectric layer 841 and coupled to bit line 838 by first patterning contact holes through dielectric layer 841 using a patterning process (e.g., photolithography and dry/wet etch of dielectric materials in dielectric layer 841). The contact holes can be filled with conductive materials (e.g., W, TiN, and/or Cu) to form bit line contacts 842.

In the self-aligned gate processes described above with respect to FIGS. 8A-8N and FIGS. 9A-9D, sacrificial layers 815 are fully removed and are replaced with gate structures and dielectric isolation layers and thus, no longer exist in the final semiconductor devices. According to some aspects of the present disclosure, parts of sacrificial layers 815 can remain in the final products without being replaced with the gate structures or dielectric isolation layers, for example, as second pad layers 602*b* of semiconductor device 603 in FIG. 6C, using another self-aligned gate process described below with respect to FIGS. 10A-10F.

Figure 10A:
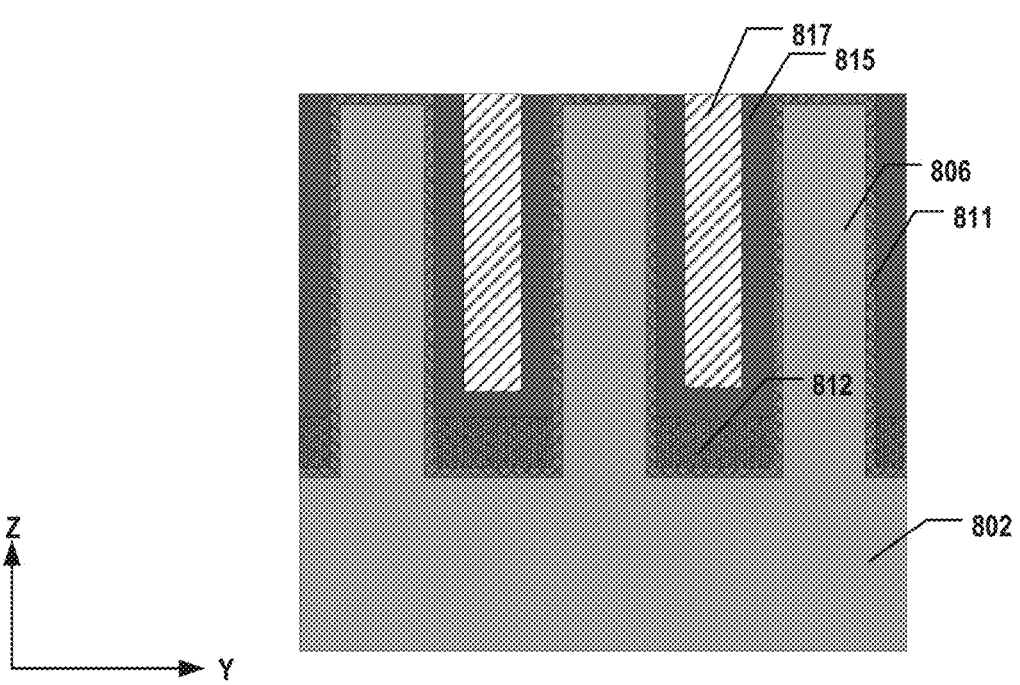
FIGS. 10A-10F illustrate a fabrication process for forming still another semiconductor device including vertical transistors, according to some aspects of the present disclosure.
Figure 11A:
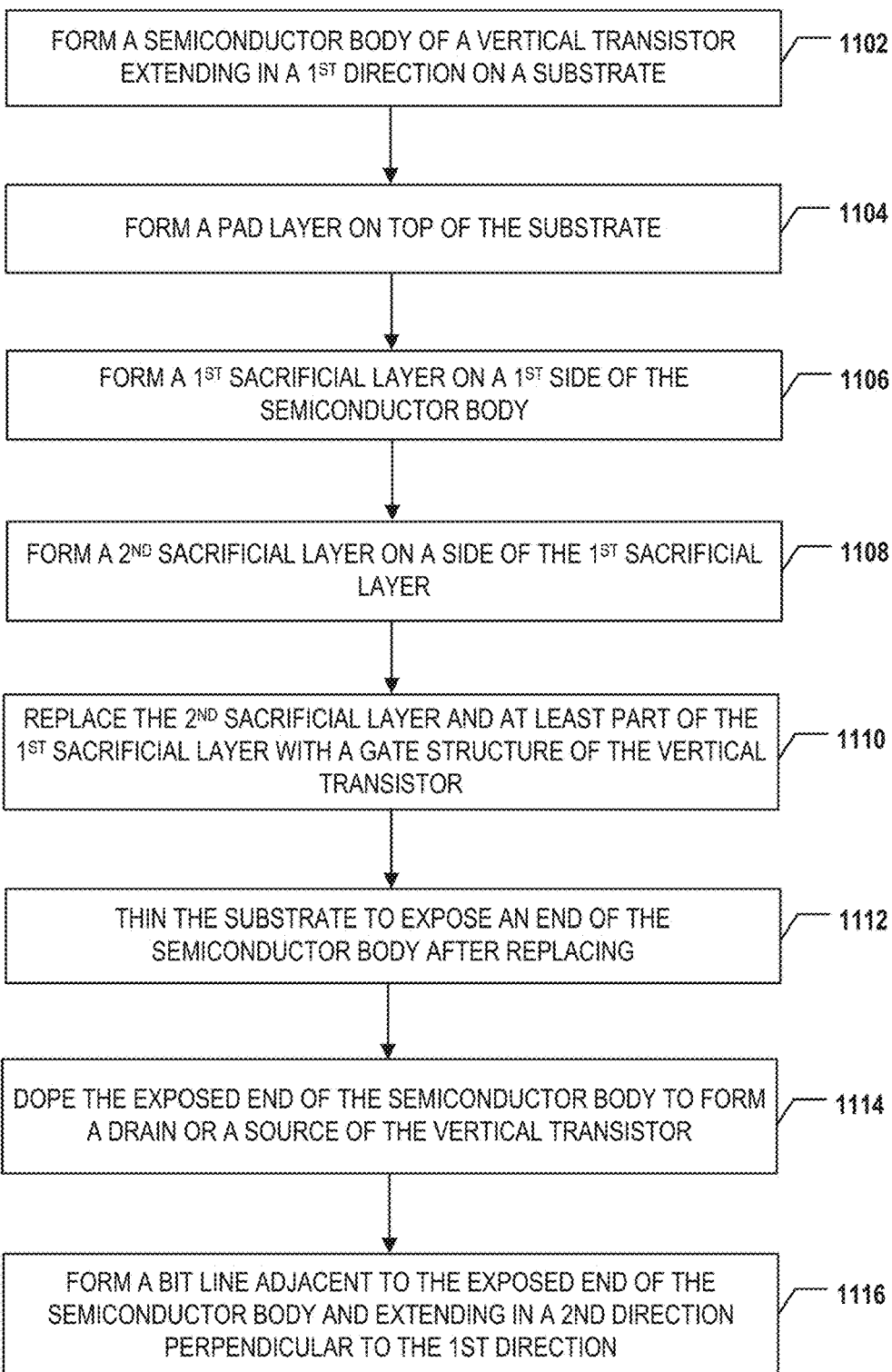
FIG. 11A illustrates a flowchart of a method for forming a semiconductor device including vertical transistors, according to some aspects of the present disclosure.

As illustrated in FIG. 10A, the bottom portion of sacrificial layer 815 formed on the bottom surface of trench 810 is not removed to expose pad layer 812 before forming sacrificial layer 817. That is, different from the self-aligned gate process described above with respect to FIG. 8E in which sacrificial layers 815 on opposite sides of semiconductor body 806 are separated, the self-aligned gate process described with respect to FIG. 10A leaves sacrificial layers 815 on opposite sides of semiconductor body 806 connected as parts of a continuous layer when forming sacrificial layer 817, according to some implementations. As a result, the bottom surface of sacrificial layer 817 is in contact with sacrificial layer 815, instead of pad layer 812, according to some implementations. In other words, pad layer 812 and sacrificial layer 817 can be separated by sacrificial layer 815, and the top surface of pad layer 812 can be fully covered by sacrificial layer 815.

Figure 10B:
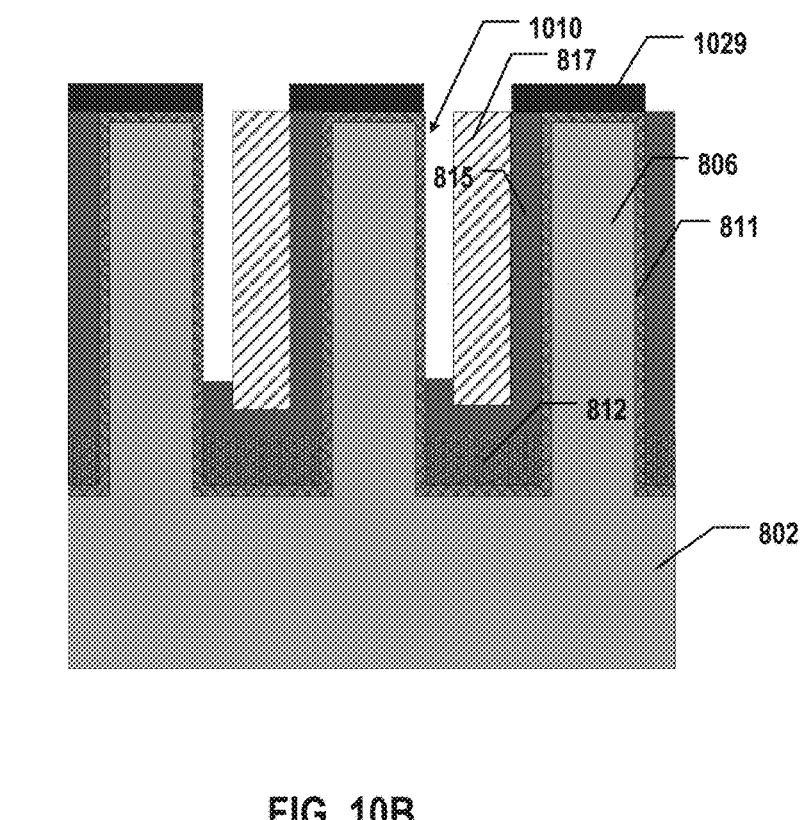

As illustrated in FIG. 10B, after forming sacrificial layers 815 and 817, sacrificial layers 815 on one side of semiconductor bodies 806 in the bit line direction where the gate structures are not to be formed (shown in FIG. 10A) are partially removed to form trenches 1010, partially exposing the opposite side of semiconductor bodies 806 where the gate structures are not to be formed. To partially remove sacrificial layer 815, a lithography process, such as SADP or SAQP, can be performed to pattern trenches 1010 using an etch mask 1029 (e.g., a photoresist mask and/or a hard mask), which exposes sacrificial layers 815 on one side of semiconductor bodies 806 in the bit line direction where the gate structures are not to be formed, but covers and protects sacrificial layers 815 on the other side of semiconductor bodies 806 in the bit line direction where the gate structures are to be formed, as shown in FIG. 10B. Then, one or more selective etching processes, such as wet etching, can be performed through etch mask 1029 to etch away only parts of sacrificial layers 815 on one side of semiconductor bodies 806 in the bit line direction where the gate structures are not to be formed, leaving other parts of sacrificial layers 815 on the same side of semiconductor bodies 806, as well as sacrificial layers 815 on the opposite side of semiconductor bodies 806 intact. The etchant can have a relatively high selectivity (e.g., greater than 5 times) of sacrificial layers 815 with respect to sacrificial layers 817 and liner layers 811, thereby leaving sacrificial layers 817 and liner layers 811 intact as well, even without the protection of etch mask 1029. For example, etchants having phosphoric acid ($H_3PO_4$) may be used to selectively etch sacrificial layers 815 having $Al_2O_3$, without etching sacrificial layers 817 having polysilicon and liner layers 811 having silicon oxide.

Different from the self-aligned gate process described above with respect to FIG. 8F in which sacrificial layer 815 on one side of semiconductor body 806 where the gate structure is not to be formed is fully removed, thereby exposing pad layer 812, the self-aligned gate process described with respect to FIG. 10B leaves part of sacrificial layer 815 intact without exposing pad layer 812. In some implementations, instead of using pad layer 812 as the etch stop layer to stop the etching of sacrificial layer 815, the etching rate and/or duration are controlled such that the etching process stops before reaching pad layer 812.

Figure 10C:
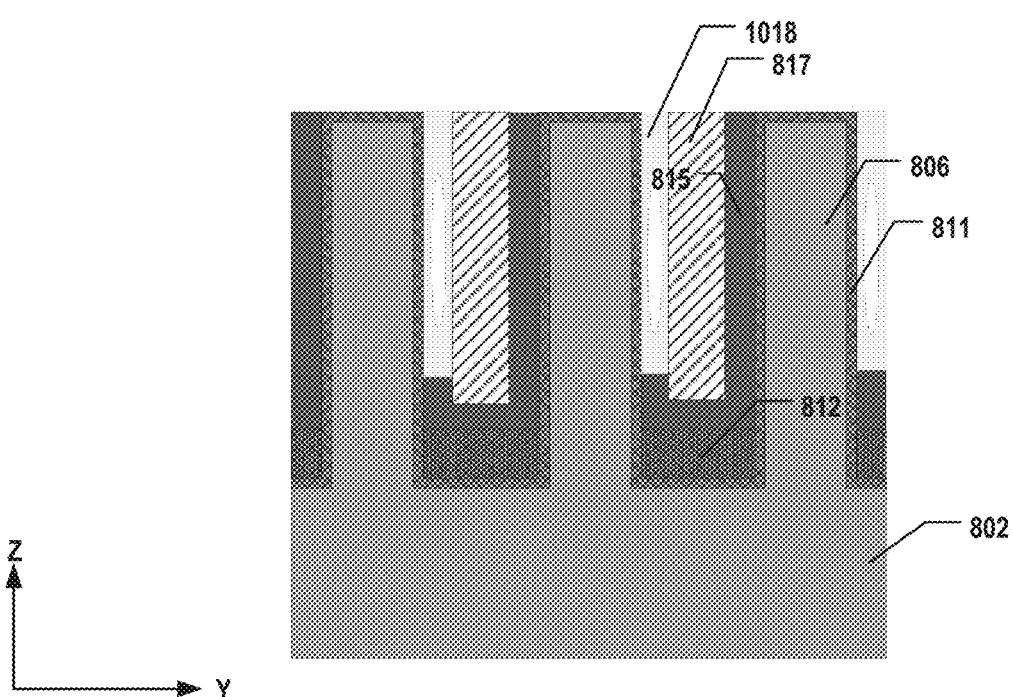

As illustrated in FIG. 10C, dielectric isolation layers 1018 are formed on the exposed side of semiconductor bodies 806 where sacrificial layers 815 are partially removed. To form dielectric isolation layers 1018, dielectric material(s), such as silicon oxide, are deposited using one or more thin film deposition processes including, but not limited to, CVD, PVD, ALD, or any combination thereof, to fill trenches 1010 (shown in FIG. 10B). Depending on the lateral dimensions of trenches 1010, trenches 1010 may not be fully filled with the deposited dielectric material(s) (e.g., silicon oxide) when forming dielectric isolation layers 1018 and thus, become air gaps therein according to the self-aligned gate process for forming "thick gate," as shown in FIG. 10C. It is understood that in some examples, when the lateral dimensions of trenches 1010 are sufficiently large, dielectric material(s) may fully fill trenches 1010 during the formation of dielectric isolation layers 1018, thereby eliminating the air gaps. Different from the self-aligned gate process described above with respect to FIG. 8G in which dielectric isolation layer 818 is formed in contact with pad layer 812, dielectric isolation layer 1018 is formed in contact with the remainder of sacrificial layer 815 according to the self-aligned gate process described with respect to FIG. 10C.

Figure 10D:
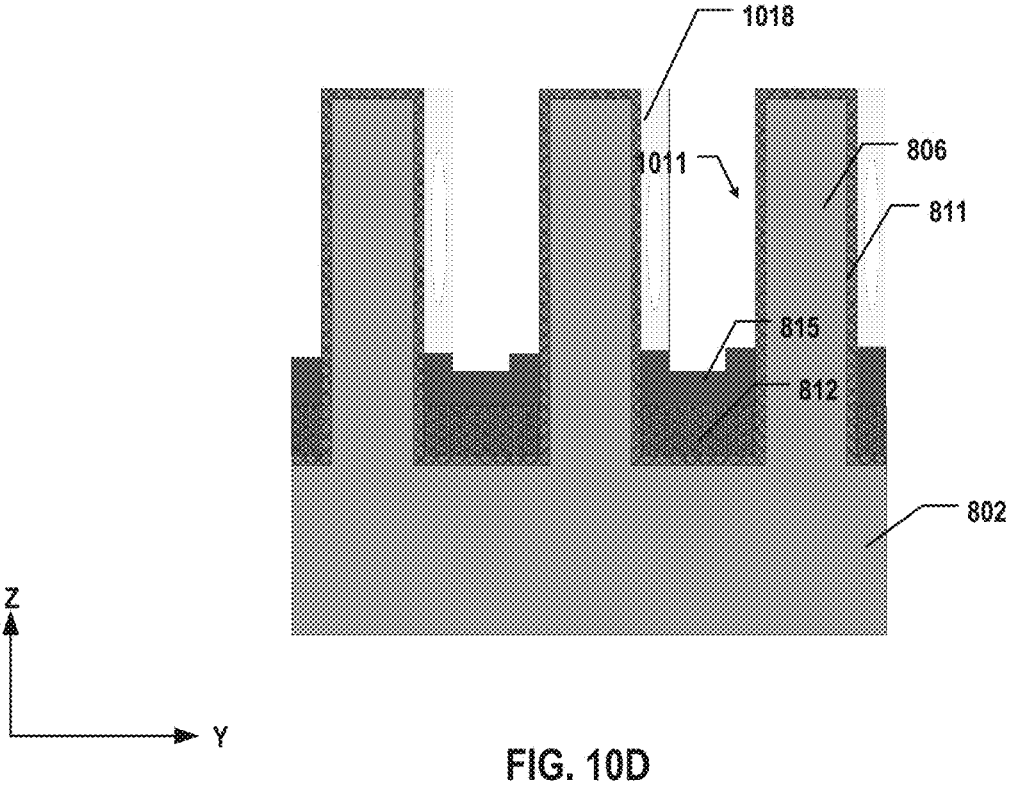

As illustrated in FIG. 10D, sacrificial layers 817 and parts of the remaining sacrificial layers 815 are selectively removed to form trenches 1011, partially exposing the side of semiconductor bodies 806 where the gate structures are to be formed. Although sacrificial layers 817 can be fully removed, sacrificial layers 815 that are on the sides of semiconductor bodies 806 where the gate structures are to be formed can be partially removed, like sacrificial layers 815 on the opposite side of semiconductor bodies 806. Selective etching processes, such as wet etching, can be sequentially performed to etch away sacrificial layers 817 and only parts of the remaining sacrificial layers 815. The first etchant can have a relatively high selectivity (e.g., greater than 5 times) of sacrificial layers 817 with respect to dielectric isolation layers 1018 and liner layers 811, and the second etchant can have a relatively high selectivity (e.g., greater than 5 times) of sacrificial layers 815 with respect to dielectric isolation layers 1018 and liner layers 811, thereby leaving dielectric isolation layers 1018 and liner layers 811 intact. For example, the first etchant having potassium hydroxide (KOH) may be used to selectively etch sacrificial layers 817 having polysilicon, and the second etchant having phosphoric acid ($H_3PO_4$) may be used to selectively etch sacrificial layers 815 having $Al_2O_3$, without etching dielectric isolation layers 1018 and liner layers 811 both having silicon oxide.

Different from the self-aligned gate process described above with respect to FIG. 8H in which sacrificial layer 815 on one side of semiconductor body 806 where the gate structure is to be formed is fully removed, thereby exposing pad layer 812, the self-aligned gate process described with respect to FIG. 10D leaves part of sacrificial layer 815 intact without exposing pad layer 812. In some implementations, instead of using pad layer 812 as the etch stop layer to stop the etching of sacrificial layer 815, the etching rate and/or duration are controlled such that the etching process stops before reaching pad layer 812. As shown in FIG. 10D, the top surface of pad layer 812 is still fully covered by the remainder of sacrificial layer 815, according to some implementations. It is understood that although a dent may be formed in the remainder of sacrificial layer 815 (shown in FIG. 10D), in some examples, by controlling the etching process of sacrificial layer 815, the top surface of the remainder of sacrificial layer 815 may be flat without the dent.

Figure 10E:
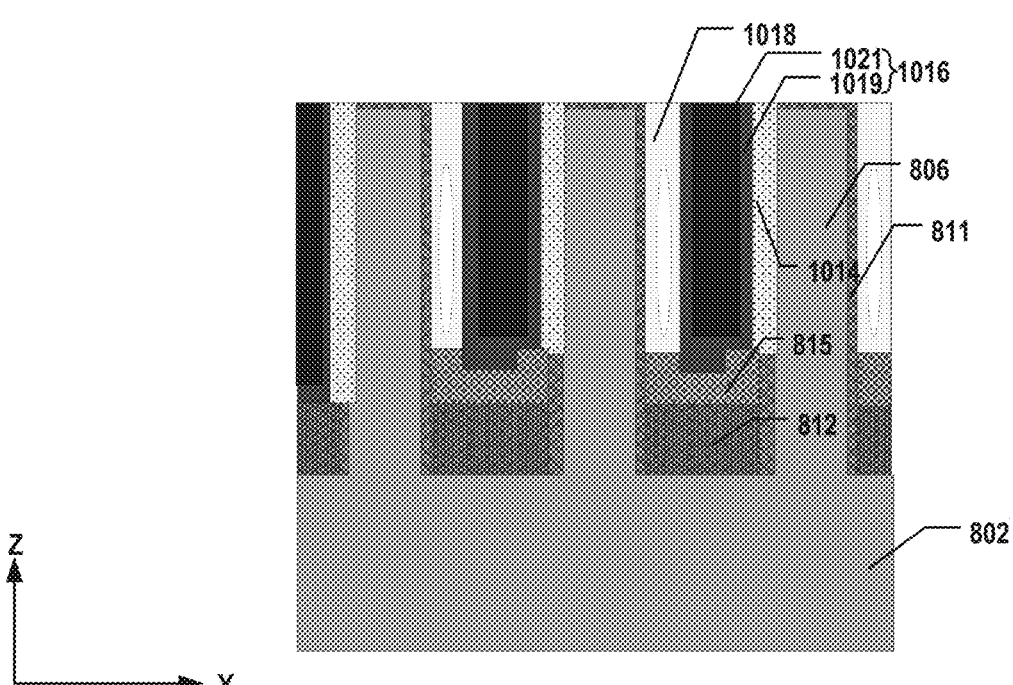

As illustrated in FIG. 10E, gate dielectrics 1014 are formed on the partially exposed side of semiconductor bodies 806 in trenches 1011 (shown in FIG. 10D). Gate dielectrics 1014 are not formed on the opposite side of semiconductor bodies 806 in the bit line direction where dielectric isolation layers 1018 are formed, according to some implementations. In some implementations, gate dielectrics 1014 are formed by depositing a layer of dielectric, such as silicon oxide, over the exposed sidewall of semiconductor bodies 806 using one or more thin film deposition processes including, but not limited to, CVD, PVD, ALD, or any combination thereof, without fully filling trenches 1011. It is understood that in some examples, gate dielectrics 1014 may not be parts of a continuous dielectric layer. For example, a thermal oxidation process, such as ISSG oxidation, is performed to further grow native oxide (e.g., silicon oxide) on semiconductor bodies 806 (e.g., single crystalline silicon) from liner layer 811 to become gate dielectric 1014. It is also understood that since gate dielectrics 1014 and liner layers 811 may have the same materials, such as silicon oxide, the interface and boundary between gate dielectrics 1014 and liner layers 811 may become indistinguishable. Thus, for ease of description, liner layers 811 that are in contact with gate dielectrics 1014 may be illustrated as part of gate dielectrics 1014 in the present disclosure, for example, as shown in FIG. 10E.

As illustrated in FIG. 10E, gate electrodes 1016 are formed on the side of gate dielectrics 1014 in trenches 1011 (shown in FIG. 10D). Gate electrode 1016 can be formed between gate dielectric 1014 and dielectric isolation layer 1018 in the bit line direction to fill trench 1011. In some implementations, gate electrode 1016 includes a gate conductor 1021 and a barrier layer 1019 surrounding gate conductor 1021. In some implementations, gate electrodes 1016 are formed by depositing one or more layers of conductive layers, such as metals or metal compounds, over the exposed sidewall of gate dielectrics 1014 using one or more thin film deposition processes including, but not limited to, CVD, PVD, ALD, or any combination thereof, fully filling trenches 1011. For example, a layer of TiN and a layer of W may be sequentially deposited into trench 1011 to form barrier layer 1019 having TiN and gate conductor 1021 having W, respectively. That is, the self-aligned gate process disclosed herein can allow the later deposited gate conductor 1021 to be surrounded by the first deposited barrier layer 1019 when filling trench 1011. In some implementations, gate electrode 1016 fills the dent in the remainder of sacrificial layer 815 as well to become a protrusion into the remainder of sacrificial layer 815, for example, as shown in FIG. 10E. It is understood that in some examples in which the top surface of the remainder of sacrificial layer 815 is flat without the dent, gate electrode 1016 may not have the protrusion.

Figure 10F:
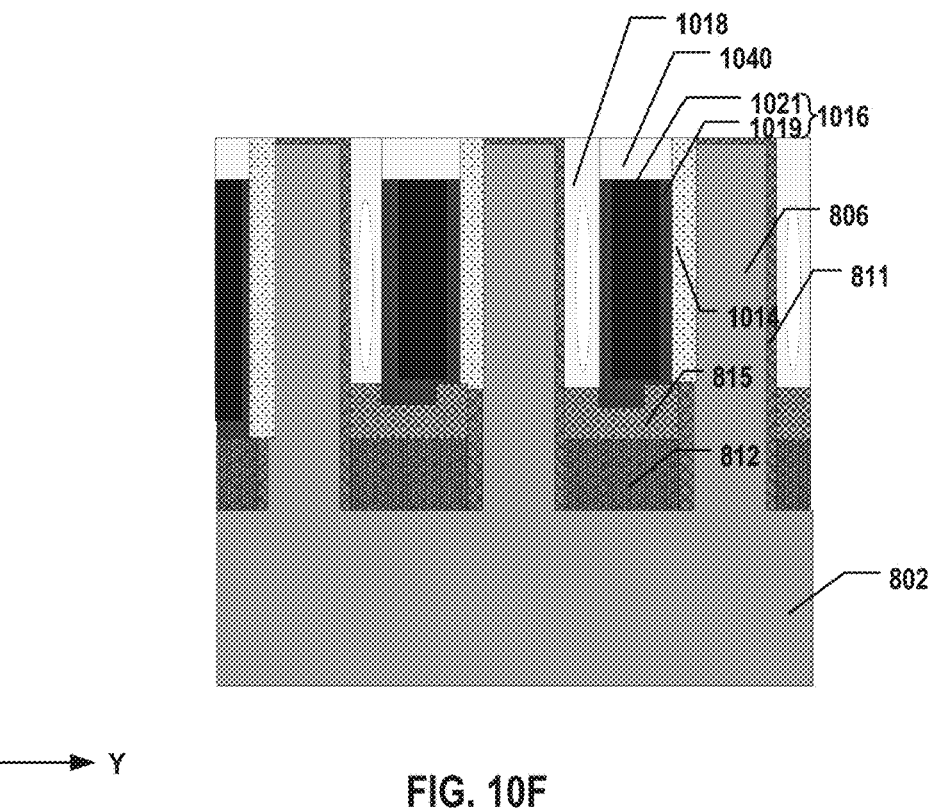

As illustrated in FIG. 10F, a top portion of gate electrode 1016 is replaced with a dielectric plug 1040, making the top end of gate electrode 1016 below the top end of semiconductor body 806. To form dielectric plug 1040, gate electrode 1016 can be etched back (recessed) from the top by wet etching and/or drying etching, such that the upper end of gate electrode 1016 becomes below the top surface of semiconductor body 806, and the resulting recess can be filled with dielectric plug 1040 by depositing dielectrics, such as silicon oxide, using one or more thin film deposition processes including, but not limited to, CVD, PVD, ALD, or any combination thereof. It is understood that since dielectric isolation layer 1018 and dielectric plug 1040 may have the same materials, such as silicon oxide, the interface and boundary between dielectric isolation layer 1018 and dielectric plug 1040 may become indistinguishable. The remainder of gate electrode 1016 (referring to hereafter as "gate electrode 1016" for ease of description) and gate dielectric 1014 in contact with gate electrode 1016 become a gate structure coupled to one side of semiconductor body 806 in the bit line direction, according to some implementations, as shown in FIG. 10F.

As shown in the side view of FIG. 10F, gate electrode 1016, gate dielectric 1014, and dielectric isolation layer 1018 can be formed on top of the remainder of sacrificial layer 815 (which may be viewed as another pad layer, e.g., second pad layer 602b in FIGS. 6C and 6D). That is, pad layer 812 and sacrificial layers 815 and 817 are used to define the shape, position, and dimensions of the gate structure having gate electrode 1016 and gate dielectric 1014 according to the self-aligned gate process. Specifically, the shape, position, and dimensions of gate electrode 1016 can be further defined by dielectric plug 1040 and the remainder of sacrificial layer 815 as well. As a result, the various issues associated with the gate process described above, such as the nonuniformity of the gate structure, the challenging bottom punch process, and the F attack, can be addressed by the self-aligned gate process disclosed herein. It is understood that although the self-aligned gate process described above with respect FIGS. 10A-10F is for forming "thick gate," for example, as shown in FIG. 6C, the process may be combined with the self-aligned gate process described above with respect FIGS. 9A-9D to form "thin gate," for example, as shown in FIG. 6D as well.

According to some aspects of the present disclosure, the vertical transistors are dual-gate transistors with increased gate control area and lower leakage current. For example, FIGS. 12A and 12B illustrate a plan view and a perspective view, respectively, of another array of vertical transistors 1202 in a semiconductor device 1200, according to some aspects of the present disclosure. As shown in FIGS. 12A and 12B, semiconductor device 1200 can include a plurality of word lines 1204 each extending in a first lateral direction (the x-direction). Semiconductor device 1200 can also include a plurality of bit lines 1206 each extending in a second lateral direction perpendicular to the first lateral direction (they-direction). It is understood that FIG. 12A does not illustrate a cross-section of semiconductor device 1200 in the same lateral plane, and word lines 1204 and bit lines 1206 may be formed in different lateral planes for ease of routing as described below in detail.

Vertical transistors 1202 can be formed at the intersections of word lines 1204 and bit lines 1206. In some implementations, each vertical transistor 1202 includes a semiconductor body 1208 and a gate structure 1210. As shown in FIG. 12B, semiconductor body 1208 can extend on a substrate 1201 (shown in FIG. 12A) in the vertical direction (the z-direction) perpendicular to the first and second lateral directions. Vertical transistor 1202 can be a dual-gate transistor in which gate structure 1210 is coupled to two sides (e.g., two of four sides in FIGS. 12A and 12B) of semiconductor body 1208 (the active region in which channels are formed). As shown in FIGS. 12A and 12B, vertical transistor 1202 is a dual-gate transistor in which gate structure 1210 abuts two opposite sides of semiconductor body 1208 (having a rectangle or square-shaped cross-section) in the bit line direction (the y-direction) in the plan view. Gate structure 1210 does not surround and contact the other two sides of semiconductor body 1208 in the word line direction (the x-direction), according to some implementations. As shown in FIG. 12B, gate structure 1210 can include a gate dielectric 1212 abutting two opposite sides of semiconductor body 1208 in the plan view, and a gate electrode 1214 in contact with gate dielectric 1212. In some implementations, gate dielectric 1212 is positioned laterally between gate electrode 1214 and semiconductor body 1208 in the bit line direction (the y-direction).

As described above, gate electrode 1214 may be part of word line 1204, and word line 1204 may be an extension of gate electrode 1214. That is, gate electrodes 1214 of adjacent vertical transistors 1202 in the word line direction (the x-direction), e.g., in the same row, are continuous, e.g., parts of a continuous conductive layer having gate electrodes 1214 and word line 1204. As shown in the plan view of FIG. 12A, in some implementations, each word line 1204 is a rectangular annulus word line surrounding the respective row of vertical transistors 1202 to connect gate electrodes 1214 of the row of vertical transistors 1202. Similarly, gate dielectrics 1212 of adjacent vertical transistors 1202 in the word line direction, e.g., in the same row, are continuous, e.g., parts of a continuous dielectric layer having gate dielectrics 1212 and extending in the word line direction to abut vertical transistors 1202 in the same row. Gate structures 1210 can be thus viewed as parts of a continuous structure extending in the word line direction at which the continuous structure abut vertical transistors 1202 in the same row. Gate electrodes 1214 and gate dielectrics 1212 of a row of vertical transistors 1202 are continuous in the word line direction, according to some implementations.

As shown in FIG. 12A, semiconductor device 1200 can further include a plurality of parallel dielectric isolation layers 1216 each extending in the word line direction (the x-direction). Each dielectric isolation layer 1216 is positioned laterally between two adjacent rows of vertical transistors 1202 in the bit line direction (the y-direction) to reduce the coupling effect between the adjacent rows of vertical transistors 1202. As described below in detail, the thickness (the dimension in the bit line direction) of dielectric isolation layer 1216 and/or whether air gaps being formed in dielectric isolation layer 1216 can affect the effectiveness of coupling reduction.

Figure 13A:
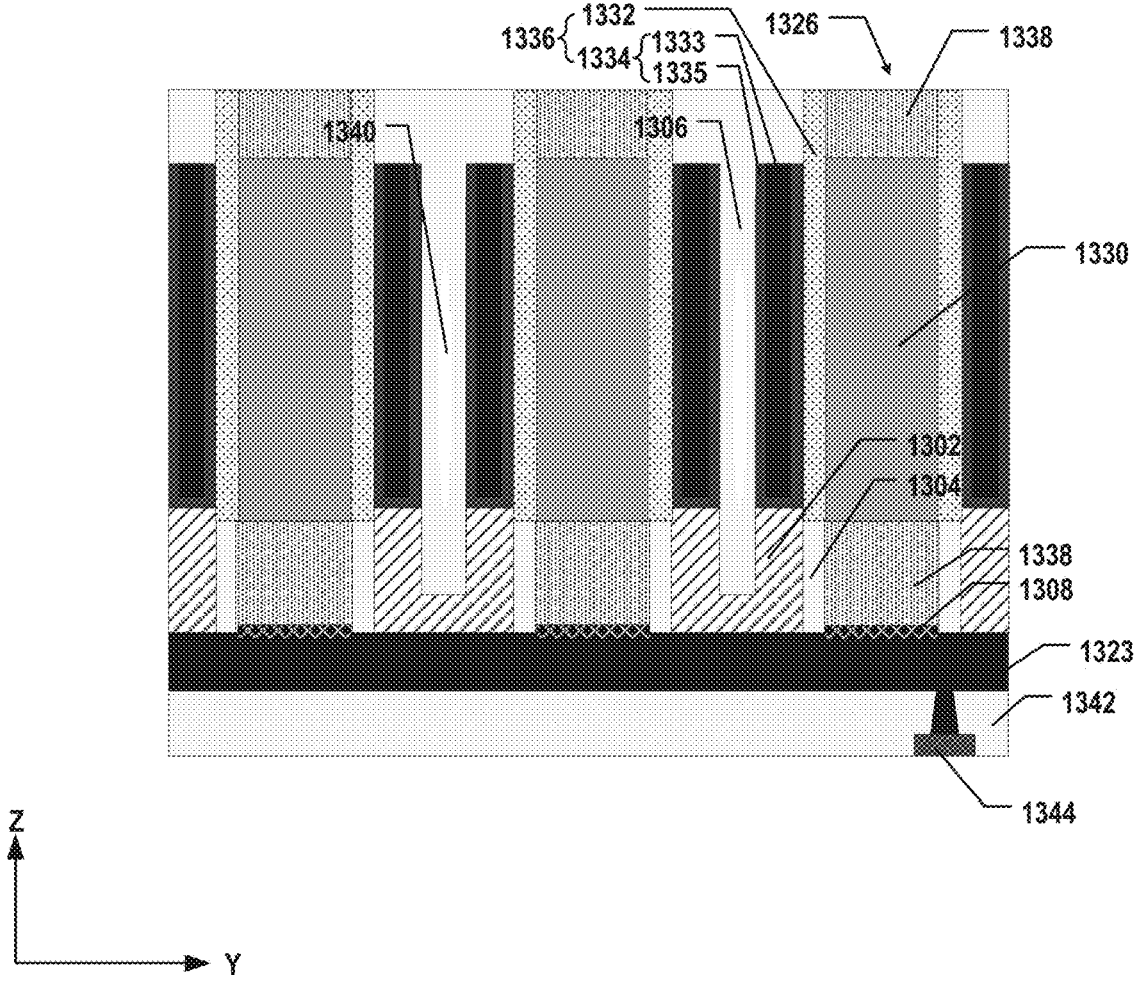
FIG. 13A illustrates a side view of a cross-section of yet another semiconductor device including vertical transistors, according to some aspects of the present disclosure.

FIG. 13A illustrates a side view of a cross-section of a semiconductor device 1300 including vertical transistors 1326, according to some aspects of the present disclosure. Semiconductor device 1300 may be one example of semiconductor device 1200 including dual-gate vertical transistors 1202 in which gate structure 1210 is coupled to two sides of semiconductor body 1208. It is understood that FIG. 13A is for illustrative purposes only and may not necessarily reflect the actual device structure (e.g., interconnections) in practice. It is also understood that any other suitable components not shown in FIG. 13A may be included in semiconductor device 1300 to be coupled to vertical transistors 1326, such as any suitable storage units and peripheral circuits. It is further understood that the cross-section of semiconductor device 1300 in FIG. 13A may be made along the bit line direction (the y-direction), and bit line 1323 extending laterally in the y-direction may be coupled to a column of vertical transistors 1326.

Vertical transistor 1326 can be a MOSFET. In some implementations, vertical transistor 1326 includes a semiconductor body 1330 (the active region in which one or more channels can form) extending vertically (in the z-direction), and a gate structure 1336 coupled to two opposite sides of semiconductor body 1330 in the bit line direction. As described above, as in a dual-gate vertical transistor, semiconductor body 1330 can have a cuboid shape or a cylinder shape, and gate structure 1336 can be in contact with both of the two sides of semiconductor body 1330 in the bit line direction in the plan view. Gate structure 1336 includes a gate electrode 1334 and a gate dielectric 1332 position laterally between gate electrode 1334 and semiconductor body 1330 in the bit line direction, according to some implementations. For example, for semiconductor body 1330 having a cylinder shape, semiconductor body 1330, gate dielectric 1332, and gate electrode 1334 may be disposed radially from the center of vertical transistor 1326 in this order. In some implementations, gate dielectric 1332 abuts two opposite sides of semiconductor body 1330, and gate electrode 1334 abuts gate dielectric 1332.

As shown in FIG. 13A, in some implementations, semiconductor body 1330 has two ends (the upper end and lower end) in the vertical direction (the z-direction), and both ends extend beyond gate electrode 1334, respectively, in the vertical direction (the z-direction). That is, semiconductor body 1330 can have a larger vertical dimension (e.g., the depth) than that of gate electrode 1334 (e.g., in the z-direction), and neither the upper end nor the lower end of semiconductor body 1330 is flush with the respective end of gate electrode 1334. Thus, short circuits between bit lines

1323 and word lines/gate electrodes 1334 or between word lines/gate electrodes 1334 and other components coupled to the upper terminal of vertical transistor 1326 (not shown, e.g., a capacitor) can be avoided. In some implementations, the upper end of semiconductor body 1330 is flush with the upper end of gate dielectric 1332, as shown in FIG. 13A. Thus, within gate structure 1336, the upper end of gate dielectric 1332 can extend beyond the upper end of gate electrode 1334 in the vertical direction as well.

Vertical transistor 1326 can further include a source and a drain (both referred to as 1338 as their locations may be interchangeable) disposed at the two ends (the upper end and lower end) of semiconductor body 1330, respectively, in the vertical direction (the z-direction). In some implementations, one of source and drain 1338 (e.g., at the upper end in FIG. 13A) is coupled to a capacitor (not shown), and the other one of source and drain 1338 (e.g., at the lower end in FIG. 13A) is coupled to bit line 1323 (e.g., via an ohmic contact 1308). That is, vertical transistor 1326 can have a first terminal in the positive z-direction and a second terminal opposite the first terminal in the negative z-direction, as shown in FIG. 13A. In some implementations, a metal bit line (e.g., bit line 1323 made of a metal material) is coupled to the second terminal of vertical transistor 1326 via ohmic contact 1308. Ohmic contact 1308 can be made of a metal silicide material, i.e., a metal silicide contact. The usage of a metal bit line (as opposed to doped silicon) and a metal silicide contact (as opposed to a Schottky contact) can significantly reduce the contact resistance between vertical transistor 1326 and bit line 1323. For example, bit line 1323 may include W, Co, Cu, Al, or any other suitable metals having higher conductivities than doped silicon. For example, ohmic contact 1308 may include metal silicides, such as WSi, CoSi, CuSi, AlSi, or any other suitable metal silicides having higher conductivities than doped silicon.

In some implementations, semiconductor body 1330 includes semiconductor materials, such as single crystalline silicon, polysilicon, amorphous silicon, Ge, any other semiconductor materials, or any combinations thereof. In one example, semiconductor body 1330 may include single crystalline silicon. Source and drain 1338 can be doped with N-type dopants (e.g., P or As) or P-type dopants (e.g., B or Ga) at a desired doping level. In some implementations, gate dielectric 1332 includes dielectric materials, such as silicon oxide, silicon nitride, or high-k dielectrics including, but not limited to, $Al_2O_3$, $HfO_2$, $Ta_2O_5$, $ZrO_2$, $TiO_2$, or any combination thereof. In some implementations, gate electrode 1334 includes conductive materials including, but not limited to W, Co, Cu, Al, TiN, TaN, polysilicon, silicides, or any combination thereof. In one example, gate structure 1336 may be a "gate oxide/gate poly" gate in which gate dielectric 1332 includes silicon oxide and gate electrode 1334 includes doped polysilicon. In another example, gate structure 1336 may be an HKMG in which gate dielectric 1332 includes a high-k dielectric and gate electrode 1334 includes a metal.

As shown in FIG. 13A, in some implementations, gate electrode 1334 includes a gate conductor 1333 and a barrier layer 1335 surrounding gate conductor 1333. In one example, gate conductor 1333 may include W, and barrier layer 1335 may include TiN. In forming gate conductor 1333 having W, F may be used in the precursor of the deposition materials and trapped into gate conductor 1333 having W. Barrier layer 1335 that surrounds the gate conductor 1333 thus can prevent the trapped F from releasing and attacking the adjacent silicon oxide to form voids and seams. Barrier layer 1335 can also serve as the glue layer/adhesive layer to increase the adhesion between gate conductor 1333 and gate dielectric 1332. As described below in detail with respect to the fabrication process, the self-aligned gate process can enable the formation of barrier layer 1335 that surrounds gate conductor 1333.

As described above, since gate electrode 1334 may be part of a word line or extend in the word line direction (e.g., the x-direction in FIG. 12A) as a word line, although not directly shown in FIG. 13A, semiconductor device 1300 can also include a plurality of word lines (e.g., an example of word lines 1204 in FIG. 12A, referred to as 1334 in FIG. 13A as well) each extending in the word line direction (the x-direction). Each word line 1334 can be coupled to a row of vertical transistors 1326. That is, bit line 1323 and word line 1334 can extend in two perpendicular lateral directions, and semiconductor body 1330 of vertical transistor 1326 can extend in the vertical direction perpendicular to the two lateral directions in which bit line 1323 and word line 1334 extend. Word lines 1334 are in contact with word line contacts (not shown), according to some implementations. In some implementations, word lines 1334 include conductive materials including, but not limited to W, Co, Cu, Al, TiN, TaN, polysilicon, silicides, or any combination thereof. In some implementations, word line 1334 includes multiple conductive layers, such as a gate conductor 1333 having W surrounded by a barrier layer 1335 having TiN.

As shown in FIG. 13A, semiconductor device 1300 can further include a plurality of dielectric isolation layers 1306 each disposed laterally between adjacent vertical transistors 1326 in the bit line direction. In some implementations, air gaps 1340 are formed in dielectric isolation layers 1306 to further increase the effectiveness of coupling reduction between adjacent vertical transistors 1326. Each air gap 1340 can be a trench extending in the word line direction (e.g., the x-direction) in parallel with word lines 1334 to separate adjacent rows of vertical transistors 1326. As described below with respect to the fabrication process, air gaps 1340 may be formed due to the relatively small pitches of word lines 1334 (and rows of vertical transistors 1326) in the bit line direction (e.g., the y-direction). On the other hand, the relatively large dielectric constant of air in air gaps 1340 (e.g., about 4 times of the dielectric constant of silicon oxide) can improve the insulation effect between word lines 1334 (and rows of vertical transistors 1326) compared with some dielectrics (e.g., silicon oxide).

Consistent with the scope of the present disclosure, as shown in FIG. 13A, semiconductor device 1300 can further include a pad layer 1302 positioned between gate electrode 1334 and bit line 1323 in the vertical direction. As described above, pad layer 1302 can provide insulation between gate electrode 1334 and bit line 1323 and avoid direct contact between gate electrode 1334 and bit line 1323. In some implementations, the largest thickness (the largest dimension in the z-direction) of pad layer 1302 is the same as the step between the lower end of semiconductor body 1330 and the lower end of gate electrode 1334. As described below with respect to the fabrication process, pad layer 1302 can also serve as the stop layer when removing the substrate on which semiconductor body 1330 is formed to expose the lower end of semiconductor body 1330. It is understood that, like bit line 1323, pad layer 1302 may extend laterally in the bit line direction (the y-direction) such that pad layer 1302 may be positioned between dielectric isolation layer 1306 and bit line 1323 in the vertical direction as well.

As shown in FIG. 13A, pad layer 1302 can have a single dielectric layer in contact with gate electrode 1334 and bit line 1323 on opposite sides. In some implementations, pad layer 1302 and gate dielectric 1332 have different dielectric materials. For example, when gate dielectric 1332 has silicon oxide, pad layer 1302 may have any dielectric materials other than silicon oxide. In some implementations, pad layer 1302 has at least one of silicon nitride or high-k dielectrics, such as $Al_2O_3$, $HfO_2$, $Ta_2O_5$, $ZrO_2$, $TiO_2$, etc.

Different from semiconductor devices 600 and 601 in FIGS. 6A and 6B in which the single-layer pad layer 602 has a flat top surface and a uniform thickness, the single-layer pad layer 1302 of semiconductor device 1300 in FIG. 13A has a "U" shape, according to some implementations, because of the different self-aligned gate processes for forming gate structures 636 and 1336, as described below with respect to the fabrication process. As shown in FIG. 13A, gate electrode 1334 can land on the thicker portions of pad layer 1302, while dielectric isolation layer 1306 can protrude into pad layer 1302 and extend beyond gate electrode 1334. That is, in some implementations, the lower end of dielectric isolation layer 1306 is below the lower end of gate electrode 1334 but is above the lower end of semiconductor body 1330.

As shown in FIG. 13A, in some implementations, semiconductor device 1300 further includes a liner layer 1304 positioned between pad layer 1302 and semiconductor body 1330 in the bit line direction (the y-direction). Gate dielectric 1332 and liner layer 1304 can have the same material, such as silicon oxide. Thus, it is understood that the interface and boundary between gate dielectric 1332 and liner layer 1304 may become indistinguishable in some cases when gate dielectric 1332 and liner layer 1304 have the same material. Like gate dielectric 1332, liner layer 1304 can be formed on both sides of semiconductor body 1330 in the bit line direction.

As shown in FIG. 13A, semiconductor device 1300 further includes a dielectric layer 1342 opposing vertical transistor 1326 with bit line 1323 positioned between dielectric layer 1342 and vertical transistor 1326 in the vertical direction. That is, vertical transistor 1326 and dielectric layer 1342 can be formed on opposite sides of bit line 1323 in the vertical direction. Local interconnects, such as bit line contacts 1344 can be formed in dielectric layer 1342. Bit line contacts 1344 can include conductive materials including, but not limited to, W, Co, Cu, Al, doped silicon, silicides, or any combination thereof. Dielectric layer 1342 can include dielectric materials including, but not limited to, silicon oxide, silicon nitride, silicon oxynitride, low-k dielectrics, or any combination thereof.

FIG. 14A illustrates a side view and a plan view of bit lines 1323 and bit line contacts 1344 coupled to vertical transistors 1326 in semiconductor device 1300, according to some aspects of the present disclosure. It is understood that the plan view of FIG. 14A does not illustrate a cross-section of semiconductor device 1300 in the same lateral plane, and bit lines 1323 and bit line contacts 1344, as well as other components (e.g., semiconductor bodies 1330 and pad layers 1302) may be formed in different lateral planes. As shown in FIG. 14A, semiconductor device 1300 can include parallel bit lines 1323 each extending in the bit line direction (the y-direction), and semiconductor bodies 1330 of each column of vertical transistors 1326 can be coupled to a respective bit line 1323. Two adjacent bit lines 1323 can be coupled to two bit line contacts 1344 disposed at the opposite ends of bit lines 1323 in the bit line direction (e.g., the upper end and the lower end in the plan view of FIG. 14A), thereby doubling the landing window of bit line contacts 1344. For example, bit line contacts 1344 may be coupled to the top ends of the odd numbers of bit lines 1323 and the lower ends of the even numbers of bit lines 1323, as shown in the plan view of FIG. 14A.

As shown in FIG. 14A, semiconductor device 1300 can include parallel pad layers 1302 each extending in the word line direction (the x-direction) and positioned between bit line 1323 and gate electrodes 1334 of a row of vertical transistors 1326 in the vertical direction. As shown in the side view of FIG. 14A, semiconductor device 1300 can further include rectangular annulus liner layer 1304 separated by pad layers 1302 and in contact with semiconductor bodies 1330 of a row of vertical transistors 1326.

FIG. 14B illustrates a side view and a plan view of word lines 1334 and word line contacts coupled to vertical transistors in semiconductor device 1300, according to some aspects of the present disclosure. Besides bit line contacts 1344, local interconnects formed in dielectric layer 1342 can also include word line contacts 1352 each extending through pad layer 1302 and dielectric layer 1342 to be coupled to word line 1334, as shown in the side view of FIG. 14B. Word line contacts 1352 can include conductive materials including, but not limited to, W, Co, Cu, Al, doped silicon, silicides, or any combination thereof.

It is understood that the plan view of FIG. 14B does not illustrate a cross-section of semiconductor device 1300 in the same lateral plane, and word lines 1334 and word line contacts 1352, as well as other components (e.g., semiconductor bodies 1330 and pad layers 1302) may be formed in different lateral planes. As shown in FIG. 14B, semiconductor device 1300 can include parallel word line 1334 each extending in the word line direction (the x-direction), and two opposite sides of semiconductor bodies 1330 of each row of vertical transistors 1326 can be coupled to a respective word line 1334 having a rectangular annulus shape. Two adjacent word lines 1334 can be coupled to two word line contacts 1352 disposed at the opposite ends of word lines 1334 in the word line direction (e.g., the left end and the right end in the plan view of FIG. 14B), thereby doubling the landing window of word line contacts 1352. For example, word line contacts 1352 may be coupled to the right ends of the odd numbers of word lines 1334 and the left ends of the even numbers of word lines 1334, as shown in the plan view of FIG. 14B. As shown in FIG. 14B, semiconductor device 1300 can include parallel pad layers 1302 each extending in the word line direction (the x-direction) and positioned between bit lines 1323 and word lines 1334 in the vertical direction.

Figure 13B:
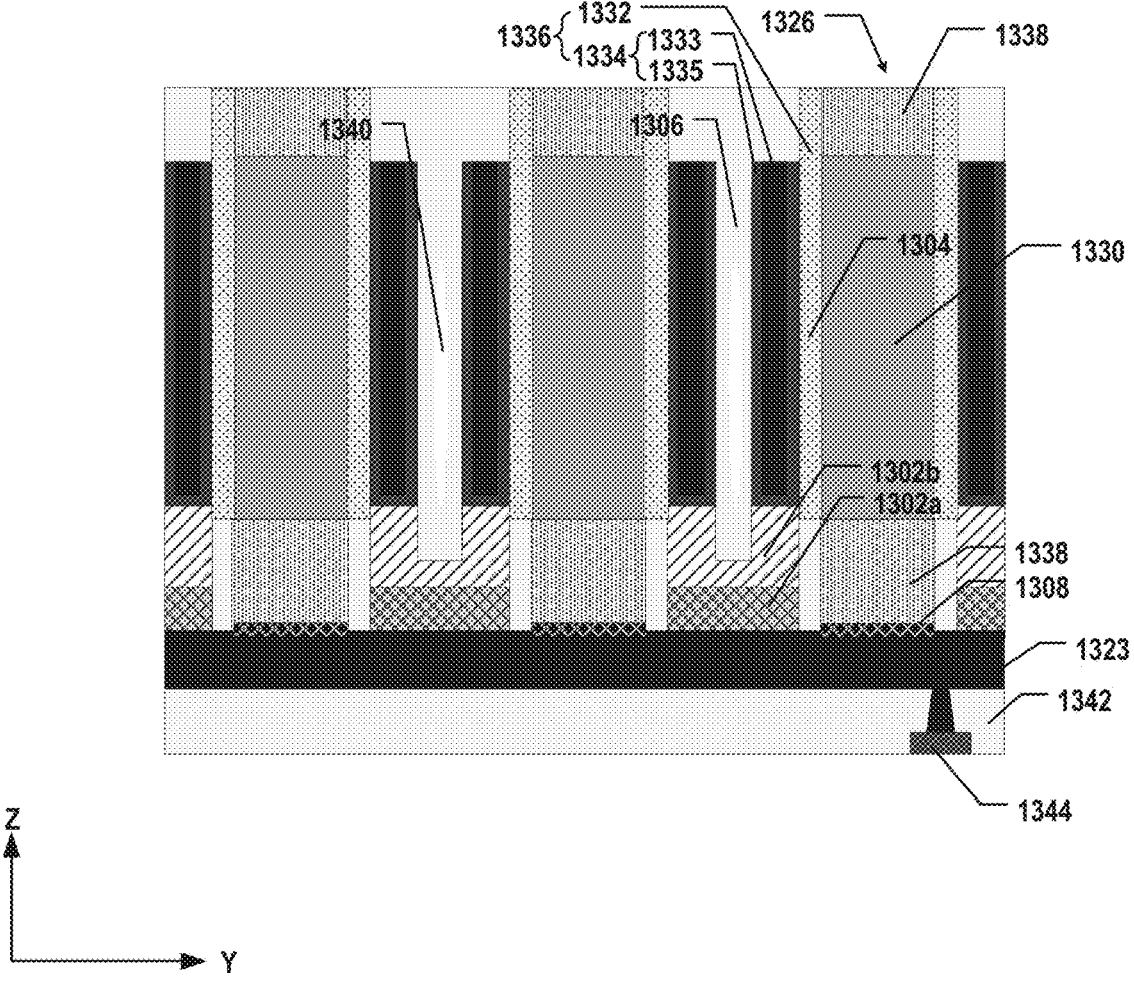
FIG. 13B illustrates a side view of a cross-section of yet another semiconductor device including vertical transistors, according to some aspects of the present disclosure.

It is understood that pad layer 1302 may include more than one dielectric layer with different dielectric materials. For example, FIG. 13B illustrates a side view of a cross-section of yet another semiconductor device 1301 including vertical transistors 1326, according to some aspects of the present disclosure. A two-layer pad layer 1302 in semiconductor device 1301 can include a first pad layer 1302a in contact with bit line 1323, and a second pad layer 1302b in contact with gate electrode 1334. First and second pad layers 1302a and 1302b have different dielectric materials, according to some implementations. For example, first pad layer 1302a may have silicon nitride, and second pad layer 1302b may have high-k dielectric, such as $Al_2O_3$, or vice versa. As described below with respect to the self-aligned gate process, first pad layer 1302a may serve as the stop layer for removing the substrate on which semiconductor body 1330 is formed to expose the lower end of semiconductor body 1330, and second pad layer 1302b may be the remainder of the first sacrificial layer for defining gate electrode 1334.

FIGS. 15A-15L illustrate a fabrication process for forming yet another semiconductor device including vertical transistors, according to some aspects of the present disclosure. FIG. 16 illustrates a flowchart of a method 1600 for forming a semiconductor device including vertical transistors, according to some aspects of the present disclosure. Examples of the semiconductor devices depicted in FIGS. 15A-15L include semiconductor device 1300 depicted in FIG. 13A. FIGS. 15A-15L and 16 will be described together. It is understood that the operations shown in method 1600 are not exhaustive and that other operations can be performed as well before, after, or between any of the illustrated operations. Further, some of the operations may be performed simultaneously, or in a different order than shown in FIG. 16.

Referring to FIG. 16, method 1600 starts at operation 1602, in which a semiconductor body of a vertical transistor extending in a first direction on a substrate is formed. The substrate can be a silicon substrate.

As illustrated in FIG. 15A, a plurality of parallel semiconductor walls 1505 are formed in they-direction (the bit line direction). To form semiconductor walls 1505, a plurality of parallel trenches are formed in a silicon substrate 1502 in the y-direction. In some implementations, a lithography process is performed to pattern the trenches and semiconductor walls 1505 using an etch mask 1504 (e.g., a photoresist mask and/or a hard mask), for example, based on the design of bit lines, and one or more dry etching and/or wet etching processes, such as RIE, are performed to etch the trenches in silicon substrate 1502. Thus, semiconductor wall 1505 extending in the vertical direction on silicon substrate 1502 can be formed. Since semiconductor walls 1505 are formed by etching silicon substrate 1502, semiconductor walls 1505 can have the same material as silicon substrate 1502, such as single crystalline silicon. FIG. 15A illustrates both the side view (in the bottom portion of FIG. 15A) of a cross-section along the x-direction (the word line direction, e.g., in the AA plane) and the plan view (in the top portion of FIG. 15A) of a cross-section in the x-y plane (e.g., in the BB plane through semiconductor walls 1505).

As illustrated in FIG. 15A, trench isolations 1508 are formed in the trenches. In some implementations, a dielectric, such as silicon oxide and/or silicon nitride, is deposited to fully fill the trenches using one or more thin film deposition processes including, but not limited to, CVD, PVD, ALD, or any combination thereof. In some implementations, a planarization process, such as CMP, is performed to remove excess dielectric deposited beyond the top surface of etch mask 1504. As a result, parallel semiconductor walls 1505 can be separated by trench isolations 1508. It is understood that in some examples, before depositing trench isolations 1508, a liner layer (e.g., a native oxide layer, not shown) may be formed on the sidewalls of semiconductor walls 1505 to cure the defects on the sidewalls of semiconductor walls 1505 caused by the etching process.

As illustrated in FIG. 15B, a plurality of parallel trenches 1510 are formed each extending in the x-direction (the word line direction) to form an array of semiconductor bodies 1506 each extending in the vertical direction on silicon substrate 1502. In some implementations, a lithography process is performed to pattern trenches 1510 to be perpendicular to trench isolations 1508 using an etch mask (e.g., a photoresist mask and/or a hard mask), for example, based on the design of word lines, and one or more dry etching and/or wet etching processes, such as RIE, are performed on silicon substrate 1502 and trench isolation 1508 to etch trenches 1510 in silicon substrate 1502. As a result, semiconductor walls 1505 (shown in FIG. 15A) can be cut by trenches 1510 to form an array of semiconductor bodies 1506 each extending vertically on silicon substrate 1502. Since semiconductor bodies 1506 are formed by etching silicon substrate 1502, semiconductor bodies 1506 can have the same material as silicon substrate 1502, such as single crystalline silicon. FIG. 15B illustrates both the side view (in the bottom portion of FIG. 15B) of a cross-section along the y-direction (the bit line direction, e.g., in the AA plane through semiconductor bodies 1506) and the plan view (in the top portion of FIG. 15B) of a cross-section in the x-y plane (e.g., in the BB plane through semiconductor bodies 1506).

Method 1600 proceeds to operation 1604, as illustrated in FIG. 16, in which a first sacrificial layer is formed on a first side of the semiconductor body, and another first sacrificial layer is formed on a second side of the semiconductor body opposite the first side. In some implementations, a liner layer is formed on sidewalls of the semiconductor body prior to forming the first sacrificial layers.

As illustrated in FIG. 15C, a liner layer 1511 is formed on the top surface and the sidewalls of semiconductor body 1506. Liner layer 1511 can be a native oxide layer of semiconductor body 1506 having single crystalline silicon, for example, grown using thermal oxidation (e.g., ISSG oxidation), which can cure the defects on the surfaces of semiconductor body 1506 caused by the etching processes.

As illustrated in FIG. 15C, sacrificial layers 1515 are formed on the sidewalls and the top surfaces of semiconductor body 1506. For each semiconductor body 1506, two sacrificial layers 1515 can be formed on the two opposite sides of each semiconductor body 1506 in the bit line direction (the y-direction), as shown in the plan view. In some implementations, sacrificial layers 1515 are formed by depositing one or more materials that are different from the materials of liner layers 1511 over liner layers 1511 using one or more thin film deposition processes including, but not limited to, CVD, PVD, ALD, or any combination thereof, to partially fill trenches 1510. For example, a high-k dielectric, such as silicon nitride or $Al_2O_3$, may be deposited to form sacrificial layers 1515 over liner layers 1511 having silicon oxide. FIG. 15C illustrates both the side view (in the bottom portion of FIG. 15C) of a cross-section along the y-direction (the bit line direction, e.g., in the AA plane through semiconductor bodies 1506) and the plan view (in the top portion of FIG. 15C) of a cross-section in the x-y plane (e.g., in the BB plane through semiconductor bodies 1506 and sacrificial layers 1515) As shown in the plan view, sacrificial layers 1515 can be parts of a continuous rectangular annulus layer surrounding a row of semiconductor bodies 1506. As illustrated in the side view, the bottom portion of sacrificial layer 1515 formed on the bottom surface of trench 1510 is not removed, thereby leaving sacrificial layers 1515 on opposite sides of semiconductor body 1506 connected as parts of a continuous layer, according to some implementations.

Method 1600 proceeds to operation 1606, as illustrated in FIG. 16, in which a second sacrificial layer is formed on a side of the first sacrificial layer, another second sacrificial layer is formed on a side of the another first sacrificial layer.

As illustrated in FIG. 15D, sacrificial layers 1517 are formed on the sidewalls of sacrificial layers 1515 to fill trenches 1510 (shown in FIG. 15C). Each sacrificial layer 1517 can be a continuous layer in the word line direction that separating adjacent sacrificial layers 1515, as shown in the plan view. In some implementations, sacrificial layers 1517 are formed by depositing one or more materials that are different from the materials of sacrificial layers 1515 over sacrificial layers 1515 using one or more thin film deposition processes including, but not limited to, CVD, PVD, ALD, or any combination thereof, to fully fill trenches 1510. For example, polysilicon may be deposited to form sacrificial layers 1517 over sacrificial layers 1515 having silicon nitride or a high-k dielectric (e.g., $Al_2O_3$). Similar to sacrificial layers 1515, any excess materials of sacrificial layers 1517 over the top surfaces of semiconductor bodies 1506 and sacrificial layers 1515 can be removed by a dry etching process, such as RIE, and/or a planarization process, such as CMP, to separate sacrificial layers 1517 into discrete pieces in the bit line direction. Thus, for each semiconductor body 1506, a pair of sacrificial layers 1515 and 1517 are sequentially formed on one side in the bit line direction, and another pair of sacrificial layers 1515 and 1517 are sequentially formed on the opposite side in the bit line direction, according to some implementations. FIG. 15D illustrates both the side view (in the bottom portion of FIG. 15D) of a cross-section along the y-direction (the bit line direction, e.g., in the AA plane through semiconductor bodies 1506) and the plan view (in the top portion of FIG. 15D) of a cross-section in the x-y plane (e.g., in the BB plane through semiconductor bodies 1506 and sacrificial layers 1515 and 1517).

Method 1600 proceeds to operation 1608, as illustrated in FIG. 16, in which at least part of the first sacrificial layer and at least part of the another first sacrificial layer are replaced with a gate structure. The gate structure can be coupled to two sides of the semiconductor body. In some implementations, to replace the at least parts of the first and another first sacrificial layers with the gate structure, the at least parts of the first and another first sacrificial layers are removed to expose the first and second sides of the semiconductor body, a gate dielectric of the gate structure is formed on the exposed first and second sides of the semiconductor body, and a gate electrode of the gate structure is formed on a side of the gate dielectric.

As illustrated in FIG. 15E, sacrificial layers 1515 on two opposite sides of semiconductor bodies 1506 in the bit line direction (shown in FIG. 15D) are partially removed to form trenches 1509, partially exposing both sides of semiconductor bodies 1506 in the bit line direction. To partially remove sacrificial layers 1515, one or more selective etching processes, such as wet etching, can be performed to etch away parts of sacrificial layers 1515 on both sides of semiconductor bodies 1506 in the bit line direction, leaving other parts of sacrificial layers 1515 intact. The remainder of sacrificial layers 1515 after etching is referred to hereafter as "pad layer 1512." The etchant can have a relatively high selectivity (e.g., greater than 5 times) of sacrificial layers 1515 with respect to sacrificial layers 1517 and liner layers 1511, thereby leaving sacrificial layers 1517 and liner layers 1511 intact as well. For example, etchants having phosphoric acid ($H_3PO_4$) may be used to selectively etch sacrificial layers 1515 having silicon nitride or $Al_2O_3$, without etching sacrificial layers 1517 having polysilicon and liner layers 1511 having silicon oxide. In some implementations, the etching rate and/or duration are controlled such that the etching process stops before fully etching away sacrificial layers 1515. FIG. 15E illustrates both the side view (in the bottom portion of FIG. 15E) of a cross-section along the y-direction (the bit line direction, e.g., in the AA plane through semiconductor bodies 1506) and the plan view (in the top portion of FIG. 15E) of a cross-section in the x-y plane (e.g., in the BB plane through semiconductor bodies 1506 and sacrificial layers 1517).

As illustrated in FIG. 15F, gate dielectrics 1514 are formed on the partially exposed two opposite sides of semiconductor bodies 1506 in the bit line direction in trenches 1509 (shown in FIG. 15E). In some implementations, gate dielectrics 1514 are formed by depositing a layer of dielectric, such as silicon oxide, over the exposed sidewalls of semiconductor bodies 1506 using one or more thin film deposition processes including, but not limited to, CVD, PVD, ALD, or any combination thereof, without fully filling trenches 1509. It is understood that in some examples, gate dielectrics 1514 may not be parts of a continuous dielectric layer. For example, a thermal oxidation process, such as ISSG oxidation, is performed to further grow native oxide (e.g., silicon oxide) on semiconductor bodies 1506 (e.g., single crystalline silicon) from liner layer 1511 to become gate dielectric 1514. It is also understood that since gate dielectrics 1514 and liner layers 1511 may have the same materials, such as silicon oxide, the interface and boundary between gate dielectrics 1514 and liner layers 1511 may become indistinguishable. Thus, for ease of description, liner layers 1511 that are in contact with gate dielectrics 1514 may be illustrated as part of gate dielectrics 1514 in the present disclosure, for example, as shown in FIG. 15F.

As illustrated in FIG. 15F, gate electrodes 1516 are formed on the side of gate dielectrics 1514 in trenches 1509 (shown in FIG. 15E). Gate electrode 1516 can be formed between gate dielectric 1514 and sacrificial layer 1517 in the bit line direction to fill trench 1509. In some implementations, gate electrode 1516 includes a gate conductor 1521 and a barrier layer 1519 surrounding gate conductor 1521. In some implementations, gate electrodes 1516 are formed by depositing one or more layers of conductive layers, such as metals or metal compounds, over the exposed sidewall of gate dielectrics 1514 using one or more thin film deposition processes including, but not limited to, CVD, PVD, ALD, or any combination thereof, fully filling trenches 1509. For example, a layer of TiN and a layer of W may be sequentially deposited into trench 1509 to form barrier layer 1519 having TiN and gate conductor 1521 having W, respectively. That is, the self-aligned gate process disclosed herein can allow the later deposited gate conductor 1521 to be surrounded by the first deposited barrier layer 1519 when filling trench 1509. FIG. 15F illustrates both the side view (in the bottom portion of FIG. 15F) of a cross-section along the y-direction (the bit line direction, e.g., in the AA plane through semiconductor bodies 1506) and the plan view (in the top portion of FIG. 15F) of a cross-section in the x-y plane (e.g., in the BB plane through semiconductor bodies 1506, gate electrodes 1516, gate dielectrics 1514, and sacrificial layers 1517). As shown in the plan view, gate electrodes 1516 can be parts of a continuous rectangular annulus conductive layer (word line) surrounding a row of semiconductor bodies 1506.

As illustrated in FIG. 15F, top portions of gate electrodes 1516 are replaced with dielectric plugs 1540, making the top end of gate electrodes 1516 below the top end of semiconductor body 1506. To form dielectric plugs 1540, gate electrodes 1516 can be etched back (recessed) from the top by wet etching and/or drying etching, such that the upper end of gate electrodes 1516 becomes below the top surface of semiconductor body 1506, and the resulting recesses can be filled with dielectric plugs 1540 by depositing dielectrics, such as silicon oxide, using one or more thin film deposition processes including, but not limited to, CVD, PVD, ALD, or any combination thereof. The remainder of gate electrode 1516 (referring to hereafter as "gate electrode 1516" for ease of description) and gate dielectric 1514 in contact with gate electrode 1516 become a gate structure coupled to two opposite sides of semiconductor body 1506 in the bit line direction, according to some implementations, as shown in FIG. 15F.

Method 1600 proceeds to operation 1610, as illustrated in FIG. 16, in which the second sacrificial layer and the another second sacrificial layer are replaced with a dielectric isolation layer. In some implementations, to replace the second and another second sacrificial layers with the dielectric isolation layer, the second and another second sacrificial layers are removed to expose one side of the gate structure, and the dielectric isolation layer is formed on the exposed side of the gate structure.

Figure 15G:
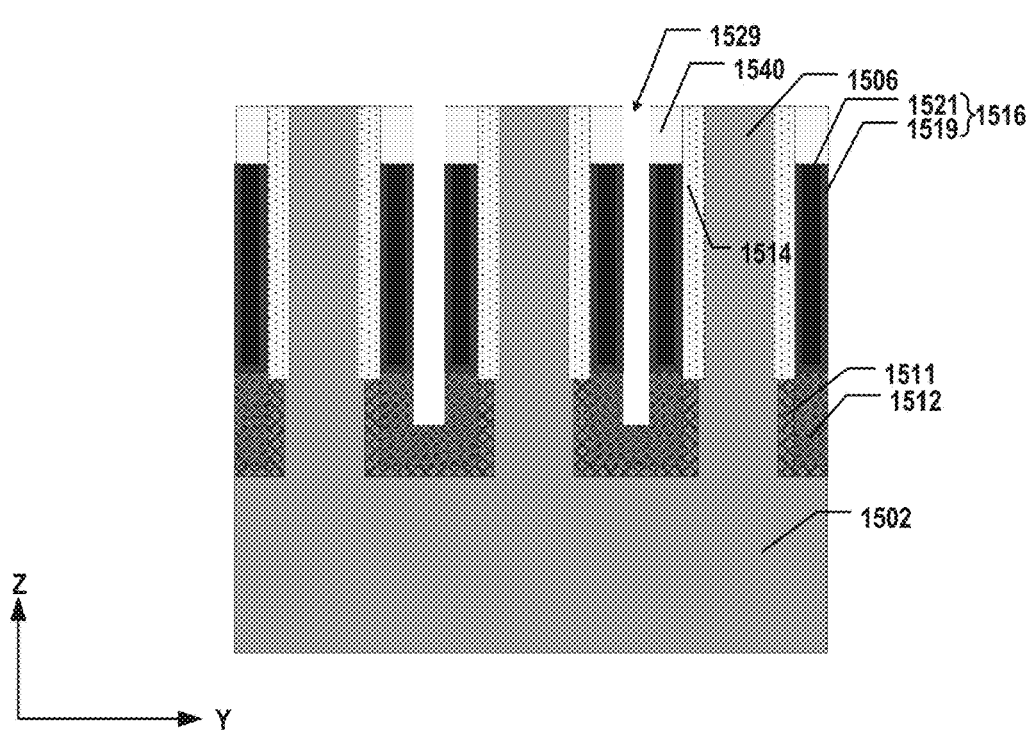

As illustrated in FIG. 15G, sacrificial layers 1517 (shown in FIG. 15F) are selectively removed to form trenches 1529, exposing the sidewalls of gate electrodes 1516 of the gate structures and parts of pad layers 1512. Selective etching processes, such as wet etching, can be performed to etch away sacrificial layers 1517. The etchant can have a relatively high selectivity (e.g., greater than 5 times) of sacrificial layers 1517 with respect to gate electrodes 1516 and pad layers 1512, thereby leaving gate electrodes 1516 and pad layers 1512 intact. For example, the etchant having potassium hydroxide (KOH) may be used to selectively etch sacrificial layers 1517 having polysilicon, without etching gate electrodes 1516 having W/TiN and pad layers 1512 having silicon nitride or $Al_2O_3$.

Figure 15H:
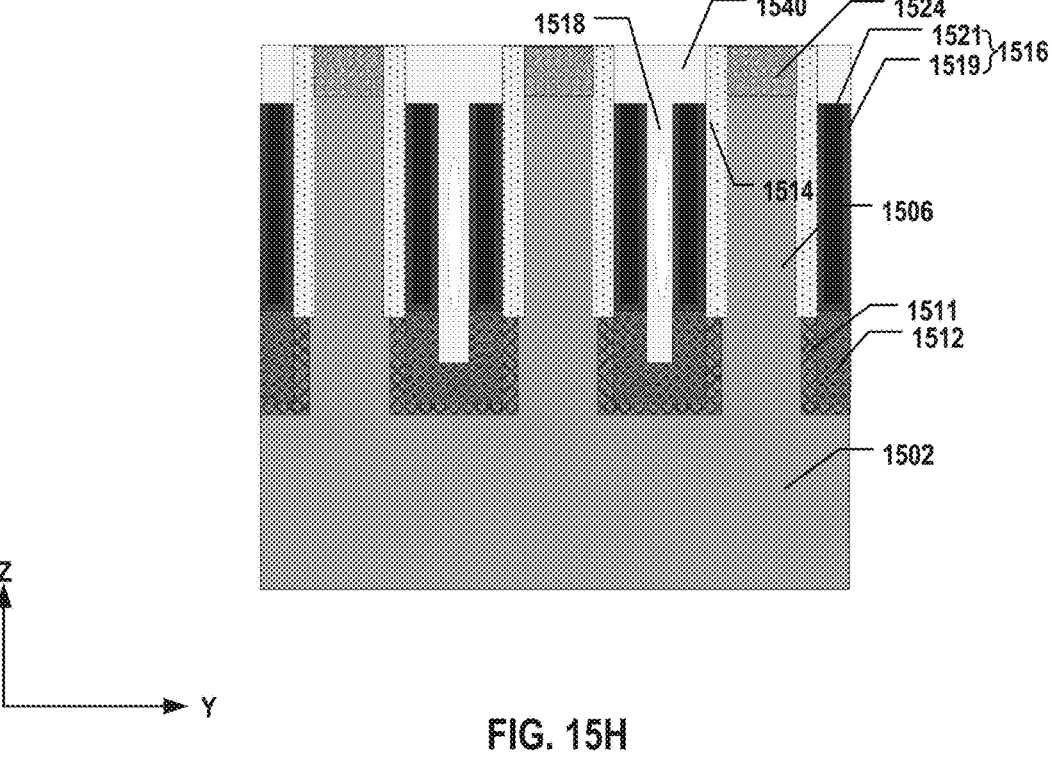

As illustrated in FIG. 15H, dielectric isolation layers 1518 are formed on the exposed side of gate electrodes 1516 of the gate structures. To form dielectric isolation layers 1518, dielectric material(s), such as silicon oxide, are deposited using one or more thin film deposition processes including, but not limited to, CVD, PVD, ALD, or any combination thereof, to fill trenches 1529 (shown in FIG. 15G). Depending on the lateral dimensions of trenches 1529, trenches 1529 may not be fully filled with the deposited dielectric material(s) (e.g., silicon oxide) when forming dielectric isolation layers 1518 and thus, become air gaps therein according to the self-aligned gate process, as shown in FIG. 15H. It is understood that in some examples, when the lateral dimensions of trenches 1529 are sufficiently large, dielectric material(s) may fully fill trenches 1529 during the formation of dielectric isolation layers 1518, thereby eliminating the air gaps. It is understood that since dielectric isolation layer 1518 and dielectric plug 1540 may have the same materials, such as silicon oxide, the interface and boundary between dielectric isolation layer 1518 and dielectric plug 1540 may become indistinguishable.

As shown in FIG. 15H, gate electrode 1516, gate dielectric 1514, and dielectric isolation layer 1518 can be formed on top of pad layer 1512 (i.e., the remainder of sacrificial layer 1515). That is, sacrificial layers 1515 and 1517 are used to define the shape, position, and dimensions of the gate structure having gate electrode 1516 and gate dielectric 1514 according to the self-aligned gate process. Specifically, the shape, position, and dimensions of gate electrode 1516 can be further defined by dielectric plug 1540 and pad layer 1512 as well. As a result, the various issues associated with the gate process described above, such as the nonuniformity of the gate structure, the challenging bottom punch process, and the F attack, can be addressed by the self-aligned gate process disclosed herein.

As illustrated in FIG. 15H, the exposed top end (e.g., the end away from silicon substrate 1502 in the vertical direction) of semiconductor body 1506 is doped to form a drain or a source 1524 (referrer to hereinafter "source/drain 1524") of the vertical transistor. For example, source/drain 1524 may be the source terminal of the vertical transistor. In some implementations, an implantation process and/or thermal diffusion process are performed to dope P-type dopants or N-type dopants to exposed upper ends of semiconductor bodies 1506 to form sources/drains 1524. In some implementations, a silicide layer is formed on source/drain 1524 by performing a silicidation process at the exposed upper ends of semiconductor bodies 1506.

Method 1600 proceeds to operation 1612, as illustrated in FIG. 16, in which the substrate is thinned to expose an end of the semiconductor body. In some implementations, to thin the substrate, a carrier substrate is attached above the vertical transistor and opposite the substrate, and the substrate is polished until being stopped by a remainder of the first sacrificial layer.

As illustrated in FIG. 15I, a carrier substrate 1526 (a.k.a. a handle substrate) is attached above gate electrodes 1516 of the gate structures and semiconductor bodies 1506 and opposite silicon substrate 1502 using any suitable bonding processes, such as anodic bonding, fusion bonding, transfer bonding, adhesive bonding, and eutectic bonding. In some implementations, a dielectric layer 1525 is formed between carrier substrate 1526 and silicon substrate 1502 prior to attaching carrier substrate 1526. The attached structure can then be flipped upside down, such that silicon substrate 1502 becomes above carrier substrate 1526.

As illustrated in FIG. 15J, silicon substrate 1502 (shown in FIG. 15I) is thinned to expose the undoped upper ends of semiconductor bodies 1506 (used to be the lower ends before flipping over) that are away from carrier substrate 1526. In some implementations, a polishing process (e.g., CMP) is performed to polish silicon substrate 1502 from the backside until being stopped by pad layers 1512 (the remainder of sacrificial layer 1515). In other words, pad layers 1512 can be used as the stop layers in thinning silicon substrate 1502 from the backside. As a result, pad layers 1512 and semiconductor bodies 1506 are exposed from the backside, according to some implementations.

Figure 15K:
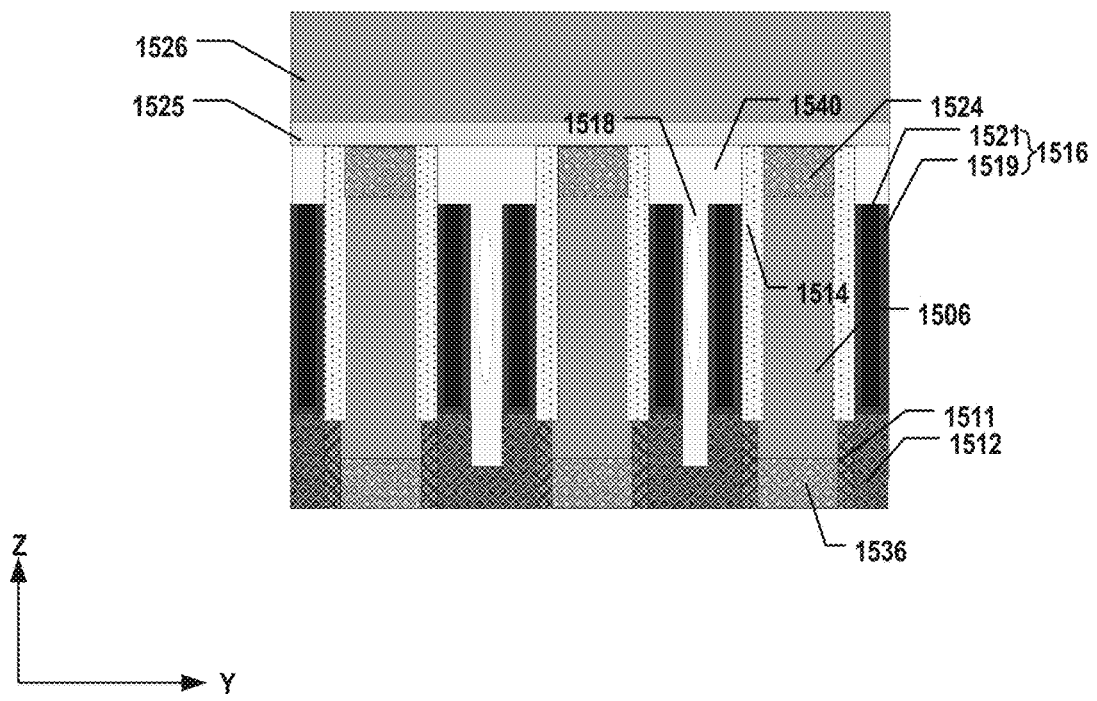

Method 1600 proceeds to operation 1614, as illustrated in FIG. 16, in which the exposed end of the semiconductor body is doped to form a drain or a source of the vertical transistor. As illustrated in FIG. 15K, the exposed bottom end (e.g., the end away from carrier substrate 1526 in the vertical direction) of semiconductor body 1506 is doped to form another drain or source 1536 (referrer to hereinafter as "source/drain 1536") of the vertical transistor. For example, source/drain 1536 may be the drain terminal of the vertical transistor. In some implementations, an implantation process and/or thermal diffusion process are performed to dope P-type dopants or N-type dopants to exposed lower ends of semiconductor bodies 1506 to form sources/drains 1536.

Method 1600 proceeds to operation 1616, as illustrated in FIG. 16, in which a bit line adjacent to the exposed end of the semiconductor body and extending in a second direction perpendicular to the first direction is formed. The bit line can be coupled to the drain or the source.

Figure 15L:
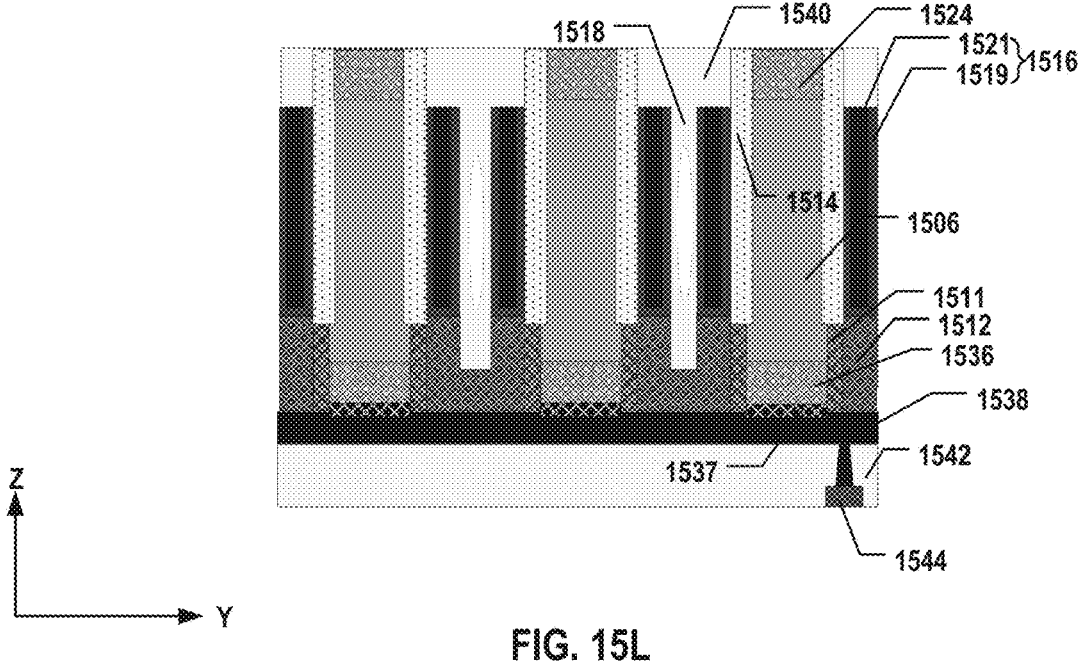

As illustrated in FIG. 15L, a bit line 1538 extending in the bit line direction (they-direction) is formed adjacent to the exposed lower ends of semiconductor bodies 1506, being coupled to drains/sources 1536. Bit line 1538 can be formed by patterning and etching a trench aligned with a column of sources/drains in the bit line direction using lithography and etching processes. The trenches can then be filled by depositing conductive materials, such as metals (e.g., W), using one or more thin film deposition processes including, but not limited to, CVD, PVD, ALD, or any combination thereof. In some implementations, forming bit line 1538 includes depositing a metal layer (e.g., W) onto the exposed lower end of semiconductor body 1506 to form a metal bit line.

As illustrated in FIG. 15L, ohmic contacts 1537 are formed between bit line 1538 and sources/drains 1536 at the exposed lower ends of semiconductor bodies 1506 to couple bit line 1538 and sources/drains 1536. Ohmic contacts 1537 can include metal silicide material, i.e., metal silicide contacts. In some implementations, a metal silicide layer is formed between sources/drains 1536 and bit line 1538 by performing a silicidation process, for example, RTA, as ohmic contacts 1537 having a metal silicide, such as WSi.

As illustrated in FIG. 15L, a dielectric layer 1542 is formed opposing pad layers 1512 with bit line 1538 positioned between dielectric layer 1542 and pad layers 1512 in the vertical direction. Bit line contacts 1544 in contact with bit line 1538 can be formed through dielectric layer 1542. In some implementations, dielectric layer 1542 having silicon oxide is deposited on bit line 1538 using one or more thin film deposition processes including, but not limited to, CVD, PVD, ALD, or any combination thereof. Bit line contacts 1544 can then be formed through dielectric layer 1542 and coupled to bit line 1538 by first patterning contact holes through dielectric layer 1542 using a patterning process (e.g., photolithography and dry/wet etch of dielectric materials in dielectric layer 1542). The contact holes can be filled with conductive materials (e.g., W, TiN, and/or Cu) to form bit line contacts 1544.

It is understood that although the self-aligned gate process described above with respect FIGS. 15A-15L is for forming "single-layer pad layer," for example, as shown in FIG. 13A, the process may be modified in view of the self-aligned gate process described above with respect FIGS. 10A-10F to form "two-layer pad layer," for example, as shown in FIG. 13B as well. For example, a pad layer may be formed on the bottom surface of trench 1510 before forming sacrificial layer 1515 such that sacrificial layer 1515 may be formed on top of the pad layer. The first-formed pad layer may be used as the stop layer in thinning silicon substrate 1502, and the first-formed pad layer and the remainder of sacrificial layer 1515 may become a two-layer pad layer in the final semiconductor device.

According to some aspects of the present disclosure, the vertical transistors are single-gate transistors, and two adjacent rows of vertical transistors are mirror-symmetric to one another (referred to herein as "mirror-symmetric gate (MSG)" as well). For example, FIGS. 17A and 17B illustrate a plan view and a perspective view, respectively, of still another array of vertical transistors 1702 in a semiconductor device 1700, according to some aspects of the present disclosure. As shown in FIGS. 17A and 17B, semiconductor device 1700 can include a plurality of word lines 1704 each extending in a first lateral direction (the x-direction). Semiconductor device 1700 can also include a plurality of bit lines 1706 each extending in a second lateral direction perpendicular to the first lateral direction (they-direction). It is understood that FIG. 17A does not illustrate a cross-section of semiconductor device 1700 in the same lateral plane, and word lines 1704 and bit lines 1706 may be formed in different lateral planes for ease of routing as described below in detail.

Vertical transistors 1702 can be formed at the intersections of word lines 1704 and bit lines 1706. In some implementations, each vertical transistor 1702 includes a semiconductor body 1708 and a gate structure 1710. As shown in FIG. 17B, semiconductor body 1708 can extend on a substrate 1701 (shown in FIG. 17A) in the vertical direction (the z-direction) perpendicular to the first and second lateral directions. Vertical transistor 1702 can be a single-gate transistor in which gate structure 1710 is coupled to a single side (e.g., one of four sides in FIGS. 17A and 17B) of semiconductor body 1708 (the active region in which channels are formed). As shown in FIGS. 17A and 17B, vertical transistor 1702 is a single-gate transistor in which gate structure 1710 abuts one side of semiconductor body 1708 (having a rectangle or square-shaped cross-section) in the bit line direction (the y-direction) in the plan view. Gate structure 1210 does not surround and contact other three sides of semiconductor body 1708, according to some implementations. As shown in FIG. 17B, gate structure 1710 can include a gate dielectric 1712 abuts one side of semiconductor body 1708 in the plan view, and a gate electrode 1714 in contact with gate dielectric 1712. In some implementations, gate dielectric 1712 is positioned laterally between gate electrode 1714 and semiconductor body 1708 in the bit line direction (the y-direction).

As described above, gate electrode 1714 may be part of word line 1704, and word line 1704 may be an extension of gate electrode 1714. That is, gate electrodes 1714 of adjacent vertical transistors 1702 in the word line direction (the x-direction), e.g., in the same row, are continuous, e.g., parts of a continuous conductive layer having gate electrodes 1714 and word line 1704. Similarly, gate dielectrics 1712 of adjacent vertical transistors 1702 in the word line direction, e.g., in the same row, are continuous, e.g., parts of a continuous dielectric layer having gate dielectrics 1712 and extending in the word line direction to abut vertical transistors 1702 in the same row. Gate structures 1710 can be thus viewed as parts of a continuous structure extending in the word line direction at which the continuous structure abut vertical transistors 1702 in the same row. Gate electrodes 1714 and gate dielectrics 1712 of a row of vertical transistors 1702 are continuous in the word line direction, according to some implementations.

As shown in FIG. 17A, semiconductor device 1700 can further include a plurality of parallel dielectric isolation layers 1716 each extending in the word line direction (the x-direction). Each dielectric isolation layer 1716 is positioned laterally between gate structures 1710 of two adjacent rows of vertical transistors 1702 in the bit line direction (the y-direction) to reduce the coupling effect between the adjacent rows of vertical transistors 1702. As described below in detail, the thickness (the dimension in the bit line direction) of dielectric isolation layer 1716 and/or whether air gaps being formed in dielectric isolation layer 1716 can affect the effectiveness of coupling reduction.

As shown in FIG. 17A, semiconductor device 1700 can further include a plurality of parallel trench isolations 1705 each extending in the word line direction (the x-direction) and in parallel with dielectric isolation layer 1716. Each trench isolation 1705 can be positioned between two adjacent rows of vertical transistors 1702 in the bit line direction (they-direction), and the two adjacent rows of vertical transistors 1702 can be mirror-symmetric with respect to trench isolation 1705. As described below with respect to the fabrication process, semiconductor bodies 1708 of each pair of two adjacent vertical transistors 1702 in the bit line direction can be formed by separating a semiconductor pillar into two pieces using trench isolation 1705. Trench isolations 1705 and word lines 1704 can be disposed in an interleaved manner in the bit line direction. In some implementations, trench isolation 1705 is formed in the middle of the semiconductor pillars (not shown) such that the resulting pair of semiconductor bodies 1708 are mirror-symmetric to one another with respect to trench isolation 1705, so are the pair of vertical transistors 1702 having semiconductor bodies 1708 when the respective gate structures 1710 are mirror-symmetric to one another with respect to trench isolation 1705 as well.

It is understood that in some examples, trench isolations 1705 extending in the word line directions may not be formed such that two adjacent semiconductor bodies 1708 separated by a respective trench isolation 1705 may be merged as a single semiconductor body having two opposite sides in the bit line direction in contact with gate structure 1710 (e.g., as shown in FIG. 12A). That is, without trench isolations 1705, the adjacent single-gate vertical transistors may be merged to form a double-gate vertical transistor (e.g., 1202 in FIG. 12A) with increased gate control area and lower leakage current. The gate structure of the double-gate vertical transistor may include two mirror-symmetric gate structures 1710 in FIGS. 17A and 17B, such that both sides of the merged semiconductor body 1708 in the bit line direction may be in contact with the gate structure in the double-gate vertical transistor. On the other hand, by splitting the double-gate vertical transistors into single-gate vertical transistors using trench isolations 1705, the number of vertical transistors 1702 (and the device density) in the bit line direction can be doubled compared to double-gate vertical transistors without unduly complexing the fabrication process (e.g., compared with using SADP process).

Figure 18A:
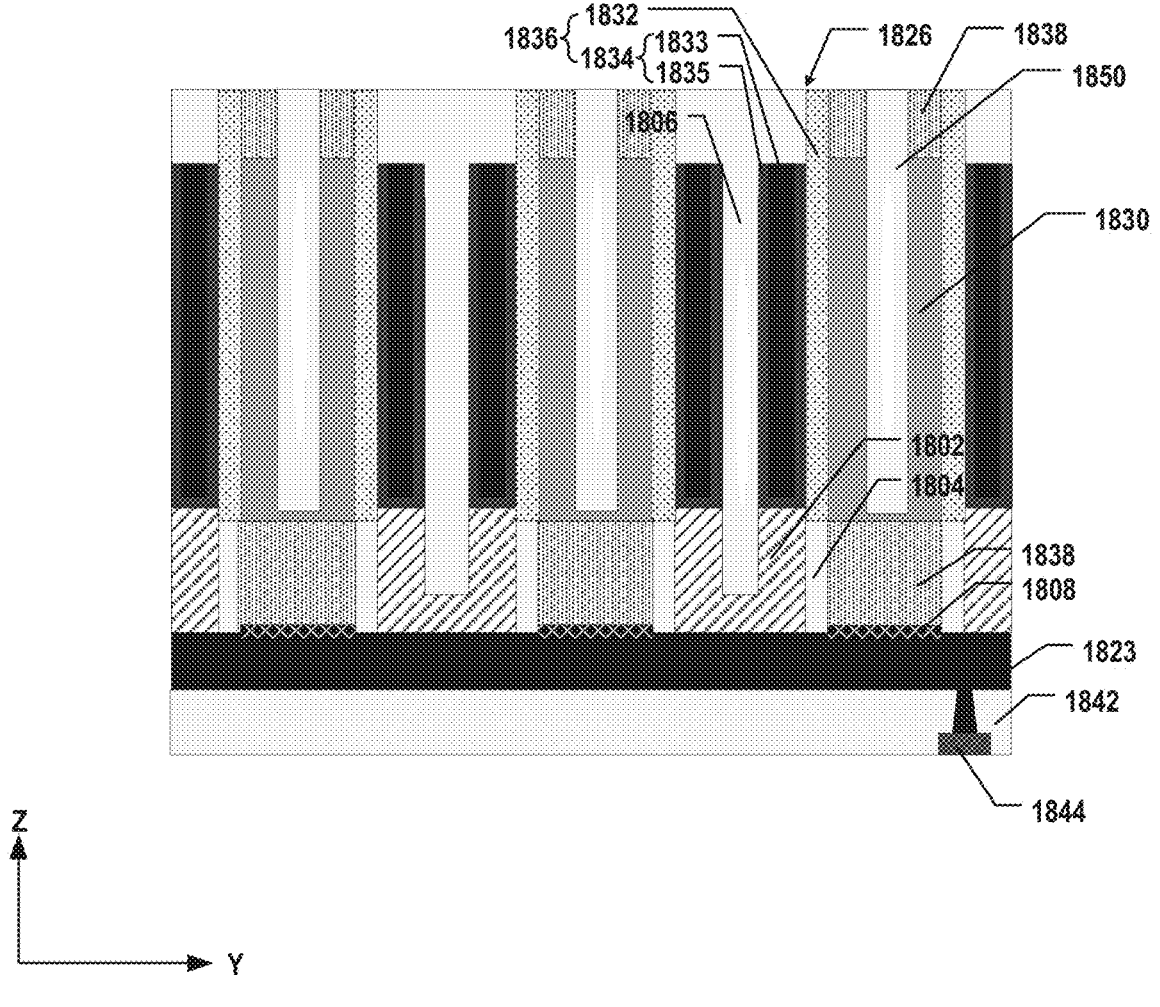
FIG. 18A illustrates a side view of a cross-section of yet another semiconductor device including vertical transistors, according to some aspects of the present disclosure.

FIG. 18A illustrates a side view of a cross-section of a semiconductor device 1800 including vertical transistors 1826, according to some aspects of the present disclosure. Semiconductor device 1800 may be one example of semiconductor device 1700 including single-gate vertical transistors 1702 in which gate structure 1710 is coupled to one side of semiconductor body 1708 and two adjacent rows of vertical transistors 1702 are mirror-symmetric to one another. It is understood that FIG. 18A is for illustrative purposes only and may not necessarily reflect the actual device structure (e.g., interconnections) in practice. It is also understood that any other suitable components not shown in FIG. 18A may be included in semiconductor device 1800 to be coupled to vertical transistors 1826, such as any suitable storage units and peripheral circuits. It is further understood that the cross-section of semiconductor device 1800 in FIG. 18A may be made along the bit line direction (they-direction), and bit line 1823 extending laterally in they-direction may be coupled to a column of vertical transistors 1826.

Vertical transistor 1826 can be a MOSFET. In some implementations, vertical transistor 1326 includes a semiconductor body 1830 (the active region in which one or more channels can form) extending vertically (in the z-direction), and a gate structure 1836 coupled to one side of semiconductor body 1830 in the bit line direction. As described above, as in a single-gate vertical transistor, semiconductor body 1830 can have a cuboid shape or a cylinder shape, and gate structure 1836 can be in contact with one of the two sides of semiconductor body 1830 in the bit line direction in the plan view. Gate structure 1836 includes a gate electrode 1834 and a gate dielectric 1832 position laterally between gate electrode 1834 and semiconductor body 1830 in the bit line direction, according to some implementations. For example, for semiconductor body 1830 having a cylinder shape, semiconductor body 1830, gate dielectric 1832, and gate electrode 1834 may be disposed radially from the center of vertical transistor 1826 in this order. In some implementations, gate dielectric 1832 abuts one side of semiconductor body 1830, and gate electrode 1834 abuts gate dielectric 1832.

As shown in FIG. 18A, in some implementations, semiconductor body 1830 has two ends (the upper end and lower end) in the vertical direction (the z-direction), and both ends extend beyond gate electrode 1834, respectively, in the vertical direction (the z-direction). That is, semiconductor body 1830 can have a larger vertical dimension (e.g., the depth) than that of gate electrode 1834 (e.g., in the z-direction), and neither the upper end nor the lower end of semiconductor body 1830 is flush with the respective end of gate electrode 1834. Thus, short circuits between bit lines 1823 and word lines/gate electrodes 1834 or between word lines/gate electrodes 1834 and other components coupled to the upper terminal of vertical transistor 1826 (not shown, e.g., a capacitor) can be avoided. In some implementations, the upper end of semiconductor body 1830 is flush with the upper end of gate dielectric 1832, as shown in FIG. 18A. Thus, within gate structure 1836, the upper end of gate dielectric 1832 can extend beyond the upper end of gate electrode 1834 in the vertical direction as well.

As shown in FIG. 18A, semiconductor device 1800 can include trench isolations 1850 (e.g., corresponding to trench isolations 1705 in FIG. 17A) each extending in the vertical direction and between adjacent semiconductor bodies 1830 in the bit line direction. In some implementations, semiconductor bodies 1830 of two adjacent vertical transistors 1826 in the bit line direction are mirror-symmetric to one another with respect to trench isolation 1850. That is, semiconductor device 1800 can include a plurality of trench isolations 1850 each extending in the word line direction (the x-direction) and positioned between semiconductor bodies 1830 of two adjacent rows of vertical transistors 1826. In some implementations, the rows of vertical transistors 1826 separated by trench isolation 1850 are mirror-symmetric to one another with respect to trench isolation 1850. Trench isolation 1850 can be formed with dielectric materials including, but not limited to, silicon oxide, silicon nitride, silicon oxynitride, low-k dielectrics, or any combination thereof. It is understood that trench isolation 1850 may include an air gap (as shown in FIG. 18A) each disposed laterally between adjacent semiconductor bodies 1830. As described below with respect to the fabrication process, air gaps may be formed due to the relatively small pitches of vertical transistors 1826 in the bit line direction (e.g., the y-direction). On the other hand, the relatively large dielectric constant of air in air gaps (e.g., about 4 times of the dielectric constant of silicon oxide) can improve the insulation effect between vertical transistors 1826 compared with some dielectrics (e.g., silicon oxide).

In some implementations, as shown in FIG. 18A, trench isolation 1850 does not fully separate adjacent semiconductor bodies 1830, leaving parts thereof (e.g., the bottom portions in FIG. 18A) still connected. In other words, trench isolation 1850 does not extend all the way through adjacent semiconductor bodies 1830 in the vertical direction, such that adjacent semiconductor bodies 1830 has a "U" shape in the side view, according to some implementations. It is understood that in some examples, trench isolation 1850 may extend all the way through adjacent semiconductor bodies 1830 in the vertical direction to fully separate adjacent semiconductor bodies 1830.

Vertical transistor 1826 can further include a source and a drain (both referred to as 1838 as their locations may be interchangeable) disposed at the two ends (the upper end and lower end) of semiconductor body 1830, respectively, in the vertical direction (the z-direction). In some implementations, one of source and drain 1838 (e.g., at the upper end in FIG. 18A) is coupled to a capacitor (not shown), and the other one of source and drain 1838 (e.g., at the lower end in FIG. 18A) is coupled to bit line 1823 (e.g., via an ohmic contact 1808). That is, vertical transistor 1826 can have a first terminal in the positive z-direction and a second terminal opposite the first terminal in the negative z-direction, as shown in FIG. 18A. As described above, in some implementations, sources or drains 1838 at the upper end of adjacent semiconductor bodies 1830 are fully separated by trench isolation 1850 and thus, are disconnected, while sources or drains 1838 at the lower end of adjacent semiconductor bodies 1830 are not fully separated by trench isolation 1850 and are still connected, as shown in FIG. 18A. It is understood that in some examples, sources and drains 1838 at both upper and lower ends of adjacent semiconductor bodies 1830 may be fully separated by trench isolation 1850 and thus, are disconnected.

In some implementations, a metal bit line (e.g., bit line 1823 made of a metal material) is coupled to the second terminal of vertical transistor 1826 via ohmic contact 1808. Ohmic contact 1808 can be made of a metal silicide material, i.e., a metal silicide contact. The usage of a metal bit line (as opposed to doped silicon) and a metal silicide contact (as opposed to a Schottky contact) can significantly reduce the contact resistance between vertical transistor 1826 and bit line 1823. For example, bit line 1823 may include W, Co, Cu, Al, or any other suitable metals having higher conductivities than doped silicon. For example, ohmic contact 1808 may include metal silicides, such as WSi, CoSi, CuSi, AlSi, or any other suitable metal silicides having higher conductivities than doped silicon.

In some implementations, semiconductor body 1830 includes semiconductor materials, such as single crystalline silicon, polysilicon, amorphous silicon, Ge, any other semiconductor materials, or any combinations thereof. In one example, semiconductor body 1830 may include single crystalline silicon. Source and drain 1838 can be doped with N-type dopants (e.g., P or As) or P-type dopants (e.g., B or Ga) at a desired doping level. In some implementations, gate dielectric 1832 includes dielectric materials, such as silicon oxide, silicon nitride, or high-k dielectrics including, but not limited to, $Al_2O_3$, $HfO_2$, $Ta_2O_5$, $ZrO_2$, $TiO_2$, or any combination thereof. In some implementations, gate electrode 1834 includes conductive materials including, but not limited to W, Co, Cu, Al, TiN, TaN, polysilicon, silicides, or any combination thereof. In one example, gate structure 1836 may be a "gate oxide/gate poly" gate in which gate dielectric 1832 includes silicon oxide and gate electrode 1834 includes doped polysilicon. In another example, gate structure 1836 may be an HKMG in which gate dielectric 1832 includes a high-k dielectric and gate electrode 1834 includes a metal.

As shown in FIG. 18A, in some implementations, gate electrode 1834 includes a gate conductor 1833 and a barrier layer 1835 surrounding gate conductor 1833. In one example, gate conductor 1833 may include W, and barrier layer 1835 may include TiN. In forming gate conductor 1833 having W, F may be used in the precursor of the deposition materials and trapped into gate conductor 1833 having W. Barrier layer 1835 that surrounds the gate conductor 1833 thus can prevent the trapped F from releasing and attacking the adjacent silicon oxide to form voids and seams. Barrier layer 1835 can also serve as the glue layer/adhesive layer to increase the adhesion between gate conductor 1833 and gate dielectric 1832. As described below in detail with respect to the fabrication process, the self-aligned gate process can enable the formation of barrier layer 1835 that surrounds gate conductor 1833.

As described above, since gate electrode 1834 may be part of a word line or extend in the word line direction (e.g., the x-direction in FIG. 17A) as a word line, although not directly shown in FIG. 18A, semiconductor device 1800 can also include a plurality of word lines (e.g., an example of word lines 1704 in FIG. 17A, referred to as 1834 in FIG. 18A as well) each extending in the word line direction (the x-direction). Each word line 1834 can be coupled to a row of vertical transistors 1826. That is, bit line 1823 and word line 1834 can extend in two perpendicular lateral directions, and semiconductor body 1830 of vertical transistor 1826 can extend in the vertical direction perpendicular to the two lateral directions in which bit line 1823 and word line 1834 extend. Word lines 1834 are in contact with word line contacts (not shown), according to some implementations. In some implementations, word lines 1834 include conductive materials including, but not limited to W, Co, Cu, Al, TiN, TaN, polysilicon, silicides, or any combination thereof. In some implementations, word line 1834 includes multiple conductive layers, such as a gate conductor 1833 having W surrounded by a barrier layer 1835 having TiN.

As shown in FIG. 18A, semiconductor device 1800 can further include a plurality of dielectric isolation layers 1806 (e.g., corresponding to dielectric isolation layers 1716 in FIG. 17A) each disposed laterally between adjacent vertical transistors 1826 in the bit line direction. Different from trench isolation 1850 that is positioned between and in contact with semiconductor bodies of adjacent vertical transistors 1826, dielectric isolation layer 1806 is positioned between and in contact with gate electrodes/word lines 1834 of adjacent vertical transistors 1826, according to some implementations. In some implementations, air gaps are formed in dielectric isolation layers 1806 to further increase the effectiveness of coupling reduction between adjacent vertical transistors 1826. Each air gap can be a trench extending in the word line direction (e.g., the x-direction) in parallel with word lines 1834 to separate adjacent rows of vertical transistors 1826. As described below with respect to the fabrication process, air gaps may be formed due to the relatively small pitches of word lines 1834 (and rows of vertical transistors 1826) in the bit line direction (e.g., the y-direction). On the other hand, the relatively large dielectric constant of air in air gaps (e.g., about 4 times of the dielectric constant of silicon oxide) can improve the insulation effect between gate electrodes/word lines 1834 (and rows of vertical transistors 1826) compared with some dielectrics (e.g., silicon oxide).

Consistent with the scope of the present disclosure, as shown in FIG. 18A, semiconductor device 1800 can further include a pad layer 1802 positioned between gate electrodes 1834 and bit line 1823 in the vertical direction. As described above, pad layer 1802 can provide insulation between gate electrodes 1834 and bit line 1823 and avoid direct contact between gate electrodes 1834 and bit line 1823. In some implementations, the largest thickness (the largest dimension in the z-direction) of pad layer 1802 is the same as step between the lower end of semiconductor body 1830 and the lower end of gate electrode 1834. As described below with respect to the fabrication process, pad layer 1802 can also serve as the stop layer when removing the substrate on which semiconductor body 1830 is formed to expose the lower end of semiconductor body 1830. It is understood that, like bit line 1823, pad layer 1802 may extend laterally in the bit line direction (the y-direction) such that pad layer 1802 may be positioned between dielectric isolation layer 1806 and bit line 1823 in the vertical direction as well.

As shown in FIG. 18A, pad layer 1802 can have a single dielectric layer in contact with gate electrodes 1834 and bit line 1823 on opposite sides. In some implementations, pad layer 1802 and gate dielectric 1832 have different dielectric materials. For example, when gate dielectric 1832 has silicon oxide, pad layer 1802 may have any dielectric materials other than silicon oxide. In some implementations, pad layer 1802 has at least one of silicon nitride or high-k dielectrics, such as $Al_2O_3$, $HfO_2$, $Ta_2O_5$, $ZrO_2$, $TiO_2$, etc.

Different from semiconductor devices 600 and 601 in FIGS. 6A and 6B in which the single-layer pad layer 602 has a flat top surface and a uniform thickness, the single-layer pad layer 1802 of semiconductor device 1800 in FIG. 18A has a "U" shape, according to some implementations, because of the different self-aligned gate processes for forming gate structures 636 and 1836, as described below with respect to the fabrication process. As shown in FIG. 18A, gate electrodes 1834 can land on the thicker portions of pad layer 1802, while dielectric isolation layer 1806 can protrude into pad layer 1802 and extend beyond gate electrodes 1834. That is, in some implementations, the lower end of dielectric isolation layer 1806 is below the lower end of gate electrodes 1834 but is above the lower end of semiconductor body 1830.

As shown in FIG. 18A, in some implementations, semiconductor device 1800 further includes a liner layer 1804 positioned between pad layer 1802 and semiconductor body 1830 in the bit line direction (they-direction). Gate dielectric 1832 and liner layer 1804 can have the same material, such as silicon oxide. Thus, it is understood that the interface and boundary between gate dielectric 1832 and liner layer 1804 may become indistinguishable in some cases when gate dielectric 1832 and liner layer 1804 have the same material.

As shown in FIG. 18A, semiconductor device 1800 further includes a dielectric layer 1842 opposing vertical transistor 1826 with bit line 1823 positioned between dielectric layer 1842 and vertical transistor 1826 in the vertical direction. That is, vertical transistor 1826 and dielectric layer 1842 can be formed on opposite sides of bit line 1823 in the vertical direction. Local interconnects, such as bit line contacts 1844 can be formed in dielectric layer 1842. Bit line contacts 1844 can include conductive materials including, but not limited to, W, Co, Cu, Al, doped silicon, silicides, or any combination thereof. Dielectric layer 1842 can include dielectric materials including, but not limited to, silicon oxide, silicon nitride, silicon oxynitride, low-k dielectrics, or any combination thereof.

Figure 18B:
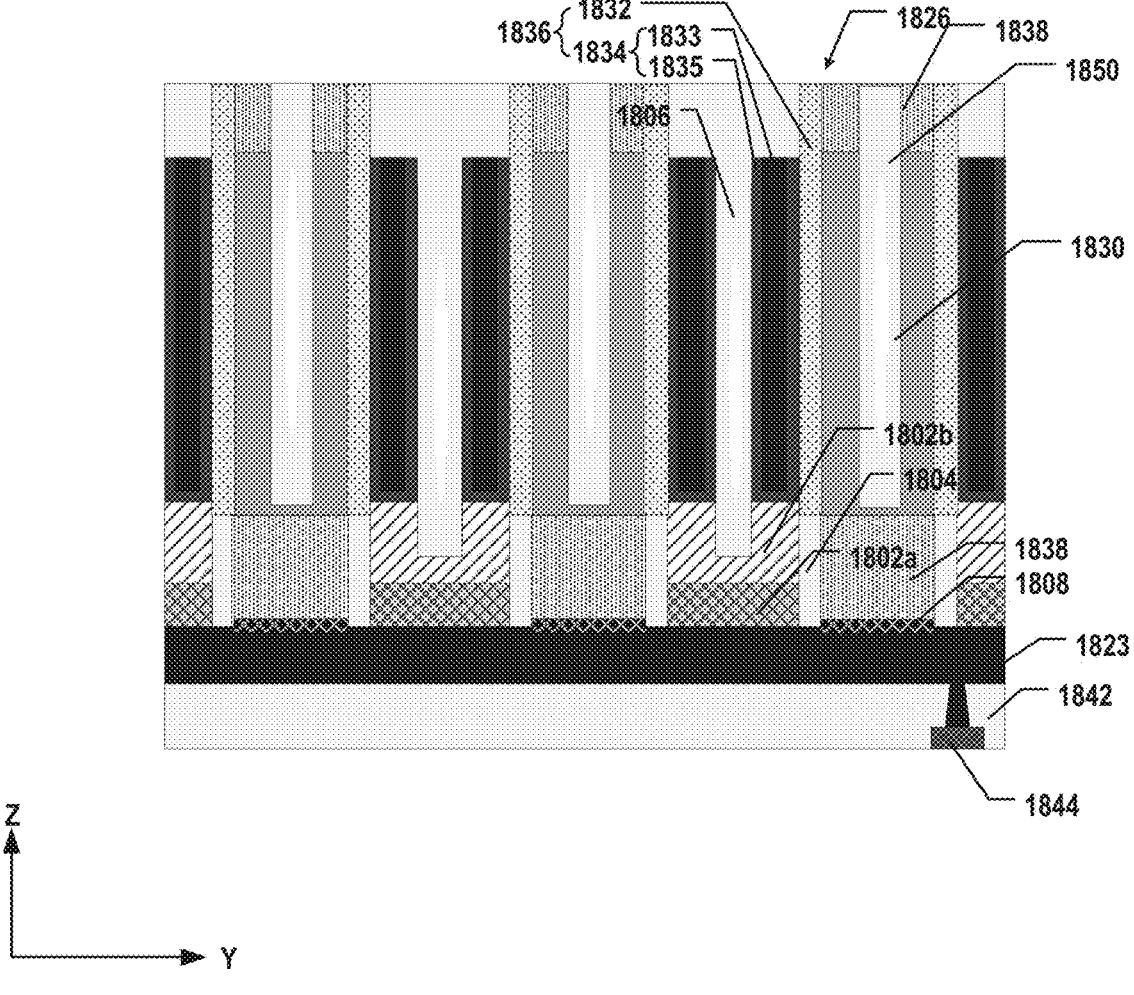
FIG. 18B illustrates a side view of a cross-section of yet another semiconductor device including vertical transistors, according to some aspects of the present disclosure.

It is understood that pad layer 1802 may include more than one dielectric layer with different dielectric materials. For example, FIG. 18B illustrates a side view of a cross-section of yet another semiconductor device 1801 including vertical transistors 1826, according to some aspects of the present disclosure. A two-layer pad layer 1802 in semiconductor device 1801 can include a first pad layer 1802a in contact with bit line 1823, and a second pad layer 1802b in contact with gate electrode 1834. First and second pad layers 1802a and 1802b have different dielectric materials, according to some implementations. For example, first pad layer 1802a may have silicon nitride, and second pad layer 1802b may have high-k dielectric, such as $Al_2O_3$, or vice versa. As described below with respect to the self-aligned gate process, first pad layer 1802a may serve as the stop layer for removing the substrate on which semiconductor body 1830 is formed to expose the lower end of semiconductor body 1830, and second pad layer 1802b may be the remainder of the first sacrificial layer for defining gate electrode 1834.

Figure 19I:
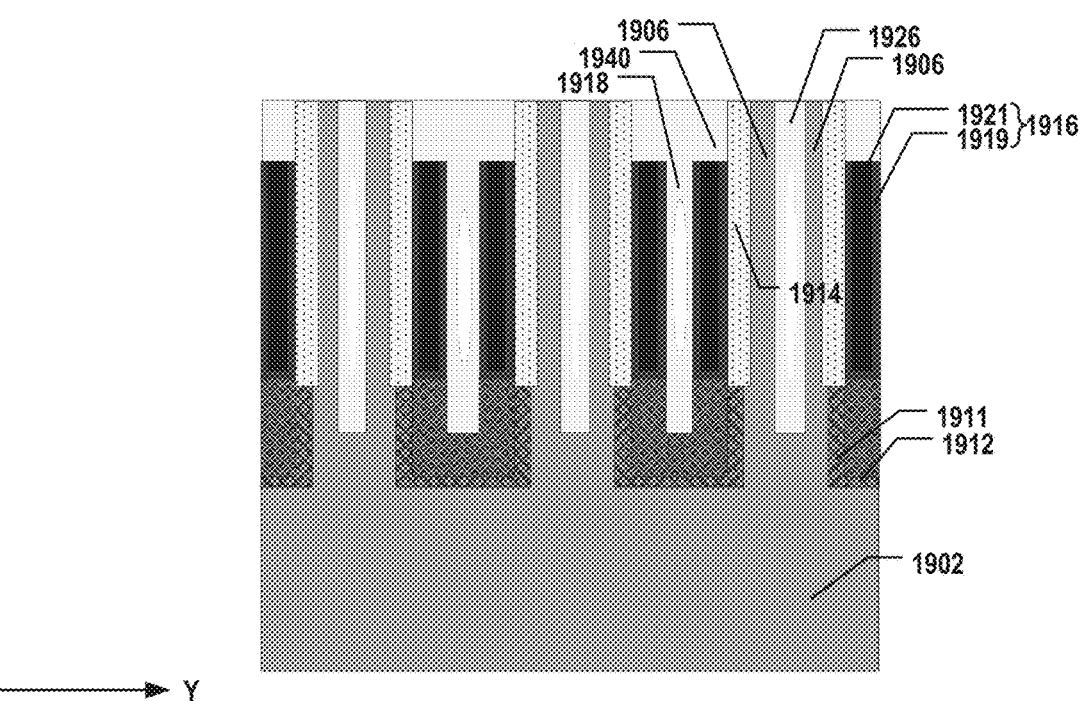
FIGS. 19A-19N illustrate a fabrication process for forming yet another semiconductor device including vertical transistors, according to some aspects of the present disclosure.
Figure 19J:
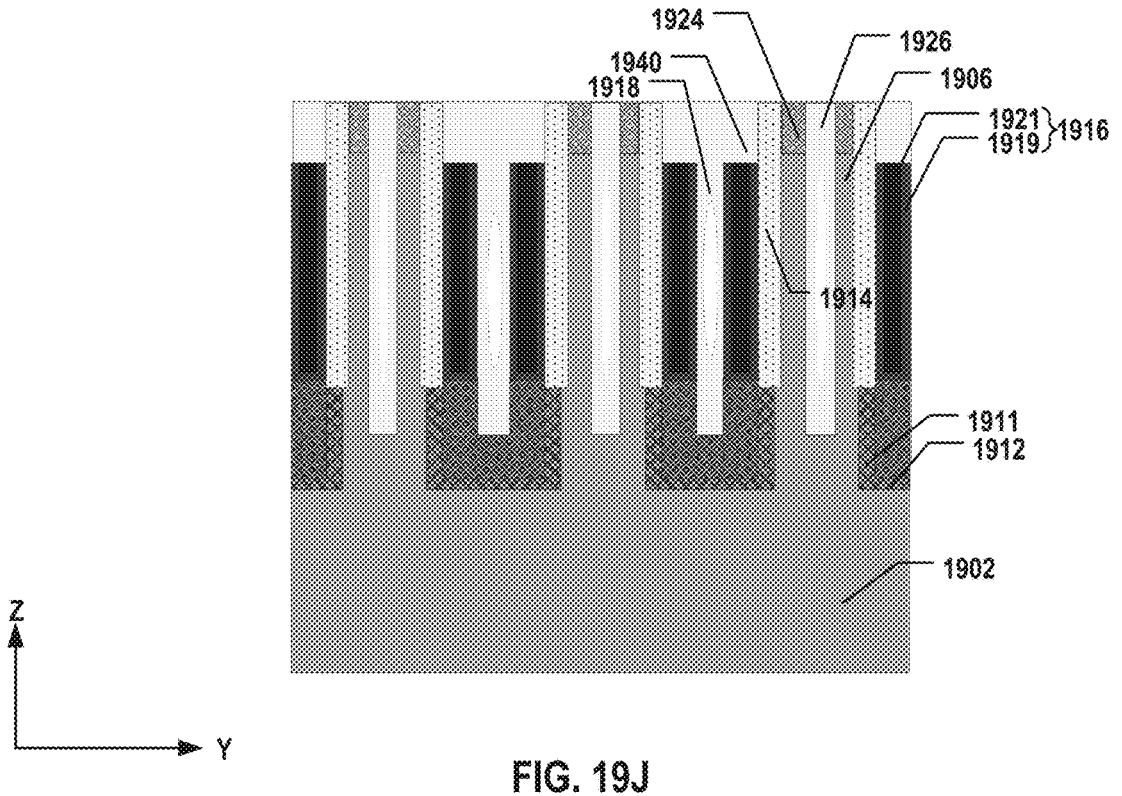
Figure 19K:
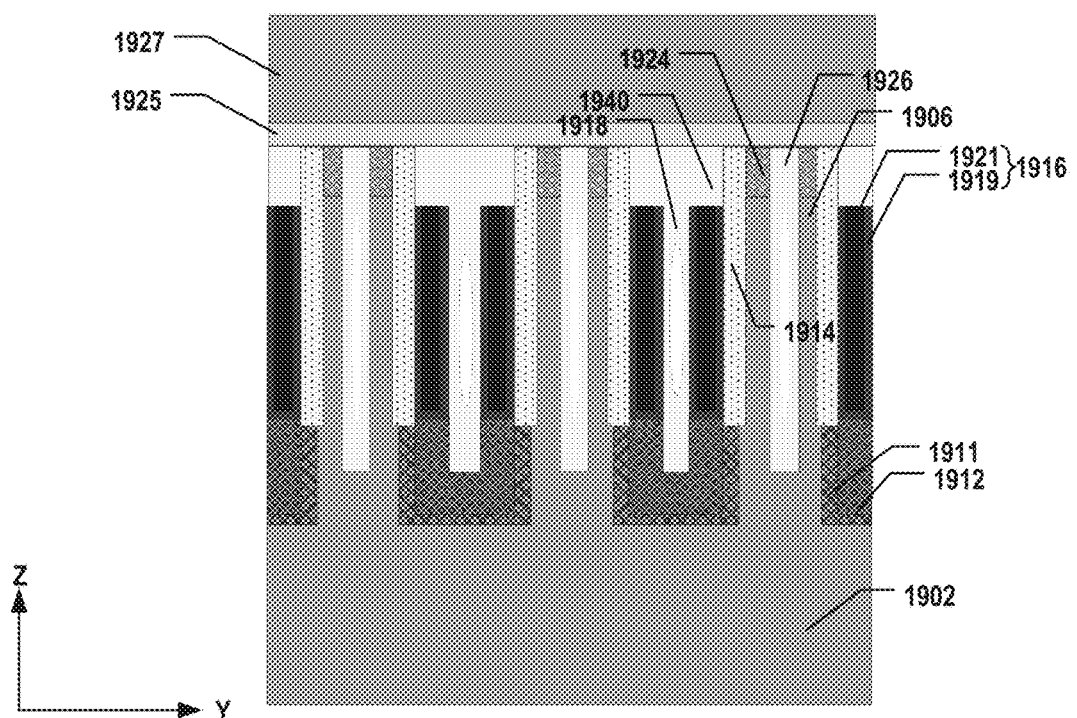
Figure 19L:
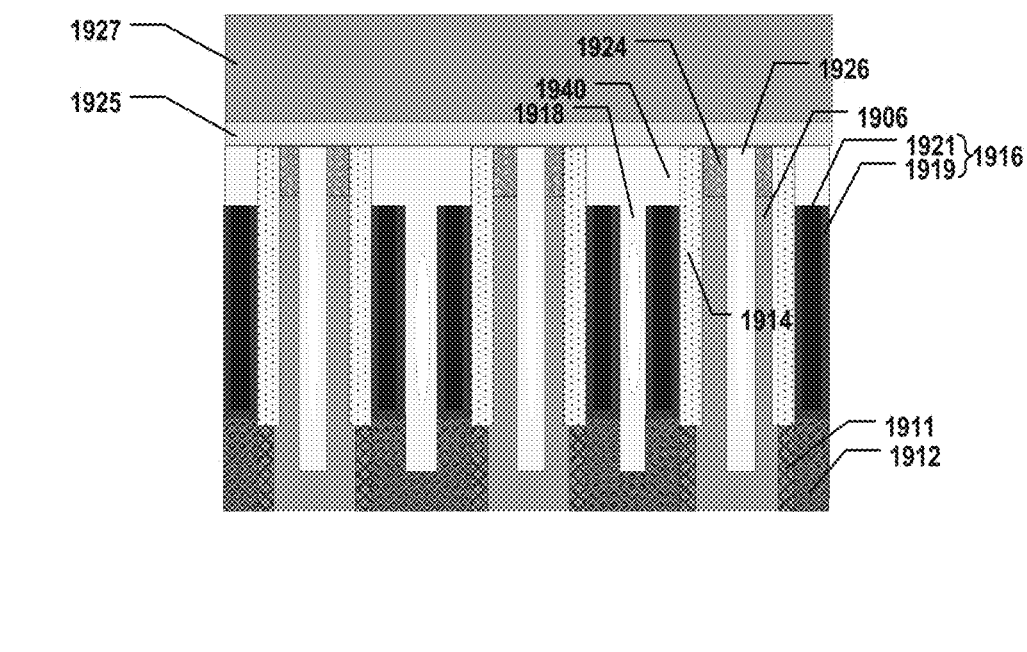
Figure 19M:
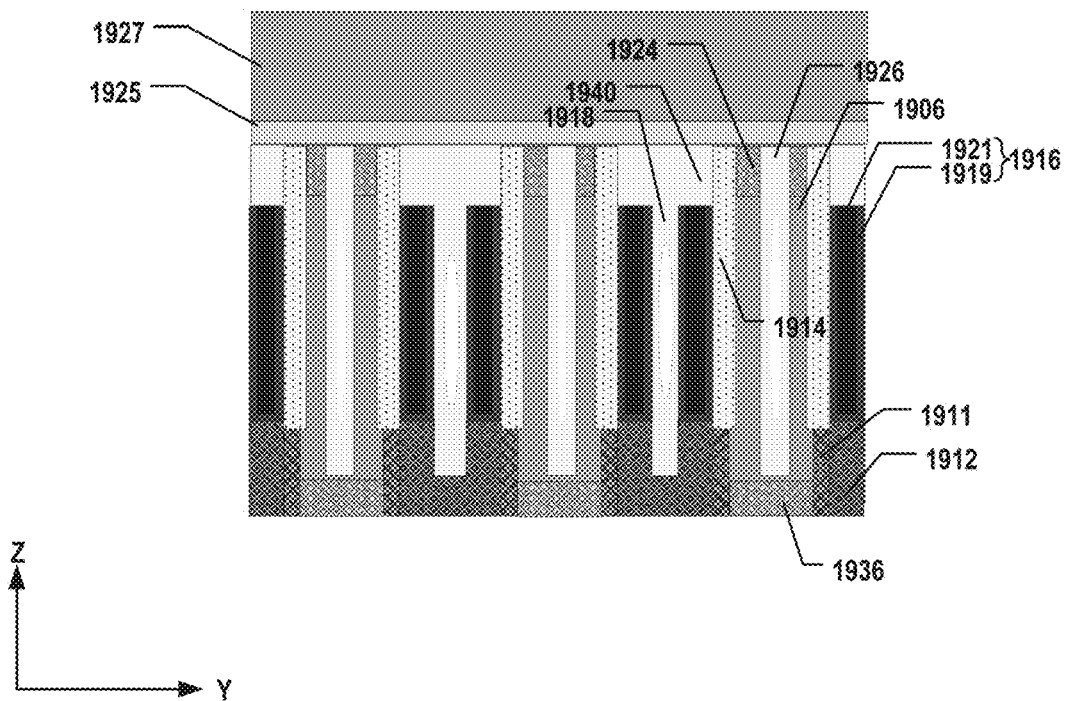
Figure 19N:
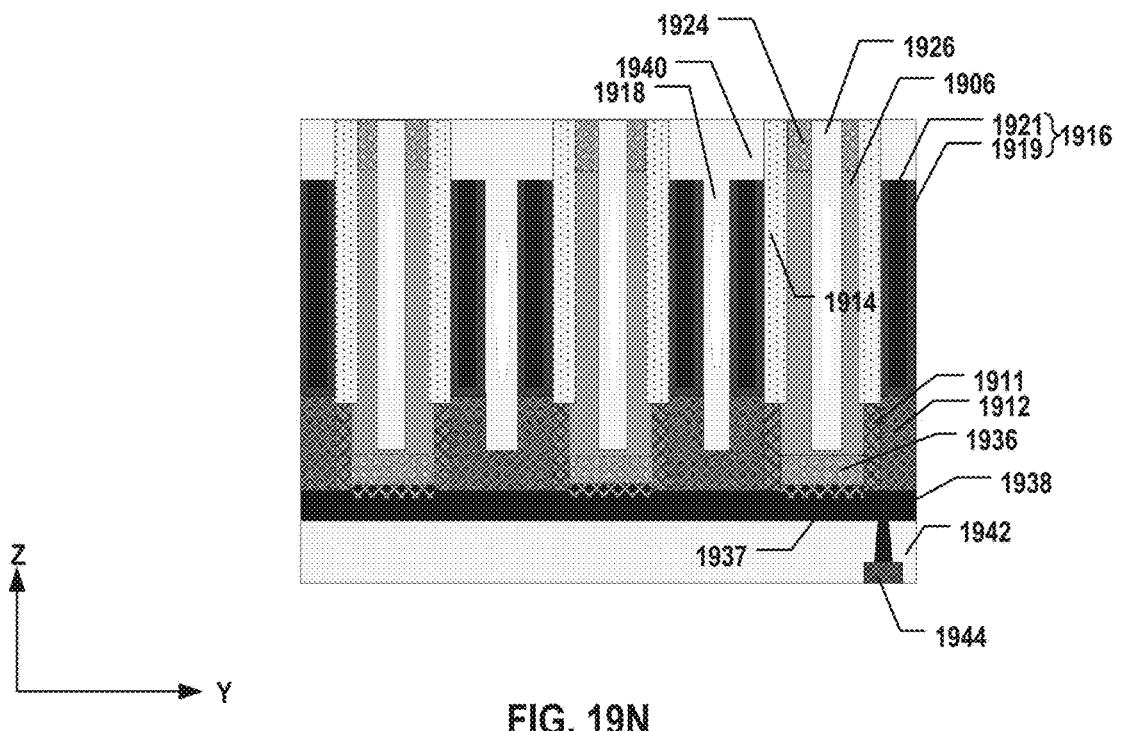

FIGS. 19A-19N illustrate a fabrication process for forming yet another semiconductor device including vertical transistors, according to some aspects of the present disclosure. FIGS. 20A-20F illustrate a fabrication process for forming yet another semiconductor device including vertical transistors, according to some aspects of the present disclosure. FIG. 21 illustrates a flowchart of a method 2100 for forming a semiconductor device including vertical transistors, according to some aspects of the present disclosure. Examples of the semiconductor devices depicted in FIGS. 19A-19N and 20A-20F include semiconductor device 1800 depicted in FIG. 18A. FIGS. 19A-19N, 20A-20F, and 21 will be described together. It is understood that the operations shown in method 2100 are not exhaustive and that other operations can be performed as well before, after, or between any of the illustrated operations. Further, some of the operations may be performed simultaneously, or in a different order than shown in FIG. 21.

Referring to FIG. 21, method 2100 starts at operation 2102, in which a semiconductor body of a vertical transistor extending in a first direction on a substrate is formed. The substrate can be a silicon substrate.

As illustrated in FIG. 19A, a plurality of parallel semiconductor walls 1905 are formed in the y-direction (the bit line direction). To form semiconductor walls 1905, a plurality of parallel trenches are formed in a silicon substrate 1902 in the y-direction. In some implementations, a lithography process is performed to pattern the trenches and semiconductor walls 1905 using an etch mask 1904 (e.g., a photoresist mask and/or a hard mask), for example, based on the design of bit lines, and one or more dry etching and/or wet etching processes, such as RIE, are performed to etch the trenches in silicon substrate 1902. Thus, semiconductor wall 1905 extending in the vertical direction on silicon substrate 1902 can be formed. Since semiconductor walls 1905 are formed by etching silicon substrate 1902, semiconductor walls 1905 can have the same material as silicon substrate 1902, such as single crystalline silicon. FIG. 19A illustrates both the side view (in the bottom portion of FIG. 19A) of a cross-section along the x-direction (the word line direction, e.g., in the AA plane) and the plan view (in the top portion of FIG. 19A) of a cross-section in the x-y plane (e.g., in the BB plane through semiconductor walls 1905).

As illustrated in FIG. 19A, trench isolations 1908 are formed in the trenches. In some implementations, a dielectric, such as silicon oxide and/or silicon nitride, is deposited to fully fill the trenches using one or more thin film deposition processes including, but not limited to, CVD, PVD, ALD, or any combination thereof. In some implementations, a planarization process, such as CMP, is performed to remove excess dielectric deposited beyond the top surface of etch mask 1904. As a result, parallel semiconductor walls 1905 can be separated by trench isolations 1908. It is understood that in some examples, before depositing trench isolations 1908, a liner layer (e.g., a native oxide layer, not shown) may be formed on the sidewalls of semiconductor walls 1905 to cure the defects on the sidewalls of semiconductor walls 1905 caused by the etching process.

As illustrated in FIG. 19B, a plurality of parallel trenches 1910 are formed each extending in the x-direction (the word line direction) to form an array of semiconductor bodies 1906 each extending in the vertical direction on silicon substrate 1902. In some implementations, a lithography process is performed to pattern trenches 1910 to be perpendicular to trench isolations 1908 using an etch mask (e.g., a photoresist mask and/or a hard mask), for example, based on the design of word lines, and one or more dry etching and/or wet etching processes, such as RIE, are performed on silicon substrate 1902 and trench isolation 1908 to etch trenches 1910 in silicon substrate 1902. As a result, semiconductor walls 1905 (shown in FIG. 19A) can be cut by trenches 1910 to form an array of semiconductor bodies 1906 each extending vertically on silicon substrate 1902. Since semiconductor bodies 1906 are formed by etching silicon substrate 1902, semiconductor bodies 1906 can have the same material as silicon substrate 1902, such as single crystalline silicon. FIG. 19B illustrates both the side view (in the bottom portion of FIG. 19B) of a cross-section along the y-direction (the bit line direction, e.g., in the AA plane through semiconductor bodies 1906) and the plan view (in the top portion of FIG. 19B) of a cross-section in the x-y plane (e.g., in the BB plane through semiconductor bodies 1906).

Method 2100 proceeds to operation 2104, as illustrated in FIG. 21, in which a first sacrificial layer is formed on a first side of the semiconductor body, and another first sacrificial layer is formed on a second side of the semiconductor body opposite the first side. In some implementations, a liner layer is formed on sidewalls of the semiconductor body prior to forming the first sacrificial layers.

As illustrated in FIG. 19C, a liner layer 1911 is formed on the top surface and the sidewalls of semiconductor body 1906. Liner layer 1911 can be a native oxide layer of semiconductor body 1906 having single crystalline silicon, for example, grown using thermal oxidation (e.g., ISSG oxidation), which can cure the defects on the surfaces of semiconductor body 1906 caused by the etching processes.

As illustrated in FIG. 19C, sacrificial layers 1915 are formed on the sidewalls and the top surfaces of semiconductor body 1906. For each semiconductor body 1906, two sacrificial layers 1915 can be formed on the two opposite sides of each semiconductor body 1906 in the bit line direction (the y-direction), as shown in the plan view. In some implementations, sacrificial layers 1915 are formed by depositing one or more materials that are different from the materials of liner layers 1911 over liner layers 1911 using one or more thin film deposition processes including, but not limited to, CVD, PVD, ALD, or any combination thereof, to partially fill trenches 1910. For example, a high-k dielectric, such as silicon nitride or $Al_2O_3$, may be deposited to form sacrificial layers 1915 over liner layers 1911 having silicon oxide. FIG. 19C illustrates both the side view (in the bottom portion of FIG. 19C) of a cross-section along the y-direction (the bit line direction, e.g., in the AA plane through semiconductor bodies 1906) and the plan view (in the top portion of FIG. 19C) of a cross-section in the x-y plane (e.g., in the BB plane through semiconductor bodies 1906 and sacrificial layers 1915) As shown in the plan view, sacrificial layers 1915 can be parts of a continuous rectangular annulus layer surrounding a row of semiconductor bodies 1906. As illustrated in the side view, the bottom portion of sacrificial layer 1915 formed on the bottom surface of trench 1910 is not removed, thereby leaving sacrificial layers 1915 on opposite sides of semiconductor body 1906 connected as parts of a continuous layer, according to some implementations.

Method 2100 proceeds to operation 2106, as illustrated in FIG. 21, in which a second sacrificial layer is formed on a side of the first sacrificial layer, another second sacrificial layer is formed on a side of the another first sacrificial layer.

As illustrated in FIG. 19D, sacrificial layers 1917 are formed on the sidewalls of sacrificial layers 1915 to fill trenches 1910 (shown in FIG. 19C). Each sacrificial layer 1917 can be a continuous layer in the word line direction that separating adjacent sacrificial layers 1915, as shown in the plan view. In some implementations, sacrificial layers 1917 are formed by depositing one or more materials that are different from the materials of sacrificial layers 1915 over sacrificial layers 1915 using one or more thin film deposition processes including, but not limited to, CVD, PVD, ALD, or any combination thereof, to fully fill trenches 1910. For example, polysilicon may be deposited to form sacrificial layers 1917 over sacrificial layers 1915 having silicon nitride or a high-k dielectric (e.g., $Al_2O_3$). Similar to sacrificial layers 1915, any excess materials of sacrificial layers 1917 over the top surfaces of semiconductor bodies 1906 and sacrificial layers 1915 can be removed by a dry etching process, such as RIE, and/or a planarization process, such as CMP, to separate sacrificial layers 1917 into discrete pieces in the bit line direction. Thus, for each semiconductor body 1906, a pair of sacrificial layers 1915 and 1917 are sequentially formed on one side in the bit line direction, and another pair of sacrificial layers 1915 and 1917 are sequentially formed on the opposite side in the bit line direction, according to some implementations. FIG. 19D illustrates both the side view (in the bottom portion of FIG. 19D) of a cross-section along the y-direction (the bit line direction, e.g., in the AA plane through semiconductor bodies 1906) and the plan view (in the top portion of FIG. 19D) of a cross-section in the x-y plane (e.g., in the BB plane through semiconductor bodies 1906 and sacrificial layers 1915 and 1917).

Method 2100 proceeds to operation 2108, as illustrated in FIG. 21, in which at least part of the first sacrificial layer and at least part of the another first sacrificial layer are replaced with a gate structure. In some implementations, to replace the at least parts of the first and another first sacrificial layers with the gate structure, the at least parts of the first and another first sacrificial layers are removed to expose the first and second sides of the semiconductor body, a gate dielectric of the gate structure is formed on the exposed first and second sides of the semiconductor body, and a gate electrode of the gate structure is formed on a side of the gate dielectric.

As illustrated in FIG. 19E, sacrificial layers 1915 on two opposite sides of semiconductor bodies 1906 in the bit line direction (shown in FIG. 19D) are partially removed to form trenches 1909, partially exposing both sides of semiconductor bodies 1906 in the bit line direction. To partially remove sacrificial layers 1915, one or more selective etching processes, such as wet etching, can be performed to etch away parts of sacrificial layers 1915 on both sides of semiconductor bodies 1906 in the bit line direction, leaving other parts of sacrificial layers 1915 intact. The remainder of sacrificial layers 1915 after etching is referred to hereafter as "pad layer 1912." The etchant can have a relatively high selectivity (e.g., greater than 5 times) of sacrificial layers 1915 with respect to sacrificial layers 1917 and liner layers 1911, thereby leaving sacrificial layers 1917 and liner layers 1911 intact as well. For example, etchants having phosphoric acid ($H_3PO_4$) may be used to selectively etch sacrificial layers 1915 having silicon nitride or $Al_2O_3$, without etching sacrificial layers 1917 having polysilicon and liner layers 1911 having silicon oxide. In some implementations, the etching rate and/or duration are controlled such that the etching process stops before fully etching away sacrificial layers 1915. FIG. 19E illustrates both the side view (in the bottom portion of FIG. 19E) of a cross-section along the y-direction (the bit line direction, e.g., in the AA plane through semiconductor bodies 1906) and the plan view (in the top portion of FIG. 19E) of a cross-section in the x-y plane (e.g., in the BB plane through semiconductor bodies 1906 and sacrificial layers 1917).

As illustrated in FIG. 19F, gate dielectrics 1914 are formed on the partially exposed two opposite sides of semiconductor bodies 1906 in the bit line direction in trenches 1909 (shown in FIG. 19E). In some implementations, gate dielectrics 1914 are formed by depositing a layer of dielectric, such as silicon oxide, over the exposed sidewalls of semiconductor bodies 1906 using one or more thin film deposition processes including, but not limited to, CVD, PVD, ALD, or any combination thereof, without fully filling trenches 1909. It is understood that in some examples, gate dielectrics 1914 may not be parts of a continuous dielectric layer. For example, a thermal oxidation process, such as ISSG oxidation, is performed to further grow native oxide (e.g., silicon oxide) on semiconductor bodies 1906 (e.g., single crystalline silicon) from liner layer 1911 to become gate dielectric 1914. It is also understood that since gate dielectrics 1914 and liner layers 1911 may have the same materials, such as silicon oxide, the interface and boundary between gate dielectrics 1914 and liner layers 1911 may become indistinguishable. Thus, for ease of description, liner layers 1911 that are in contact with gate dielectrics 1914 may be illustrated as part of gate dielectrics 1914 in the present disclosure, for example, as shown in FIG. 19F.

As illustrated in FIG. 19F, gate electrodes 1916 are formed on the side of gate dielectrics 1914 in trenches 1909 (shown in FIG. 19E). Gate electrode 1916 can be formed between gate dielectric 1914 and sacrificial layer 1917 in the bit line direction to fill trench 1909. In some implementations, gate electrode 1916 includes a gate conductor 1921 and a barrier layer 1919 surrounding gate conductor 1921. In some implementations, gate electrodes 1916 are formed by depositing one or more layers of conductive layers, such as metals or metal compounds, over the exposed sidewall of gate dielectrics 1914 using one or more thin film deposition processes including, but not limited to, CVD, PVD, ALD, or any combination thereof, fully filling trenches 1909. For example, a layer of TiN and a layer of W may be sequentially deposited into trench 1909 to form barrier layer 1919 having TiN and gate conductor 1921 having W, respectively. That is, the self-aligned gate process disclosed herein can allow the later deposited gate conductor 1921 to be surrounded by the first deposited barrier layer 1919 when filling trench 1909. FIG. 19F illustrates both the side view (in the bottom portion of FIG. 19F) of a cross-section along the y-direction (the bit line direction, e.g., in the AA plane through semiconductor bodies 1906) and the plan view (in the top portion of FIG. 19F) of a cross-section in the x-y plane (e.g., in the BB plane through semiconductor bodies 1906, gate electrodes 1916, gate dielectrics 1914, and sacrificial layers 1917). As shown in the plan view, gate electrodes 1916 can be parts of a continuous rectangular annulus conductive layer (word line) surrounding a row of semiconductor bodies 1906.

As illustrated in FIG. 19F, top portions of gate electrodes 1916 are replaced with dielectric plugs 1940, making the top end of gate electrodes 1916 below the top end of semiconductor body 1906. To form dielectric plugs 1940, gate electrodes 1916 can be etched back (recessed) from the top by wet etching and/or drying etching, such that the upper end of gate electrodes 1916 becomes below the top surface of semiconductor body 1906, and the resulting recesses can be filled with dielectric plugs 1940 by depositing dielectrics, such as silicon oxide, using one or more thin film deposition processes including, but not limited to, CVD, PVD, ALD, or any combination thereof.

Method 2100 proceeds to operation 2110, as illustrated in FIG. 21, in which the second sacrificial layer and the another second sacrificial layer are replaced with a dielectric isolation layer. In some implementations, to replace the second and another second sacrificial layers with the dielectric isolation layer, the second and another second sacrificial layers are removed to expose one side of the gate structure, and the dielectric isolation layer is formed on the exposed side of the gate structure.

As illustrated in FIG. 19G, dielectric isolation layers 1918 are formed on the exposed side of gate electrodes 1916 of the gate structures. To form dielectric isolation layers 1918, sacrificial layers 1917 (shown in FIG. 19F) are selectively removed to form trenches, exposing the sidewalls of gate electrodes 1916 of the gate structures and parts of pad layers 1912. Selective etching processes, such as wet etching, can be performed to etch away sacrificial layers 1917. The etchant can have a relatively high selectivity (e.g., greater than 5 times) of sacrificial layers 1917 with respect to gate electrodes 1916 and pad layers 1912, thereby leaving gate electrodes 1916 and pad layers 1912 intact. For example, the etchant having potassium hydroxide (KOH) may be used to selectively etch sacrificial layers 1917 having polysilicon, without etching gate electrodes 1916 having W/TiN and pad layers 1912 having silicon nitride or $Al_2O_3$. In some implementations, dielectric material(s), such as silicon oxide, are then deposited using one or more thin film deposition processes including, but not limited to, CVD, PVD, ALD, or any combination thereof, to fill the trenches. Depending on the lateral dimensions of the trenches, the trenches may not be fully filled with the deposited dielectric material(s) (e.g., silicon oxide) when forming dielectric isolation layers 1918 and thus, become air gaps therein according to the self-aligned gate process, as shown in FIG. 19G. It is understood that in some examples, when the lateral dimensions of the trenches are sufficiently large, dielectric material(s) may fully fill the trenches during the formation of dielectric isolation layers 1918, thereby eliminating the air gaps. It is understood that since dielectric isolation layer 1918 and dielectric plug 1940 may have the same materials, such as silicon oxide, the interface and boundary between dielectric isolation layer 1918 and dielectric plug 1940 may become indistinguishable.

Method 2100 proceeds to operation 2111, as illustrated in FIG. 21, in which a trench isolation in the semiconductor body and extending in a third direction perpendicular to the first direction is formed. The semiconductor body can be separated by the trench isolation into two semiconductor bodies each in contact with a respective one of the gate structures. In some implementations, to form the trench isolation, the semiconductor body is etched to form a trench, and a dielectric is deposited to fill the trench.

As illustrated in FIG. 19H, a plurality of parallel trenches 1922 each extending in the word line direction are formed. Each trench 1922 can be formed in a row of semiconductor bodies 1906 to slit at least part of each semiconductor body 1906 into two adjacent semiconductor bodies 1906 in the bit line direction. In some implementations, a lithography process is performed to pattern trench 1922 at least partially through semiconductor body 1906 using an etch mask (e.g., a photoresist mask and/or a hard mask), and one or more dry etching and/or wet etching processes, such as RIE, are performed on semiconductor body 1906 to etch trench 1922. As shown in FIG. 19H, in some implementations, the etching rate and/or etching duration are controlled such that trench 1922 does not extend fully through semiconductor body 1906 to fully separate semiconductor body 1906 into two disconnected semiconductor bodies 1906. Although not shown, it is understood that in some examples, the etching rate and/or etching duration may be controlled such that trench 1922 extends fully through semiconductor body 1906 to fully separate semiconductor body 1906 into two disconnected semiconductor bodies 1906. FIG. 19H illustrates both the side view (in the bottom portion of FIG. 19H) of a cross-section along they-direction (the bit line direction, e.g., in the AA plane through semiconductor bodies 1906) and the plan view (in the top portion of FIG. 19H) of a cross-section in the x-y plane (e.g., in the BB plane through separated portions of semiconductor bodies 1906, gate electrodes 1916, and gate dielectrics 1914).

The remainder of gate electrode 1916 (referring to hereafter as "gate electrode 1916" for ease of description) and gate dielectric 1914 in contact with gate electrode 1916 become a gate structure coupled to one side of semiconductor body 1906 after separation, according to some implementations, as shown in FIG. 19H. As shown in FIG. 19H, gate electrode 1916, gate dielectric 1914, and dielectric isolation layer 1918 can be formed on top of pad layer 1912 (i.e., the remainder of sacrificial layer 1915). That is, sacrificial layers 1915 and 1917 are used to define the shape, position, and dimensions of the gate structure having gate electrode 1916 and gate dielectric 1914 according to the self-aligned gate process. Specifically, the shape, position, and dimensions of gate electrode 1916 can be further defined by dielectric plug 1940 and pad layer 1912 as well. As a result, the various issues associated with the gate process described above, such as the nonuniformity of the gate structure, the challenging bottom punch process, and the F attack, can be addressed by the self-aligned gate process disclosed herein.

As shown in the plan view of FIG. 19H, each semiconductor body 1906 after separation can be coupled with a gate structure having gate dielectric 1914 and gate electrode 1916 on one side of semiconductor body 1906 in the bit line direction. The opposite side of semiconductor body 1906 can be exposed by trench 1922. In some implementations, a mirror-symmetric arrangement of two semiconductor bodies 1906 and two gate structures thereof is achieved by forming trench 1922 across the middle of a respective semiconductor body 1906.

As illustrated in FIG. 19I, a trench isolation 1926 is formed in trench 1922 (shown in FIG. 19H), for example, by depositing a dielectric, such as silicon oxide, to fill trench 1922, using one or more thin film deposition processes including, but not limited to, CVD, PVD, ALD, or any combination thereof. A planarization process can be performed to remove excess dielectric over the top surface of semiconductor body 1906. It is understood that depending on the pitches of the semiconductor bodies 1906 (i.e., the dimension of trenches 1922), air gaps may be formed in trench isolation 1926. As a result, parallel trench isolations 1926 each extending in the word line direction can form an array of semiconductor bodies 1906 in which a single side is in contact with a gate structure having gate dielectric 1914 and gate electrode 1916.

As illustrated in FIG. 19J, the exposed top end (e.g., the end away from silicon substrate 1902 in the vertical direction) of semiconductor body 1906 is doped to form a drain or a source 1924 (referrer to hereinafter as "source/drain 1924") of the vertical transistor. For example, source/drain 1924 may be the source terminal of the vertical transistor. In some implementations, an implantation process and/or thermal diffusion process are performed to dope P-type dopants or N-type dopants to exposed upper ends of semiconductor bodies 1906 to form sources/drains 1924. In some implementations, a silicide layer is formed on source/drain 1924 by performing a silicidation process at the exposed upper ends of semiconductor bodies 1906.

Method 2100 proceeds to operation 2112, as illustrated in FIG. 21, in which the substrate is thinned to expose an end of the semiconductor body. In some implementations, to thin the substrate, a carrier substrate is attached above the vertical transistor and opposite the substrate, and the substrate is polished until being stopped by a remainder of the first sacrificial layer.

As illustrated in FIG. 19K, a carrier substrate 1927 (a.k.a. a handle substrate) is attached above gate electrodes 1916 of the gate structures and semiconductor bodies 1906 and opposite silicon substrate 1902 using any suitable bonding processes, such as anodic bonding, fusion bonding, transfer bonding, adhesive bonding, and eutectic bonding. In some implementations, a dielectric layer 1925 is formed between carrier substrate 1927 and silicon substrate 1902 prior to attaching carrier substrate 1927. The attached structure can then be flipped upside down, such that silicon substrate 1902 becomes above carrier substrate 1927.

As illustrated in FIG. 19L, silicon substrate 1902 (shown in FIG. 19K) is thinned to expose the undoped upper ends of semiconductor bodies 1906 (used to be the lower ends before flipping over) that are away from carrier substrate 1927. In some implementations, a polishing process (e.g., CMP) is performed to polish silicon substrate 1902 from the backside until being stopped by pad layers 1912 (the remainder of sacrificial layer 1915). In other words, pad layers 1912 can be used as the stop layers in thinning silicon substrate 1902 from the backside. As a result, pad layers 1912 and semiconductor bodies 1906 are exposed from the backside, according to some implementations.

Method 2100 proceeds to operation 2114, as illustrated in FIG. 21, in which the exposed end of the semiconductor body is doped to form a drain or a source of the vertical transistor. As illustrated in FIG. 19M, the exposed bottom end (e.g., the end away from carrier substrate 1927 in the vertical direction) of semiconductor body 1906 is doped to form another drain or source 1936 (referrer to hereinafter as "source/drain 1936") of the vertical transistor. For example, source/drain 1936 may be the drain terminal of the vertical transistor. In some implementations, an implantation process and/or thermal diffusion process are performed to dope P-type dopants or N-type dopants to exposed lower ends of semiconductor bodies 1906 to form sources/drains 1936. It is understood that sources/drains 1936 of adjacent vertical transistors on opposite sides of trench isolation 1926 may be connected (as shown in FIG. 19M) or disconnected (not shown) depending on whether trench isolation 1926 extends vertically all the way through semiconductor body 1906 or not.

Method 2100 proceeds to operation 2116, as illustrated in FIG. 21, in which a bit line adjacent to the exposed end of the semiconductor body and extending in a second direction perpendicular to the first direction is formed. The bit line can be coupled to the drain or the source.

As illustrated in FIG. 19N, a bit line 1938 extending in the bit line direction (they-direction) is formed adjacent to the exposed lower ends of semiconductor bodies 1906, being coupled to drains/sources 1936. Bit line 1938 can be formed by patterning and etching a trench aligned with a column of sources/drains in the bit line direction using lithography and etching processes. The trenches can then be filled by depositing conductive materials, such as metals (e.g., W), using one or more thin film deposition processes including, but not limited to, CVD, PVD, ALD, or any combination thereof. In some implementations, forming bit line 1938 includes depositing a metal layer (e.g., W) onto the exposed lower end of semiconductor body 1906 to form a metal bit line.

As illustrated in FIG. 19N, ohmic contacts 1937 are formed between bit line 1938 and sources/drains 1936 at the exposed lower ends of semiconductor bodies 1906 to couple bit line 1938 and sources/drains 1936. Ohmic contacts 1937 can include metal silicide material, i.e., metal silicide contacts. In some implementations, a metal silicide layer is formed between sources/drains 1936 and bit line 1938 by performing a silicidation process, for example, RTA, as ohmic contacts 1937 having a metal silicide, such as WSi.

As illustrated in FIG. 19N, a dielectric layer 1942 is formed opposing pad layers 1912 with bit line 1938 positioned between dielectric layer 1942 and pad layers 1912 in the vertical direction. Bit line contacts 1944 in contact with bit line 1938 can be formed through dielectric layer 1942. In some implementations, dielectric layer 1942 having silicon oxide is deposited on bit line 1938 using one or more thin film deposition processes including, but not limited to, CVD, PVD, ALD, or any combination thereof. Bit line contacts 1944 can then be formed through dielectric layer 1942 and coupled to bit line 1938 by first patterning contact holes through dielectric layer 1942 using a patterning process (e.g., photolithography and dry/wet etch of dielectric materials in dielectric layer 1942). The contact holes can be filled with conductive materials (e.g., W, TiN, and/or Cu) to form bit line contacts 1944.

It is understood that the separation of semiconductor bodies 1906 by forming trench isolations 1926 can be performed at a different timing during the self-aligned gate process from the example in FIGS. 19A-19N. For example, operation 2111 in which the trench isolation is formed may be performed between operations 2102 and 2104, i.e., before the formation of the first sacrificial layers.

As illustrated in FIG. 20A, after forming trenches 1910 and before forming sacrificial layers 1915, a plurality of parallel trenches 2022 each extending in the word line direction are formed. Each trench 2022 can be formed in a row of semiconductor bodies 1906 to slit at least part of each semiconductor body 1906 into two adjacent semiconductor bodies 1906 in the bit line direction. In some implementations, a lithography process is performed to pattern trench 2022 at least partially through semiconductor body 1906 using an etch mask (e.g., a photoresist mask and/or a hard mask), and one or more dry etching and/or wet etching processes, such as RIE, are performed on semiconductor body 1906 to etch trench 2022. As shown in FIG. 20A, in some implementations, the etching rate and/or etching duration are controlled such that trench 2022 does not extend fully through semiconductor body 1906 to fully separate semiconductor body 1906 into two disconnected semiconductor bodies 1906. Although not shown, it is understood that in some examples, the etching rate and/or etching duration may be controlled such that trench 2022 extends fully through semiconductor body 1906 to fully separate semiconductor body 1906 into two disconnected semiconductor bodies 1906. FIG. 20A illustrates both the side view (in the bottom portion of FIG. 20A) of a cross-section along they-direction (the bit line direction, e.g., in the AA plane through semiconductor bodies 1906) and the plan view (in the top portion of FIG. 20A) of a cross-section in the x-y plane (e.g., in the BB plane through separated portions of semiconductor bodies 1906).

As illustrated in FIG. 20B, a liner layer 1911 is formed on the top surface and the sidewalls of semiconductor bodies 1906. Liner layer 1911 can be a native oxide layer of semiconductor bodies 1906 having single crystalline silicon, for example, grown using thermal oxidation (e.g., ISSG oxidation), which can cure the defects on the surfaces of semiconductor body 1906 caused by the etching processes.

As illustrated in FIG. 20B, sacrificial layers 1915 are formed on the sidewalls and the top surfaces of semiconductor body 1906. In some implementations, sacrificial layers 1915 are formed by depositing one or more materials that are different from the materials of liner layers 1911 over liner layers 1911 using one or more thin film deposition processes including, but not limited to, CVD, PVD, ALD, or any combination thereof, to fully fill trenches 2022 (shown in FIG. 20A) and partially fill trenches 1910 (shown in FIG. 20A). For example, a high-k dielectric, such as silicon nitride or $Al_2O_3$, may be deposited to form sacrificial layers 1915 over liner layers 1911 having silicon oxide. The deposition rate and/or deposition duration can be controlled such that the deposition process stops after fully filling trenches 2022 and before fully filling trenches 1910 sacrificial layers 1915 when trenches 2022 have a smaller width (the dimension in the bit line direction) than trenches 1910. FIG. 20B illustrates both the side view (in the bottom portion of FIG. 20B) of a cross-section along the y-direction (the bit line direction, e.g., in the AA plane through semiconductor bodies 1906) and the plan view (in the top portion of FIG. 20B) of a cross-section in the x-y plane (e.g., in the BB plane through semiconductor bodies 1906 and sacrificial layers 1915 and 1917). As shown in the plan view, sacrificial layers 1915 can be parts of a continuous rectangular annulus layer surrounding a row of semiconductor bodies 1906. As illustrated in the side view, the bottom portion of sacrificial layer 1915 formed on the bottom surface of trench 1910 is not removed, thereby leaving sacrificial layers 1915 on opposite sides of semiconductor body 1906 connected as parts of a continuous layer, according to some implementations.

As illustrated in FIG. 20B, sacrificial layers 1917 are formed on the sidewalls of sacrificial layers 1915 to fill trenches 1910 (shown in FIG. 20A). Each sacrificial layer 1917 can be a continuous layer in the word line direction that separates adjacent sacrificial layers 1915, as shown in the plan view. In some implementations, sacrificial layers 1917 are formed by depositing one or more materials that are different from the materials of sacrificial layers 1915 over sacrificial layers 1915 using one or more thin film deposition processes including, but not limited to, CVD, PVD, ALD, or any combination thereof, to fully fill trenches 1910. For example, polysilicon may be deposited to form sacrificial layers 1917 over sacrificial layers 1915 having silicon nitride or a high-k dielectric (e.g., $Al_2O_3$). Any excess materials of sacrificial layers 1915 and 1917 over the top surfaces of semiconductor bodies 1906 can be removed by a dry etching process, such as RIE, and/or a planarization process, such as CMP, to separate sacrificial layers 1915 and 1917 into discrete pieces in the bit line direction. Thus, for each semiconductor body 1906 after separation, a pair of sacrificial layers 1915 and 1917 are sequentially formed on one side in the bit line direction, according to some implementations.

Figure 20C:
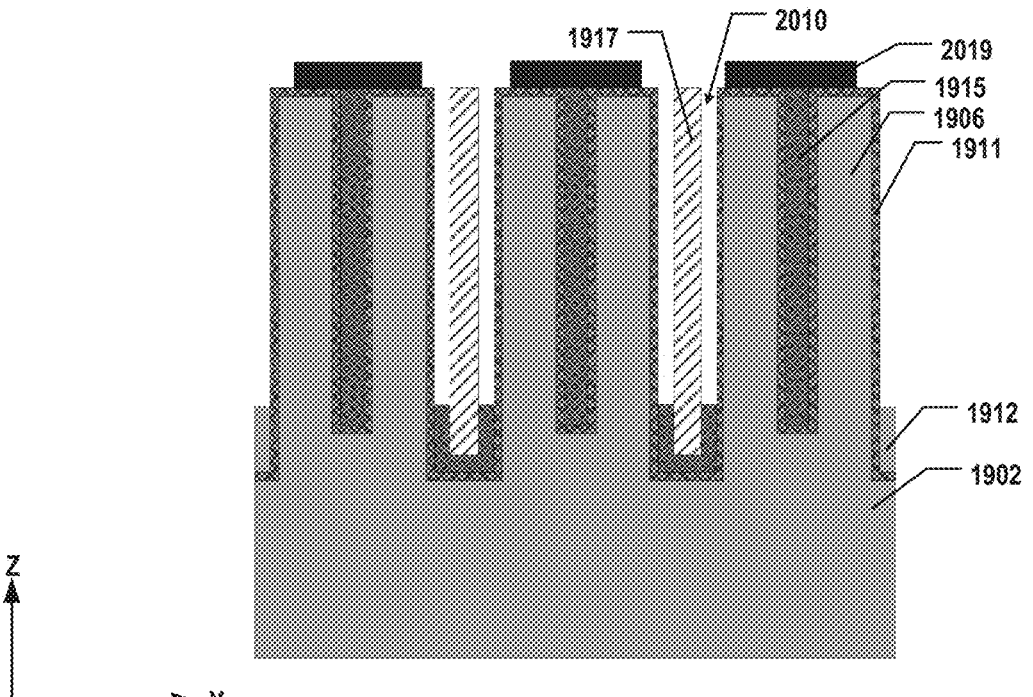

As illustrated in FIG. 20C, sacrificial layers 1915 on one side of semiconductor bodies 1906 in the bit line direction (shown in FIG. 20B) are partially removed to form trenches 2010, partially exposing one side of semiconductor bodies 1906 in the bit line direction where the gate structures are to be formed. Sacrificial layers 1915 on the opposite side of semiconductor bodies 1906 (filling trenches 2022) can still remain. To partially remove sacrificial layers 1915, in some implementations, a lithography process is performed to pattern trench 2010 using an etch mask 2019 (e.g., a photoresist mask and/or a hard mask), which exposes sacrificial layers 1915 on one side of semiconductor bodies 1906 where the gate structures are to be formed, while covers and protects sacrificial layers 1915 on the opposite side of semiconductor bodies 1906. One or more selective etching processes, such as wet etching, can be performed through etch mask 2019 to etch away parts of sacrificial layers 1915 on one side of semiconductor bodies 1906 in the bit line direction where the gate structures are to be formed, leaving other parts of sacrificial layers 1915 on the side, as well as sacrificial layers 1915 on the opposite side, intact. The remainder of sacrificial layers 1915 after etching on the side of semiconductor bodies 1906 where the gate structures are to be formed is referred to hereafter "pad layer 1912." The etchant can have a relatively high selectivity (e.g., greater than 5 times) of sacrificial layers 1915 with respect to sacrificial layers 1917 and liner layers 1911, thereby leaving sacrificial layers 1917 and liner layers 1911 intact as well. For example, etchants having phosphoric acid ($H_3PO_4$) may be used to selectively etch sacrificial layers 1915 having silicon nitride or $Al_2O_3$, without etching sacrificial layers 1917 having polysilicon and liner layers 1911 having silicon oxide. In some implementations, the etching rate and/or duration are controlled such that the etching process stops before fully etching away sacrificial layers 1915.

Figure 20D:
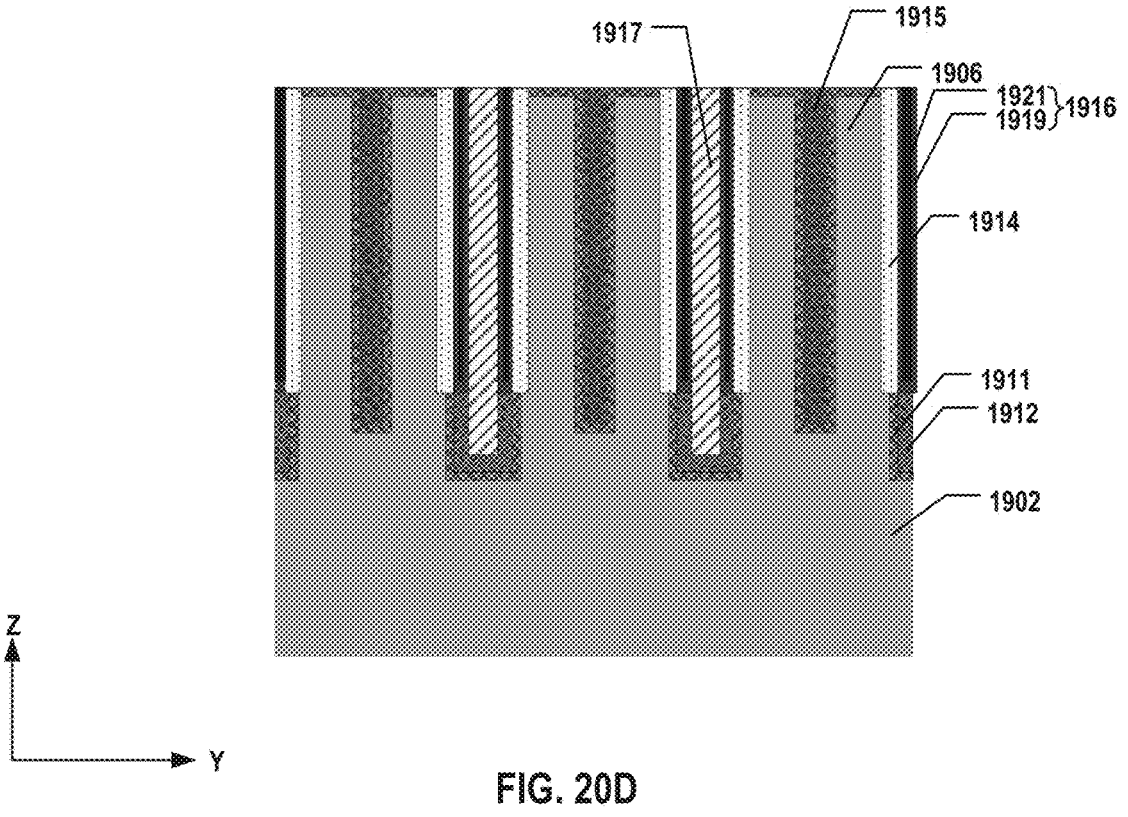

As illustrated in FIG. 20D, gate dielectrics 1914 are formed on the partially exposed one side of semiconductor bodies 1906 in the bit line direction in trenches 2010 (shown in FIG. 20C). In some implementations, gate dielectrics 1914 are formed by depositing a layer of dielectric, such as silicon oxide, over the exposed sidewalls of semiconductor bodies 1906 using one or more thin film deposition processes including, but not limited to, CVD, PVD, ALD, or any combination thereof, without fully filling trenches 2010. It is understood that in some examples, gate dielectrics 1914 may not be parts of a continuous dielectric layer. For example, a thermal oxidation process, such as ISSG oxidation, is performed to further grow native oxide (e.g., silicon oxide) on semiconductor bodies 1906 (e.g., single crystalline silicon) from liner layer 1911 to become gate dielectric 1914. It is also understood that since gate dielectrics 1914 and liner layers 1911 may have the same materials, such as silicon oxide, the interface and boundary between gate dielectrics 1914 and liner layers 1911 may become indistinguishable. Thus, for ease of description, liner layers 1911 that are in contact with gate dielectrics 1914 may be illustrated as part of gate dielectrics 1914 in the present disclosure, for example, as shown in FIG. 20D.

As illustrated in FIG. 20D, gate electrodes 1916 are formed on the side of gate dielectrics 1914 in trenches 2010 (shown in FIG. 20C). Gate electrode 1916 can be formed between gate dielectric 1914 and sacrificial layer 1917 in the bit line direction to fill trench 2010. In some implementations, gate electrode 1916 includes a gate conductor 1921 and a barrier layer 1919 surrounding gate conductor 1921. In some implementations, gate electrodes 1916 are formed by depositing one or more layers of conductive layers, such as metals or metal compounds, over the exposed sidewall of gate dielectrics 1914 using one or more thin film deposition processes including, but not limited to, CVD, PVD, ALD, or any combination thereof, fully filling trenches 2010. For example, a layer of TiN and a layer of W may be sequentially deposited into trench 2010 to form barrier layer 1919 having TiN and gate conductor 1921 having W, respectively. That is, the self-aligned gate process disclosed herein can allow the later deposited gate conductor 1921 be surrounded by the first deposited barrier layer 1919 when filling trench 2010.

Figure 20E:
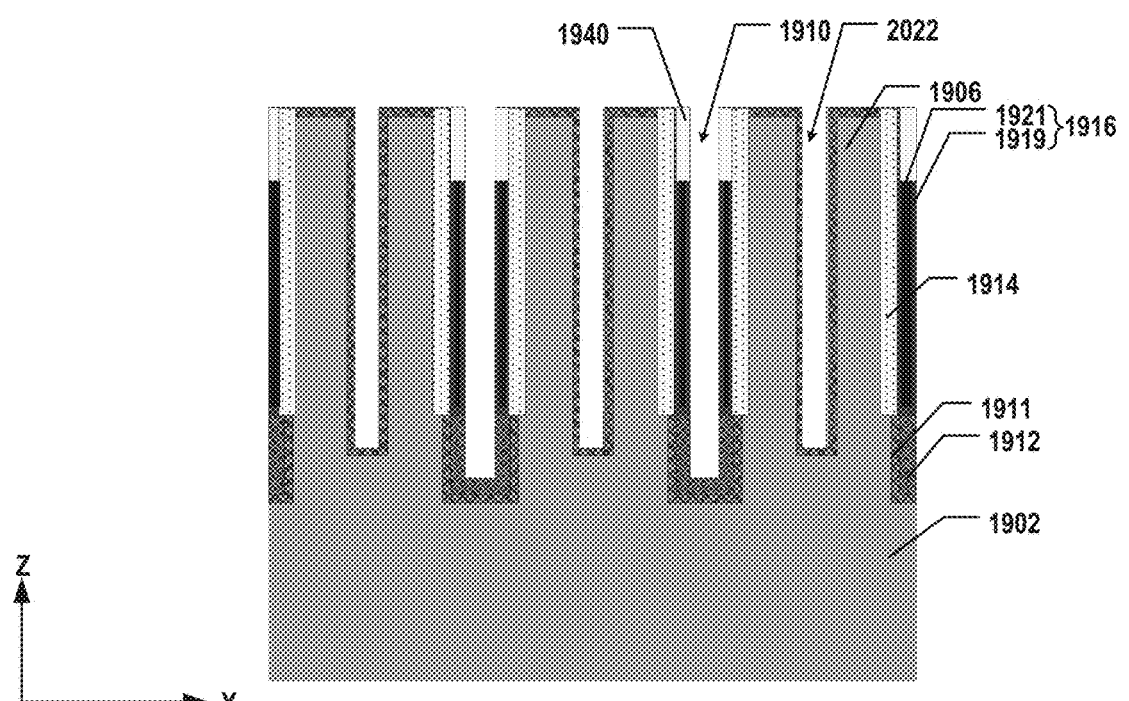

As illustrated in FIG. 20E, top portions of gate electrodes 1916 are replaced with dielectric plugs 1940, making the top end of gate electrodes 1916 below the top end of semiconductor body 1906. To form dielectric plugs 1940, gate electrodes 1916 can be etched back (recessed) from the top by wet etching and/or drying etching, such that the upper end of gate electrodes 1916 becomes below the top surface of semiconductor body 1906, and the resulting recesses can be filled with dielectric plugs 1940 by depositing dielectrics, such as silicon oxide, using one or more thin film deposition processes including, but not limited to, CVD, PVD, ALD, or any combination thereof.

As illustrated in FIG. 20E, sacrificial layers 1915 (shown in FIG. 20D) filled in trenches 2022 (shown in FIG. 20A) are selectively removed to open trenches 2022 again, exposing the sidewalls of semiconductor bodies 1906. Selective etching processes, such as wet etching, can be performed to etch away sacrificial layers 1915. The etchant can have a relatively high selectivity (e.g., greater than 5 times) of sacrificial layers 1915 with respect to gate electrodes 1916 and gate dielectrics 1914, thereby leaving gate electrodes 1916 and gate dielectrics 1914 intact. For example, the etchant having phosphoric acid ($H_3PO_4$) may be used to selectively etch sacrificial layers 1915 having silicon nitride or $Al_2O_3$, without etching gate electrodes 1916 having W/TiN and gate dielectrics 1914 having silicon oxide.

As illustrated in FIG. 20E, sacrificial layers 1917 (shown in FIG. 20D) are then selectively removed to open trenches 1910 again, exposing the sidewalls of gate electrodes 1916 of the gate structures and parts of pad layers 1912. Selective etching processes, such as wet etching, can be performed to etch away sacrificial layers 1917. The etchant can have a relatively high selectivity (e.g., greater than 5 times) of sacrificial layers 1917 with respect to gate electrodes 1916 and pad layers 1912, thereby leaving gate electrodes 1916 and pad layers 1912 intact. For example, the etchant having potassium hydroxide (KOH) may be used to selectively etch sacrificial layers 1917 having polysilicon, without etching gate electrodes 1916 having W/TiN and pad layers 1912 having silicon nitride or $Al_2O_3$.

Figure 20F:
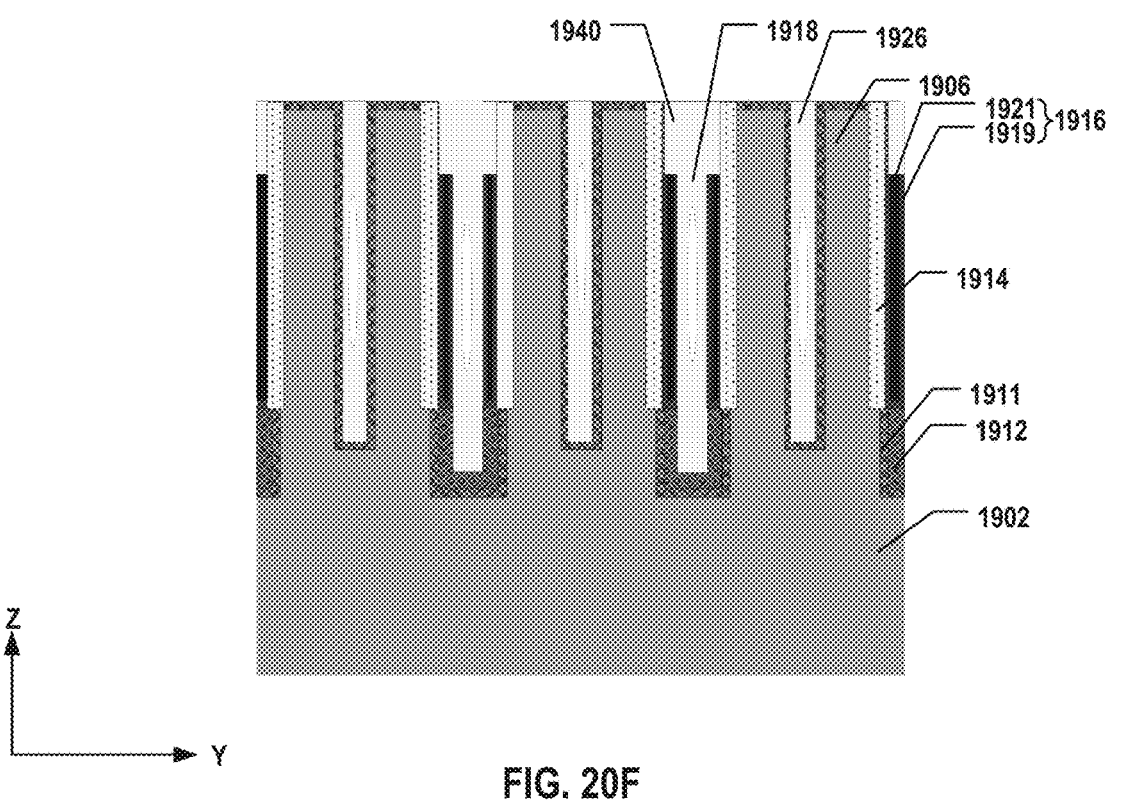

As illustrated in FIG. 20F, dielectric isolation layers 1918 are formed on the exposed side of gate electrodes 1916 of the gate structures. To form dielectric isolation layers 1918, in some implementations, dielectric material(s), such as silicon oxide, then are deposited using one or more thin film deposition processes including, but not limited to, CVD, PVD, ALD, or any combination thereof, to fill trenches 1910 (shown in FIG. 20E). Depending on the lateral dimensions of trenches 1910, trenches 1910 may not be fully filled with the deposited dielectric material(s) (e.g., silicon oxide) when forming dielectric isolation layers 1918 and thus, become air gaps therein according to the self-aligned gate process, as shown in FIG. 20F. It is understood that in some examples, when the lateral dimensions of trenches 1910 are sufficiently large, dielectric material(s) may fully fill trenches 1910 during the formation of dielectric isolation layers 1918, thereby eliminating the air gaps. It is understood that since dielectric isolation layer 1918 and dielectric plug 1940 may have the same materials, such as silicon oxide, the interface and boundary between dielectric isolation layer 1918 and dielectric plug 1940 may become indistinguishable.

As illustrated in FIG. 20F, trench isolations 1926 are formed in trenches 2022 (shown in FIG. 20E), for example, by depositing a dielectric, such as silicon oxide, to fill trench

2022, using one or more thin film deposition processes including, but not limited to, CVD, PVD, ALD, or any combination thereof. It is understood that depending on the pitches of the semiconductor bodies 1906 (i.e., the dimension of trenches 1922), air gaps may be formed in trench isolation 1926. Since trench isolations 1926 and dielectric isolation layers 1918 can have the same dielectric materials, such as silicon oxide, trench isolations 1926 and dielectric isolation layers 1918 can be formed simultaneously by the same deposition process. A planarization process can be performed to remove excess dielectric materials over the top surface of semiconductor body 1906. The remaining operations may be the same as the remaining operations in method 2100, including operations 2112, 2114, and 2116, which are not repeated.

It is understood that although the self-aligned gate processes described above with respect FIGS. 19A-19N and FIGS. 20A-20F are for forming "single-layer pad layer," for example, as shown in FIG. 18A, the process may be modified in view of the self-aligned gate process described above with respect FIGS. 10A-10F to form "two-layer pad layer," for example, as shown in FIG. 18B as well. For example, a pad layer may be formed on the bottom surface of trench 1910 before forming sacrificial layer 1915 such that sacrificial layer 1915 may be formed on top of the pad layer. The first-formed pad layer may be used as the stop layer in thinning silicon substrate 1902, and the first-formed pad layer and the remainder of sacrificial layer 1915 may become a two-layer pad layer in the final semiconductor device.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A semiconductor device, comprising:
   a vertical transistor comprising a semiconductor body extending in a first direction, and a gate structure coupled to at least one side of the semiconductor body, the gate structure comprising a gate dielectric and a gate electrode;
   a metal bit line extending in a second direction perpendicular to the first direction and coupled to a terminal of the vertical transistor via an ohmic contact;
   a pad layer positioned between the gate electrode and the metal bit line in the first direction, wherein the gate dielectric and the pad layer have different dielectric materials; and
   a liner layer positioned between the pad layer and the semiconductor body in the second direction, wherein the gate dielectric and the liner layer have a same material.

2. The semiconductor device of claim 1, wherein the pad layer has at least one of silicon nitride or high dielectric constant (high-k) dielectric.

3. The semiconductor device of claim 1, wherein the pad layer comprises a first pad layer in contact with the metal bit line, and a second pad layer in contact with the gate electrode, the first and second pad layers having different dielectric materials.

4. The semiconductor device of claim 1, wherein the gate dielectric is positioned between the gate electrode and the semiconductor body in the second direction.

5. The semiconductor device of claim 1, wherein the gate electrode comprises a gate conductor and a barrier layer surrounding the gate conductor.

6. The semiconductor device of claim 1, wherein the ohmic contact includes a metal silicide contact.

7. The semiconductor device of claim 1, further comprising a dielectric layer opposing the vertical transistor with the metal bit line positioned between the dielectric layer and the vertical transistor in the first direction.

8. A semiconductor device, comprising:

an array of vertical transistors, each of the vertical transistors comprising a semiconductor body extending in a first direction, and a gate structure coupled to at least one side of the semiconductor body, the gate structure comprising a gate dielectric and a gate electrode;

a bit line extending in a second direction perpendicular to the first direction and coupled to a column of the vertical transistors in the second direction;

a pad layer extending in a third direction perpendicular to the first direction and the second direction and positioned between the bit line and the gate electrodes of a row of the vertical transistors in the third direction, wherein the pad layer has a dielectric material; and a liner layer positioned between the pad layer and the semiconductor body in the second direction, wherein the gate dielectric and the liner layer have a same material.

9. The semiconductor device of claim 8, wherein the pad layer has at least one of silicon nitride or high dielectric constant (high-k) dielectric.

10. The semiconductor device of claim 8, wherein the pad layer comprises a first pad layer in contact with the bit line, and a second pad layer in contact with the gate electrodes, the first and second pad layers having different dielectric materials.

11. The semiconductor device of claim 8, wherein in each vertical transistor, the gate dielectric is positioned between the gate electrode and the semiconductor body in the second direction.

12. The semiconductor device of claim 8, wherein the gate structure is coupled to one side of the semiconductor body.

13. The semiconductor device of claim 12, wherein the gate electrodes of the row of the vertical transistors are continuous in the third direction.

14. The semiconductor device of claim 8, further comprising a trench isolation extending in the third direction and positioned between two adjacent rows of the vertical transistors in the second direction.

15. The semiconductor device of claim 14, wherein the two adjacent rows of the vertical transistors are mirror-symmetric with respect to the trench isolation.

16. The semiconductor device of claim 8, wherein the gate structure is coupled to two opposite sides of the semiconductor body in the second direction.

17. The semiconductor device of claim 16, further comprising a rectangular annulus word line surrounding the row of the vertical transistors to connect the gate electrodes of the row of the vertical transistors.

18. The semiconductor device of claim 8, wherein the gate dielectric is positioned between the gate electrode and the semiconductor body in the second direction.

19. The semiconductor device of claim 8, wherein the gate electrode comprises a gate conductor and a barrier layer surrounding the gate conductor.

20. The semiconductor device of claim 8, further comprising a dielectric layer opposing the vertical transistors with the bit line positioned between the dielectric layer and the vertical transistors in the first direction.

* * * * *